(12) United States Patent
Widjaja

(10) Patent No.: US 8,514,622 B2
(45) Date of Patent: Aug. 20, 2013

(54) COMPACT SEMICONDUCTOR MEMORY DEVICE HAVING REDUCED NUMBER OF CONTACTS, METHODS OF OPERATING AND METHODS OF MAKING

(75) Inventor: Yuniarto Widjaja, San Jose, CA (US)

(73) Assignee: Zeno Semiconductor, Inc., Cupertino, CA (US)

( * ) Notice: Subject to any disclaimer, the term of this patent is extended or adjusted under 35 U.S.C. 154(b) by 319 days.

(21) Appl. No.: 12/897,528

(22) Filed: Oct. 4, 2010

(65) Prior Publication Data

US 2011/0032756 A1 Feb. 10, 2011

Related U.S. Application Data

(63) Continuation-in-part of application No. 12/797,320, filed on Jun. 9, 2010, now Pat. No. 8,130,548, and a continuation-in-part of application No. 12/797,334, filed on Jun. 9, 2010, now Pat. No. 8,130,547, and a continuation-in-part of application No. 12/552,903, filed on Sep. 2, 2009, now Pat. No. 8,194,451, which is a continuation-in-part of application No. 11/998,311, filed on Nov. 29, 2007, now Pat. No. 7,760,548, and a continuation-in-part of application No. 12/533,661, filed on Jul. 31, 2009, now Pat. No. 8,077,536, and a continuation-in-part of application No. 12/545,623, filed on Aug. 21, 2009, now Pat. No. 8,159,868.

(60) Provisional application No. 61/093,726, filed on Sep. 3, 2008, provisional application No. 61/094,540, filed on Sep. 5, 2008, provisional application No. 61/309,589, filed on Mar. 2, 2010.

(51) Int. Cl.
*G11C 16/04* (2006.01)

(52) U.S. Cl.
USPC .......... 365/185.05; 365/185.17; 365/182

(58) Field of Classification Search
USPC .......... 365/185.05, 185.17, 182
See application file for complete search history.

(56) References Cited

U.S. PATENT DOCUMENTS

| | | |
|---|---|---|
| 4,300,212 A | 11/1981 | Simko |
| 4,959,812 A | 9/1990 | Momodomi et al. |
| 5,519,831 A | 5/1996 | Holzhammer |
| 5,581,504 A | 12/1996 | Chang et al. |
| 5,748,538 A * | 5/1998 | Lee et al. ............. 365/185.06 |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |

(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.

(Continued)

*Primary Examiner* — Tuan T. Nguyen
(74) *Attorney, Agent, or Firm* — Alan W. Cannon

(57) ABSTRACT

An integrated circuit including a link or string of semiconductor memory cells, wherein each memory cell includes a floating body region for storing data. The link or string includes at least one contact configured to electrically connect the memory cells to at least one control line, and the number of contacts in the string or link is the same as or less than the number of memory cells in the string or link.

54 Claims, 115 Drawing Sheets

(56) References Cited

U.S. PATENT DOCUMENTS

| | | | |
|---|---|---|---|
| 6,166,407 | A | 12/2000 | Ohta |
| 6,243,293 | B1 * | 6/2001 | Van Houdt et al. ...... 365/185.14 |
| 6,341,087 | B1 | 1/2002 | Kunikiyo et al. |
| 6,356,485 | B1 | 3/2002 | Proebsting et al. |
| 6,376,876 | B1 | 4/2002 | Shin et al. |
| 6,542,411 | B2 | 4/2003 | Tanikawa et al. |
| 6,614,684 | B1 | 9/2003 | Shukuri et al. |
| 6,724,657 | B2 | 4/2004 | Shukuri et al. |
| 6,791,882 | B2 | 9/2004 | Seki et al. |
| 6,801,452 | B2 | 10/2004 | Miwa et al. |
| 6,845,042 | B2 * | 1/2005 | Ichige et al. ............. 365/185.17 |
| 6,885,581 | B2 | 4/2005 | Nemati et al. |
| 6,925,006 | B2 | 8/2005 | Fazan et al. |
| 6,954,377 | B2 | 10/2005 | Choi et al. |
| 6,969,662 | B2 | 11/2005 | Fazan et al. |
| 7,085,156 | B2 | 8/2006 | Ferrant et al. |
| 7,118,986 | B2 | 10/2006 | Steigerwalt et al. |
| 7,170,807 | B2 | 1/2007 | Fazan et al. |
| 7,224,019 | B2 | 5/2007 | Hieda et al. |
| 7,259,420 | B2 | 8/2007 | Anderson et al. |
| 7,259,992 | B2 | 8/2007 | Shirota |
| 7,285,820 | B2 | 10/2007 | Park et al. |
| 7,301,803 | B2 | 11/2007 | Okhonin et al. |
| 7,329,580 | B2 | 2/2008 | Cho et al. |
| 7,440,333 | B2 | 10/2008 | Hsia et al. |
| 7,447,068 | B2 | 11/2008 | Tsai et al. |
| 7,450,423 | B2 | 11/2008 | Lai et al. |
| 7,473,611 | B2 | 1/2009 | Cho et al. |
| 7,498,630 | B2 * | 3/2009 | Ichige et al. ................. 257/314 |
| 7,504,302 | B2 | 3/2009 | Mathew et al. |
| 7,542,345 | B2 | 6/2009 | Okhonin et al. |
| 7,579,241 | B2 | 8/2009 | Hieda et al. |
| 7,609,551 | B2 | 10/2009 | Shino et al. |
| 7,622,761 | B2 | 11/2009 | Park et al. |
| 7,701,763 | B2 | 4/2010 | Roohparvar |
| 7,733,693 | B2 | 6/2010 | Ferrant et al. |
| 7,759,715 | B2 | 7/2010 | Bhattacharyya |
| 7,760,548 | B2 | 7/2010 | Widjaja |
| 7,847,338 | B2 | 12/2010 | Widjaja |
| 7,933,140 | B2 | 4/2011 | Wang et al. |
| 8,014,200 | B2 | 9/2011 | Widjaja |
| 8,036,033 | B2 | 10/2011 | Widjaja |
| 8,059,459 | B2 | 11/2011 | Widjaja |
| 8,077,536 | B2 | 12/2011 | Widjaja |
| 8,130,547 | B2 | 3/2012 | Widjaja et al. |
| 8,130,548 | B2 | 3/2012 | Widjaja et al. |
| 8,159,878 | B2 | 4/2012 | Widjaja |
| 8,174,886 | B2 | 5/2012 | Widjaja et al. |
| 8,194,451 | B2 | 6/2012 | Widjaja |
| 8,208,302 | B2 | 6/2012 | Widjaja |
| 8,243,499 | B2 | 8/2012 | Widjaja |
| 8,294,193 | B2 | 10/2012 | Widjaja |
| 2002/0018366 | A1 | 2/2002 | Von Schwerin et al. |
| 2002/0048193 | A1 | 4/2002 | Tanikawa et al. |
| 2005/0024968 | A1 | 2/2005 | Lee et al. |
| 2005/0032313 | A1 | 2/2005 | Forbes |
| 2005/0124120 | A1 | 6/2005 | Du et al. |
| 2006/0018164 | A1 * | 1/2006 | Wu ........................... 365/185.29 |
| 2006/0044915 | A1 | 3/2006 | Park et al. |
| 2006/0125010 | A1 | 6/2006 | Bhattacharyya |
| 2006/0157679 | A1 | 7/2006 | Scheuerlein |
| 2006/0227601 | A1 | 10/2006 | Bhattacharyya |
| 2006/0237770 | A1 | 10/2006 | Huang et al. |
| 2006/0278915 | A1 | 12/2006 | Lee et al. |
| 2007/0004149 | A1 | 1/2007 | Tews |
| 2007/0090443 | A1 | 4/2007 | Choi et al. |
| 2007/0164352 | A1 | 7/2007 | Padilla |
| 2007/0210338 | A1 | 9/2007 | Orlowski |
| 2007/0215954 | A1 | 9/2007 | Mouli |
| 2007/0284648 | A1 | 12/2007 | Park et al. |
| 2008/0048239 | A1 | 2/2008 | Huo et al. |
| 2008/0080248 | A1 | 4/2008 | Lue et al. |
| 2008/0123418 | A1 | 5/2008 | Widjaja |
| 2008/0224202 | A1 | 9/2008 | Young et al. |
| 2008/0265305 | A1 | 10/2008 | He et al. |
| 2008/0303079 | A1 | 12/2008 | Cho et al. |
| 2009/0034320 | A1 | 2/2009 | Ueda |
| 2009/0065853 | A1 | 3/2009 | Hanafi |
| 2009/0081835 | A1 | 3/2009 | Kim et al. |
| 2009/0085089 | A1 | 4/2009 | Chang et al. |
| 2009/0108322 | A1 | 4/2009 | Widjaja |
| 2009/0108351 | A1 | 4/2009 | Yang et al. |
| 2009/0109750 | A1 | 4/2009 | Widjaja |
| 2009/0173985 | A1 | 7/2009 | Lee et al. |
| 2009/0190402 | A1 | 7/2009 | Hsu et al. |
| 2009/0251966 | A1 | 10/2009 | Widjaja |
| 2009/0316492 | A1 | 12/2009 | Widjaja |
| 2010/0008139 | A1 | 1/2010 | Bae |
| 2010/0034041 | A1 | 2/2010 | Widjaja |
| 2010/0046287 | A1 | 2/2010 | Widjaja |
| 2010/0246277 | A1 | 9/2010 | Widjaja |
| 2010/0246284 | A1 | 9/2010 | Widjaja |
| 2011/0032756 | A1 | 2/2011 | Widjaja |
| 2011/0042736 | A1 | 2/2011 | Widjaja |
| 2011/0044110 | A1 | 2/2011 | Widjaja |
| 2011/0228591 | A1 | 9/2011 | Widjaja |
| 2011/0305085 | A1 | 12/2011 | Widjaja |
| 2012/0012915 | A1 | 1/2012 | Widjaja et al. |
| 2012/0014180 | A1 | 1/2012 | Widjaja |
| 2012/0014188 | A1 | 1/2012 | Widjaja et al. |
| 2012/0069652 | A1 | 3/2012 | Widjaja |
| 2012/0106234 | A1 | 5/2012 | Widjaja |
| 2012/0113712 | A1 | 5/2012 | Widjaja |
| 2012/0230123 | A1 | 9/2012 | Widjaja et al. |
| 2012/0281475 | A1 * | 11/2012 | Oh et al. ................... 365/185.17 |
| 2013/0015517 | A1 | 1/2013 | Widjaja et al. |
| 2013/0058169 | A1 * | 3/2013 | Lee et al. ................. 365/185.21 |

OTHER PUBLICATIONS

Campardo G. et al., VLSI Design of Non-Volatile Memories, 2005.

Han et al. Programming/Erasing Characteristics of 45 nm NOR-Type Flash Memory Based on SOI FinFET Structure. vol. 47, Nov. 2005, pp. S564-S567.

Headland. Hot electron injection, Feb. 19, 2004.

Pellizzer et al., A 90nm Phase Change Memory Technology for Stand-Alone Non-Volatile Memory Applications, pp. 1-1, 2006.

Ranica et al. Scaled 1T-Bulk devices built with CMOS 90nm technology for low-cost eDRAM applications. Pascale.mazoyer@st.com, 2004, pp. 1-2.

Robert F. Pierret. Semiconductor Device Fundamentals, ISBN: 0-201-54393-1, 1996, by Addison-Wesley Publishing Company, Inc. PNPN Devices 463-476.

Tack et al., The Multistable Charge-Controlled Memory Effect in SOI Transistors at Low Temperatures, IEEE Transactions on Electron Devices, vol. 37, May 1990, pp. 1373-1382.

Okhonin, et al., Principles of Transient Charge Pumping on Partially Depleted SOI MOSFETs, IEEE Electron Device Letters, vol. 23, No. 5, May 2002, pp. 279-281.

Okhonin et al. A SOI Capacitor-less 1T-DRAM Concept. 2001, pp. 153-154.

Okhonin et al., A Capacitor-less 1T-DRAM Cell, IEEE Electron Device Letters, vol. 23, No. 2, Feb. 2002, pp. 85-87.

Ohsawa et al., An 18.5ns 128Mb SOI DRAM with a Floating body Cell, IEEE International Solid-State Circuits Conference, 2005, pp. 458-459, 609.

Ohsawa et al., Memory Design Using One-Transistor Gain Cell on SOI, Tech. Digest, IEEE International Solid-State Circuits, vol. 37, No. 11, 2002, pp. 1510-1522.

Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Lanyon et al., "Bandgap Narrowing in Moderately to Heavily Doped Silicon", pp. 1014-1018, No. 7, vol. ED-26, 1979 IEEE.

Leiss, et al, "dRAM Design Using the Taper-Isolated Dynamic RAM Cell." Solid-State Circuits, IEEE Journal of 17.2 (1982): 337-344.

Lin et al., "A new 1T DRAM Cell with enhanced Floating Body Effect", pp. 1-5, Proceedings of the 2006 IEEE International Workshop on Memory Technology.

Ohsawa et al., "Autonomous refresh of floating body cell (FBC)", pp. 801-804, 2008 IEEE.

Oh et al., "A 4-Bit Double Sonos memory (DSM) with 4 Storage Nodes Per Cell for Ultimate Multi-Bit Operation", pp. 1-2, 2006 Symposium on VLSI Technology Digest of Technical Papers.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.

Reisch, "On bistable behavior and open-base breakdown of bipolar transistors in the avalanche regime-modeling and applications." Electron Devices, IEEE Transactions on 39.6 (1992): 1398-1409.

Sakui et al., "A new static memory cell based on reverse bias current (RBC) effect of bipolar transistor", Electron Devices Meeting, 1988. IEDM'88. Technical Digest, International IEEE, 1988, pp. 44-47.

Sakui et al., "A new static memory cell basedon the reverse bae current effect of bipolar transistors", Electron Devices, IEEE Transactions on 36.6 (1989): 1215-1217.

Sze et al., "Physics of Semiconductor Devices", Wiley-Interscience, 2007, p. 104.

Terada et al., "A new VLSI memory cell using capacitance coupling (CC) cell", Electron Devices, IEEE Transactions on 31.9 (1984); pp. 1319-1324.

Villaret et al., "Further insight into the physics and modeling of floating-body capacitorless DRAMs", Electron Devices, IEEE Transactions on 52.11 (2005); pp. 2447-2454.

Ohsawa et al., "Autonomous refresh of floating-body cell due to Current Anomaly of Impact Ionization", vol. 56, No. 10, pp. 2301-2311, 2009.

Bawedin et al., "Floating-Body SOI Memory: concepts, Physics and Challenges", ECS Transactions 19.4 (2009) pp. 243-256.

Ban et al., "Integration of Back-Gate doping for 15-nm node floating body cell (FBC) memory", VLSI Technology (VLSIT), 2010 Symposium on IEEE, 2010, pp. 159-160.

Chiu et al., "Characteristics of a new trench-oxide thin film transistor and its 1T-DRAM applications", Solid-State and Integrated Circuit Technology (ICSICT), 2010 10th IEEE International Conference on IEEE, 2010, pp. 1106-1108.

Chiu et al., "A simple process of thin-film transistor using the trench-oxide layer for improving 1T-DRAM performance", Next-Generation Electronics (ISNE), 2010 International Symposium on. IEEE, 2010, pp. 254-257.

Chun et al., "A 1.1 V, 667 MHz random cycle, asymmetric 2T gain cell embedded DRAM with a 99.9 percentile retention time of 110 microsec", VLSI Circuits (VLSIC), 2010 IEEE Symposium on. IEEE, 2010, pp. 191-192.

Colbert et al., "A low-voltage biasing scheme for aggressively scaled bulk FinFET 1T-DRAM featuring 10s retention at 85 C", VLSI Technology (VLSIT), 2010 Symposium on. IEEE, 2010, pp. 161-162.

Giusi et al., "Bipolar mode operation and scalability of double-gate capacitorless 1T-DRAM cells", Electron Devices, IEEE Transactions on, vol. 57, No. 8 (2010), pp. 1743-1750.

Gupta et al., "32nm high-density, high-speed T-RAM embedded memory technology", Electron Devices Meeting (IEDM), 2010 IEEE International. IEEE, 2010, pp. 12.1.1-12.1.4.

Han et al., "bistable resistor (biristor)-gateless silicon nanowire memory", VLSI Technology (VLSIT), 2010 Symposium on. IEEE, 2010, pp. 171-172.

Han et al., "biristor-Bistable resistor based on a silicon nanowire", Electron Device Letters, IEEE 31.8 (2010), pp. 797-799.

Hubert et al., "Experimental comparison of programming mechanisms in 1T-DRAM cells with variable channel length", Solid-State Device Research Conference (ESSDERC), 2010 Proceedings of the European., pp. 150-153, Sep. 14-16, 2010.

Kim et al., "Vertical double gate Z-RAM technology with remarkable low voltage operation for DRAM application", VLSI Technology (VLSIT), 2010 Symposium on., 2010, pp. 163-164.

Kim et al., "Silicon on replacement insulator (SRI) floating body cell (FBC) memory", VLSI Technology (VLSIT), 2010 Symposium on.. IEEE, 2010, pp. 165-166.

Kim et al., "Investigation of 1T DRAM cell with non-overlap structure and recessed channel", Silicon Nanoelectronics Workshop (SNW), 2010, IEEE, 2010, pp. 1-2.

Lu et al., "A simplified superior floating-body/gate DRAM cell", IEEE Elec. Dev. Letters, vol. 30, No. 3, Mar. 2009, pp. 282-284.

Moon et al., "Fin-width dependance of BJT-based 1t-DRAM implemented on FinFET", Electron Device letters, vol. 31, No. 9 (2010): 909-911.

Moon et al., "An optically assisted program method for capacitorless 1T-DRAM", Electron Devices, IEEE Transactions on., vol. 57, No. 7, 2010, pp. 1714-1718.

Moon et al., "Ultimately scaled 20nm unified-RAM", Electron Devices meeting (IEDM), 2010 IEEE Internatioanl. IEEE, 2010, pp. 12.2.1-12.2.4.

Pulcani et al., "Simulation of intrinsic bipolar transistor mechanisms for future capacitor-less eDRAM on bulk substrate", Electronics, Circuits and Systems (ICECS), 2010 17th IEEE International Conference on., IEEE, 2010, pp. 966-969.

Rodriguez et al., "A-RAM memory cell: concept and operation", Electron Device Letters, IEEE, vol. 31, No. 9 (2010), pp. 972-974.

Rodriguez et al., "A-RAM Novel capacitor-less DRAM memory", In SOI Conference, 2009 IEEE International., pp. 1-2, IEEE, 2009.

Zhang et al., "Total Ionizing dose Effects on FinFET-Based Capacitor-Less 1T-DRAMs", Nuclear Science, IEEE Transactions on., vol. 57, No. 6, 2010, pp. 3298-3304.

* cited by examiner

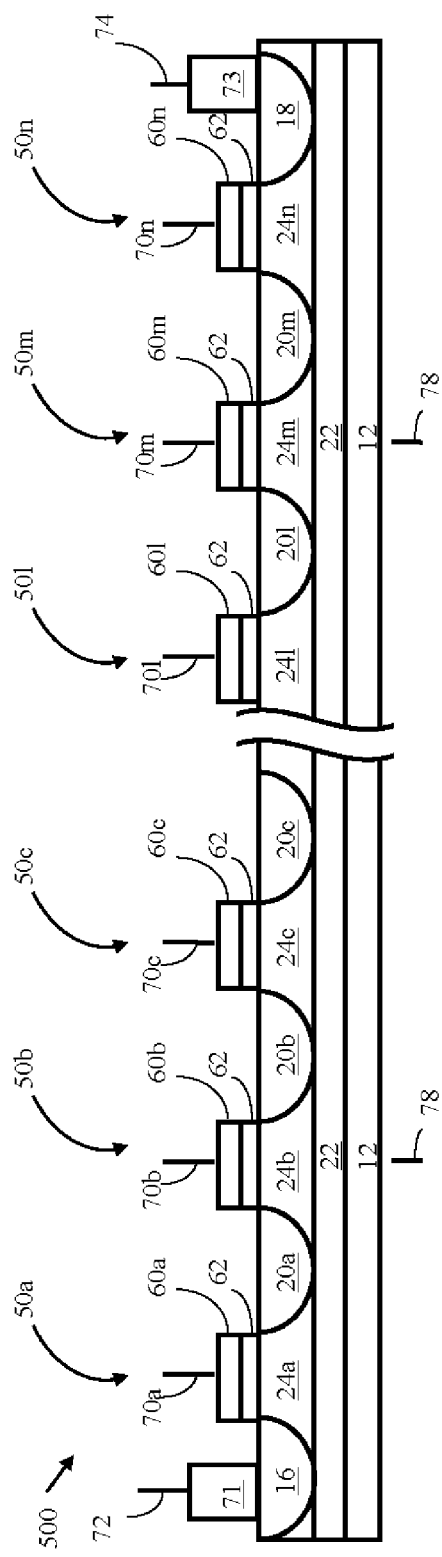
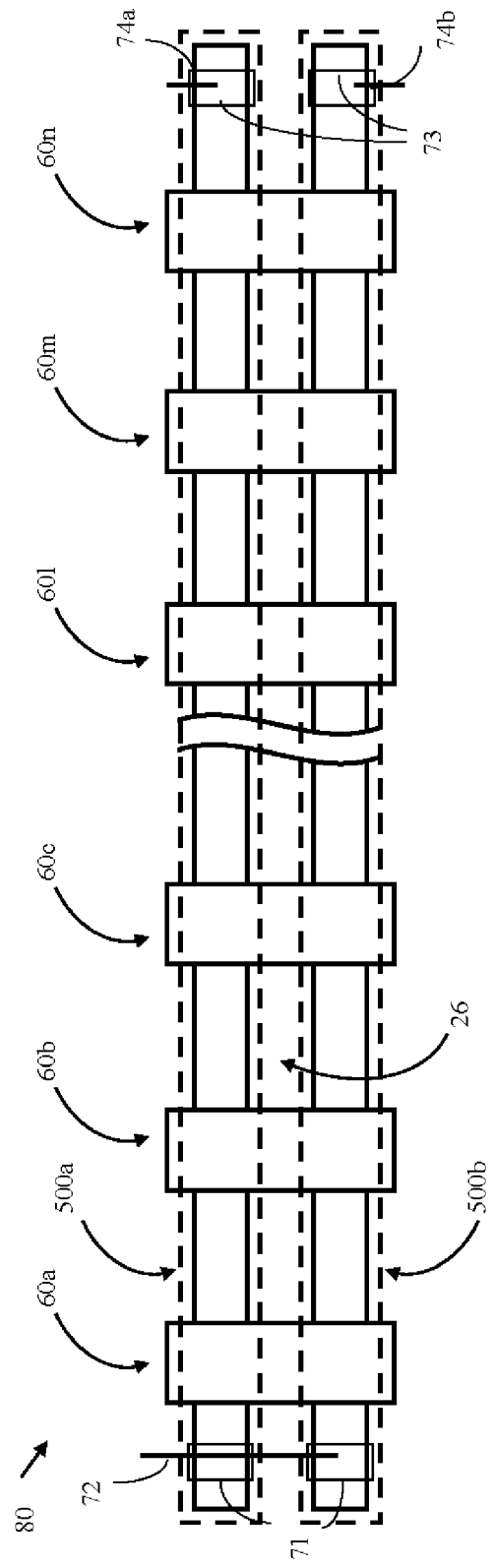
FIG. 16A
FIG. 16B

Floating Body 24 is positively charged

FB is neutrally charged: V(BL 16) = V(FB 24) = 0V

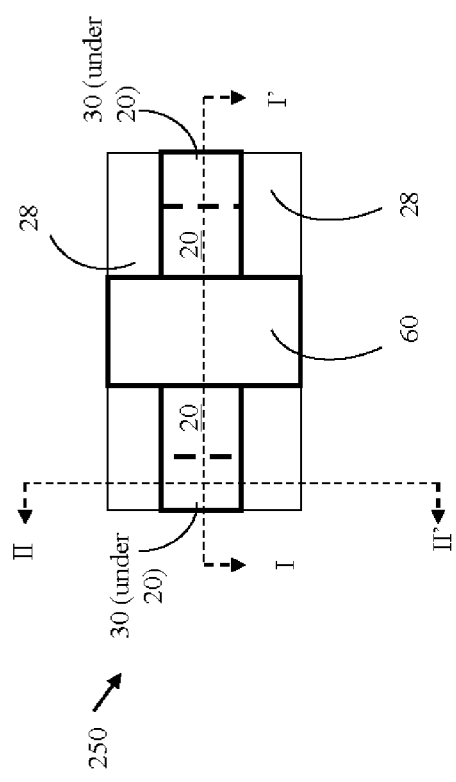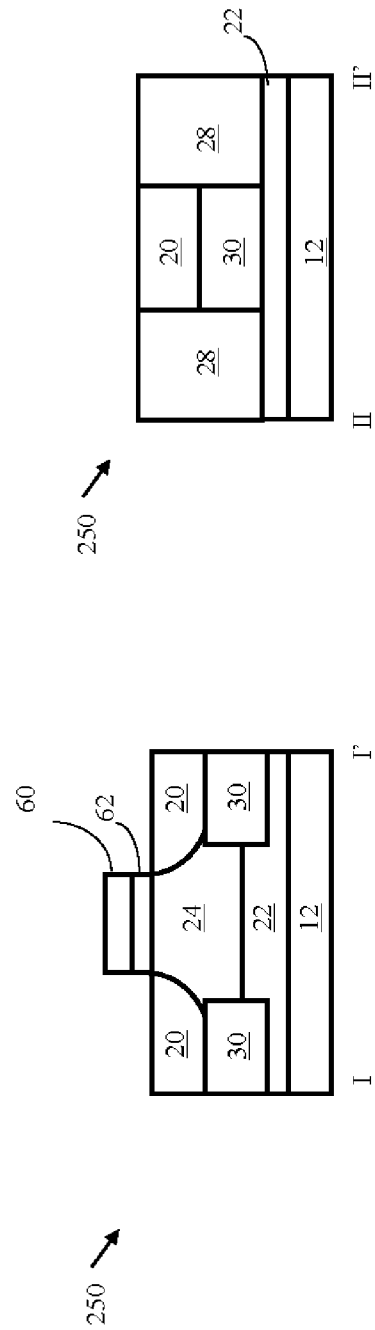

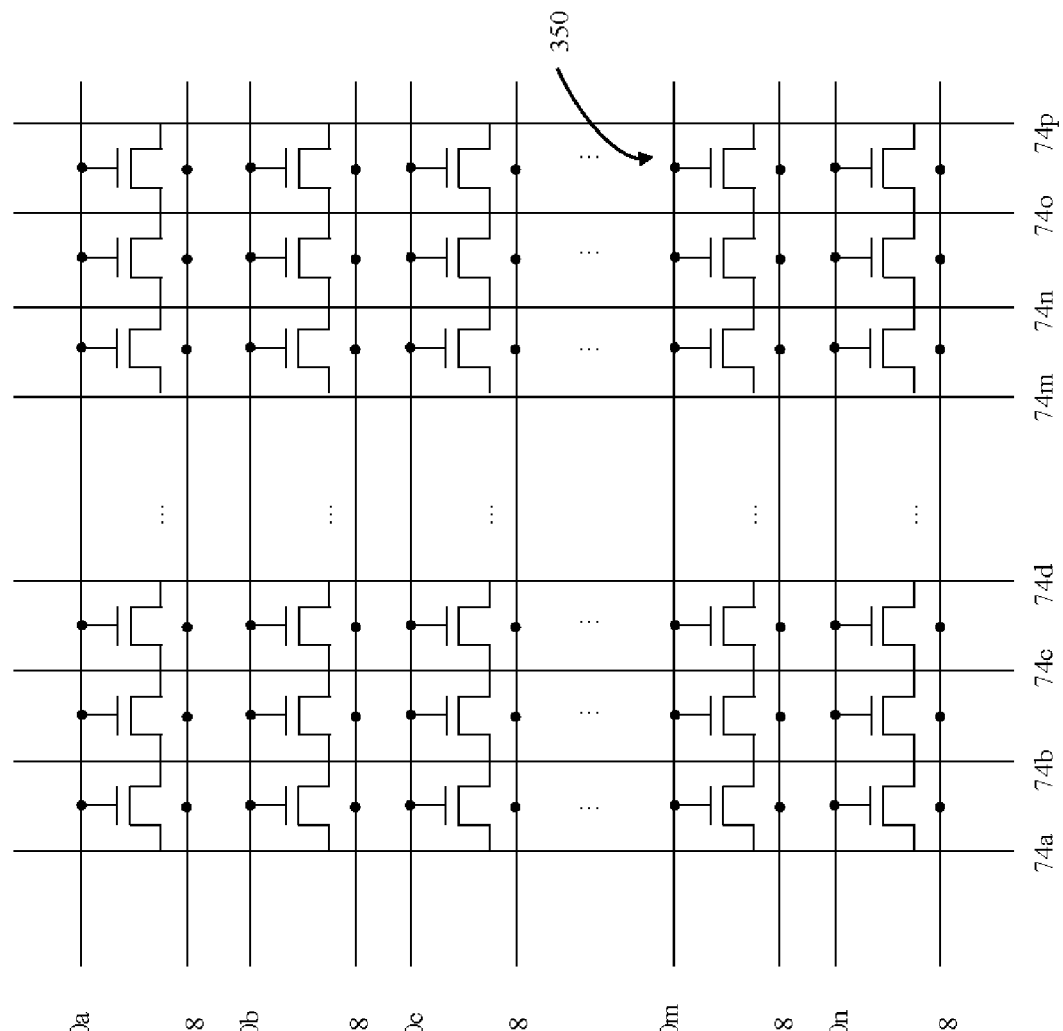

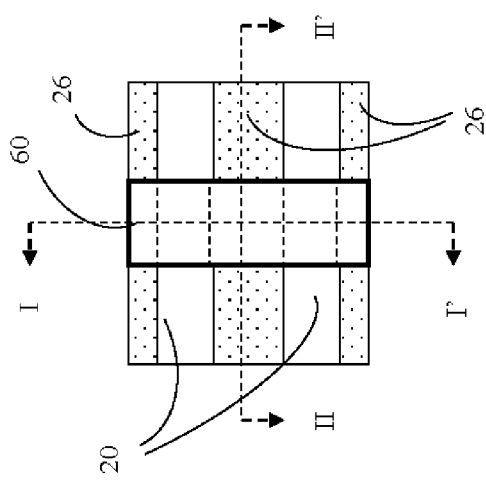
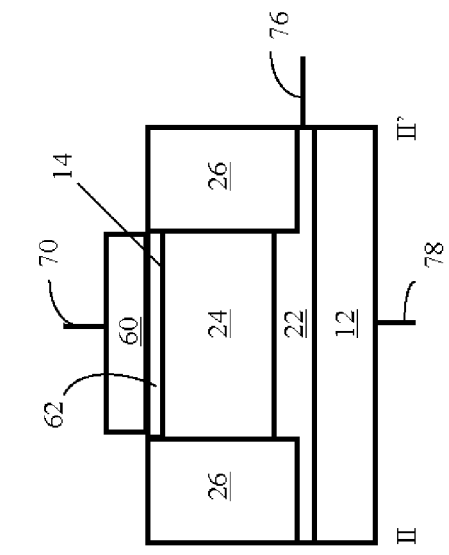
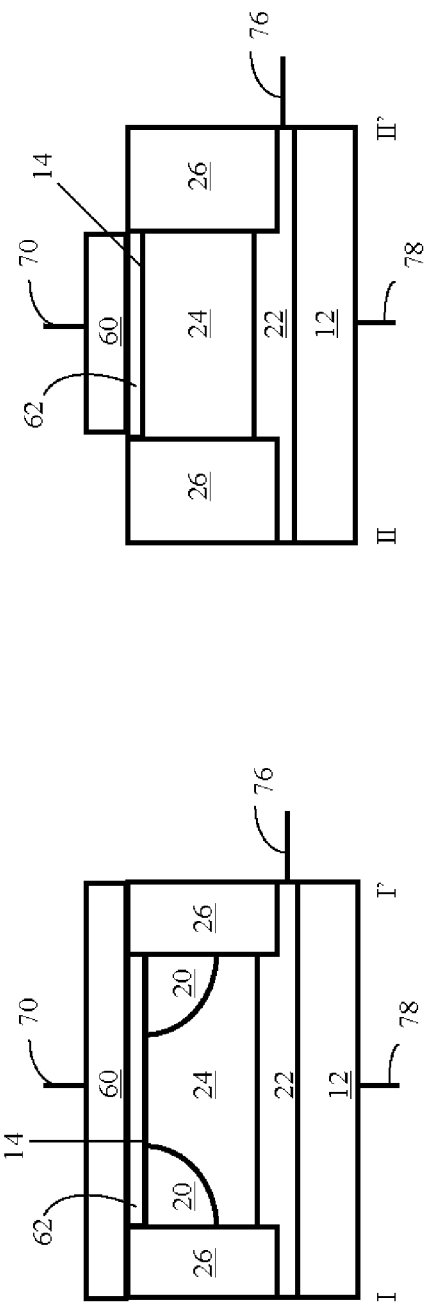
FIG. 59A
FIG. 59C
FIG. 59B

Floating Body 24 is positively charged

FB is neutrally charged: V(BL 16) = V(FB 24) = 0V

COMPACT SEMICONDUCTOR MEMORY DEVICE HAVING REDUCED NUMBER OF CONTACTS, METHODS OF OPERATING AND METHODS OF MAKING

CROSS-REFERENCE

This application is a continuation-in-part application of copending application Ser. Nos. 12/797,320 and 12/797,334, both filed on Jun. 9, 2010, both of which are continuation in part applications of co-pending application Ser. No. 12/552,903, filed Sep. 2, 2009, which is a continuation-in-part application of application Ser. No. 11/998,311, filed Nov. 29, 2007, now U.S. Pat. No. 7,760,548, and a continuation-in-part application of application Ser. No. 12/533,661, filed Jul. 31, 2009, and a continuation-in-part application of application Ser. No. 12/545,623, filed Aug. 21, 2009, and which claims the benefit of U.S. Provisional Application No. 61/093,726, filed Sep. 3, 2008, and U.S. Provisional Application No. 61/094,540, filed Sep. 5, 2008. We hereby incorporate all of the aforementioned applications and patent herein, in their entireties, by reference thereto, and we claim priority to application Ser. Nos. 12/797,320; 12/797,334; 12/552,903; 11/998,311; 12/533,661 and 12/545,623, under 35 USC §120.

This application claims the benefit of U.S. Provisional Application No. 61/309,589, filed Mar. 2, 2010, which application is hereby incorporated herein, in its entirety, by reference thereto and to which application we claim priority under 35 U.S.C. Section 119.

This application is being filed on even date with Application Serial No. (application Ser. No. 12/897,538) titled "A Semiconductor Memory Device Having an Electrically Floating Body Transistor" and Application Serial No. (application Ser. No. 12/897,516) titled "A Semiconductor Memory Device Having an Electrically Floating Body Transistor". Both application Ser. Nos. 12/897,538 and 12/897,516 are hereby incorporated herein, in their entireties, by reference thereto.

FIELD OF THE INVENTION

The present invention relates to semiconductor memory technology. More specifically, the present invention relates to a semiconductor memory device having an electrically floating body transistor.

BACKGROUND OF THE INVENTION

Semiconductor memory devices are used extensively to store data. Static and Dynamic Random Access Memory (SRAM and DRAM) are widely used in many applications. SRAM typically consists of six transistors and hence has a large cell size. However, unlike DRAM, it does not require periodic refresh operation to maintain its memory state. Conventional DRAM cells consist of one-transistor and one-capacitor (1T/1C) structure. As the 1T/1C memory cell feature is being scaled, difficulties arise due to the necessity of maintaining the capacitance value. DRAM based on the electrically floating body effect has been proposed (see for example "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002). Such memory eliminates the capacitor used in conventional 1T/1C memory cell, and thus is easier to scale to smaller feature size. In addition, such memory allows for a smaller cell size compared to the conventional 1T/1C memory cell.

There is a continuing need for semiconductor memory devices that are smaller in size than currently existing devices.

The present invention meets the above need and more.

SUMMARY OF THE INVENTION

In one aspect of the present invention, an integrated circuit is provided that includes a link or string of semiconductor memory cells, wherein each memory cell comprises a floating body region for storing data; and the link or string comprises at least one contact configured to electrically connect the memory cells to at least one control line, wherein the number of contacts is the same as or less than the number of the memory cells.

In at least one embodiment, the number of contacts is less than the number of memory cells.

In at least one embodiment, the semiconductor memory cells are connected in series and form the string.

In at least one embodiment, the semiconductor memory cells are connected in parallel and form the link.

In at least one embodiment, the integrated circuit is fabricated on a silicon-on-insulator (SOI) substrate.

In at least one embodiment, the integrated circuit is fabricated on a bulk silicon substrate.

In at least one embodiment, the number of contacts is two, and the number of semiconductor memory cells is greater than two.

In at least one embodiment, the memory cells further comprise first and second conductive regions interfacing with the floating body region.

In at least one embodiment, the first and second conductive regions are shared by adjacent ones of the memory cells for each the memory cell having the adjacent memory cells.

In at least one embodiment, each memory cell further comprises first, second, and third conductive regions interfacing with the floating body region.

In at least one embodiment, each memory cell further comprises a gate insulated from the floating body region.

In at least one embodiment, at least one of the memory cells is a contactless memory cell.

In at least one embodiment, a majority of the memory cells are contactless memory cells.

In at least one embodiment, the memory cells store multi-bit data.

In another aspect of the present invention, an integrated circuit is provided that includes a plurality of contactless semiconductor memory cells, each semiconductor memory cell including: a floating body region for storing data; first and second conductive regions interfacing with the floating body region; a gate above a surface of the floating body region; and an insulating region insulating the gate from the floating body region.

In at least one embodiment, the contactless memory cells are connected in series.

In at least one embodiment, the contactless memory cells are connected in parallel.

In at least one embodiment, the integrated circuit comprises at least one semiconductor memory cell having at least one contact, a total number of the contacts being less than a total number of memory cells that includes a total number of the memory cells having at least one contact and a total number of the contactless memory cells.

In another aspect of the present invention, an integrated circuit is provided that includes: a plurality of semiconductor memory cells connected in series, each semiconductor memory cell comprising: a floating body region for storing data; first and second conductive regions interfacing with the floating body region; a gate above a surface of the floating body region; and an insulating region insulating the gate and the floating body region.

In at least one embodiment, at least one of the semiconductor memory cells is a contactless semiconductor memory cell.

In at least one embodiment, the at least one contactless semiconductor memory cell comprises a third conductive region interfacing with the floating body region.

In another aspect of the present invention, an integrated circuit is provided that includes a plurality of semiconductor memory cells connected in parallel, each semiconductor memory cell comprising: a floating body region for storing data; a conductive region interfacing with the floating body region; a gate above a surface of the floating body region; and an insulating region insulating the gate from the floating substrate region; wherein at least one of the semiconductor memory cells is a contactless semiconductor memory cell.

In at least one embodiment, a majority of the semiconductor memory cells are contactless semiconductor memory cells.

In at least one embodiment, the integrated circuit comprises a number of contacts, the number being less than or equal to a number of the memory cells.

In at least one embodiment, the memory cells each further comprise a second conductive region interfacing with the floating body region.

In at least one embodiment, the memory cells each further comprise second and third conductive regions interfacing with the floating body region.

In another aspect of the present invention, an integrated circuit is provided that includes a plurality of contactless semiconductor memory cells connected in parallel, each semiconductor memory cell comprising: a floating body region for storing data; first and second conductive regions interfacing with the floating body region; a gate above a surface of the floating region; and an insulating region insulating the gate and the floating body region.

In another aspect of the present invention, an integrated circuit is provided that includes: a memory string or link comprising a set of contactless semiconductor memory cells; and a first contact contacting a first additional semiconductor memory cell; wherein the contactless semiconductor memory cells are accessible via the first contact.

In at least one embodiment, the integrated circuit further includes a second contact contacting a second additional semiconductor memory cell; wherein the contactless semiconductor memory cells are accessible via the second contact.

In at least one embodiment, the contactless semiconductor memory cells and the additional semiconductor memory cell are connected in series.

In at least one embodiment, the memory string or link comprises a first memory string or link and the set comprises a first set, the integrated circuit further comprising: a second memory string or link comprising a second set of contactless semiconductor memory cells; and a second contact contacting a second additional semiconductor memory cell; wherein the second set of contactless semiconductor memory cells are accessible via the second contact.

In at least one embodiment, the memory string or link comprises a first memory string and the set comprises a first set, the integrated circuit further comprising: a second memory string comprising a second set of contactless semiconductor memory cells; a third contact contacting a third additional semiconductor memory cell; and a fourth contact contacting a fourth additional semiconductor memory cell; wherein the second set of contactless semiconductor memory cells are accessible via the third and fourth contacts; wherein the first set of contactless semiconductor memory cells, the first additional semiconductor memory cell and the second additional semiconductor memory cell are connected in series, and wherein the second set of contactless semiconductor memory cells, the third additional semiconductor memory cell and the fourth additional semiconductor memory cell are connected in series in the second string.

In at least one embodiment, the integrated circuit further includes a first terminal connected to the first contact and the third contact; a second terminal connected to the second contact; and a third terminal connected to the fourth contact.

In at least one embodiment, the semiconductor memory cells comprise substantially planar semiconductor memory cells.

In at least one embodiment, the semiconductor memory cells comprise fin-type, three-dimensional semiconductor memory cells.

In at least one embodiment, the first set of contactless semiconductor memory cells are aligned side-by side of the second set of contactless semiconductor memory cells; the first string comprises a first set of insulation portions that insulate adjacent memory cells in the first string, and a second set of insulation portions that insulate the memory cells in the first string from adjacent memory cells in the second string; and the second string comprises a third set of insulation portions that insulate adjacent memory cells in the second string, and a fourth set of insulation portions that insulate the memory cells in the second string from adjacent memory cells in the first string.

In at least one embodiment, the first and second contacts are located at first and second ends of the memory string.

In at least one embodiment, each semiconductor memory cell comprises: a floating body region for storing data; first and second conductive regions interfacing with the floating body region; a gate above a surface of the floating region; an insulating region insulating the gate from the floating body region; and a word line terminal electrically connected to the gate.

In another aspect of the present invention an integrated circuit includes a plurality of floating body memory cells which are linked either in series or in parallel. The connections between the memory cells are made to reduce the number of contacts for the overall circuit. Because several memory cells are connected either in series or in parallel, a compact memory array is provided.

These and other features of the invention will become apparent to those persons skilled in the art upon reading the details of the integrated circuits, strings, links memory cells and methods as more fully described below.

BRIEF DESCRIPTION OF THE DRAWINGS

FIG. 16A shows a cross-sectional schematic illustration of a memory string according to an embodiment of the present invention.

FIG. 16B shows a top view schematic illustration of a memory cell array including two strings of memory cells between the SL terminal and BL terminal according to an embodiment of the present invention.

FIG. 49 shows an equivalent circuit representation of a memory array that includes the link of FIG. 47, according to an embodiment of the present invention.

FIG. 59A schematically illustrates a top view of a memory cell of the memory array of FIG. 58.

FIG. 59B is a sectional view of the memory cell of FIG. 59A taken along line I-I' of FIG. 59A.

FIG. 59C is a sectional view of the memory cell of FIG. 59A taken along line II-II' of FIG. 59A.

DETAILED DESCRIPTION OF THE INVENTION

Figure 1:
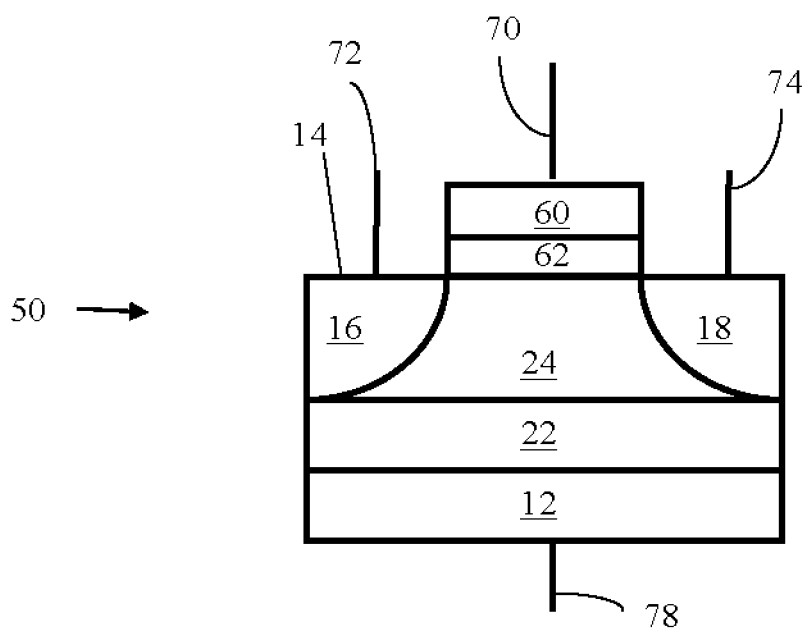
FIG. 1 schematically illustrates a memory cell in accordance with an embodiment of the present invention.

Before the present devices cells, devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and the include plural referents unless the context clearly dictates otherwise. Thus, for example, reference to "a cell" includes a plurality of such cells and reference to "the contact" includes reference to one or more contacts and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

A "memory cell" as used herein, refers to a semiconductor memory cell comprising an electrically floating body as the data storage element.

A "contactless memory cell" as used herein, refers to a memory cell which does not have a contact (or contacts) forming a direct connection(s) to a control line (or control lines). Contactless memory cells are typically connected in series when formed in a string or in parallel when formed in a link.

A "memory string" or "string" as used herein, refers to a set of interconnected memory cells connected in series, where conductive regions at the surfaces of adjacent memory cells are shared or electrically connected. In a series connection, the same current flows through each of the memory cells.

A "link" as used herein, refers to a set of interconnected memory cells connected in parallel, where conductive regions at the surfaces of adjacent memory cells are electrically connected. In a parallel connection, the voltage drop across each of the memory cells is the same.

A "memory array" or "memory cell array" as used herein, refers to a plurality of memory cells typically arranged in rows and columns. The plurality of memory cells may further be connected in strings or links within the memory array.

A "holding operation", "standby operation" or "holding/standby operation", as used herein, refers to a process of sustaining a state of a memory cell by maintaining the stored charge.

A "multi-level write operation" refers to a process that includes an ability to write more than two different states into a memory cell to store more than one bit per cell.

A "write-then-verify" "write and verify" or "alternating write and verify" algorithm or operation refers to a process where alternating write and read operations to a memory cell are employed to verify whether a desired memory state of the memory cell has been achieved during the write operation.

DESCRIPTION

Referring now to FIG. 1, a memory cell 50 according to an embodiment of the present invention is shown. The cell 50 is fabricated on a silicon-on-insulator (SOI) substrate 12 having a first conductivity type (such as p-type conductivity), which consists of buried oxide (BOX) layer 22.

A first region 16 having a second conductivity type, such as n-type, for example, is provided in substrate 12 and is exposed at surface 14. A second region 18 having the second conductivity type is also provided in substrate 12, and is also exposed at surface 14. Additionally, second region 18 is spaced apart from the first region 16 as shown in FIG. 1. First and second regions 16 and 18 may be formed by an implantation process formed on the material making up substrate 12, according to any of implantation processes known and typically used in the art. Alternatively, a solid state diffusion process can be used to form first and second regions 16 and 18.

A floating body region 24 having a first conductivity type, such as p-type conductivity type, is bounded by surface 14, first and second regions 16, 18, buried oxide layer 22, and substrate 12. The floating body region 24 can be formed by an implantation process formed on the material making up substrate 12, or can be grown epitaxially. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Figure 2A:
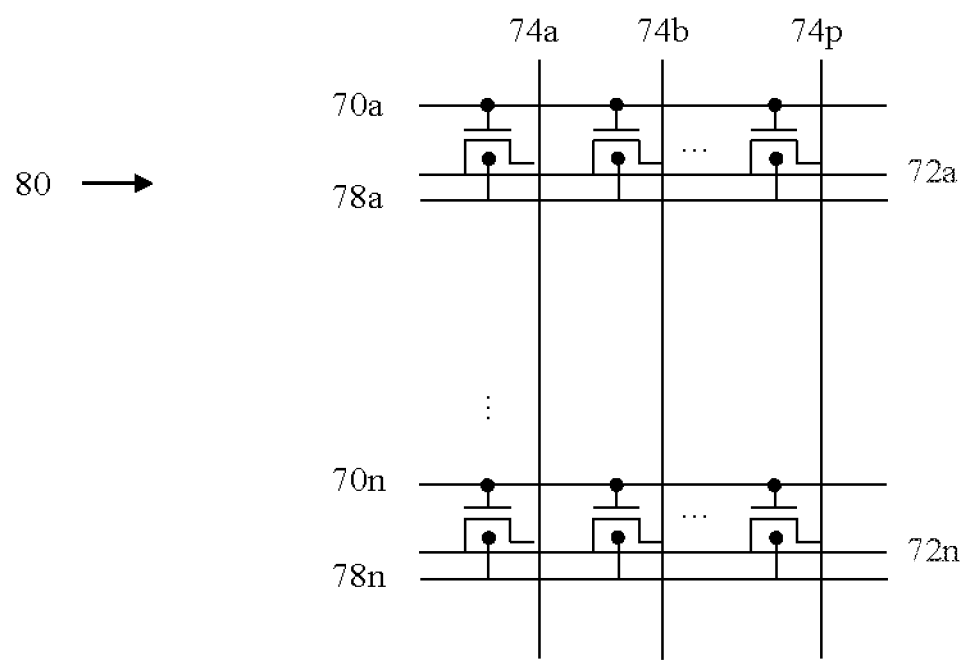
FIG. 2A schematically illustrates a memory array having a plurality of memory cells according to an embodiment of the present invention.

Cell 50 further includes word line (WL) terminal 70 electrically connected to gate 60, source line (SL) terminal 72 electrically connected to region 16, bit line (BL) terminal 74 electrically connected to region 18, and substrate terminal 78 electrically connected to substrate 12 at a location beneath insulator 22. A memory array 80 having a plurality of memory cells 50 is schematically illustrated in FIG. 2A.

The operation of a memory cell has been described (and also describes the operation of memory cell 50) for example in "A Capacitor-less 1T-DRAM Cell", S. Okhonin et al., pp. 85-87, IEEE Electron Device Letters, vol. 23, no. 2, February 2002, which is hereby incorporated herein, in its entirety, by reference thereto. The memory cell states are represented by the charge in the floating body 24. If cell 50 has holes stored in the floating body region 24, then the memory cell 50 will have a lower threshold voltage (gate voltage where transistor is turned on) compared to when cell 50 does not store holes in floating body region 24.

Figure 2B:
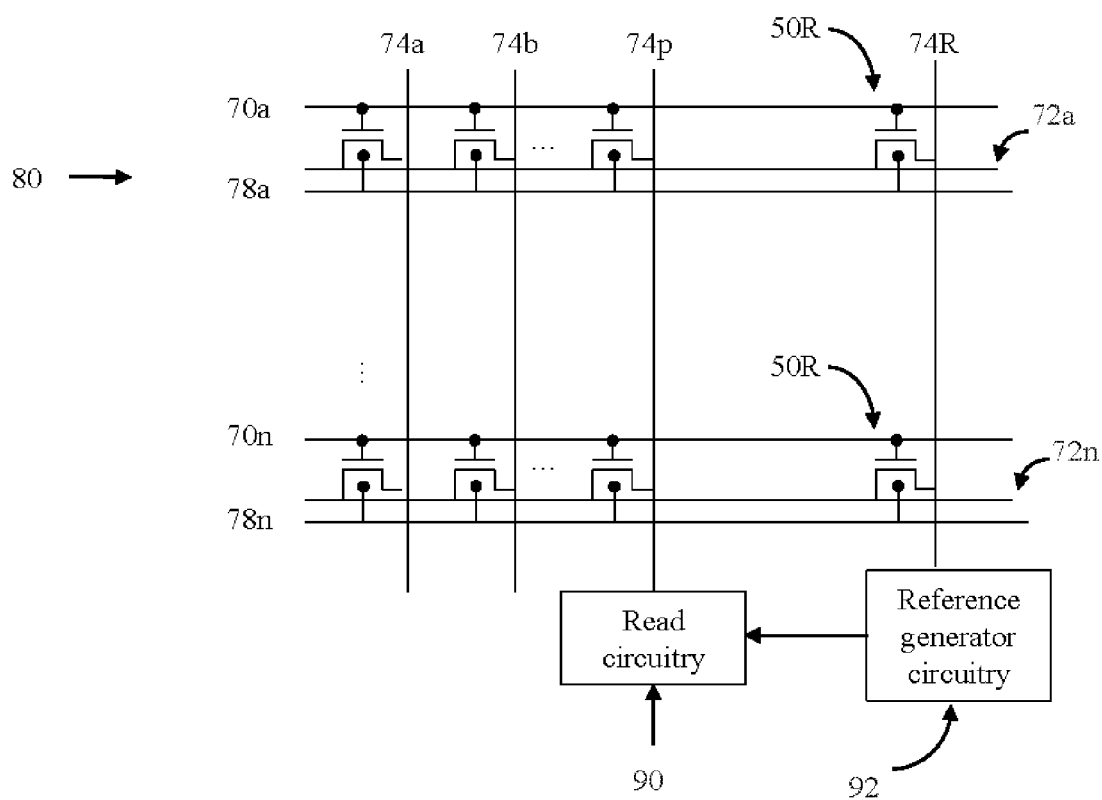
FIG. 2B schematically illustrates a memory array having a plurality of memory cells, with read circuitry connected thereto that can be used to determine data states, according to an embodiment of the present invention

The charge stored in the floating body 24 can be sensed by monitoring the cell current of the memory cell 50. If cell 50 is in a state "1" having holes in the floating body region 24, then the memory cell will have a lower threshold voltage (gate voltage where the transistor is turned on), and consequently a higher cell current (e.g. current flowing from BL to SL terminals), compared to if cell 50 is in a state "0" having no holes in floating body region 24. A sensing circuit/read circuitry 90 typically connected to BL terminal 74 of memory array 80 (e.g., see read circuitry 90 in FIG. 2B) can then be used to determine the data state of the memory cell. Examples of such read operations are described in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003 and U.S. Pat. No. 7,301,803 "Bipolar reading technique for a memory cell having an electrically floating body transistor", both of which are hereby incorporated herein, in their entireties, by reference thereto. An example of a sensing circuit is described in Oshawa et al., "An 18.5 ns 128 Mb SOI DRAM with a Floating body Cell", pp. 458-459, 609, IEEE International Solid-State Circuits Conference, 2005, which is hereby incorporated herein, in its entirety, by reference thereto.

A read operation can be performed by applying the following bias conditions: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals will remain at zero voltage, the unselected WL terminals will remain at zero or negative voltage, and the unselected SL terminals will remain at zero voltage.

Figure 3:
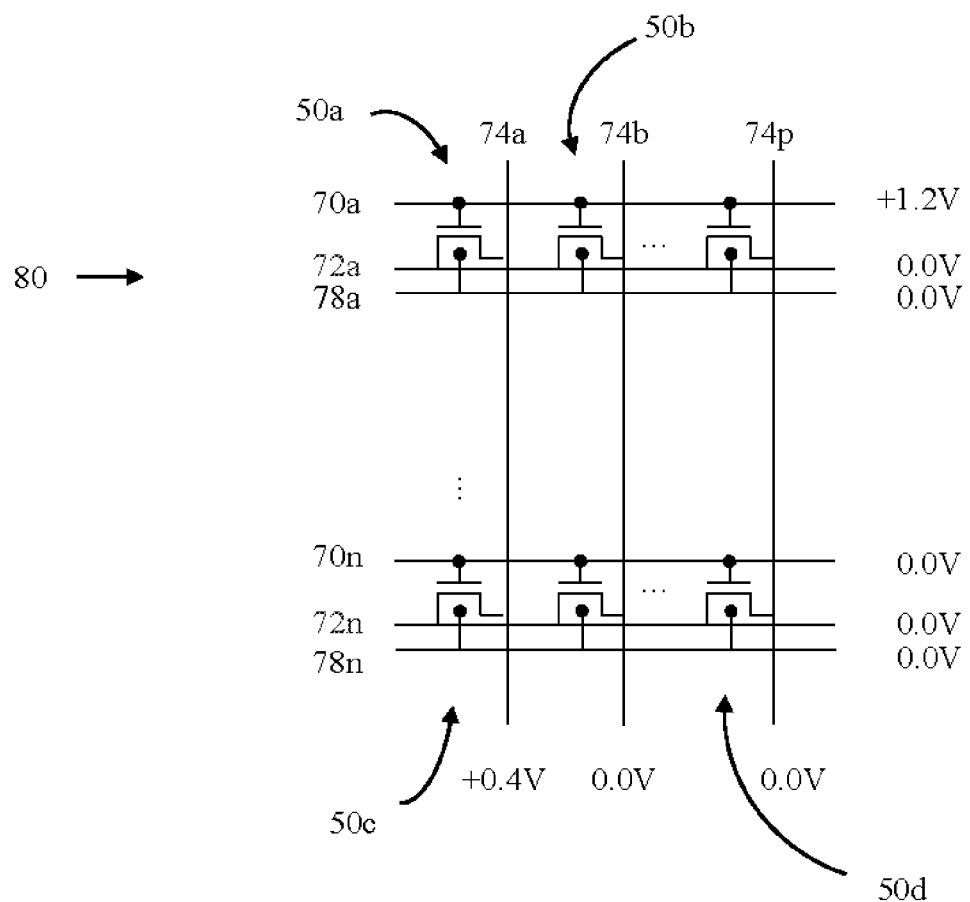
FIG. 3 shows exemplary bias conditions for reading a selected memory cell, as wells as bias conditions of unselected memory cells in a memory array according to an embodiment of the present invention.
Figure 4A:
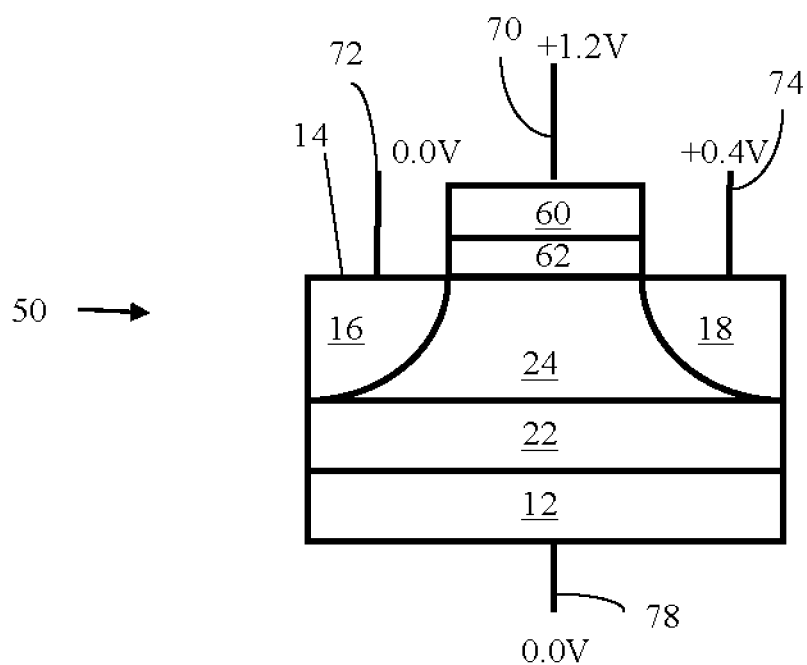
FIG. 4A shows exemplary bias conditions for reading a selected memory cell according to an embodiment of the present invention.

In one particular non-limiting embodiment, about 0.0 volts is applied to the selected SL terminal 72, about +0.4 volts is applied to the selected terminal 74, about +1.2 volts is applied to the selected terminal 70, and about 0.0 volts is applied to substrate terminal 78. The unselected terminals 74 remain at 0.0 volts, the unselected terminals 70 remain at 0.0 volts, at the unselected SL terminals 72 remain at 0.0 volts. FIG. 3 shows the bias conditions for the selected memory cell 50a and unselected memory cells 50b, 50c, and 50d in memory array 80. FIG. 4A also shows and example of bias conditions of the selected memory cell 50a. However, these voltage levels may vary.

Figure 4B:
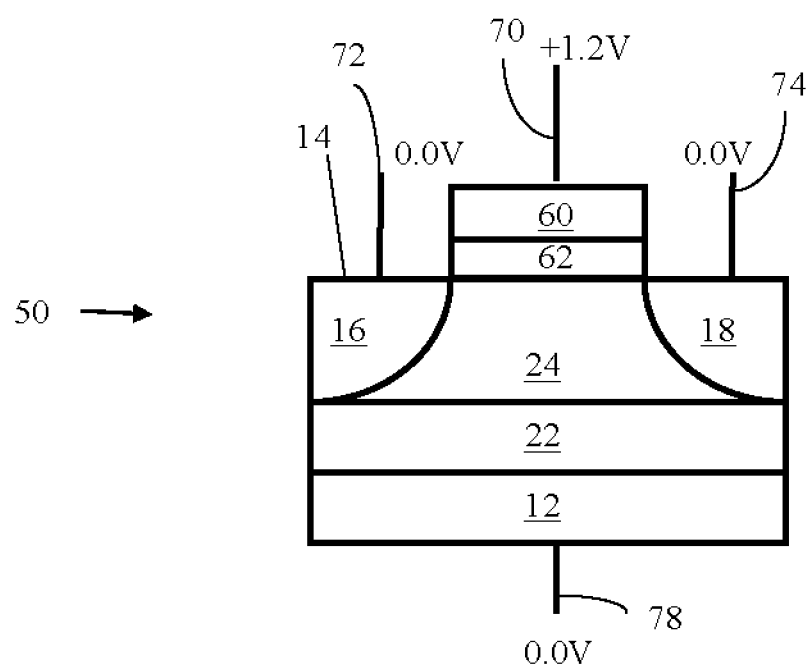
FIGS. 4B-4D illustrate bias conditions on unselected memory cells during the exemplary read operation described with regard to FIG. 3, according to an embodiment of the present invention.
Figure 4C:
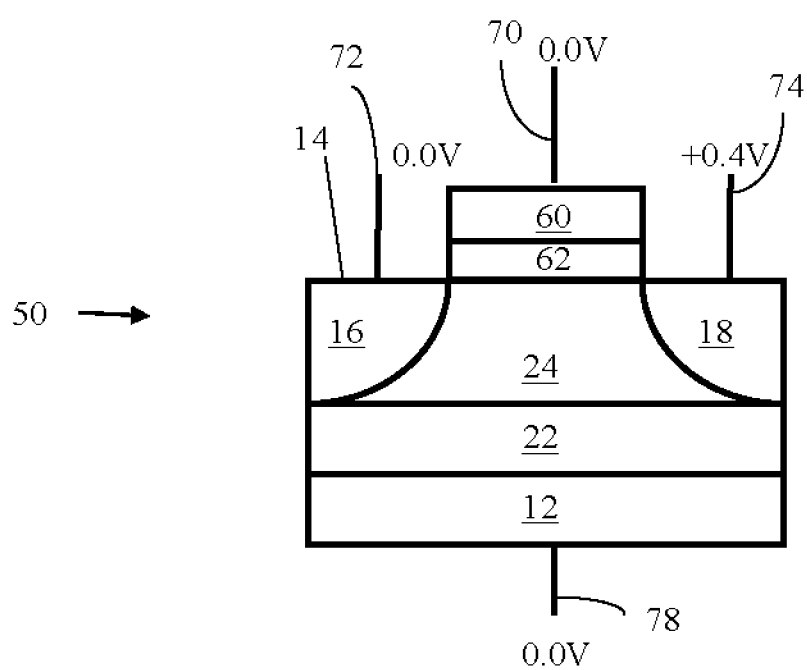
Figure 4D:
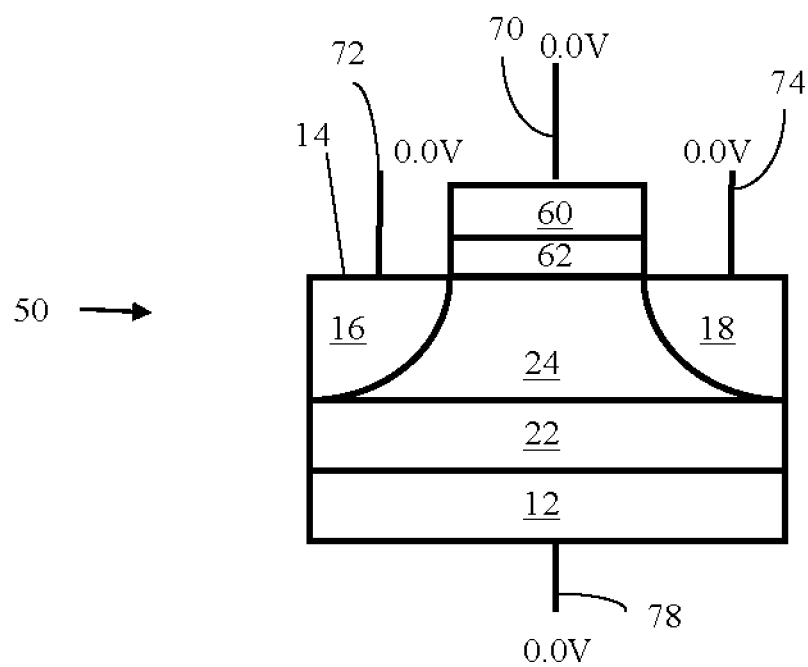

The bias conditions on unselected memory cells during the exemplary read operation described above with regard to FIG. 3 are shown in FIGS. 4B-4D. The bias conditions for memory cells sharing the same row (e.g. memory cell 50b) and those sharing the same column (e.g. memory cell 50c) as the selected memory cell 50a are shown in FIG. 4B and FIG. 4C, respectively, while the bias condition for memory cells not sharing the same row nor the same column as the selected memory cell 50 (e.g. memory cell 50d) is shown in FIG. 4D.

For memory cells sharing the same row as the selected memory cell (e.g. memory cell 50b), the WL terminal 70 is positively biased, but because the BL terminal 74 is grounded, there is no potential difference between the BL and SL terminals and consequently these cells are turned off (see FIG. 4B).

For memory cells sharing the same column as the selected memory cell (e.g. memory cell 50c), a positive voltage is applied to the BL terminal 74. However, since zero or negative voltage is applied to the unselected WL terminal 70, these memory cells are also turned off (see FIG. 4C).

For memory cells 50 not sharing the same row nor the same column as the selected memory cell (e.g. memory cell 50d), both WL and BL terminals are grounded. As a result, these memory cells are turned off (see FIG. 4D).

An exemplary write "0" operation of the cell 50 is now described with reference to FIG. 5. A negative bias is applied to SL terminal 72, zero or negative potential is applied to WL terminal 70, zero voltage is applied to BL terminal 74 and zero voltage is applied to substrate terminal 78. The unselected SL terminal 72 remains grounded. Under these conditions, the p-n junction between floating body 24 and region 16 of the selected cell 50 is forward-biased, evacuating any holes from the floating body 24. In one particular non-limiting embodiment, about −1.2 volts is applied to terminal 72, about 0.0 volts is applied to terminal 70, and about 0.0 volts is applied to terminal 74 and 78. However, these voltage levels may vary, while maintaining the relative relationship between the applied bias, as described above.

Figure 6A:
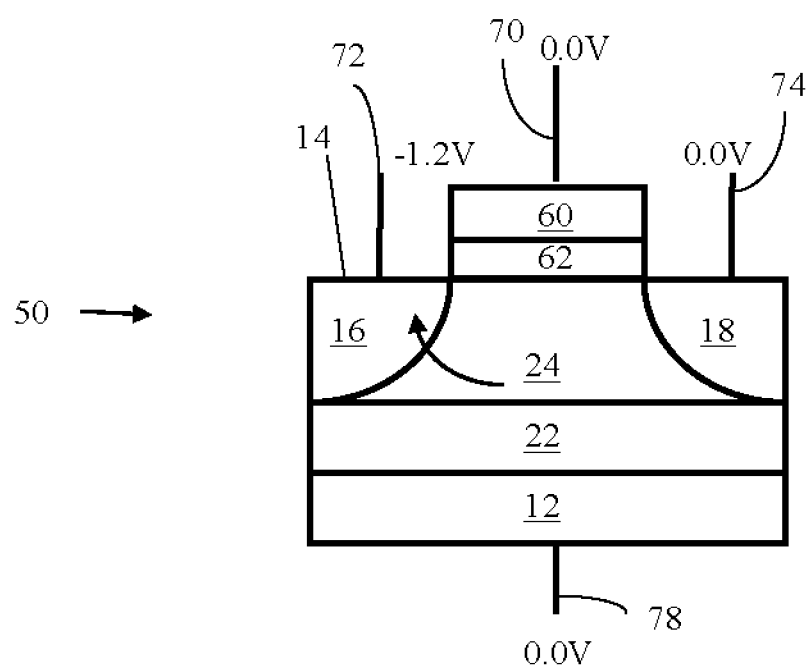
FIGS. 6A-6B show an example of bias conditions of selected and unselected memory cells during a write "0" operation according to an embodiment of the present invention.
Figure 6B:
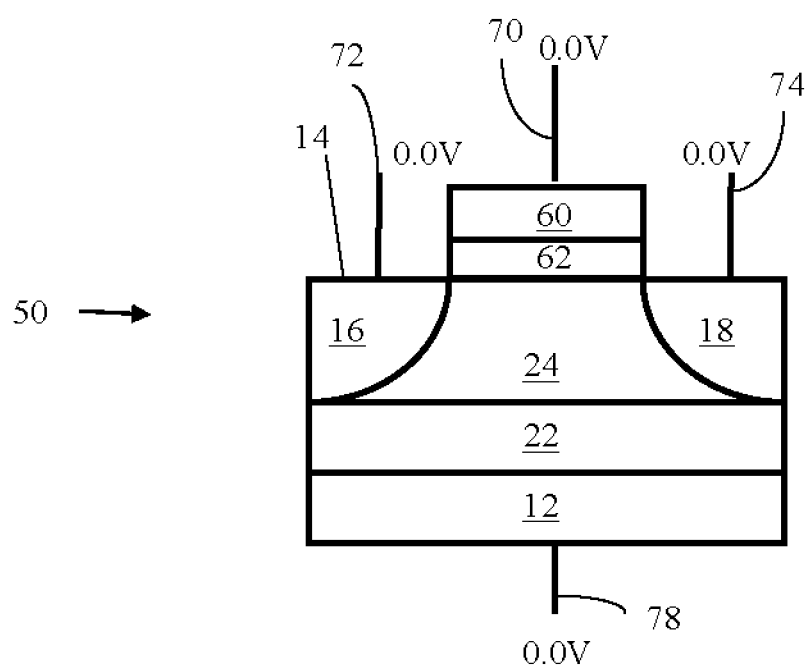

An example of bias conditions of the selected and unselected memory cells 50 during a write "0" operation is illustrated in FIGS. 6A-6B. Because a write "0" operation only involves a negative voltage applied to the selected SL terminal 72, the bias conditions for all the unselected cells are the same. As can be seen, the unselected memory cells will be in a holding operation, with the BL terminal at about 0.0 volts, WL terminal at zero or negative voltage, and the unselected SL terminal at about 0.0 volts.

Alternatively, a write "0" operation can be performed by applying a negative bias to the BL terminal 74 as opposed to the SL terminal 72. The SL terminal 72 will be grounded, while zero voltage is applied to the substrate terminal 78, and zero or negative voltage is applied to the WL terminal 70. Under these conditions, all memory cells sharing the same BL terminal 74 will be written into state "0" as shown in FIG. 7.

Figure 5:
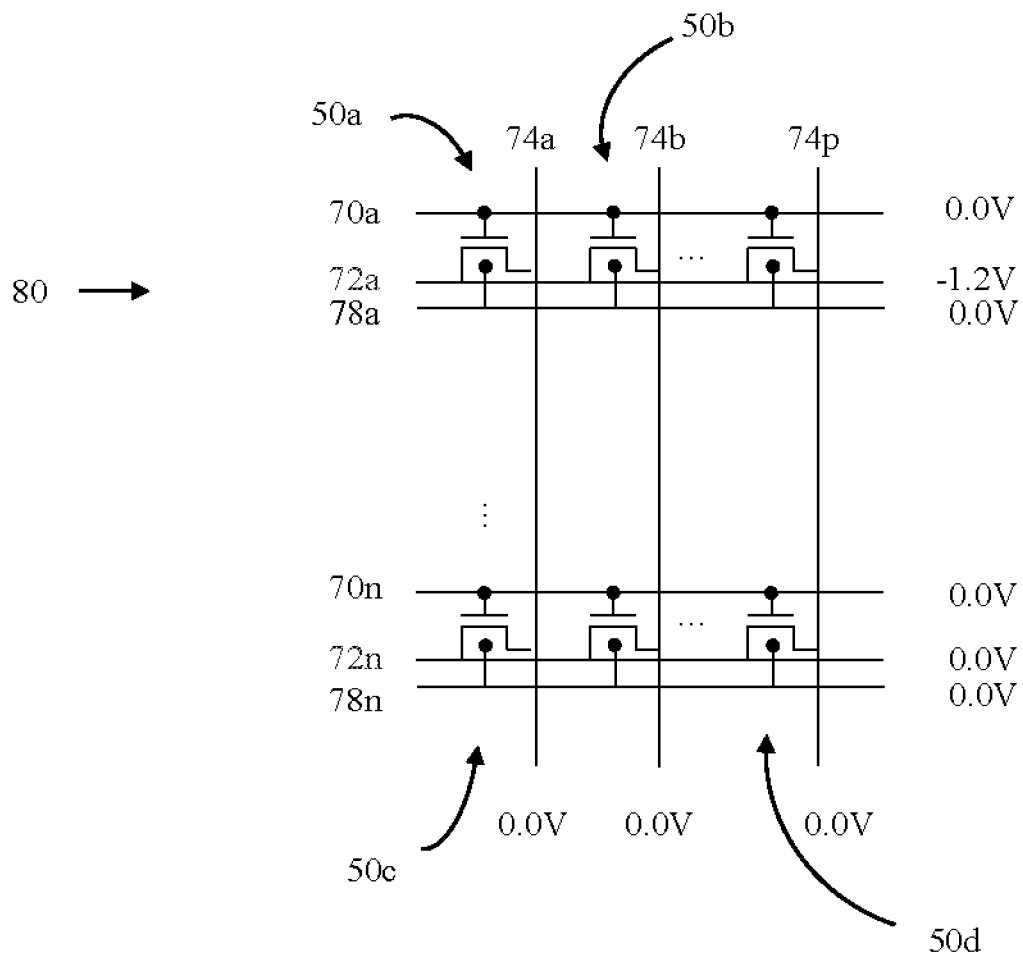
FIG. 5 schematically illustrates and example of a write "0" operation of a cell according to an embodiment of the present invention.
Figure 7:
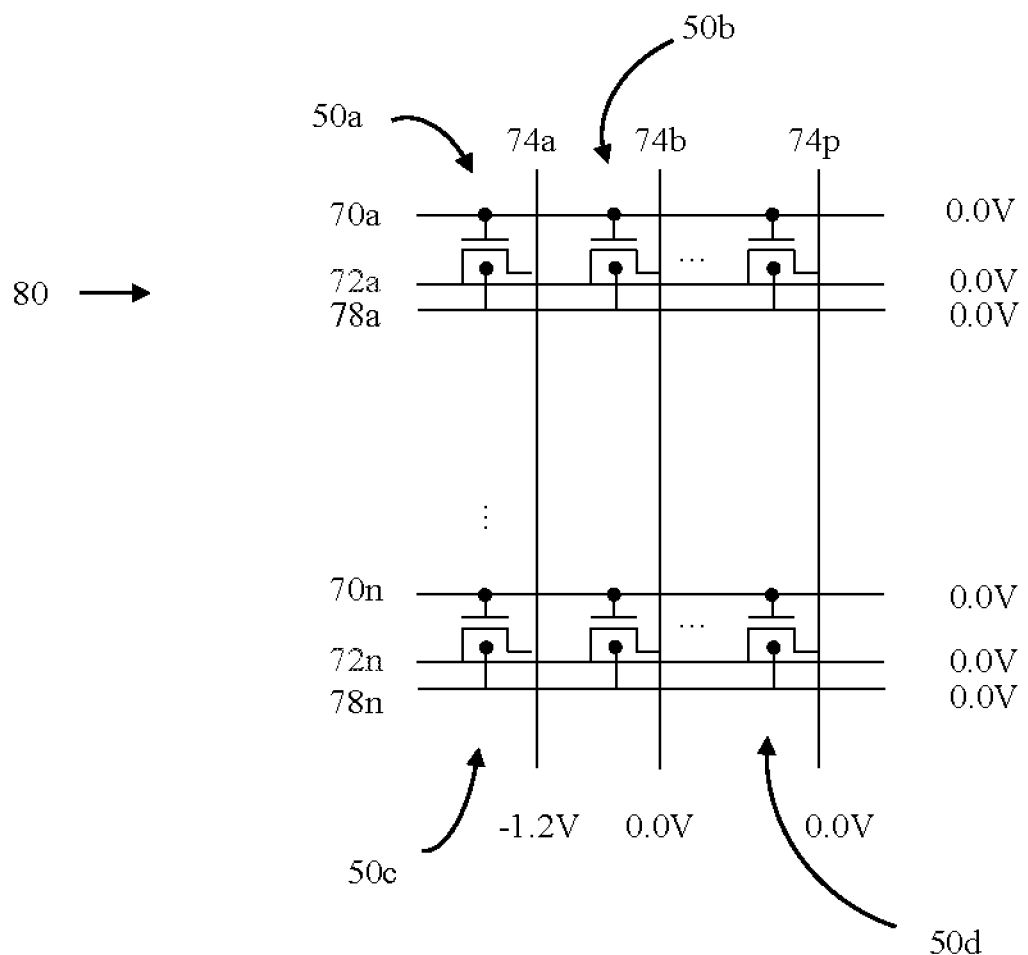
FIG. 7 illustrates bias conditions for cells in an array during a write "0" operation in which all memory cells sharing the same BL terminal are written into state "0" according to an embodiment of the present invention.

The write "0" operation referred to above with regard to FIGS. 5-7 has a drawback in that all memory cells 50 sharing either the same SL terminal 72 or the same BL terminal 74 will be written to simultaneously and as a result, does not allow individual bit writing, i.e. writing to a single cell 50 memory bit. To write multiple data to different memory cells 50, write "0" is first performed on all the memory cells, followed by write "1" operations on a selected bit or selected bits.

An alternative write "0" operation that allows for individual bit writing can be performed by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and region 18 is forward-biased, evacuating any holes from the floating body 24. To reduce undesired write "0" disturb to other memory cells 50 in the memory array 80, the applied potential can be optimized as follows: if the floating body 24 potential of state "1" is referred to $V_{FB1}$, then the voltage applied to the WL terminal 70 is configured to increase the floating body 24 potential by $V_{FB1}/2$ while $-V_{FB1}/2$ is applied to BL terminal 74.

Figure 8:
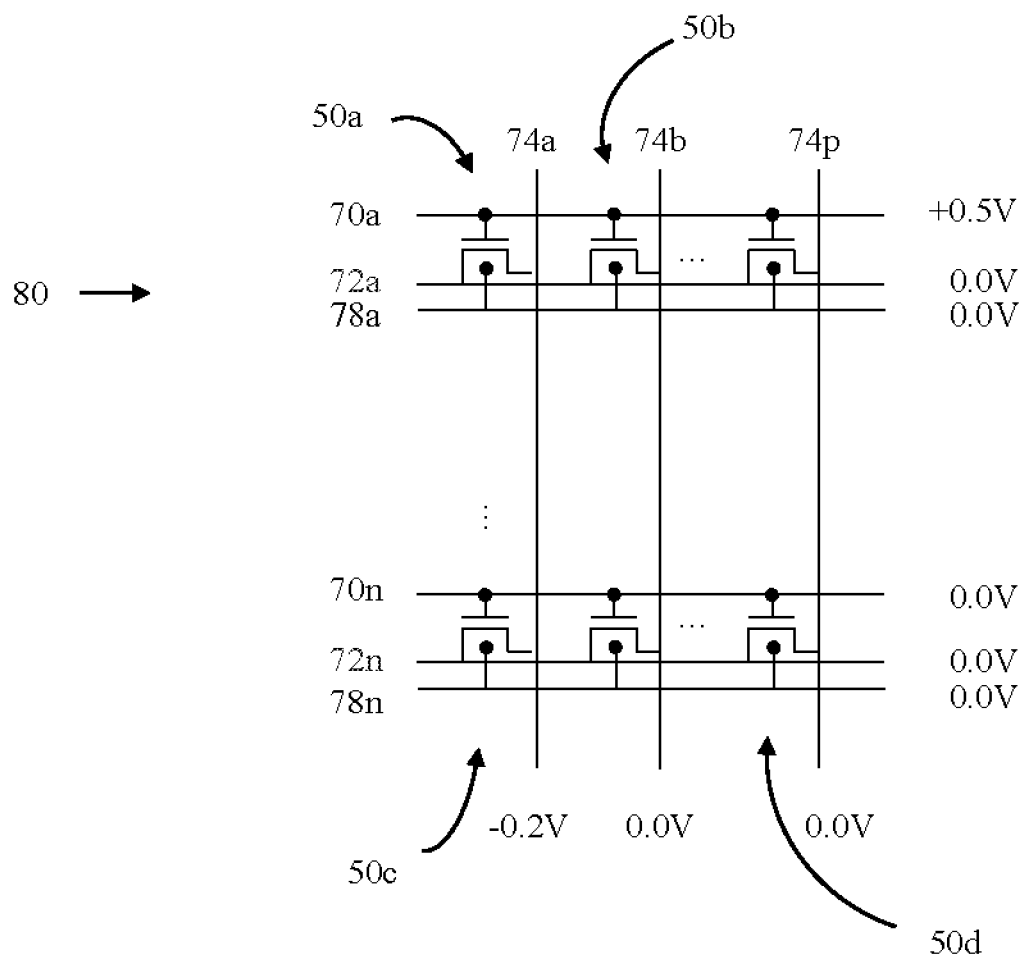
FIG. 8 illustrates bias conditions for selected and unselected memory cells of a memory array for a write "0" operation according to an alternative embodiment of the present invention.

In one particular non-limiting embodiment, the following bias conditions are applied to the selected memory cell 50a: a potential of about 0.0 volts to SL terminal 72, a potential of about −0.2 volts to BL terminal 74, a potential of about +0.5 volts is applied to terminal 70, and about 0.0 volts is applied to substrate terminal 78; while about 0.0 volts is applied to unselected SL terminal 72, about 0.0 volts is applied to unselected BL terminal 74, about 0.0 volts is applied to unselected WL terminal 70, and about 0.0 volts is applied to unselected terminal 78. FIG. 8 shows the bias conditions in the above-described example, for the selected and unselected memory cells in memory array 80. However, these voltage levels may vary.

Figure 9A:
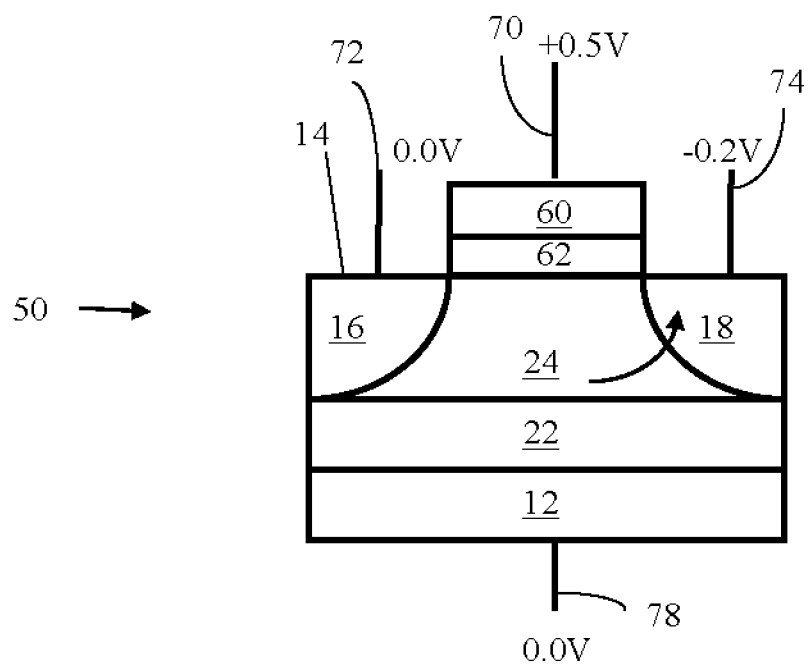
FIG. 9A illustrates bias conditions of the selected memory cell under the write "0" operation described with regard to the example of FIG. 8.

The bias conditions of the selected memory cell 50a under the write "0" operation described with regard to FIG. 8 are further elaborated and shown in FIG. 9A. As described, the potential difference between floating body 24 and region 18 (connected to BL terminal 74) is shown in FIG. 9A as having increased, resulting in a forward bias current which evacuates holes from the floating body 24.

Figure 9B:
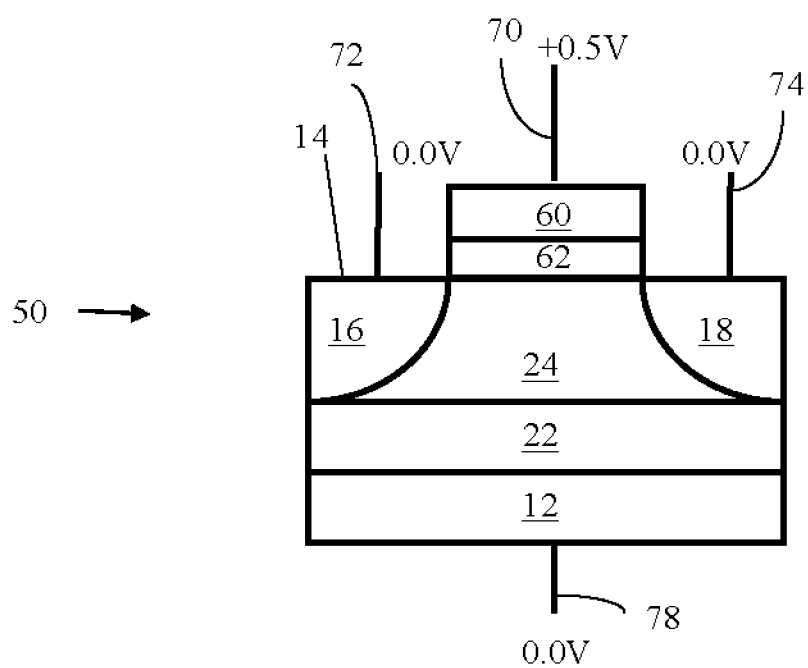
FIGS. 9B-9D illustrate examples of bias conditions on the unselected memory cells during write "0" operations described with regard to the example shown in FIG. 8.
Figure 9C:
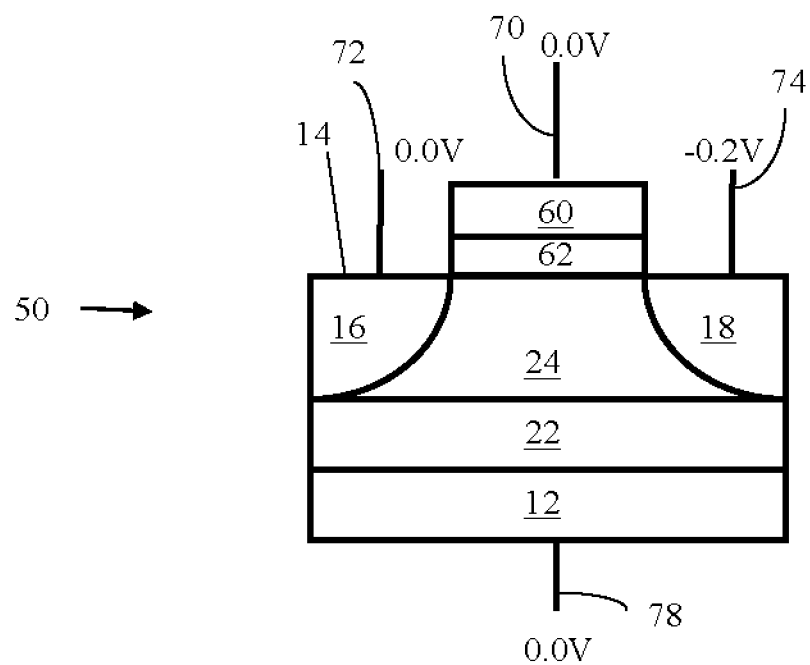
Figure 9D:
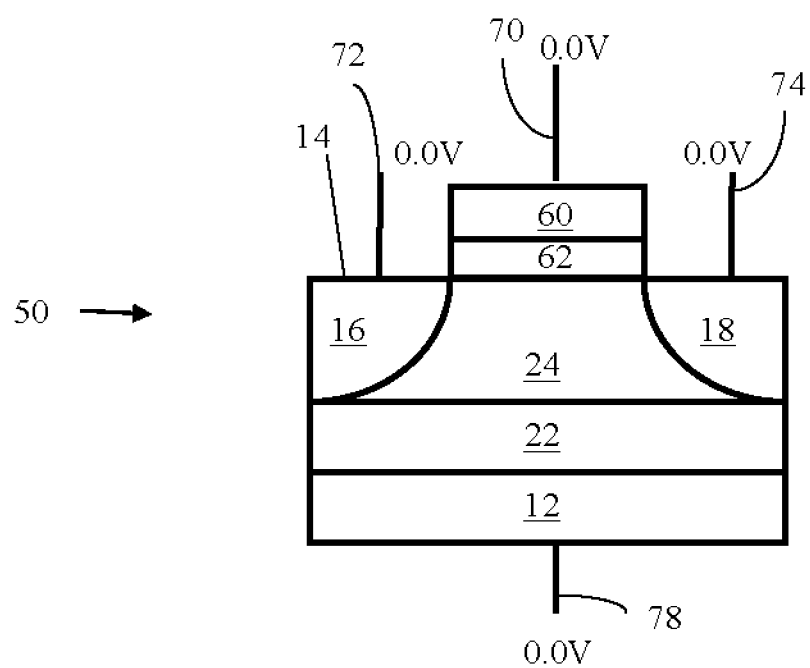

Examples of bias conditions on the unselected memory cells 50 during write "0" operations described with regard to FIG. 8 are shown in FIGS. 9B-9D. The bias conditions for memory cells sharing the same row (e.g. memory cell 50b) are illustrated in FIG. 9B, and the bias conditions for memory cells sharing the same column (e.g. memory cell 50c) as the selected memory cell 50a are shown in FIG. 9C, while the bias conditions for memory cells not sharing the same row nor the same column (e.g. memory cell 50d) as the selected memory cell 50a are shown in FIG. 9D.

The floating body 24 potential of memory cells sharing the same row as the selected memory cell (see FIG. 9B) will increase by $\Delta V_{FB}$ due to capacitive coupling from WL terminal 70. For memory cells in state "0", the increase in the floating body 24 potential is not sustainable as the forward bias current of the p-n diodes formed by floating body 24 and junctions 16 and 18 will evacuate holes from floating body 24. As a result, the floating body 24 potential will return to the initial state "0" equilibrium potential. For memory cells in state "1", the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state "1" is referred to as $V_{FB1}$, the floating body 24 potential after the write "0" operation will become $V_{FB1}-\Delta V_{FB}$. Therefore, the WL potential needs to be optimized such that the decrease in floating body potential of memory cells 50 in state "1" is not too large. For example, the maximum floating body potential due to the coupling from the WL potential cannot exceed $V_{FB1}/2$.

For memory cells sharing the same column as the selected memory cell, a negative voltage is applied to the BL terminal 74 (see FIG. 9C), resulting in an increase in the potential difference between floating body 24 and region 18 connected to the BL terminal 74. As a result, the p-n diode formed between floating body 24 and junction 18 will be forward biased. For memory cells in state "0", the increase in the floating body 24 potential will not change the initial state "0" as there is initially no hole stored in the floating body 24. For memory cells in state "1", the net effect is that the floating body 24 potential after write "0" operation will be reduced. Therefore, the BL potential also needs to be optimized such that the decrease in floating body potential of memory cells 50 in state "1" is not too large. For example, a potential of $-V_{FB1}/2$ can be applied to the BL terminal 74.

As to memory cells not sharing the same row nor the same column as the selected memory cell, zero voltage is applied to the SL terminal 72, zero voltage is applied to the BL terminal 74, and zero or negative voltage is applied to WL terminal 70, and zero voltage is applied to substrate terminal 78 (see FIG. 9D). As a result, holes will not be evacuated from floating body region 24.

A write "1" operation can be performed on memory cell 50 through impact ionization as described, for example, in "A New 1T DRAM Cell with Enhanced Floating Body Effect", Lin and Chang, pp. 23-27, IEEE International Workshop on Memory Technology, Design, and Testing, 2006, which was incorporated by reference above, or band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

Figure 10:
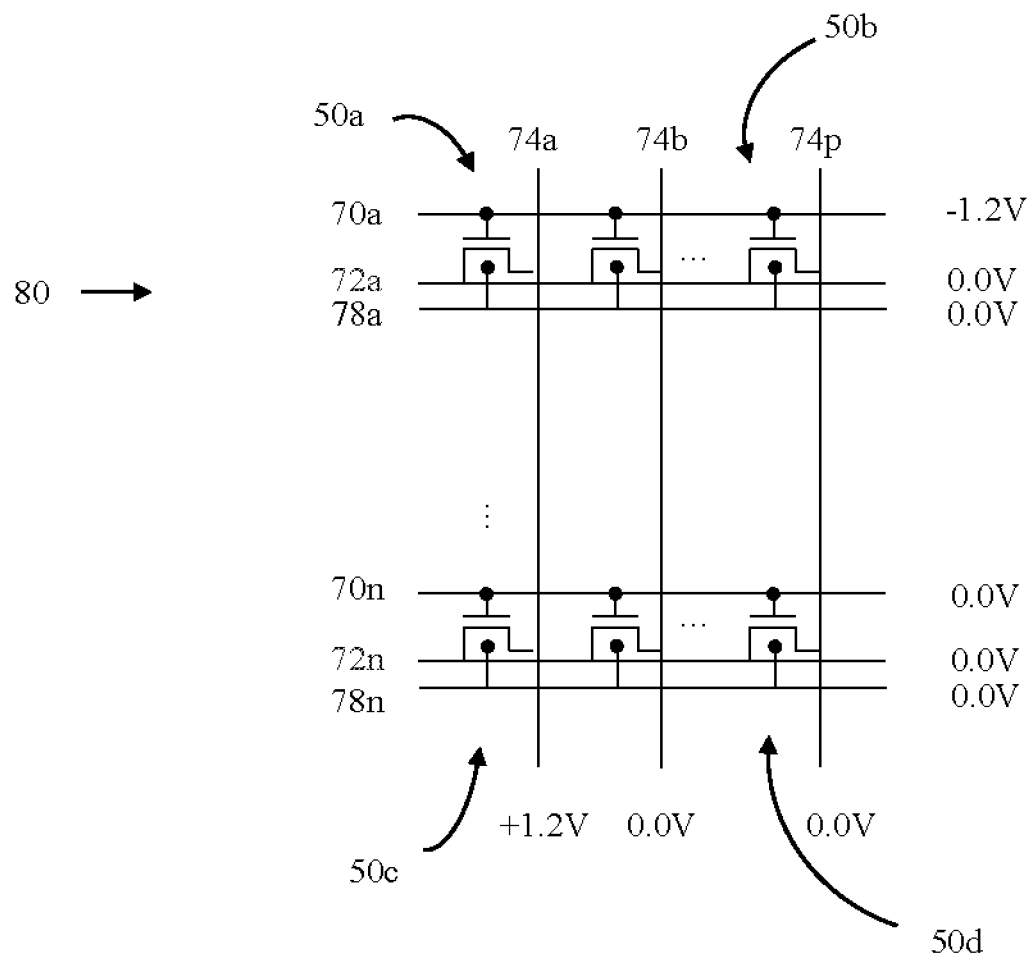
FIGS. 10 and 11A illustrate an example of the bias conditions of a selected memory cell under a write "1" operation using band-to-band tunneling according to an embodiment of the present invention.
Figure 11A:
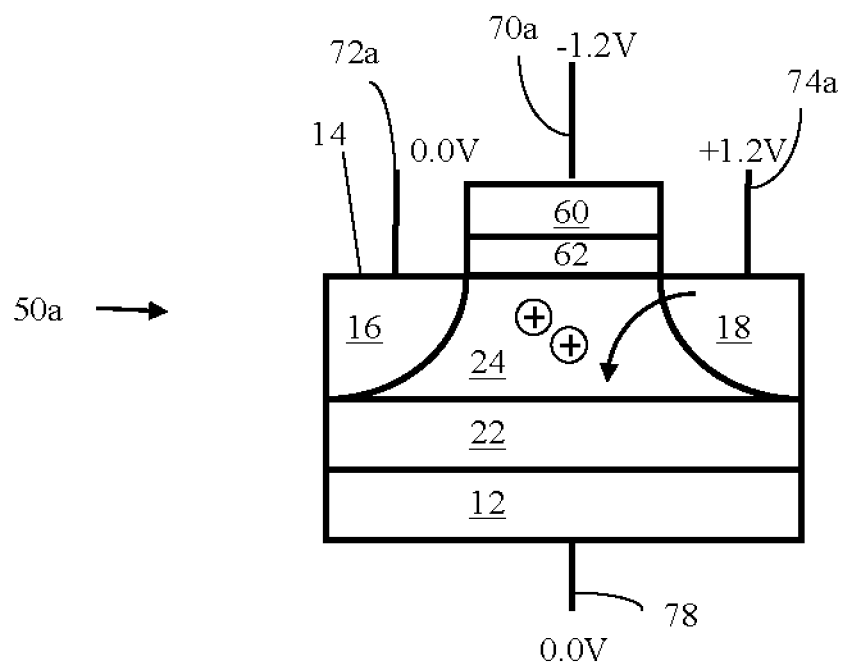

An example of the bias conditions of the selected memory cell 50 under a write "1" operation using band-to-band tunneling is illustrated in FIGS. 10 and 11A. The negative bias applied to the WL terminal 70 and the positive bias applied to the BL terminal 74 results in electron tunneling which results in electron flow to the BL terminal 74, generating holes which subsequently are injected to the floating body 24 of the selected memory cell 50. The SL terminal 72 and the substrate terminal 78 are grounded during the write "1" operation.

In one particular non-limiting embodiment, the following bias conditions are applied to the selected memory cell 50a: a potential of about 0.0 volts is applied to SL terminal 72, a potential of about +1.2 volts is applied to BL terminal 74, a potential of about −1.2 volts is applied to WL terminal 70, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, and about 0.0 volts is applied to substrate terminal 78. FIG. 10 shows the bias conditions for the selected and unselected memory cells in memory array 80. However, these voltage levels may vary.

Figure 11B:
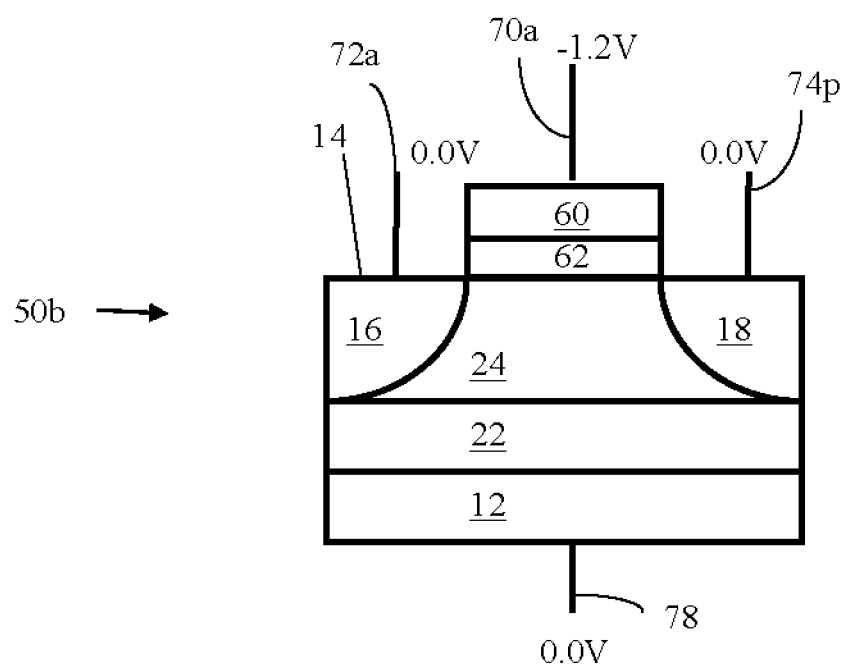
FIGS. 11B-11D show examples of bias conditions of the unselected memory cells during write "1" operations of the type described with regard to FIG. 10.
Figure 11C:
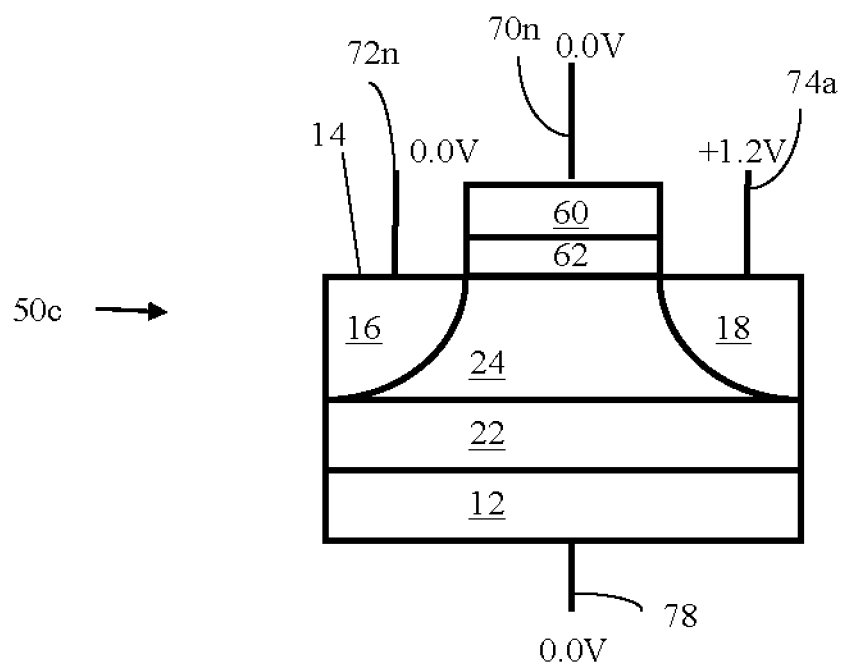
Figure 11D:
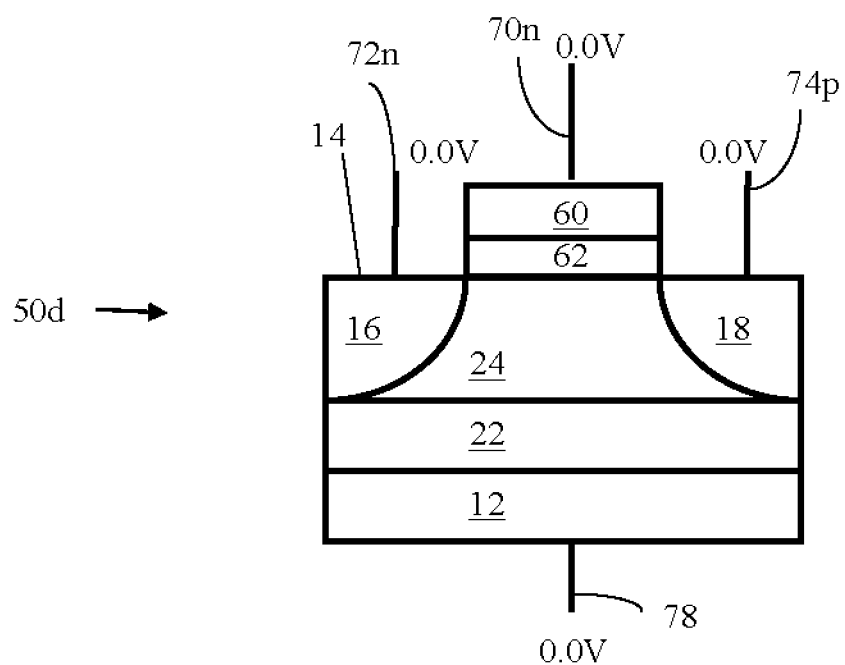
Figure 12:
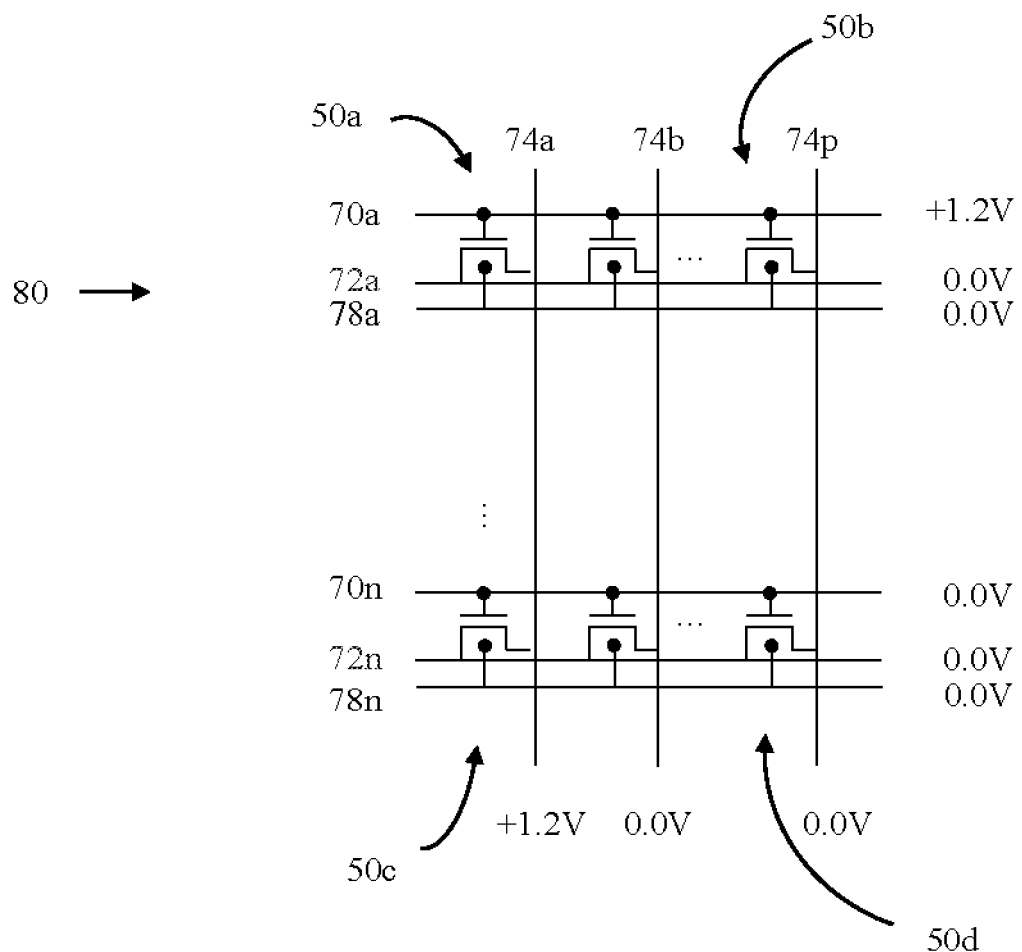
FIG. 12 schematically illustrates bias conditions on memory cells during a write "1" operation using impact ionization according to and embodiment of the present invention.

Examples of bias conditions of the unselected memory cells during write "1" operations of the type described above with regard to FIG. 10 are shown in FIGS. 11B-11D. The bias conditions for memory cells sharing the same row (e.g. memory cell 50b) are shown in FIG. 11B and the bias conditions for memory cells sharing the same column as the selected memory cell 50a (e.g. memory cell 50c) are shown in FIG. 11C. The bias conditions for memory cells 50 not sharing the same row nor the same column as the selected memory cell 50a (e.g. memory cell 50d) are shown in FIG. 11D.

For memory cells sharing the same row as the selected memory cell, both terminals 72 and 74 are grounded, while about −1.2 volts is applied to WL terminal 70 (see FIG. 11B). There is no hole injection into the floating body 24 of memory cell 50b as there is not enough potential difference for band-to-band tunneling to occur.

For memory cells sharing the same column as the selected memory cell, a positive voltage is applied to the BL terminal 74 (see FIG. 11C). No hole injection will occur for these memory cells as the WL terminal 70 is being grounded.

For memory cells 50 not sharing the same row or the same column as the selected memory cell, both the SL terminal 72 and the BL terminal 74 remain grounded (see FIG. 11D). Consequently, no write operations will occur to these memory cells.

An example of the bias conditions of the selected memory cell 50 under a write "1" operation using an impact ionization write "1" operation is illustrated in FIGS. 12 and 13A-13D. A positive bias is applied to the selected WL terminal 70, zero voltage is applied to all SL terminals 72, a positive bias applied to the selected BL terminal 74, while the substrate terminal 78 of the selected cell is grounded. These condition cause hole injection to the floating body 24 of the selected memory cell (e.g. cell 50a in FIG. 13A).

Figure 13A:
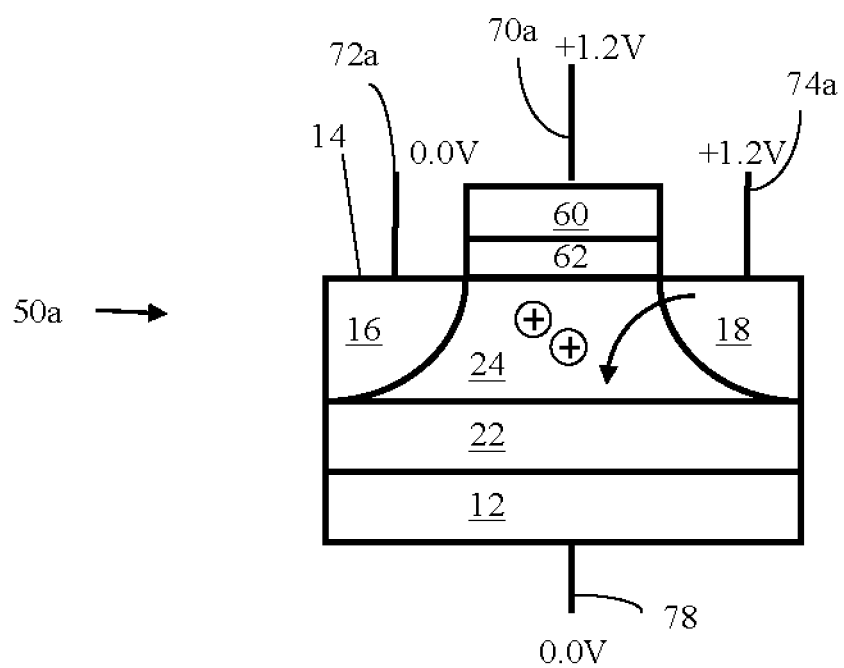
FIGS. 13A-13D and 14 illustrate an example of the bias conditions of the selected memory cell 50 under a write "1" operation using an impact ionization write "1" operation according to an embodiment of the present invention.
Figure 13B:
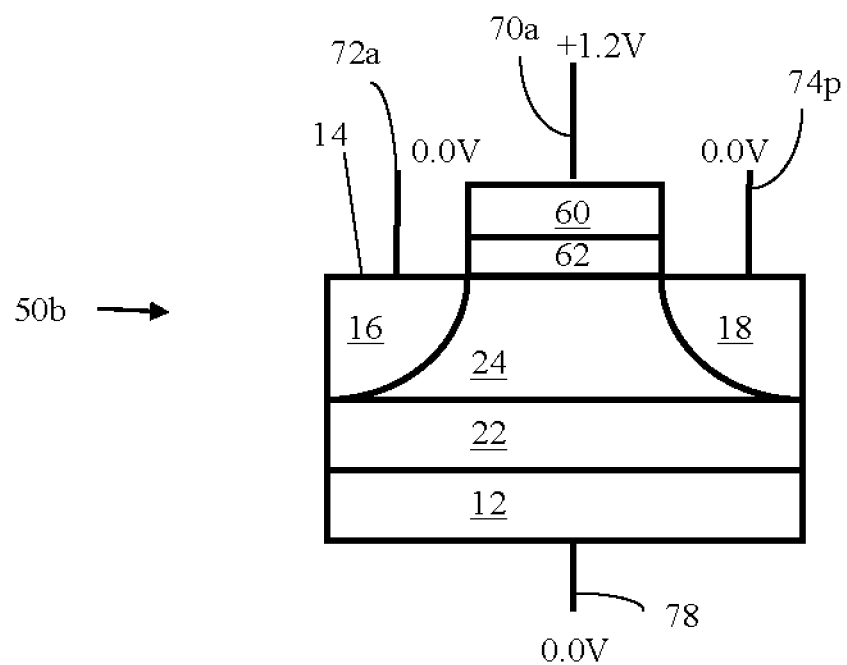
Figure 13C:
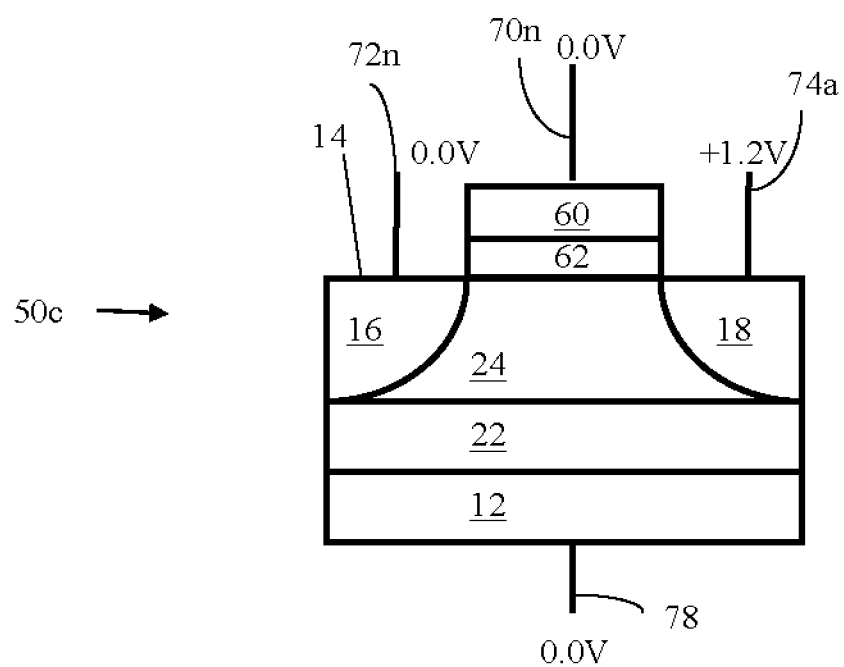
Figure 13D:
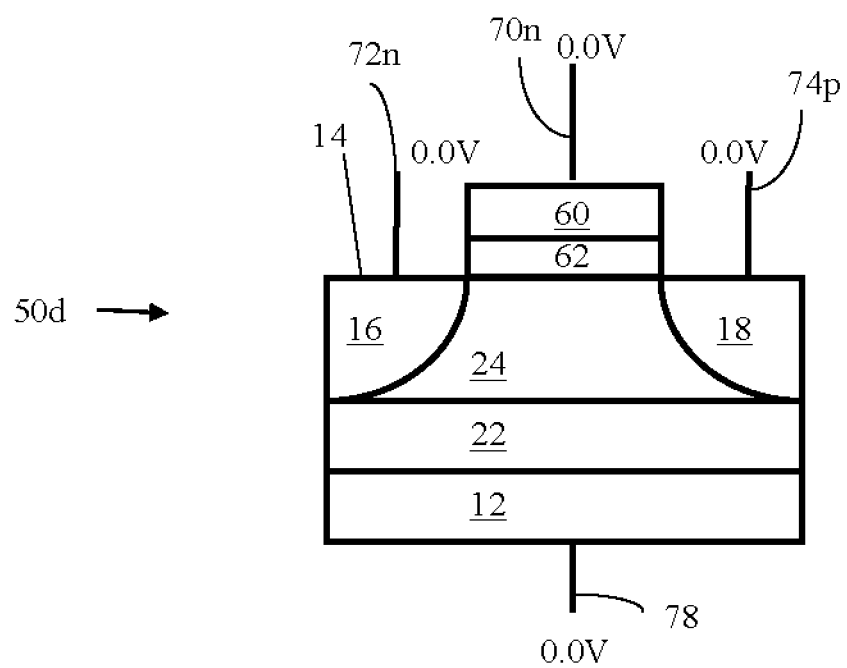

In one particular non-limiting embodiment, the following bias conditions are applied to the selected memory cell 50a: a potential of about 0.0 volts is applied to SL terminal 72, a potential of about +1.2 volts is applied to BL terminal 74, a potential of about +1.2 volts is applied to the selected WL terminal 70, and about 0.0 volts is applied to substrate terminal 78; while the following bias conditions are applied to the unselected terminals: about 0.0 volts is applied to unselected SL terminal 72, about 0.0 volts is applied to unselected BL terminal 74, a potential of about 0.0 volts is applied to unselected WL terminal 70, and about 0.0 volts is applied to unselected substrate terminal 78. FIG. 13A shows the bias conditions for the selected memory cell in the example described above. FIG. 13B shows the bias conditions for memory cells sharing the same row as the selected memory cell in the example described above with regard to FIG. 12. FIG. 13C shows the bias conditions for memory cells sharing the same column as the selected memory cell in the example described above with regard to FIG. 12. FIG. 13D shows the bias conditions for memory cells that share neither the same row nor the same column as the selected memory cell in the example described above with regard to FIG. 12. However, these voltage levels may vary.

If floating body region 24 stores a positive charge, the positive charge stored will decrease over time due to the diode leakage current of the p-n junctions formed between the floating body 24 and regions 16 and 18, respectively, and due to charge recombination. A positive bias can be applied to region 16 (connected to SL terminal 72) and/or to region 18 (connected to BL terminal 74), while zero or negative voltage is applied to WL terminal 70 and substrate terminal 78.

In one particular non-limiting embodiment, the following bias conditions are applied to the selected memory cell 50: a potential of about +1.2 volts is applied to SL terminal 72, a potential of about +1.2 volts is applied to BL terminal 74, a potential of 0.0 volts is applied to WL terminal 70, and 0.0 volts is applied to substrate terminal 78. Under these conditions, the p-n junctions formed between the floating body 24 and regions 16 and 18 are reverse biased, improving the lifetime of the positive charge stored in the floating body region 24.

Figure 14:
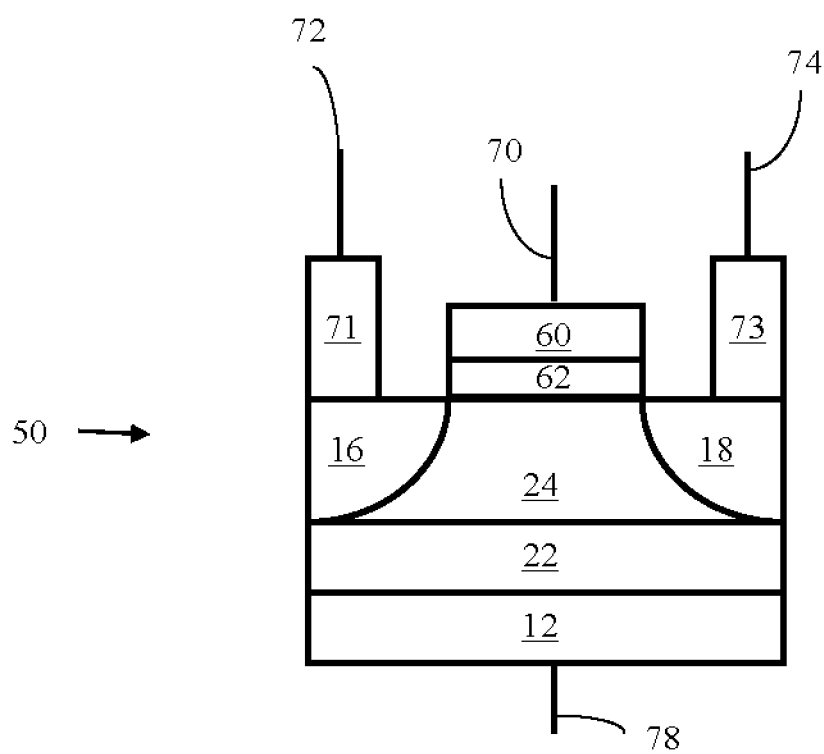

The connection between region 16 of the memory cell 50 and the SL terminal 72 and the connection between region 18 of the memory cell 50 and the BL terminal 74 are usually made through conductive contacts, which for example could be made of polysilicon or tungsten. FIG. 14 shows contact 71 connecting region 16 and the SL terminal 72 and contact 73 connecting region 18 and the BL terminal 74. Many difficulties arise with contact formation. For example, separation between the contact and other electrodes (e.g. the gate electrode or neighboring contacts) must be provided to avoid electrical shorts between neighboring conductive regions. Difficulties related to contact formation and some potential solutions are described for example in U.S. Patent Application Publication No. 2010/0109064, titled "Semiconductor Device and Manufacturing Method Thereof", which is hereby incorporated herein, in its entirety, by reference thereto.

Figure 15:
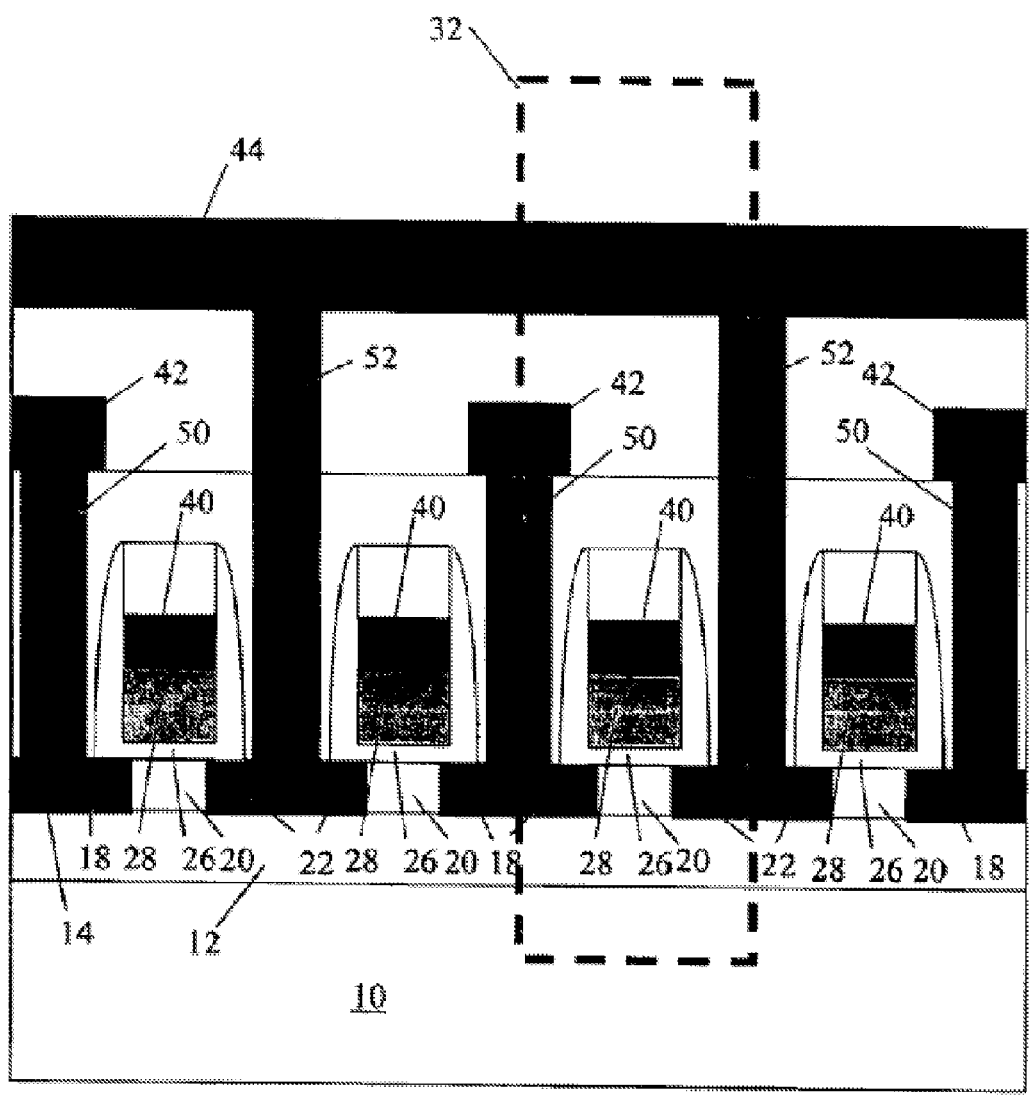
FIG. 15 illustrates a prior art arrangement in which adjacent memory cells share common contacts.

To simplify the manufacturing of the memory cell 50 and to reduce the size of the memory 50, adjacent memory cells can be designed to share a common region 16 (and SL terminal 72) or a common region 18 (and BL terminal 74). For example, as shown in FIG. 15, U.S. Pat. No. 6,937,516, "Semiconductor Device" to Fazan and Okhonin, which is hereby incorporated herein, in its entirety, by reference thereto, shows an arrangement where adjacent memory cells share common contacts 50 and 52. This reduces the number of contacts from two contacts per memory cell (when adjacent contacts are not shared between adjacent memory cells) to where the number of contacts of memory cells in connection equals the number of memory cells plus one. For example, in FIG. 15, the number of interconnected memory cells (the cross section shows memory cells interconnected in the same column) is four and the number of contacts is five.

The present invention provides a semiconductor memory device having a plurality of floating body memory cells which are connected either in series to from a string, or in parallel to form a link. The connections between the memory cells are made to reduce the number of contacts for each memory cell. In some embodiments, connections between control lines, such as source line or bit line, to the memory cells are made at the end or ends of a string or link of several memory cells, such that memory cells not at the end are "contactless" memory cells, because no contacts are provided on these cells to connect them to control lines. Rather, they are in direct contact with other memory cells that they are immediately adjacent to. Because several memory cells are connected either in series or in parallel, a compact memory cell can be achieved.

FIG. 16A shows a cross-sectional schematic illustration of a memory string 500 that includes a plurality of memory cells 50 (50a-50n in FIG. 16A, although there may be more or fewer cells 50), while FIG. 16B shows a top view of the memory cell array 80, which shows two strings 500 of memory cells 50 between the SL terminal 72 and BL terminal 74. Each memory string 500 includes a plurality of memory cells 50 connected in a NAND architecture, in which the plurality of memory cells 50 are serially connected to make one string of memory cells. In a series connection, the same current flows through each of the memory cells 50, from the BL terminal 74 to the SL terminal 72, or vice versa. String 500 includes "n" memory cells 50, where "n" is a positive integer, which typically ranges between eight and sixty-four (although this number could be lower than eight (as low as two) or higher than sixty-four), and in at least one example, is sixteen. The region 18 of a second conductivity at one end of the memory string is connected to the BL terminal 74, while the source region 16 of a second conductivity at the other end of the memory string is connected to the SL terminal 72. Although FIG. 16B schematically illustrates an array of two strings, it should be noted that the present invention is not limited to two strings.

Each memory cell transistor 50 includes a floating body region 24 of a first conducting type, and first and second regions 20 (corresponding to first and second regions 16 and 18 in the single cell embodiments of cell 50 described above) of a second conductivity type, which are spaced apart from each other and define a channel region. A buried insulator layer 22 isolates the floating body region 24 from the bulk substrate 12. A gate 60 is positioned above the surface of floating body 24 and is in between the first and second regions 20. An insulating layer 62 is provided between gate 60 and floating body 24 to insulate gate 60 from floating body 24. As can be seen in FIGS. 16A-16B, connections to the control lines SL terminal 72 and BL terminal 74 are only made at the ends of the string 500. Connection between SL terminal 72 and region 16 is made through contact 71 and connection between BL terminal 74 and region 18 is made through contact 73. No contact are made to the regions 20 of the memory cells 50 in memory string 500, resulting in contactless memory cells intermediate of the end memory cells. In some embodiments, the transistors at the end of the string 500 (e.g., cells 50a and 50n in FIG. 16A) may be configured as access transistors to the memory string 500, wherein the charges stored in the associated floating bodies 24 (in the FIG. 16A example, 24a and 24n) are not read.

Figure 17:
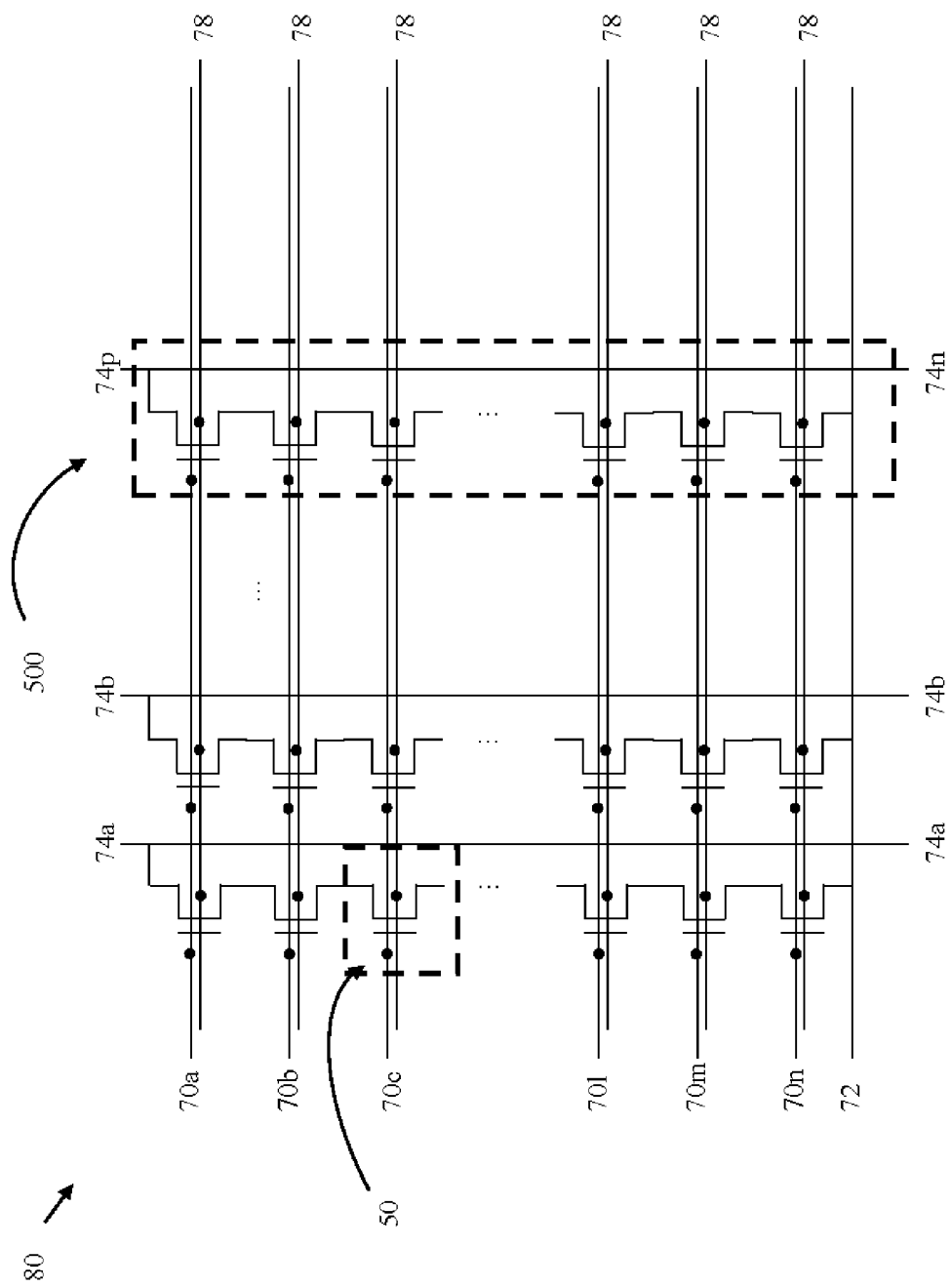
FIG. 17 shows an equivalent circuit representation of the memory array of FIG. 16B.

FIG. 17 shows an equivalent circuit representation of the memory array 80 of FIG. 16B. In FIG. 17, the memory cells are arranged in a grid, with the rows of the memory array being defined by the WL terminals 70, while the columns are defined by the BL terminals 74. Within each column, multiple memory cells 50 are serially connected forming the string 500. Adjacent columns are separated by columns of isolation 26 (see FIG. 16B), such as shallow trench isolation (STI).

Figure 18:
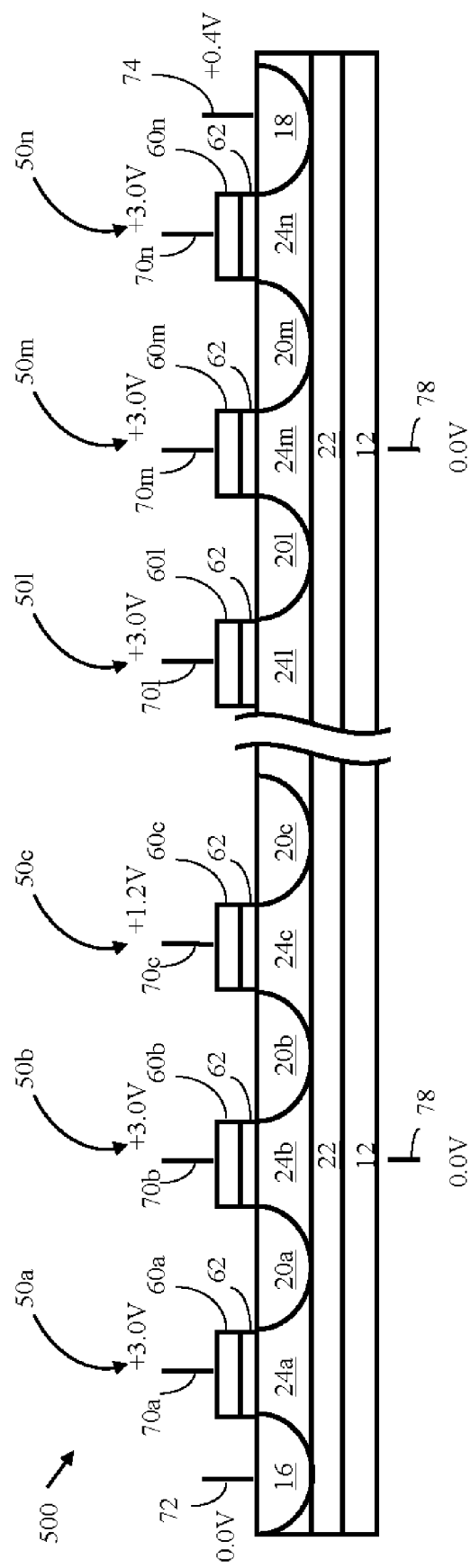
FIGS. 18 and 19A-19B illustrate bias conditions during a read operation according to an embodiment of the present invention.
Figure 19A:
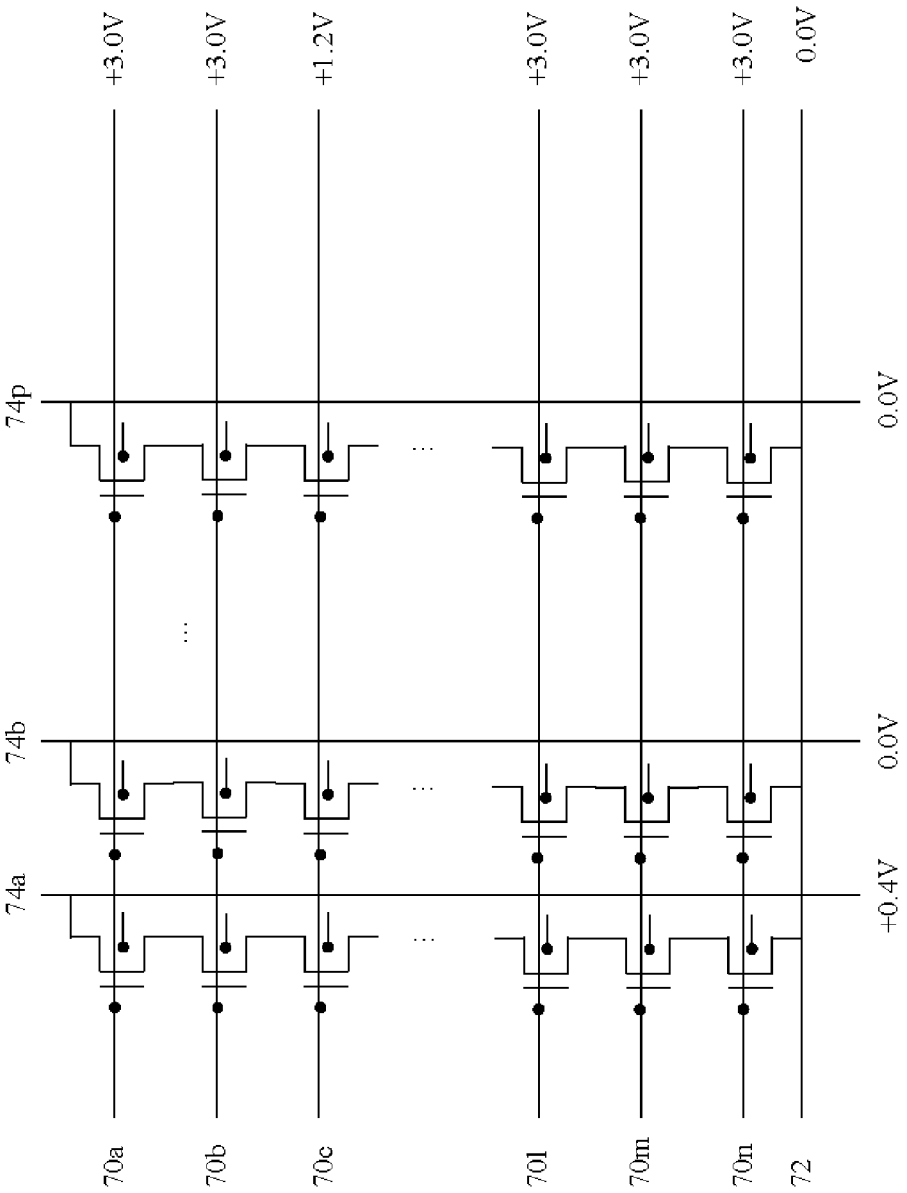
Figure 19B:
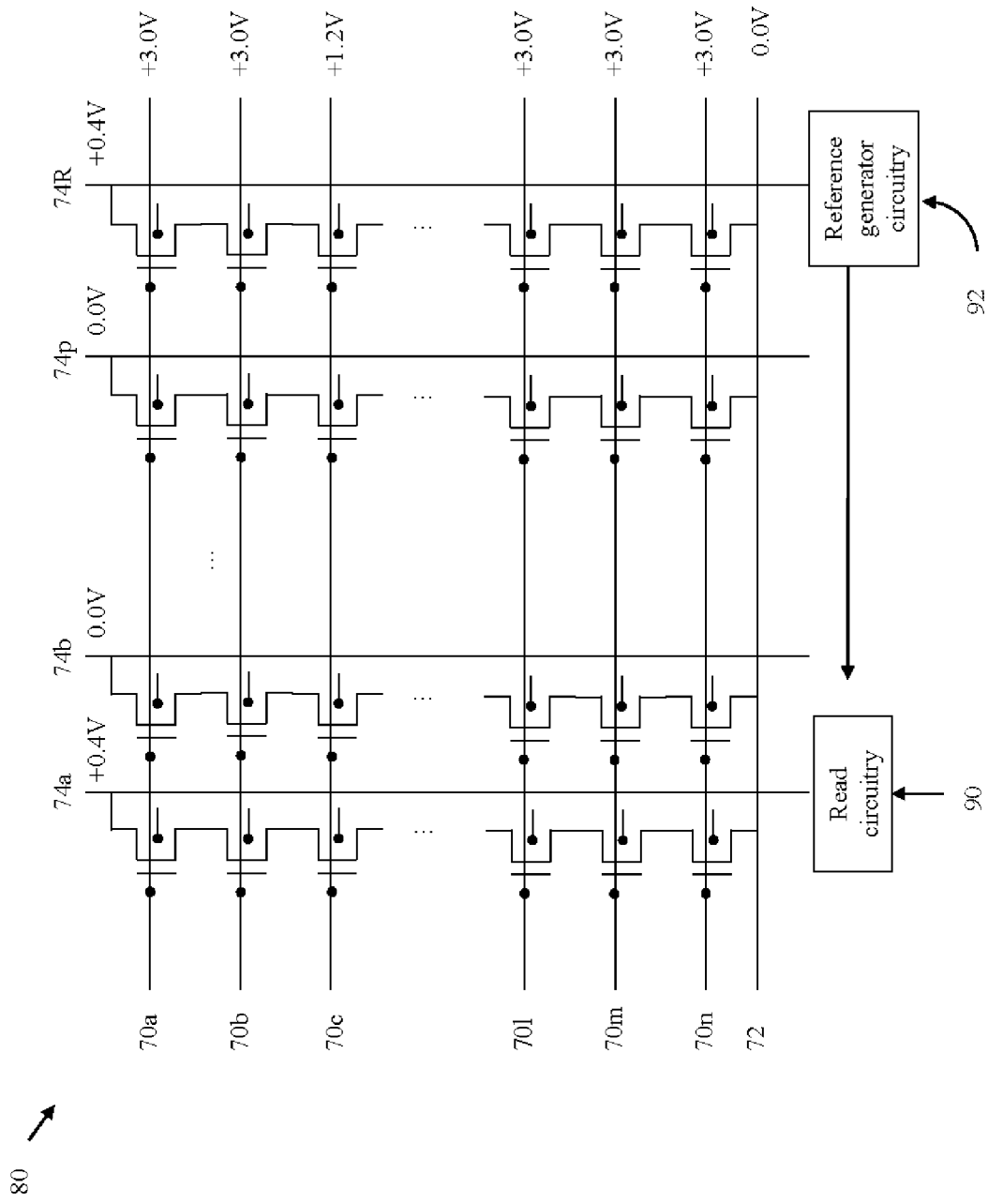

A read operation is described with reference to FIGS. 18 and 19A-19B. The read operation can be performed by applying the following bias conditions, where memory cell 50c is being selected in this example: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals 74 will remain at zero voltage and the unselected SL terminals 72 will remain at zero voltage. A positive voltage greater than the positive voltage applied to the selected WL terminal 70c is applied to passing WL terminals 70a, 70b, 70l, 70m, and 70n (see FIGS. 18 and 19A-19B). Passing WL terminals are connected to the gates of the passing cells, i.e. the unselected cells which are serially connected to the selected memory cell 50c (e.g. memory cells 50a, 50b, 50l, 50m, and 50n in FIG. 18). The voltages applied to the gate of the passing cells are such that the passing transistors are turned on, irrespective of the potentials of their floating body regions. The passing cells need to be turned on because in a series connection, the current flows from the BL terminal 74 to SL terminal 72 (or vice versa) thereby flowing through each of the memory cells 50. As a result, the passing cells will pass the potentials applied to the SL terminal 72 and BL terminal 74 to the source and drain regions 20b and 20c of the selected cell 50c. For example, the memory cell 50n will pass the voltage applied to the BL terminal 74 to region 20m connected to cell 50n (and 50m), which memory cell 50m will subsequently pass to the region 201 connected to cell 501. The adjacent passing memory cells will subsequently pass the voltage applied to BL terminal 74 until the voltage reaches region 20c of the selected cell 50c.

In one particular non-limiting embodiment, the following bias conditions are applied to the selected memory cell 50c: a potential of about 0.0 volts is applied to SL terminal 72, a potential of about +0.4 volts is applied to BL terminal 74, a potential of about +1.2 volts is applied to selected WL terminal 70, about +3.0 volts is applied to passing WL terminals 70, and about 0.0 volts is applied to substrate terminal 78; while the following bias conditions are applied to the unselected terminals: about 0.0 volts is applied to SL terminal 72 (i.e., unselected SL terminal 72 not shown in FIG. 19A), about 0.0 volts is applied to BL terminal 74, a potential of about 0.0 volts is applied to WL terminal 70 that are not passing WL terminals (not shown in FIG. 19A), and about 0.0 volts is applied to substrate terminal 78. FIGS. 18 and 19A-19B show bias condition for the selected and unselected memory cells in memory array 80. However, these voltage levels may vary.

Under these conditions, about +1.2 volts will be applied to the gate 60 of the selected cell 50c and about 0.0 volts and 0.4 volts will be passed to the regions 20b and 20c of the selected cells 50c, similar to the read condition described in FIG. 4A.

As described, the passing cells are biased so that its channels are conducting, and therefore the current flowing from the BL terminal 74 and SL terminal 72 of the string 500 is then determined by the potential of the floating body region 24 of the selected cell 50c. If cell 50c is in a state "1" having holes in the floating body region 24, then the memory cell will have a lower threshold voltage (gate voltage where the transistor is turned on), and consequently be conducting a larger current compared to if cell 50c is in a state "0" having no holes in floating body region 24.

A sensing circuit/read circuitry 90 typically connected to BL terminal 74 of memory array 80 (e.g., see read circuitry 90 in FIG. 19B) can be used to determine the data state of the memory cell. An example of a sensing circuit is described in Ohsawa et al., "An 18.5 ns 128 Mb SOI DRAM with a Floating body Cell", pp. 458-459, 609, IEEE International Solid-State Circuits Conference, 2005, which is hereby incorporated herein, in its entirety, by reference thereto.

Figure 20:
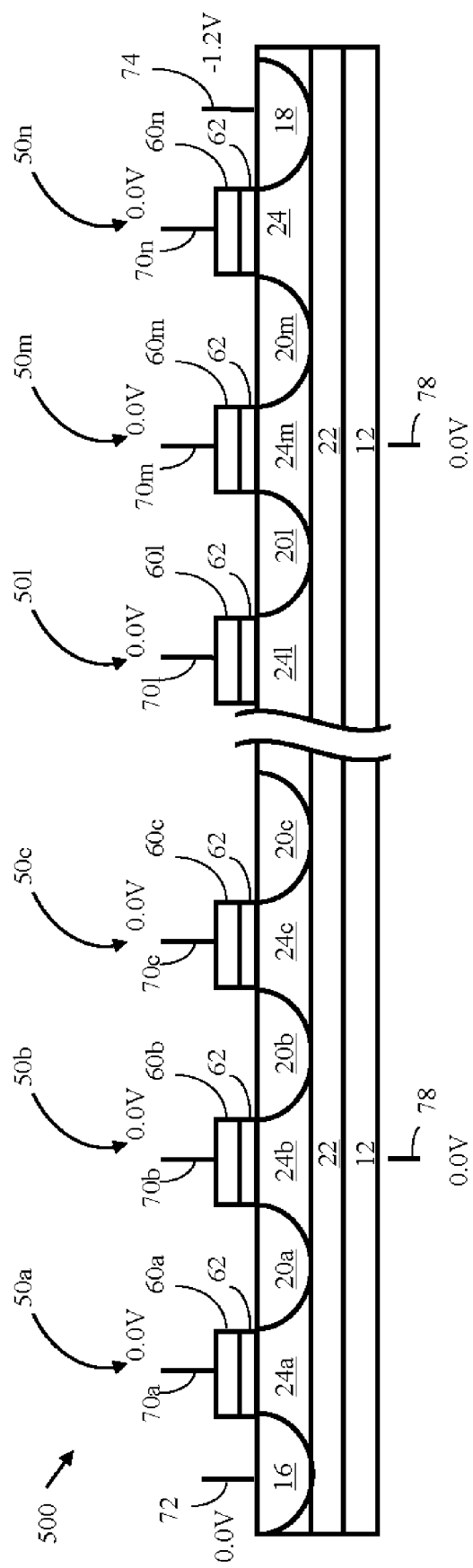
FIGS. 20-21 illustrate bias conditions during a write "0" operation according to an embodiment of the present invention.
Figure 21:
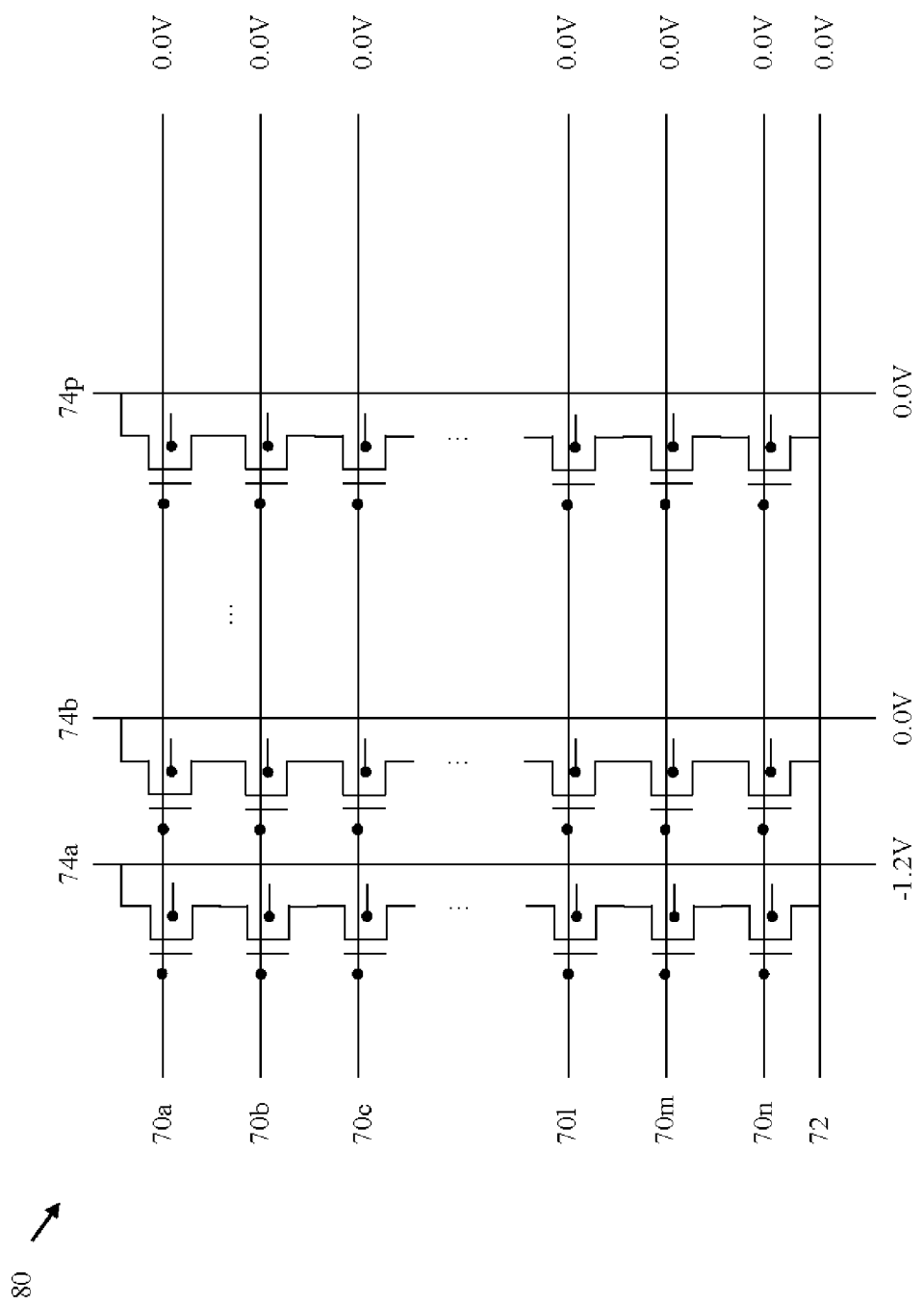

A write "0" operation is described with reference to FIGS. 20-21. Bias conditions shown include: zero voltage applied to the SL terminal 72, zero voltage applied to the WL terminals 70, and negative voltage applied to the BL terminal 74, while the substrate terminal 78 is grounded. Under these conditions, the p-n junctions between floating bodies 24 and regions 20 of the respective memory cells in string 500 are forward-biased, evacuating any holes from each floating body 24. In one particular non-limiting embodiment, about −1.2 volts is applied to terminal 74, about 0.0 volts is applied to terminal 70, about 0.0 volts is applied to terminal 72 and about 0.0 volts is applied to terminal 78. Alternatively, a positive voltage can be applied to the WL terminals 70 to ensure that the negative voltage applied to the BL terminal 74 is passed to all the memory cells in string 500. However, these voltage levels may vary, while maintaining the relative relationship between the charges applied, as described above.

Figure 22A:
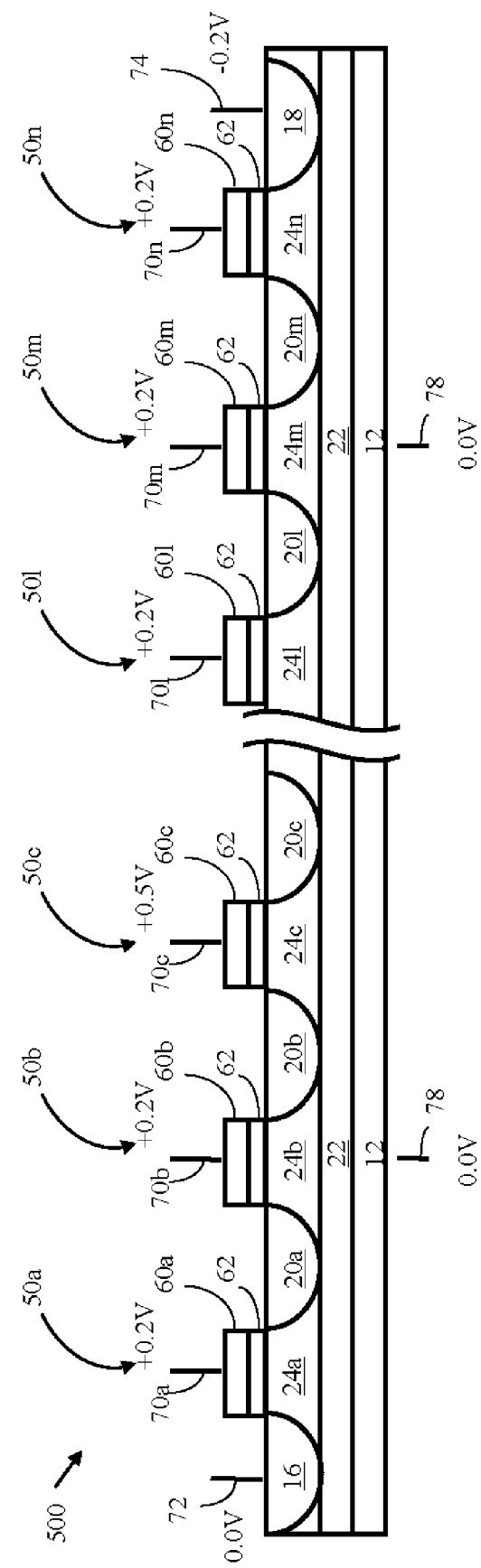
FIGS. 22A-22B illustrate bias conditions during a write "0" operation that allows for individual bit writing according to an embodiment of the present invention.
Figure 22B:
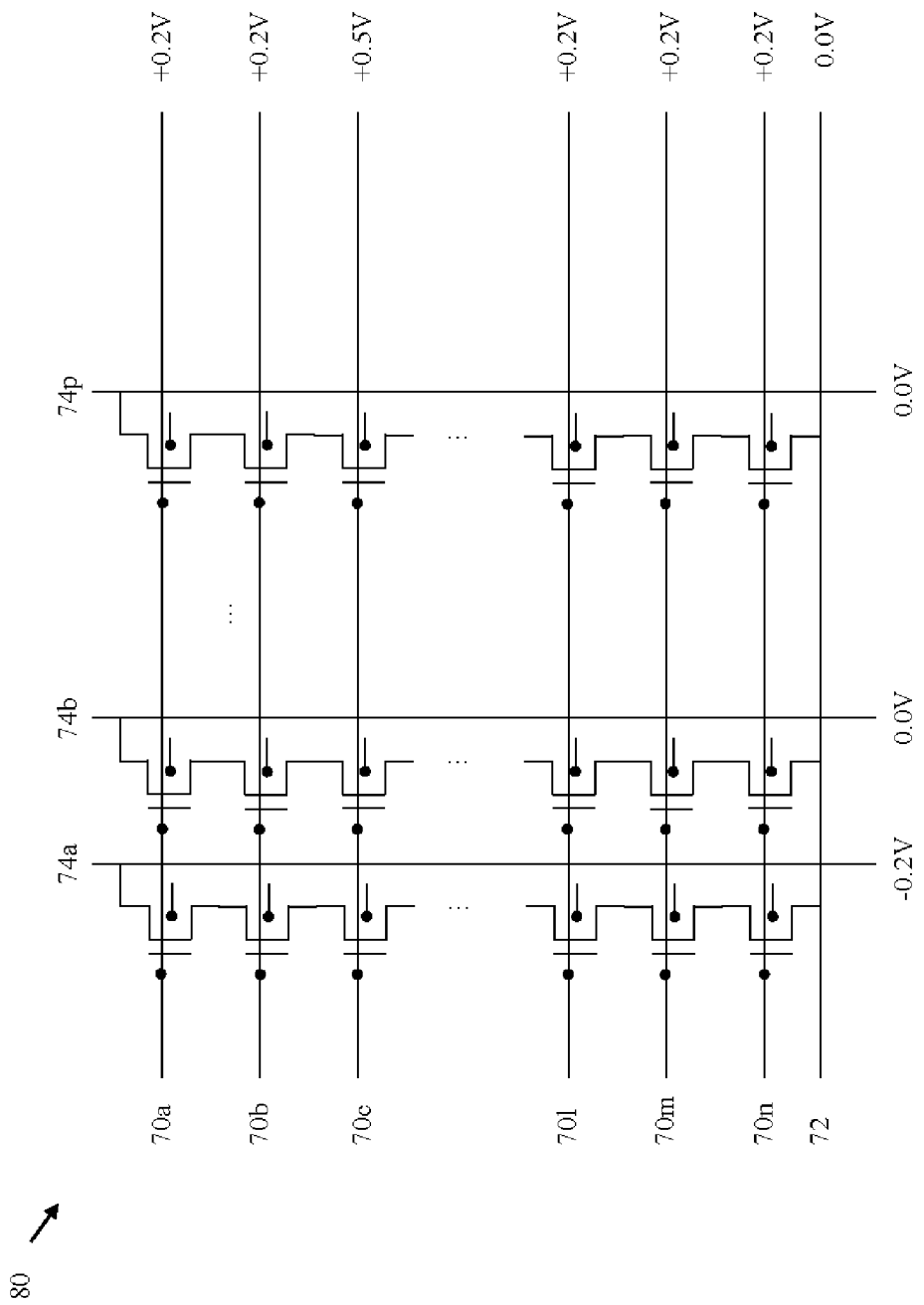

An alternative write "0" operation that allows for individual bit writing is shown in FIGS. 22A-22B. This write "0" operation can be performed by applying a negative voltage to BL terminal 74, zero voltage to SL terminal 72, zero voltage to substrate terminal 78, and a positive voltage to passing WL terminals. The selected WL terminal is initially grounded until the voltages applied to SL terminal 72 and BL terminal 74 reach the regions 20b and 20c, respectively, of the selected memory cell 50c. Subsequently, the potential of the selected WL terminal 70 (70c in this example) is raised to a positive voltage higher than the positive voltage applied to passing WL terminals. Under these conditions, a positive voltage will be applied to the gate of the selected memory cell (e.g. memory cell 50c in FIGS. 22A-22B) and consequently the floating body 24 potential will increase through capacitive coupling from the positive voltage applied to the WL terminal 70. The passing cells (e.g. memory cell 50l, 50m, and 50n) will pass the negative voltage applied to the BL terminal 74 to the region 20c of the memory cell 50c, while passing cells 50a and 50b will pass zero voltage applied to the SL terminal 72 to the region 20b of the memory cell 50c. Under these conditions, the bias conditions of the selected memory cell 50c will be similar to the conditions described in FIG. 9A. As a result of the floating body 24 potential increase and the negative voltage applied to the BL terminal 74, the p-n junction between 24c and region 20c is forward-biased, evacuating any holes from the floating body 24. To reduce undesired write "0" disturb to other memory cells 50 in the memory array 80, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74. The voltage applied to WL terminal of the passing cells is optimized such that it is high enough to pass the negative voltage applied to the BL terminal 74, but cannot be too high to prevent the potential of the floating body 24 of the passing cells becoming too high, which will result in holes being evacuated from the passing cells that are in state "1". A higher positive voltage can be applied to passing WL terminals passing zero voltage applied to the SL terminal 72 (e.g. passing WL terminals to the left of selected WL terminal 70c, i.e. 70a and 70b in FIG. 22A) than the voltage applied to passing WL terminals passing negative voltage applied to the BL terminal 74 (e.g. passing WL terminals to the right of selected WL terminal 70c). This is because the higher voltage applied to terminal 72 (compared to the negative voltage applied to terminal 74) may require a higher passing gate voltage for the passing transistors to be turned on.

In one particular non-limiting embodiment, the following bias conditions are applied to the memory string 500: a potential of about 0.0 volts is applied to SL terminal 72, a potential of about −0.2 volts is applied to BL terminal 74, a potential of about +0.5 volts is applied to selected terminal 70, a potential of about +0.2 volts is applied to passing WL terminals 70 and about 0.0 volts is applied to substrate terminal 78; while about 0.0 volts is applied to unselected SL terminal 72, about 0.0 volts is applied to unselected BL terminal 74, about 0.0 volts is applied to unselected (but not passing) WL terminal 70, and about 0.0 volts is applied to unselected terminal 78. FIG. 22A shows the bias conditions for the selected and passing memory cells in selected memory string 500, while FIG. 22B shows the bias conditions for selected and unselected memory cells in memory array 80 where memory cell 50c is the selected cell. However, these voltage levels may vary.

Under these bias conditions, a positive voltage will be applied to the gate 60 of the selected cell 50c, while a negative voltage applied to the BL terminal 74 will be passed to the region 20c of the selected cell 50c, and zero voltage applied to the SL terminal 72 will be passed to the region 20b of the selected cell 50c. This condition is similar to the condition described in FIG. 9A, which will result in hole evacuation out of the floating body 24 of the cell 50c.

A write "1" operation can be performed on memory cell 50 through impact ionization as described for example in Lin et al., "A New 1T DRAM Cell with Enhanced Floating Body Effect", pp. 23-27, IEEE International Workshop on Memory Technology, Design, and Testing, 2006, which was incorporated by reference above, or by a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

Figure 23A:
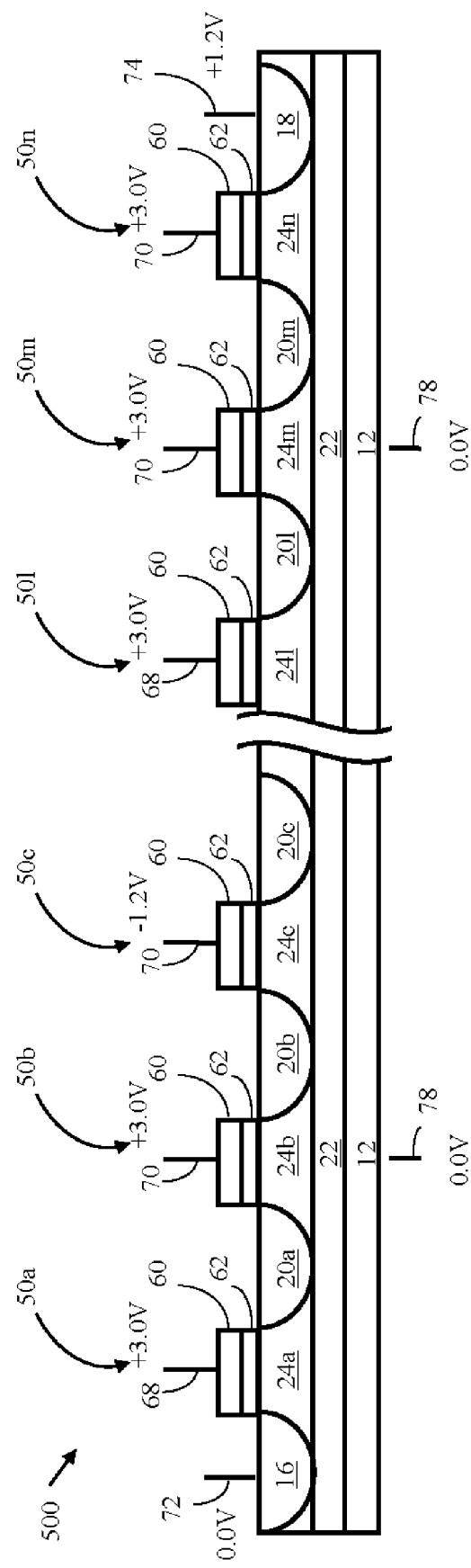
FIGS. 23A-23B illustrate bias conditions during a band-to-band tunneling write "1" operation according to an embodiment of the present invention.
Figure 23B:
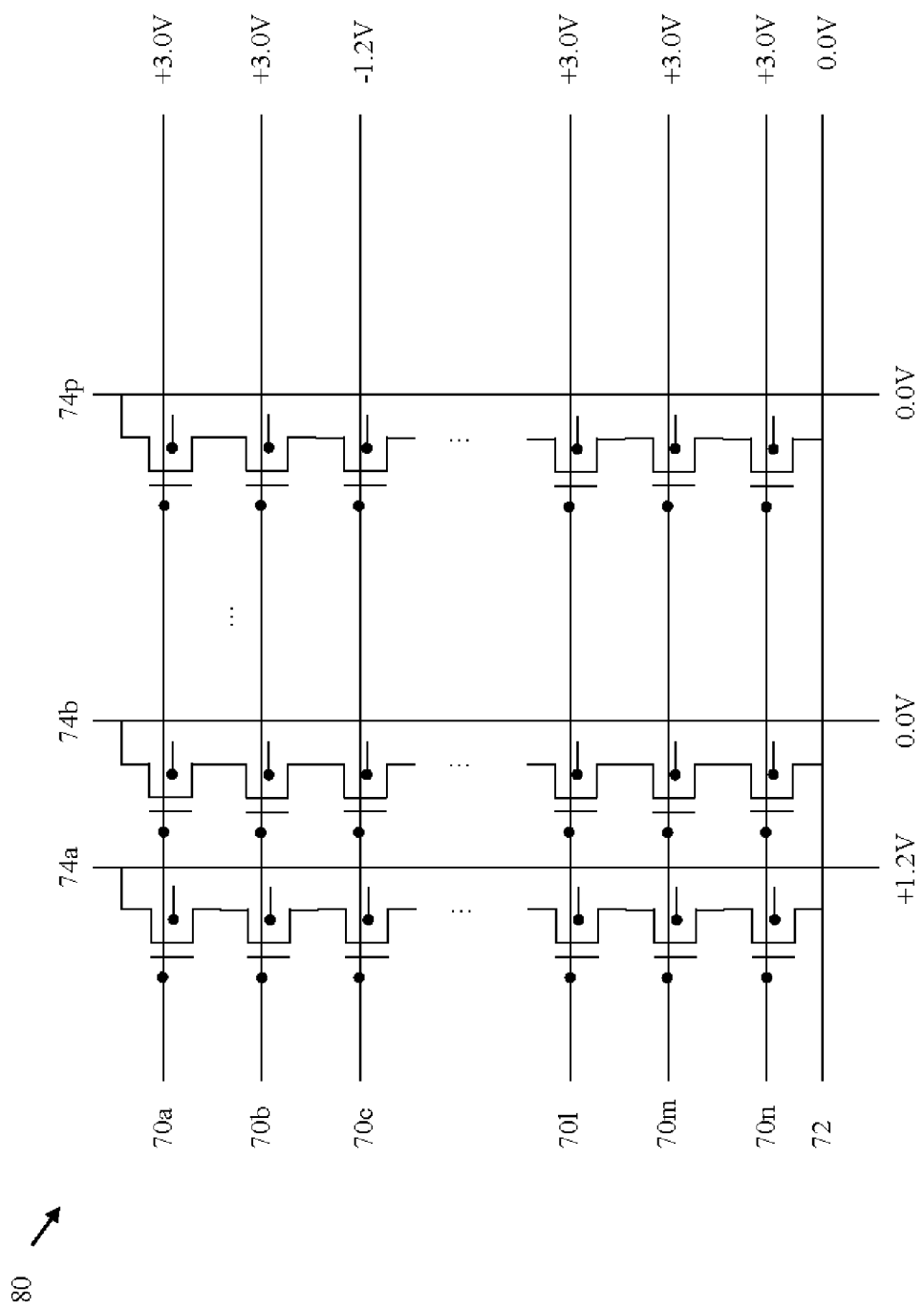

An example of bias conditions of a selected memory cell 50 during a band-to-band tunneling write "1" operation is illustrated in FIGS. 23A and 23B. A negative bias is applied to the selected WL terminal 70, a positive voltage is applied to the passing WL terminals 70, zero voltage is applied to the SL terminal 72 (and to all SL terminals 72), and a positive bias is applied to the selected BL terminal 74 (zero voltage is applied to unselected BL terminals 74), while the substrate terminal 78 is grounded. These conditions cause hole injection to the floating body 24 of the selected memory cell (e.g. cell 50c in FIGS. 23A-23B).

In one particular non-limiting embodiment, the following bias conditions are applied to the selected memory string 500: a potential of about 0.0 volts is applied to SL terminal 72, a potential of about +1.2 volts is applied to BL terminal 74, a potential of about −1.2 volts is applied to the selected WL terminal 70, about +3.0 volts is applied to the passing WL terminals 70, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to unselected (but not passing) WL terminal 70 (not shown in FIG. 23B), and about 0.0 volts is applied to substrate terminal 78. FIG. 23A shows the bias conditions for the selected and passing memory cells in selected memory string 500, while FIG. 23B shows the bias conditions for the selected and unselected memory cells in memory array 80, where memory cell 50c is the selected cell. However, these voltage levels may vary.

Under these bias conditions, a negative voltage will be applied to the gate 60 of the selected cell 50c, while a positive voltage applied to the BL terminal 74 will be passed to the region 20c of the selected cell 50c, and zero voltage applied to the SL terminal 72 will be passed to the region 20b of the selected cell 50c. This condition is similar to the condition described in FIG. 11A, which will result in hole injection to the floating body 24 of the cell 50c.

Figure 24A:
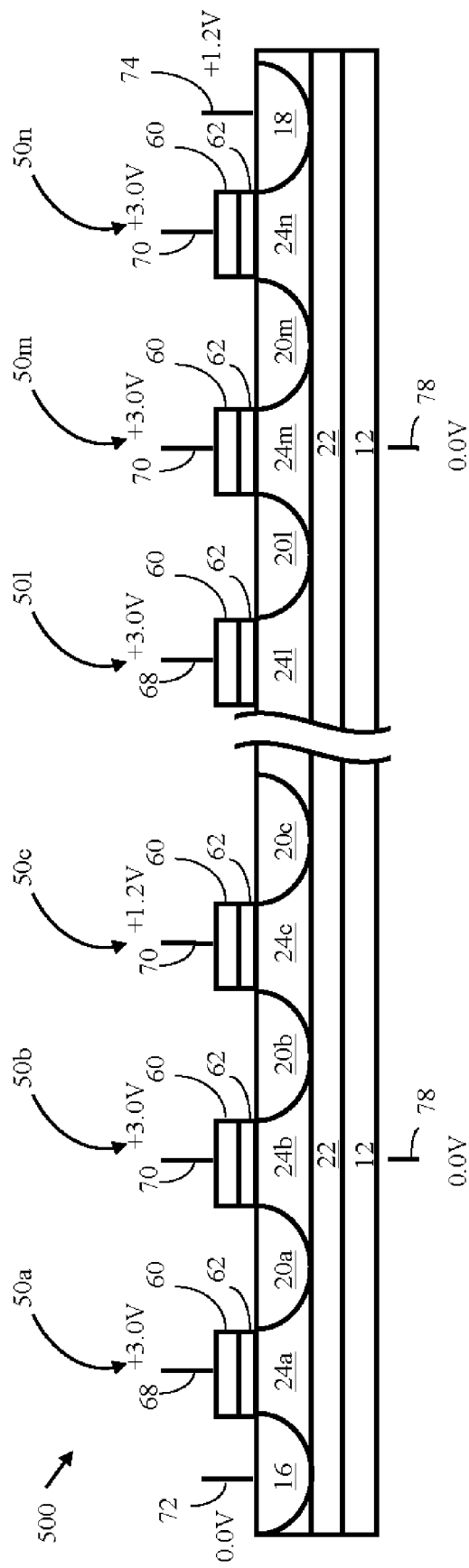
FIGS. 24A-24B illustrate bias conditions during an impact ionization write "1" operation according to an embodiment of the present invention.
Figure 24B:
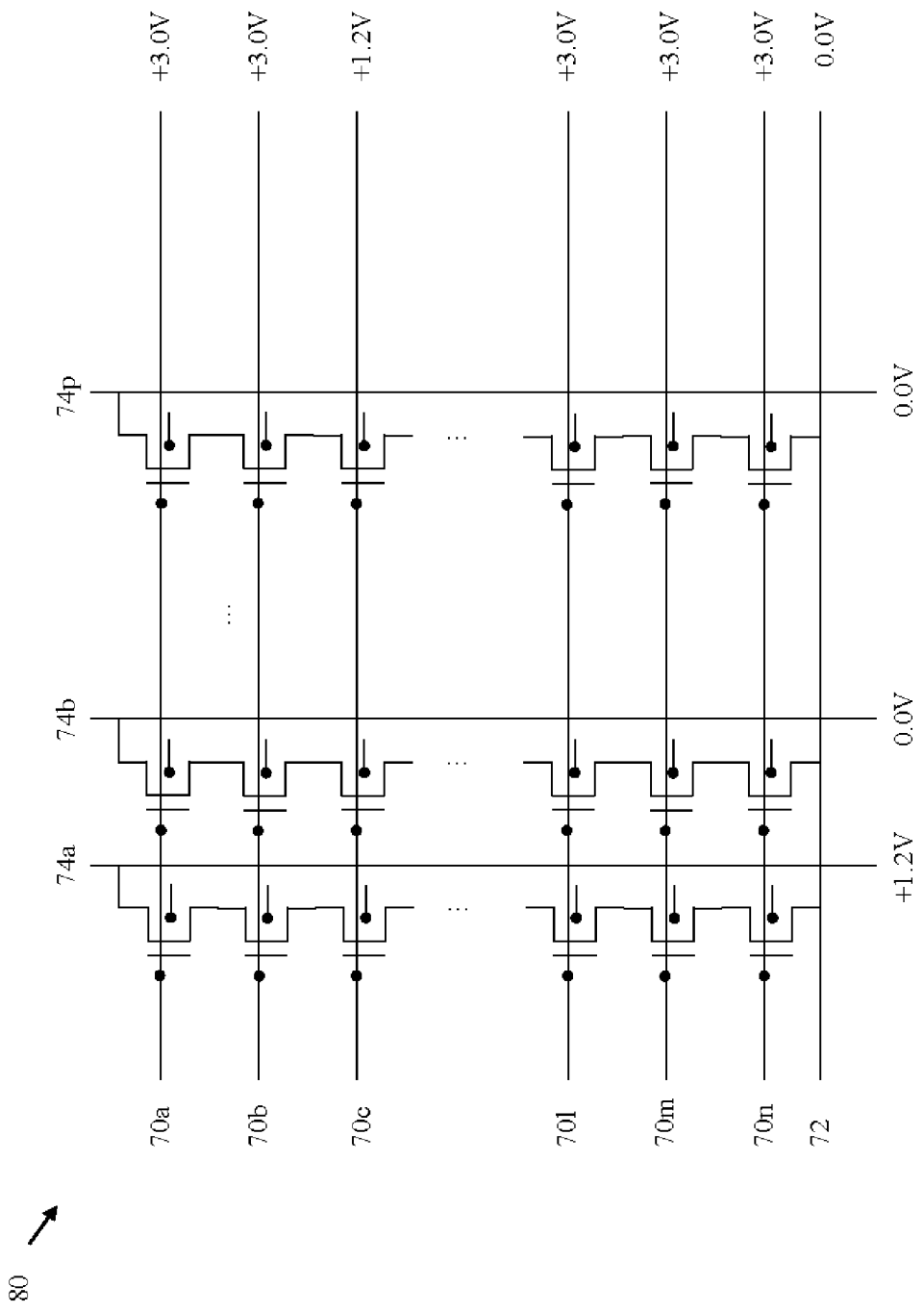

An example of the bias conditions of the selected memory cell 50 under an impact ionization write "1" operation is illustrated in FIGS. 24A-24B. A positive bias is applied to the selected WL terminal 70, a positive voltage more positive than the positive voltage applied to the selected WL terminal 70 is applied to the passing WL terminals 70, zero voltage is applied to the SL terminal 72 (both the selected SL terminal 72 as well as all other SL terminals 72), and a positive bias is applied to the selected BL terminal 74 (zero voltage is applied to the unselected BL terminals 74), while the substrate terminal 78 is grounded. These conditions cause hole injection to the floating body 24 of the selected memory cell (e.g. cell 50c in FIGS. 24A-24B).

In one particular non-limiting embodiment, the following bias conditions are applied to the selected memory string 500: a potential of about 0.0 volts is applied to SL terminal 72, a potential of about +1.2 volts is applied to BL terminal 74, a potential of about +1.2 volts is applied to the selected WL terminal 70, about +3.0 volts is applied to the passing WL terminals 70, and about 0.0 volts is applied to substrate terminal 78; while the following bias conditions are applied to the unselected terminals (i.e., terminals in strings other than the string that the selected cell is in): about 0.0 volts is applied to SL terminal 72, about 0.0 volts is applied to BL terminal 74, a potential of about 0.0 volts is applied to WL terminal 70 (not shown in FIG. 24B), and about 0.0 volts is applied to substrate terminal 78. FIG. 24A shows the bias conditions for the selected and passing memory cells in selected memory string 500, while FIG. 24B shows bias conditions for selected and unselected memory cells in memory array 80 (with memory cell 50c as the selected cell). However, these voltage levels may vary.

A multi-level write operation can be performed using an alternating write and verify algorithm, where a write pulse is first applied to the memory cell 50, followed by a read operation to verify if the desired memory state has been achieved. If the desired memory state has not been achieved, another write pulse is applied to the memory cell 50, followed by another read verification operation. This loop is repeated until the desired memory state is achieved.

For example, using band-to-band hot hole injection, a positive voltage is applied to BL terminal 74, zero voltage is applied to SL terminal 72, a negative voltage is applied to the selected WL terminal 70, a positive voltage is applied to the passing WL terminals, and zero voltage is applied to the substrate terminal 78. Positive voltages of different amplitudes are applied to BL terminal 74 to write different states to floating body 24. This results in different floating body potentials 24 corresponding to the different positive voltages or the number of positive voltage pulses that have been applied to BL terminal 74. In one particular non-limiting embodiment, the write operation is performed by applying the following bias conditions: a potential of about 0.0 volts is applied to SL terminal 72, a potential of about −1.2 volts is applied to the selected WL terminal 70, about +3.0 volts is applied to the passing WL terminals, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever state of states 00, 01, 10 or 11 is desired is achieved), then the multi write operation is concluded. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

Figure 25A:
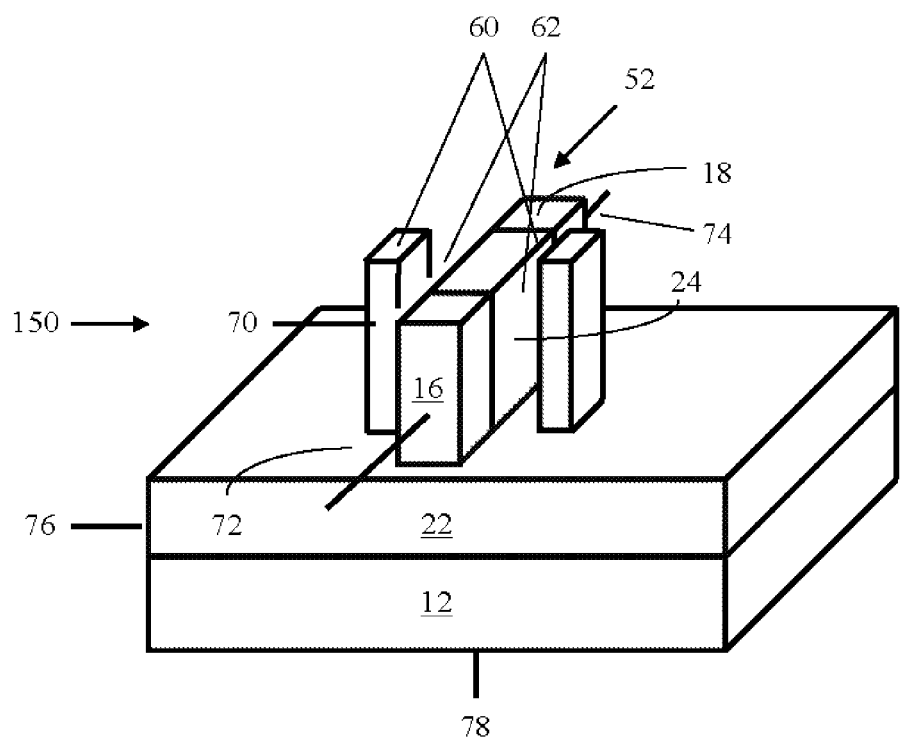
FIG. 25A schematically illustrates a fin-type, three-dimensional memory cell according to an embodiment of the present invention.
Figure 25B:
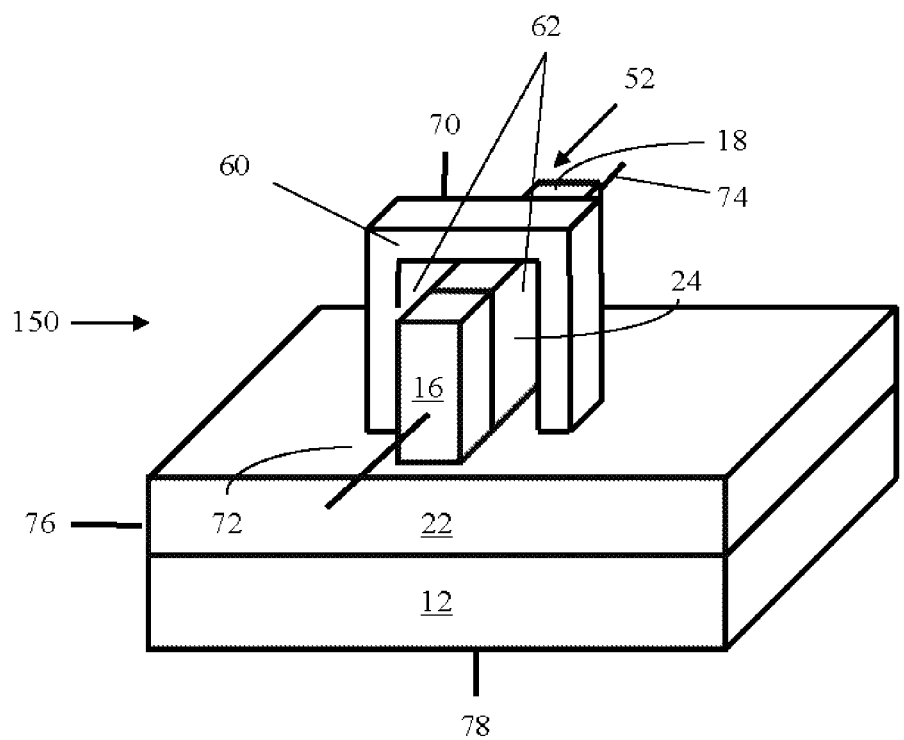
FIG. 25B schematically illustrates a fin-type, three-dimensional memory cell according to another embodiment of the present invention.

The string 500 may be provided as planar cells, such as the embodiments described above with reference to FIGS. 1 and 16A, or may be provided as fin-type, three-dimensional cells, such as those illustrated in FIGS. 25A-25B, for example. Other variations, modifications and alternative cells 50 may be provided without departing from the scope of the present invention and its functionality.

Figure 26:
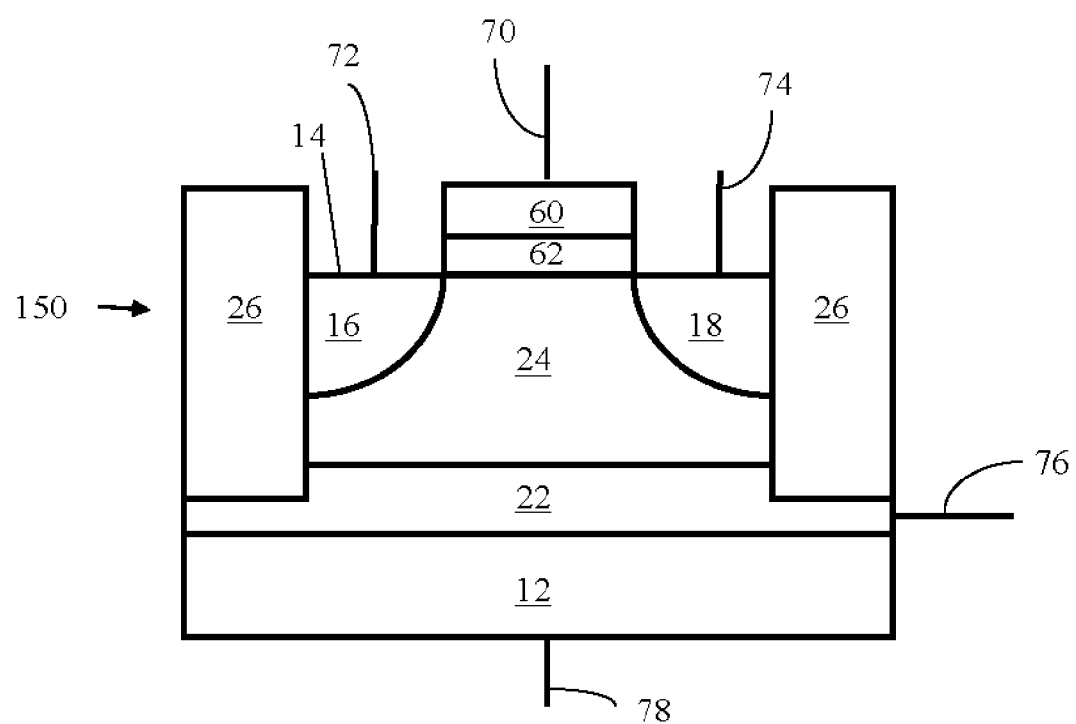
FIG. 26 schematically illustrates a memory cell fabricated on a bulk substrate according to an embodiment of the present invention.

Referring now to FIG. 26, a memory cell 150 according to an embodiment of the present invention is shown. The cell 150 is fabricated on a bulk substrate 12 having a first conductivity type (such as p-type conductivity). A buried layer 22 of a second conductivity type (such as n-type conductivity) is also provided in the substrate 12 and buried in the substrate 12, as shown. Buried layer 22 may be formed by an ion implantation process on the material of substrate 12. Alternatively, buried layer 22 can be grown epitaxially.

A first region 16 having the second conductivity type is provided in substrate 12 and first region 16 is exposed at surface 14. A second region 18 having the second conductivity type is also provided in substrate 12, is also exposed at surface 14 and is spaced apart from the first region 16. First and second regions 16 and 18 may be formed by an implantation process formed on the material making up substrate 12, according to any of implantation processes known and typically used in the art. Alternatively, a solid state diffusion process can be used to form first and second regions 16 and 18.

A floating body region 24 having a first conductivity type, such as p-type conductivity type, is bounded by surface 14, first and second regions 16, 18, insulating layers 26, and buried layer 22. Insulating layers 26 (e.g., shallow trench isolation (STI)), may be made of silicon oxide, for example. Insulating layers 26 insulate cell 150 from neighboring cells 150 when multiple cells 150 are joined in an array 180. The floating body region 24 can be formed by an implantation process formed on the material making up substrate 12, or can be grown epitaxially. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Cell 150 further includes word line (WL) terminal 70 electrically connected to gate 60, source line (SL) terminal 72 electrically connected to region 16, bit line (BL) terminal 74 electrically connected to region 18, buried well (BW) terminal 76 connected to buried layer 22, and substrate terminal 78 electrically connected to substrate 12 at a location beneath insulator 22.

The operation of a memory cell 150 has been described for example in Ranica et al., "Scaled 1T-Bulk Devices Built with CMOS 90 nm Technology for Low-cost eDRAM Applications", pp. 38-41, Tech. Digest, Symposium on VLSI Technology, 2005 and application Ser. No. 12/797,334, titled "Method of Maintaining the State of Semiconductor Memory Having Electrically Floating Body Transistor", both of which are hereby incorporated herein, in their entireties, by reference thereto.

Memory cell states are represented by the charge in the floating body 24. If cell 150 has holes stored in the floating body region 24, then the memory cell 150 will have a lower threshold voltage (gate voltage where transistor is turned on) compared to when cell 150 does not store holes in floating body region 24.

Figure 27A:
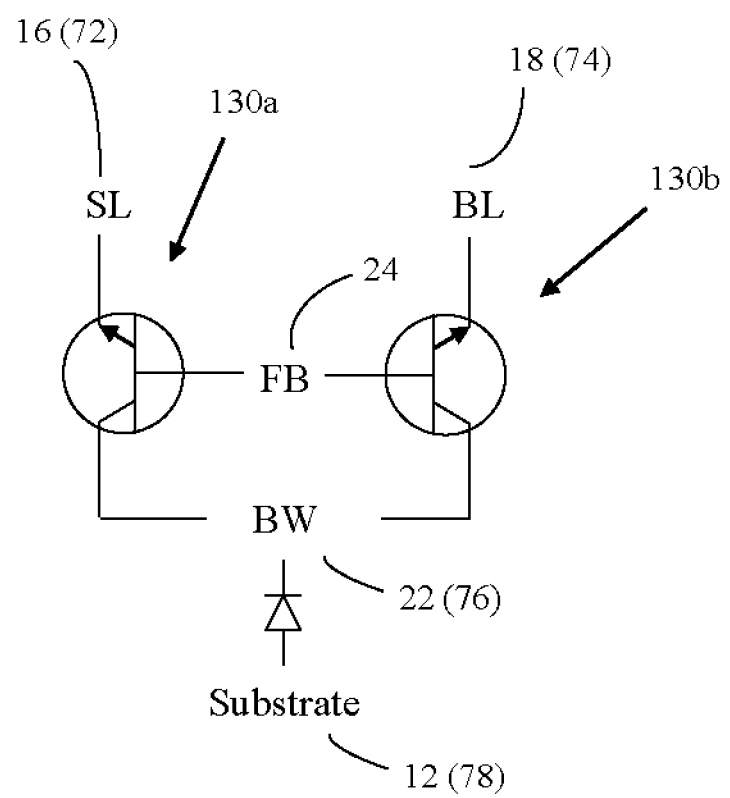
FIG. 27A schematically illustrates n-p-n bipolar devices formed by the buried well region, floating body, and SL and BL regions of the memory cell of FIG. 26 according to an embodiment of the present invention.

As shown in FIG. 27A, inherent in this embodiment of the memory cell 150 are n-p-n bipolar devices 130a, 130b formed by buried well region 22, floating body 24, and SL and BL regions 16, 18. A holding operation can be performed by utilizing the properties of the n-p-n bipolar devices 130a, 130b through the application of a positive back bias to the BW terminal 76 while grounding terminal 72 and/or terminal 74. If floating body 24 is positively charged (i.e. in a state "1"), the bipolar transistor 130a formed by SL region 16, floating body 24, and buried well region 22 and bipolar transistor 130b formed by BL region 18, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar devices 130a, 130b formed by buried well layer 22, floating region 24, and regions 16/18 to be a low-gain bipolar device, where the bipolar gain is defined as the ratio of the collector current flowing out of BW terminal 76 to the base current flowing into the floating region 24.

For memory cells in state "0" data, the bipolar devices 130a, 130b will not be turned on, and consequently no base hole current will flow into floating region 24. Therefore, memory cells in state "0" will remain in state "0".

An example of the bias conditions applied to cell 150 to carry out a holding operation includes: zero voltage is applied to BL terminal 74, zero voltage is applied to SL terminal 72, zero or negative voltage is applied to WL terminal 70, a positive voltage is applied to the BW terminal 76, and zero voltage is applied to substrate terminal 78. In one particular non-limiting embodiment, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. However, these voltage levels may vary.

Figure 27B:
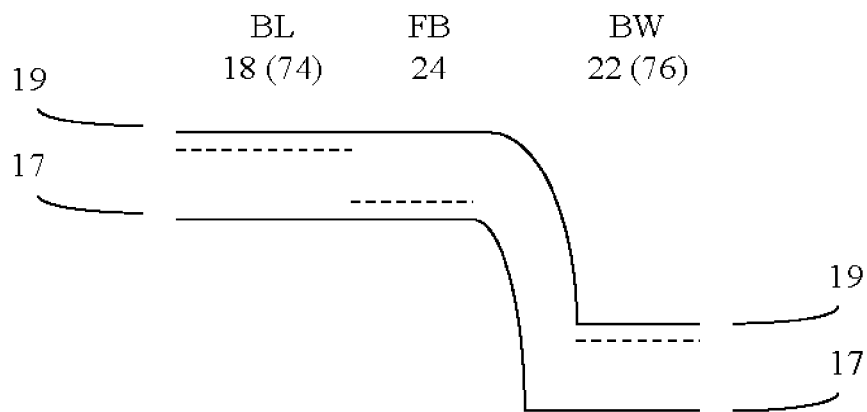
FIG. 27B shows an energy band diagram of the intrinsic n-p-n bipolar device of the cell of FIG. 26 when the floating body region is positively charged and a positive bias voltage is applied to the buried well region according to an embodiment of the present invention.

FIG. 27B shows an energy band diagram of the intrinsic n-p-n bipolar device 130 when the floating body region 24 is positively charged and a positive bias voltage is applied to the buried well region 22. The dashed lines indicate the Fermi levels in the various regions of the n-p-n transistor 130. The Fermi levels are located in the band gap between the solid line 17 indicating the top of the valance band (the bottom of the band gap) and the solid line 19 indicating the bottom of the conduction band (the top of the band gap). The positive charge in the floating body region 24 lowers the energy barrier of electron flow into the floating body region 24 (i.e., the base region of the n-p-n bipolar device). Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 to its maximum level and will maintain the charge stored in the floating body region 24 which will keep the n-p-n bipolar transistor 130 on for as long as a positive bias is applied to the buried well region 22 through BW terminal 76.

If floating body 24 is neutrally charged (the voltage on floating body 24 being equal to the voltage on grounded bit line region 16), a state corresponding to state "0", the bipolar device will not be turned on, and consequently no base hole current will flow into floating region 24. Therefore, memory cells in the state "0" will remain in the state "0".

Figure 27C:
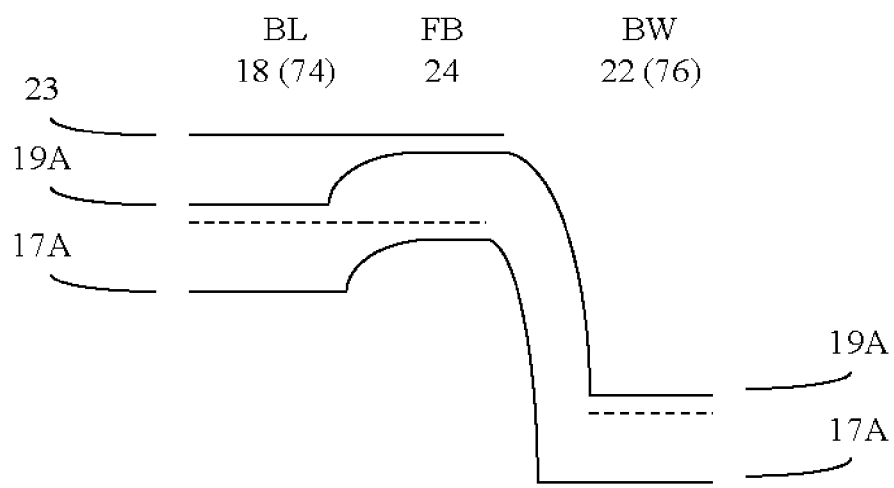
FIG. 27C shows an energy band diagram of the intrinsic n-p-n bipolar device of the cell of FIG. 26 when the floating body region 24 is neutrally charged and a bias voltage is applied to the buried well region according to an embodiment of the present invention.

FIG. 27C shows an energy band diagram of the intrinsic n-p-n bipolar device 130 when the floating body region 24 is neutrally charged and a bias voltage is applied to the buried well region 22. In this state the energy level of the band gap bounded by solid lines 17A and 19A is different in the various regions of n-p-n bipolar device 130. Because the potential of the floating body region 24 and the bit line region 16 are equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 130 will remain off.

Although the embodiment discussed in FIGS. 27A through 27C refers to bipolar devices 130 as n-p-n transistors, persons of ordinary skill in the art will readily appreciate that by reversing the first and second connectivity types and inverting the relative values of the applied voltages memory cell 150 could include a bipolar device 130 which is a p-n-p transistor. Thus the choice of an n-p-n transistor as an illustrative example for simplicity of explanation in FIGS. 27A through 27C is not limiting in any way. In addition, the discussions in regard to FIGS. 27A-27C use bipolar device 130b formed by bit line region 18, floating body region 24, and buried well region 22, and the same principles also apply to bipolar device 130a formed by source line region 16, floating body region 24 and buried well region 22.

The charge stored in the floating body 24 can be sensed by monitoring the cell current of the memory cell 150. If cell 150 is in a state "1" having holes in the floating body region 24, then the memory cell will have a lower threshold voltage (gate voltage where the transistor is turned on), and consequently a higher cell current (e.g. current flowing from BL to SL terminals), compared to if cell 150 is in a state "0" having no holes in floating body region 24. Examples of the read operation is described in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003; Ohsawa et al., "An 18.5 ns 128 Mb SOI DRAM with a Floating body Cell", pp. 458-459, 609, IEEE International Solid-State Circuits Conference, 2005; and U.S. Pat. No. 7,301,803 "Bipolar reading technique for a memory cell having an electrically floating body transistor", which are hereby incorporated herein, in their entireties, by reference thereto.

Figure 28:
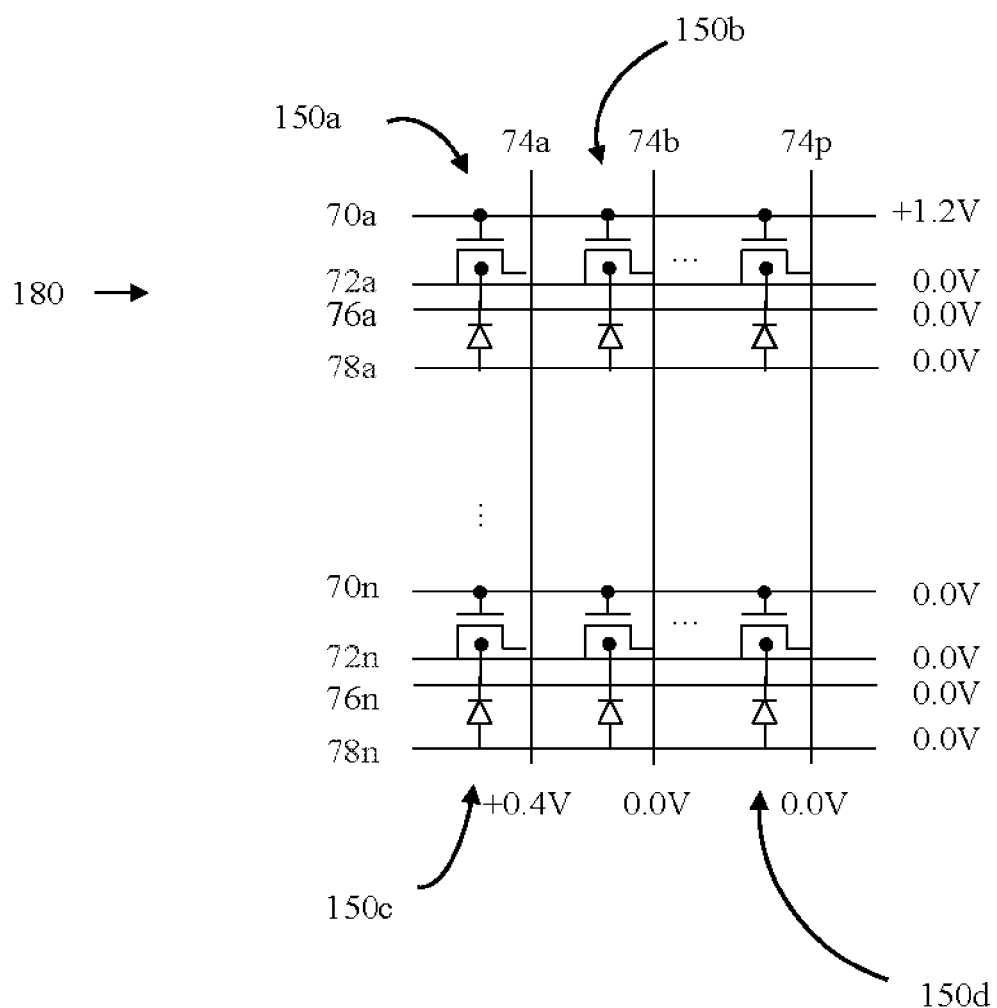
FIG. 28 schematically illustrates bias conditions on memory cells during a read operation of a selected memory cell according to an embodiment of the present invention.

A read operation can be performed on cell 150 by applying the following bias conditions: zero voltage is applied to the BW terminal 76, zero voltage is applied to SL terminal 72, a positive voltage is applied to the selected BL terminal 74, and a positive voltage greater than the positive voltage applied to the selected BL terminal 74 is applied to the selected WL terminal 70, while zero voltage is applied to substrate terminal 78. When cell 150 is in an array 180 of cells 150 (e.g., see FIG. 28), the unselected BL terminals 74 will remain at zero voltage and the unselected WL terminals 70 will remain at zero or negative voltage. In one particular non-limiting embodiment, about 0.0 volts is applied to terminal 72, about +0.4 volts is applied to the selected terminal 74a, about +1.2 volts is applied to the selected terminal 70a, about 0.0 volts is applied to terminal 76, and about 0.0 volts is applied to terminal 78, as illustrated in FIG. 28.

A write "0" operation of the cell 150 is now described with reference to FIG. 29. In this example, to write "0" to cell 150, a negative bias is applied to SL terminal 72, zero voltage is applied to BL terminal 74, zero or negative voltage is applied to WL terminal 70, zero or positive voltage is applied to BW terminal 76, and zero voltage is applied to substrate terminal 78. The SL terminal 72 for the unselected cells 150 that are not commonly connected to the selected cell 150a will remain grounded. Under these conditions, the p-n junctions (junction between 24 and 16) are forward-biased, evacuating any holes from the floating body 24. In one particular non-limiting embodiment, about −1.2 volts is applied to terminal 72, about 0.0 volts is applied to terminal 74, about 0.0 volts is applied to terminal 70, about 0.0 volts is applied to terminal 76, and about 0.0 volts is applied to terminal 78. However, these voltage levels may vary, while maintaining the relative relationships between the charges applied, as described above. Under these conditions, all memory cells sharing the same SL terminal 72 will be written into state "0".

A write "0" operation can also be performed by applying a negative bias to the BL terminal 74 as opposed to the SL terminal 72. The SL terminal 72 will be grounded, while zero or positive voltage is applied to BW terminal 76, zero voltage is applied to the substrate terminal 78, and zero or negative voltage is applied to the WL terminal 70. Under these conditions, all memory cells sharing the same BL terminal 74 will be written into state "0".

Figure 29:
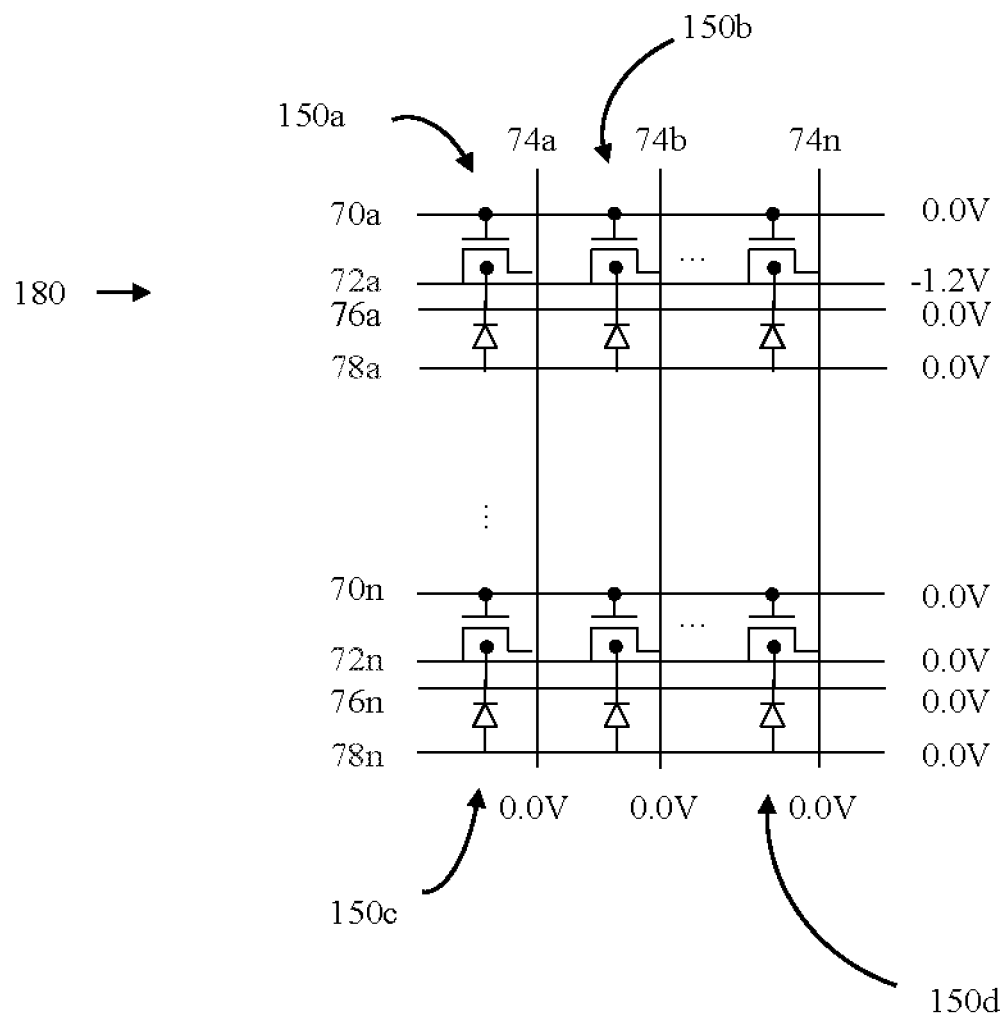
FIG. 29 schematically illustrates bias conditions on memory cells during a write "0" operation according to an embodiment of the present invention.

The write "0" operations referred to above with regard to FIG. 29 have a drawback in that all memory cells 150 sharing either the same SL terminal 72 or the same BL terminal 74 will be written to simultaneously and as a result, these operations do not allow individual bit writing, i.e. writing to a single cell 150 memory bit. To write multiple data to different memory cells 150, write "0" is first performed on all the memory cells, followed by write "1" operations on a selected bit or selected bits.

Figure 30:
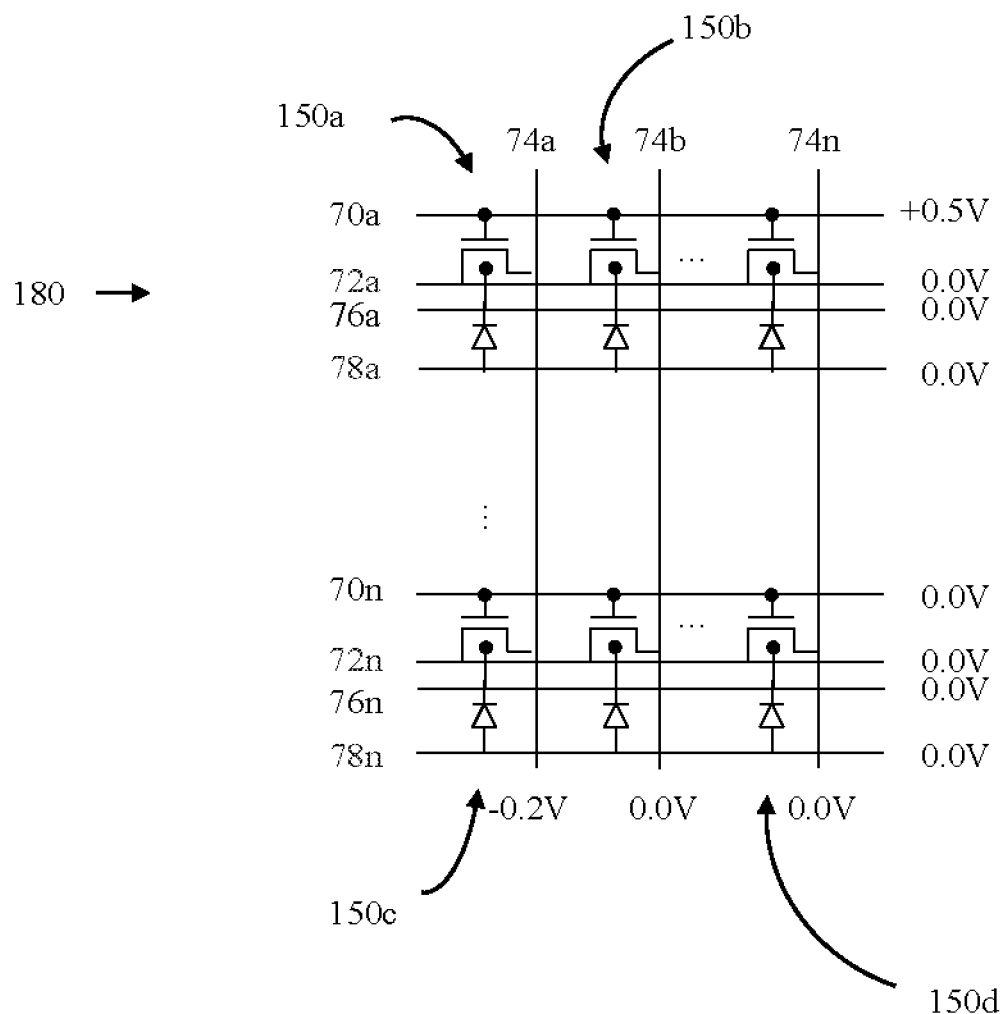
FIG. 30 schematically illustrates bias conditions on memory cells during a write "0" operation according to another embodiment of the present invention.

An alternative write "0" operation, which, unlike the previous write "0" operations described above with regard to FIG. 29, allows for individual bit write, can be performed by applying a positive voltage to WL terminal 70, a negative voltage to BL terminal 74, zero or positive voltage to SL terminal 72, zero or positive voltage to BW terminal 76, and zero voltage to substrate terminal 78, an example of which is illustrated in FIG. 30. Under these conditions, the floating body 24 potential will increase through capacitive coupling from the positive voltage applied to the WL terminal 70. As a result of the floating body 24 potential increase and the negative voltage applied to the BL terminal 74, the p-n junction (junction between 24 an 18) is forward-biased, evacuating any holes from the floating body 24. The applied bias to selected WL terminal 70 and selected BL terminal 74 can potentially affect the states of the unselected memory cells 150 sharing the same WL or BL terminal as the selected memory cell 150. To reduce undesired write "0" disturb to other memory cells 150 in the memory array 180, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. This will minimize the floating body 24 potential change in the unselected cells 150 in state "1" sharing the same BL terminal as the selected cell 150 from $V_{FB1}$ to $V_{FB1}/2$. For memory cells 150 in state "0" sharing the same WL terminal as the selected cell 150, unless the increase in floating body 24 potential is sufficiently high (i.e., at least $V_{FB}/3$, see below), then both n-p-n bipolar devices 130a and 130b will not be turned on, or so that the base hold current is low enough that it does not result in an increase of the floating body 24 potential over the time during which the write operation is carried out (write operation time). It has been determined according to the present invention that a floating body 24 potential increase of $V_{FB}/3$ is low enough to suppress the floating body 24 potential increase. A positive voltage can be applied to SL terminal 72 to further reduce the undesired write "0" disturb on other memory cells 150 in the memory array. The unselected cells will remain at holding state, i.e. zero or negative voltage applied to WL terminal 70 and zero voltage applied to BL terminal 74.

In one particular non-limiting embodiment, for the selected cell 150 a potential of about 0.0 volts is applied to terminal 72, a potential of about −0.2 volts is applied to terminal 74, a potential of about +0.5 volts is applied to terminal 70, about 0.0 volts is applied to terminal 76, and about 0.0 volts is applied to terminal 78. For the unselected cells not sharing the same WL terminal or BL terminal with the selected memory cell 150, about 0.0 volts is applied to terminal 72, about 0.0 volts is applied to terminal 74, about 0.0 volts is applied to terminal 70, about 0.0 volts is applied to terminal 76, and about 0.0 volts is applied to terminal 78. FIG. 30 shows the aforementioned bias conditions for the selected memory cell 150 and other cells 150 in the array 180. However, these voltage levels may vary.

A write "1" operation can be performed on memory cell 150 through impact ionization as described for example in Lin et al., "A New 1T DRAM Cell with Enhanced Floating Body Effect", pp. 23-27, IEEE International Workshop on Memory Technology, Design, and Testing, 2006, which was incorporated by reference above, or a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

Figure 31A:
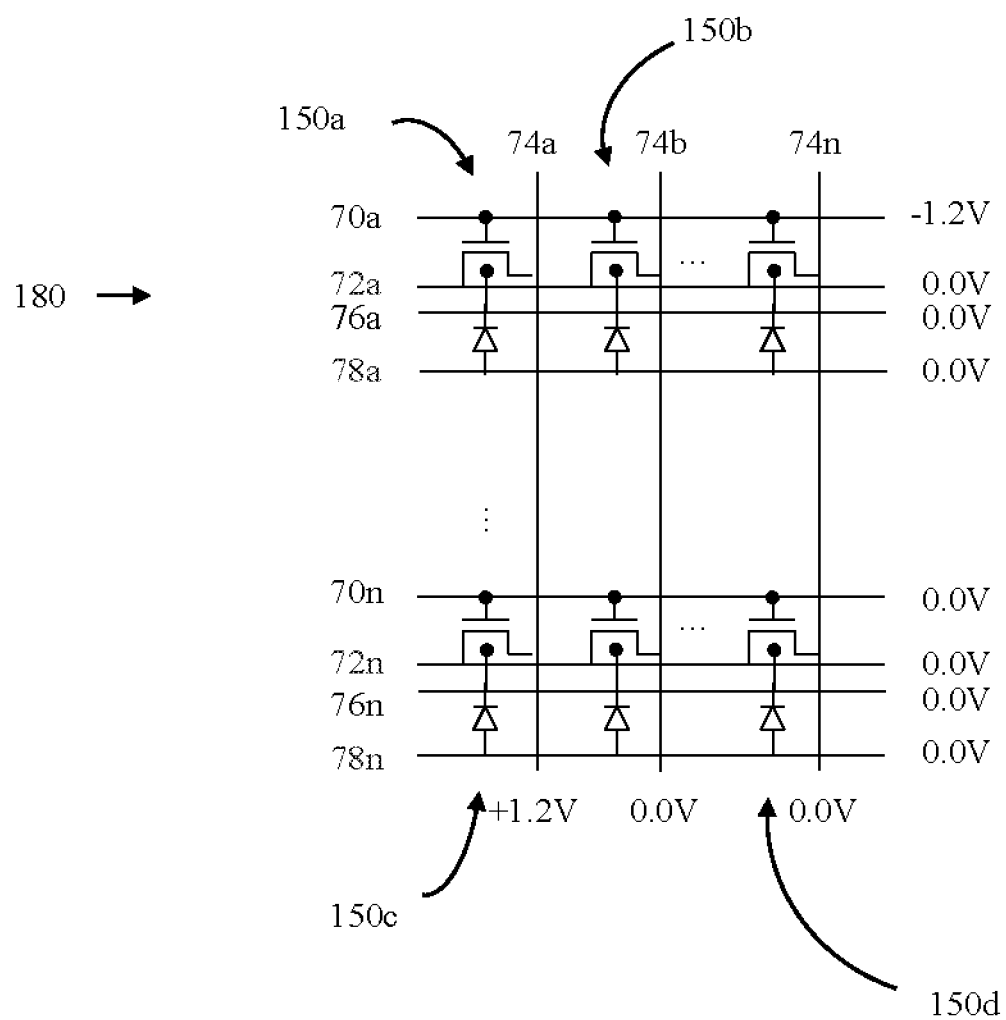
FIG. 31A schematically illustrates an example of bias conditions of a selected memory cell under a band-to-band tunneling write "1" operation according to an embodiment of the present invention.

An example of the bias conditions of the selected memory cell 150 under a band-to-band tunneling write "1" operation is illustrated in FIG. 31A. The negative bias applied to the WL terminal 70 (70a in FIG. 31A) and the positive bias applied to the BL terminal 74 (74a in FIG. 31A) results in hole injection to the floating body 24 of the selected memory cell 150 (150a in FIG. 31A). The SL terminal 72 (72*a* in FIG. 31A) and the substrate terminal 78 (78*a* in FIG. 31A) are grounded during the write "1" operation, while zero or positive voltage can be applied to BW terminal 76 (76*a* in FIG. 31A) (positive voltage can be applied to maintain the resulting positive charge on the floating body 24 as discussed in the holding operation above). The unselected WL terminals 70 (70*n* in FIG. 31A) and unselected BL terminals 74 (74*n* in FIG. 31A) will remain grounded.

In one particular non-limiting embodiment, the following bias conditions are applied to the selected memory cell 150*a*: a potential of about 0.0 volts is applied to SL terminal 72, a potential of about +1.2 volts is applied to BL terminal 74, a potential of about −1.2 volts is applied to WL terminal 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, about 0.0 volts is applied to BW terminal 76 (or +1.2 volts so that unselected cells are in the holding operation) and about 0.0 volts is applied to substrate terminal 78. FIG. 31A shows the bias condition for the selected memory cell 150. However, these voltage levels may vary.

Figure 31B:
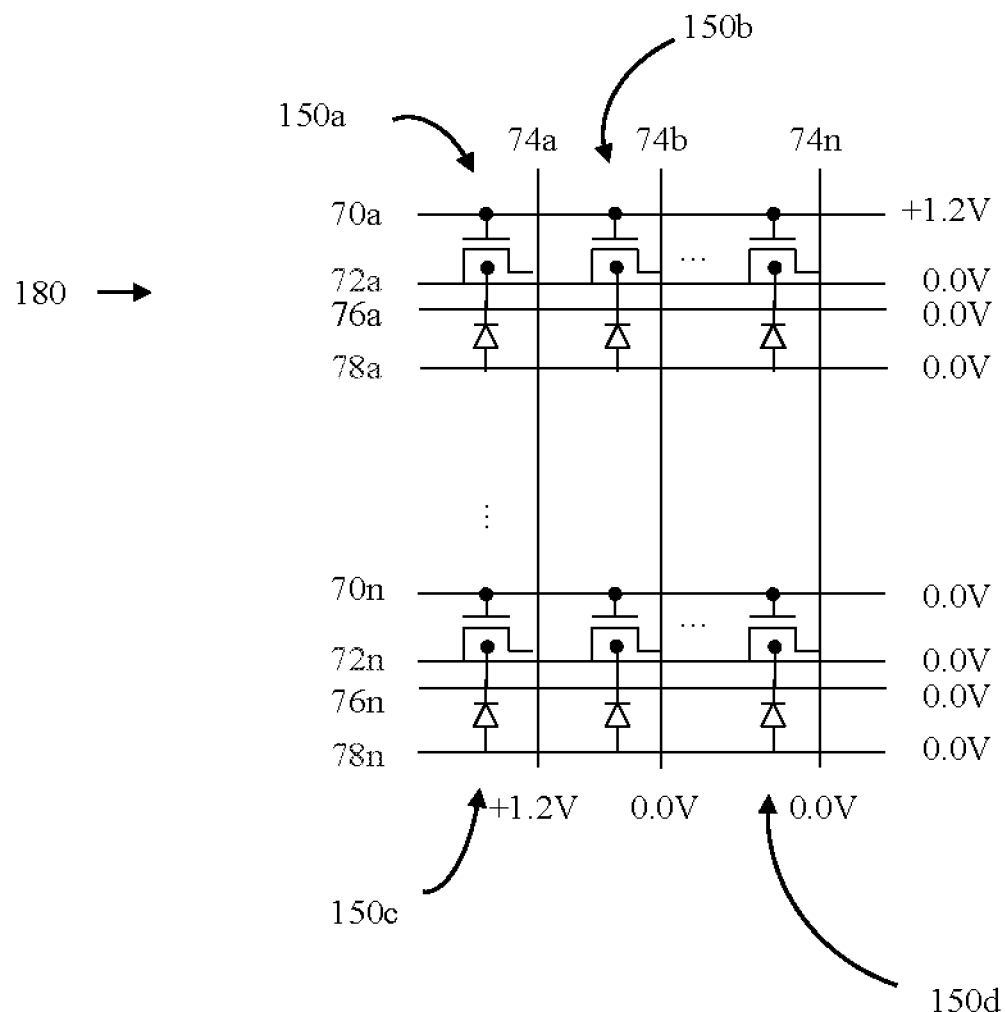
FIG. 31B shows bias conditions of selected and unselected memory cells 150 during an impact ionization write "1" operation according to an embodiment of the present invention.

FIG. 31B shows bias conditions of the selected (150*a*) and unselected (150*b*, 150*c*, 150*d*) memory cells 150 during an impact ionization write "1" operation. A positive voltage is applied to the selected WL terminal 70 (i.e., 70*a* in FIG. 31B) and a positive voltage is applied to the selected BL terminal 74 (i.e., 74*a* in FIG. 31B), with the SL terminal 72 (i.e., 72*a* in FIG. 31B), the BW terminal 76 (i.e., 76*a* in FIG. 31B), and the substrate terminal 78 (i.e., 78*a* in FIG. 31B) are grounded. This condition results in a lateral electric field in the channel region sufficient to create hot electrons, which subsequently create electron and hole pairs, with the holes being subsequently injected to the floating body region 24 of the selected memory cell. The unselected WL terminals 70 and unselected BL terminals 74 are grounded, while the unselected BW terminal can be grounded or a positive voltage can be applied thereto to maintain the states of the unselected cells.

In one particular non-limiting embodiment, the following bias conditions are applied to the selected memory cell 150*a*: a potential of about 0.0 volts is applied to SL terminal 72, a potential of about +1.2 volts is applied to BL terminal 74, a potential of about +1.2 volts is applied to WL terminal 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, about 0.0 volts is applied to BW terminal 76 (or +1.2 volts so that unselected cells are in the holding operation) and about 0.0 volts is applied to substrate terminal 78. FIG. 31B shows the bias conditions for the selected memory cell 150. However, these voltage levels may vary.

Figure 32A:
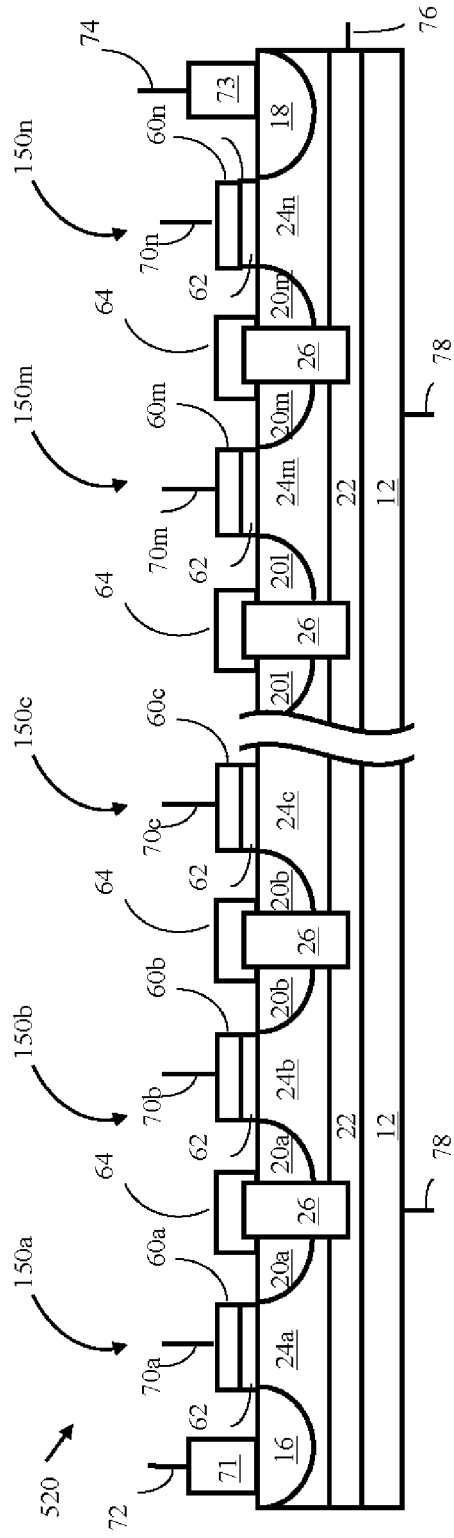
FIG. 32A shows a cross-sectional schematic illustration of a memory string according to an embodiment of the present invention.
Figure 32B:
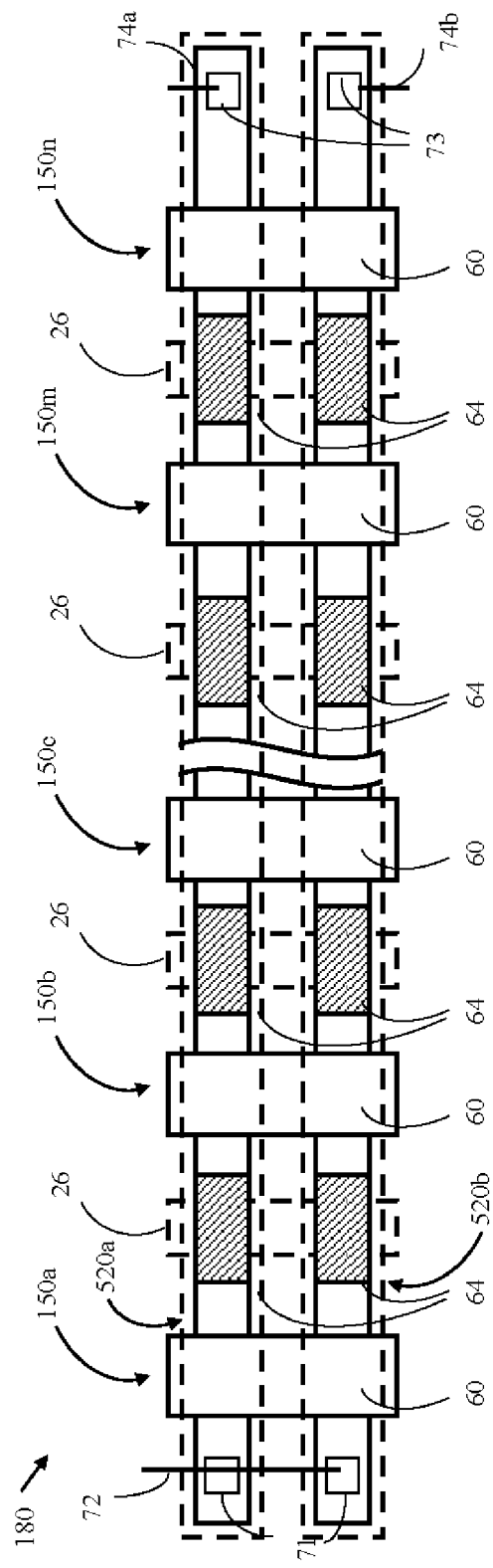
FIG. 32B shows a top view schematic illustration of a memory cell array including two strings of memory cells between the SL terminal and BL terminal according to an embodiment of the present invention.

FIG. 32A shows a cross-sectional schematic illustration of a memory string 520 that includes a plurality of memory cells 150 connected in series, while FIG. 32B shows a top view of a memory cell array 180, which shows two strings of memory cells 520 between the SL terminal 72 and BL terminal 74. Although FIG. 32B schematically illustrates an array of two strings, it should be noted that the present invention is not limited to two strings, as one string, or more than two string can be made in the same manner as described. Each memory string 520 includes a plurality of memory cells 150 connected in a NAND architecture, in which the plurality of memory cells 150 are serially connected to make one string of memory cells. In a series connection, the same current flows through each of the memory cells 150, from the BL terminal 74 to the SL terminal 72, or vice versa. String 520 includes "n" memory cells 150, where "n" is a positive integer, which typically ranges between 8 and 64, and in at least one example, is 16. However, string 520 could have less than eight cells (as low as two) or greater than sixty-four cells. The region 18 of a second conductivity at one end of the memory string is connected to the BL terminal 74, while the source region 16 of a second conductivity at the other end of the memory string is connected to the SL terminal 72.

Each memory cell transistor 150 includes a floating body region 24 of a first conducting type, and first and second regions 20 (corresponding to first and second regions 16 and 18 in the single cell embodiments of cell 150 described above) of a second conductivity type, which are spaced apart from each other and define a channel region. Regions 20 of adjacent memory cells within a string 520 are connected together by the conducting region 64.

A buried layer 22 isolates the floating body region 24 from the bulk substrate 12, while insulating layers 26 isolate the floating body region 24 between adjacent memory cells 150. A gate 60 is positioned above the surface of floating body 24 and is in between the first and second regions 20. An insulating layer 62 is provided between gate 60 and floating body 24 to insulate gate 60 from floating body 24.

Figure 32C:
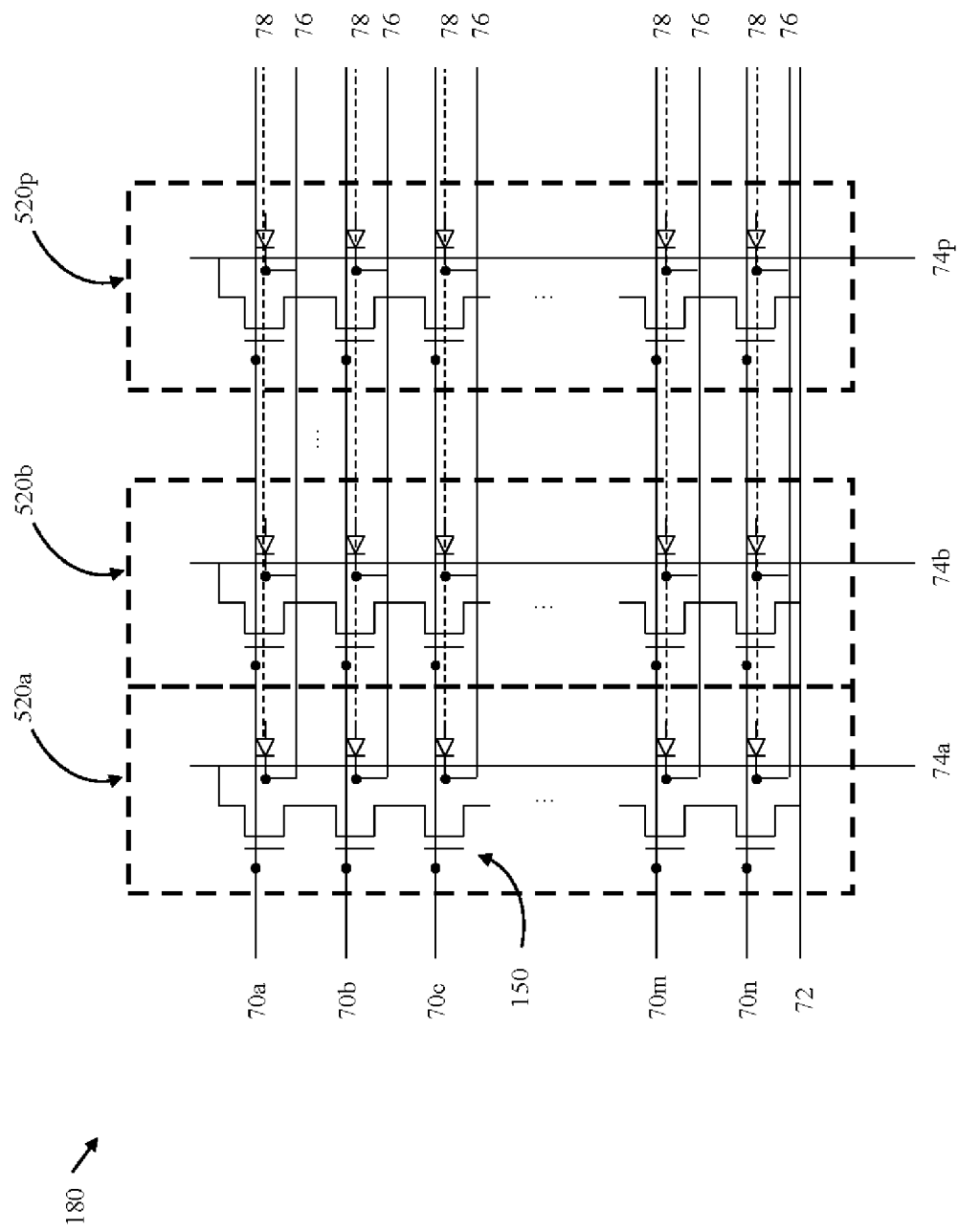
FIG. 32C shows an equivalent circuit representation of a memory array that includes strings shown in FIG. 32B as well as additional strings, in accordance with an embodiment of the present invention.

FIG. 32C shows an equivalent circuit representation of a memory array 180 that includes strings 520*a* and 520*b* as well as additional strings. In FIG. 32C, the memory cells are arranged in a grid, with the rows of the memory array 180 being defined by the WL terminals 70, while the columns are defined by the BL terminals 74. Within each column, multiple memory cells 150 are serially connected forming the string 520. Adjacent columns are separated by columns of isolation, such as shallow trench isolation (STI).

The memory cell operations of memory string 520 will be described as follows. As will be seen, the operation principles of this embodiment of the memory string 520 will follow the operation principles of memory string 500 described above, where the back bias terminal 76 available in memory string 520 can be used to perform holding operation. In some embodiments, the transistors at the end of the string 520 (e.g., cells 150*a* and 150*n* in FIG. 32A) may be configured as access transistors to the memory string 520, wherein the charges stored in the associated floating bodies 24 (floating bodies 24*a* and 24*n* in the example of FIG. 32A) are not read.

Figure 33:
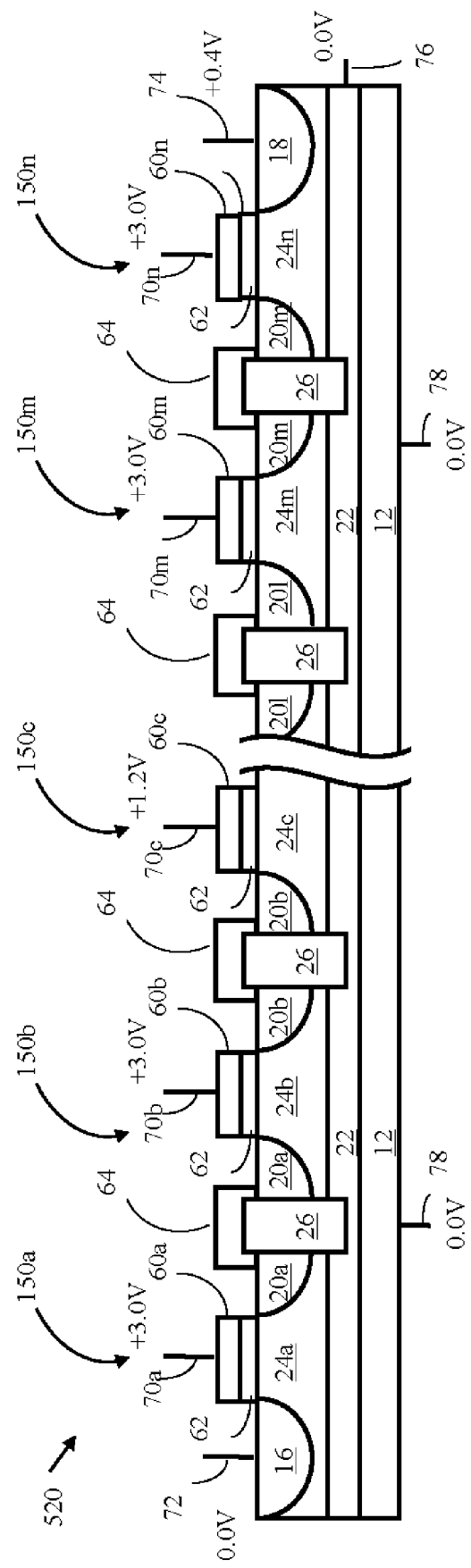
FIG. 33 shows bias conditions on a memory string during a read operation according to an embodiment of the present invention.
Figure 34A:
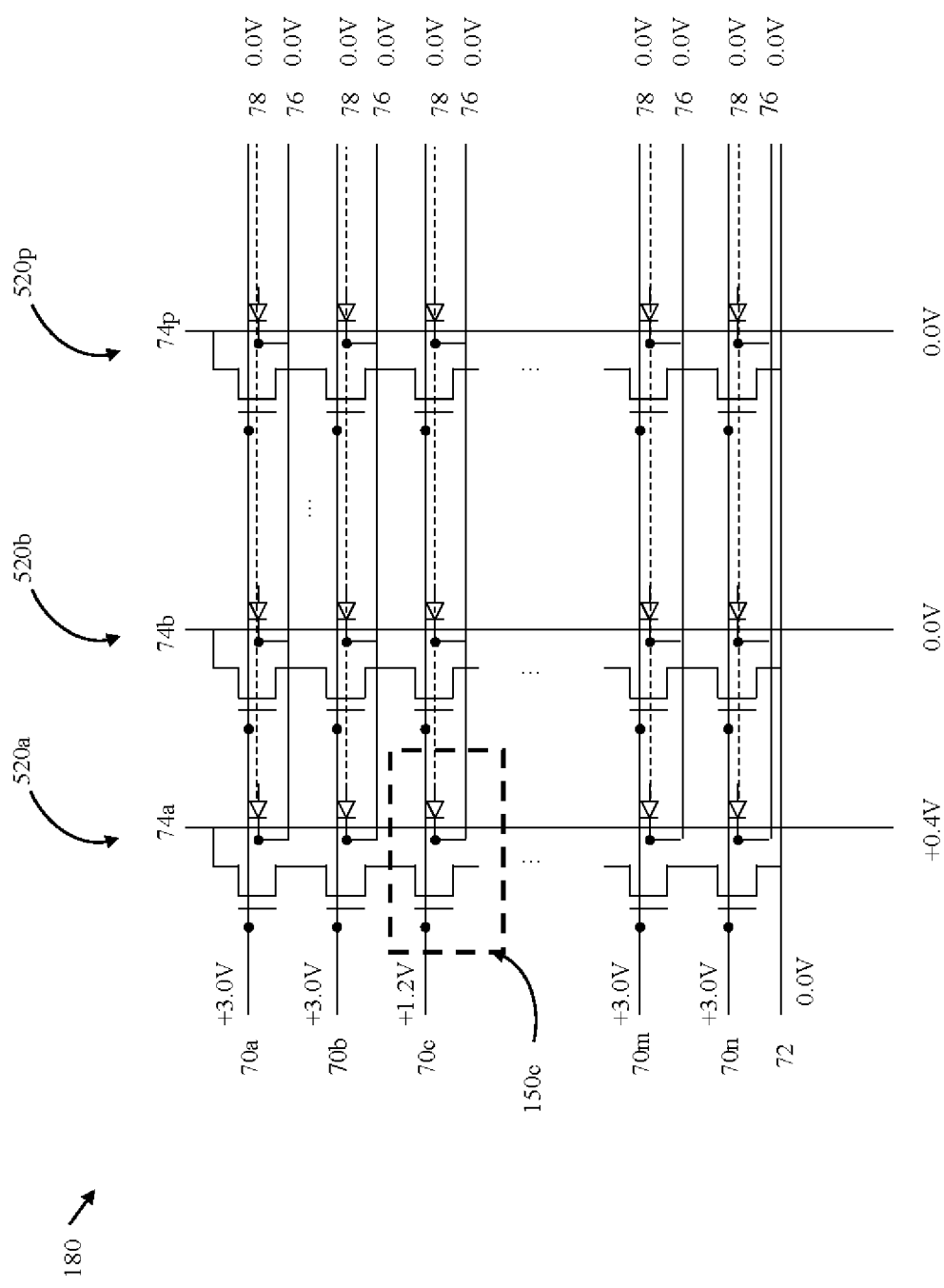
FIG. 34A illustrates bias conditions on a selected memory cell as well as unselected memory cells in the same and in other strings, during a read operation according to an embodiment of the present invention.

A read operation is described with reference to FIGS. 33, 34A and 34B. The read operation can be performed by applying the following bias conditions, where memory cell 150*c* within the memory string 520*a* is being selected (as shown in FIG. 33): a positive voltage is applied to the selected BL terminal 74, and a positive voltage greater than the positive voltage applied to the selected BL terminal 74 is applied to the selected WL terminal 70, zero voltage is applied to the selected SL terminal 72, zero or positive voltage is applied to BW terminal 76, and zero voltage is applied to the substrate terminal 78. The unselected BL terminals 74 will remain at zero voltage and the unselected SL terminals 72 will remain at zero voltage as shown in FIG. 34A. A positive voltage greater than the positive voltage applied to the selected WL terminal 70*c* is applied to passing WL terminals 70*a*, 70*b*, 70*l*, 70*m*, and 70*n* (see FIGS. 33 and 34A-34B). Passing WL terminals are connected to the gates of the passing cells, i.e. the unselected cells which are serially connected to the selected memory cell 150*c* (e.g. memory cells 150*a*, 150*b*, 150*l*, 150m, and 150n in FIG. 33). The voltages applied to the gates of the passing cells are such that the passing transistors are turned on, irrespective of the potentials of their floating body regions. The passing cells need to be turned on because in a series connection, the current flows from the BL terminal 74 to the SL terminal 72 (or vice versa) wherein current flows through each of the memory cells 150. As a result, the passing cells will pass the potentials applied to the SL terminal 72 and BL terminal 74 to the source and drain regions 20b and 20c of the selected cell 150c. For example, the memory cell 150n will pass the voltage applied to the BL terminal 74 to region 20m connected to cell 150n (and 150m), which memory cell 150m will subsequently pass to the region 201 connected to cell 1501, etc. The adjacent passing memory cells sequentially pass the voltage applied to BL terminal 74 until it reaches region 20c of the selected memory cell 50c.

In one particular non-limiting embodiment, the following bias conditions are applied to the selected memory cell 150: a potential of about 0.0 volts is applied to SL terminal 72, a potential of about +0.4 volts is applied to BL terminal 74, a potential of about +1.2 volts is applied to selected WL terminal 70, about +3.0 volts is applied to passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to BW terminal 76 to maintain the states of the unselected memory cells), and about 0.0 volts is applied to substrate terminal 78. FIGS. 34A-34B show the bias conditions for the selected and unselected memory cells in memory array 180. However, these voltage levels may vary.

Under these conditions, about +1.2 volts will be applied to the gate 60c and about 0.0 volts and 0.4 volts will be passed to the regions 20b and 20c of the selected cell 150c, similar to the read condition described in FIG. 28. As described, the passing cells are biased so that their channels are conducting, and therefore the current flowing from the BL terminal 74 and SL terminal 72 of the string 520 is then determined by the potential of the floating body region 24 of the selected cell 150c. If cell 150c is in a state "1" having holes in the floating body region 24, then the memory cell will have a lower threshold voltage (gate voltage where the transistor is turned on), and consequently be conducting a larger current compared to if cell 150 is in a state "0" having no holes in floating body region 24.

Figure 34B:
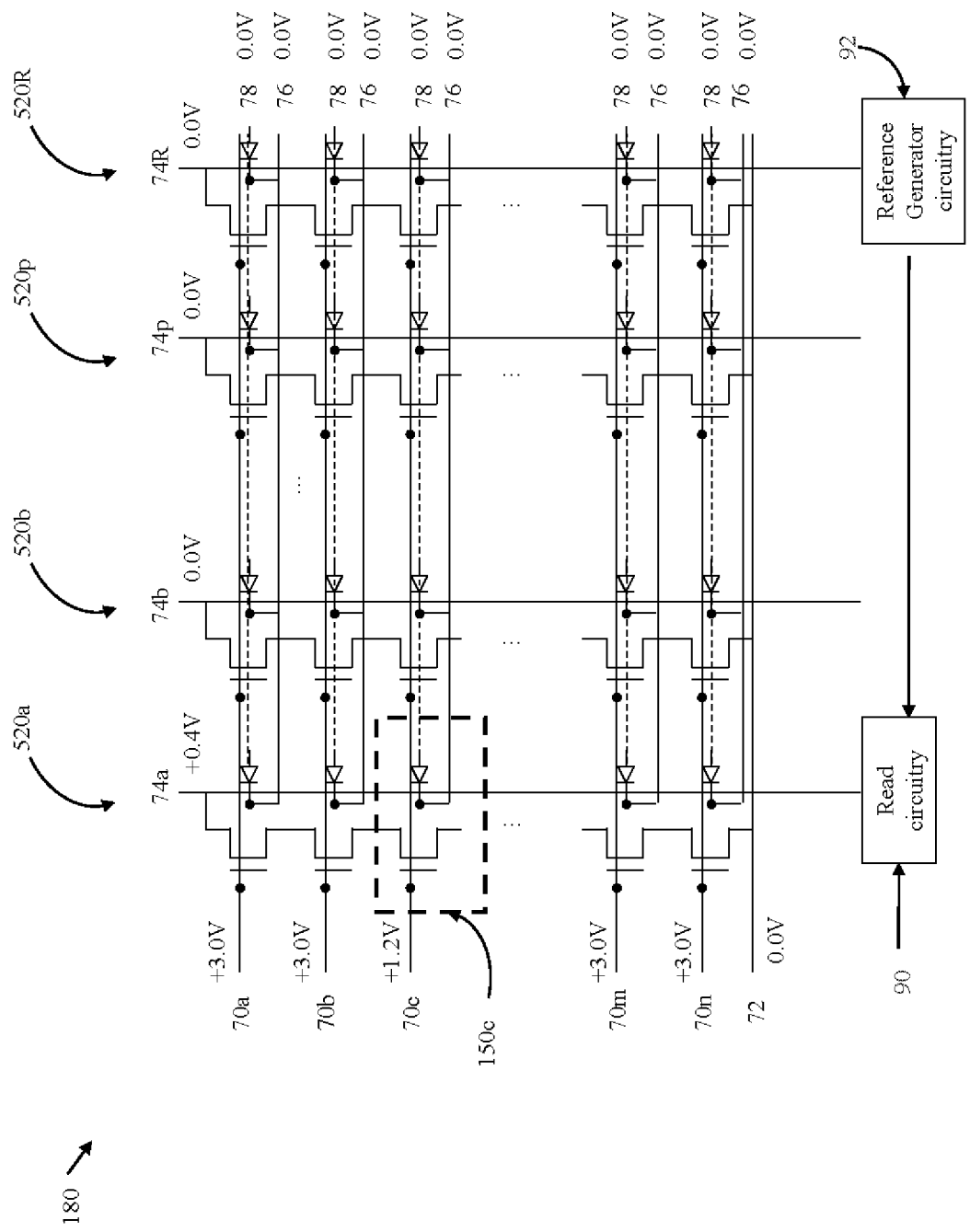
FIG. 34B illustrates the array of FIG. 34A with read circuitry attached to measure or sense the current flow from the BL terminal to the SL terminal in regard to the selected cell, according to an embodiment of the present invention.

The current flow from the BL terminal 74 to SL terminal 72 can then be measured or sensed using a read circuitry 90 attached to BL terminal 74 as illustrated in FIG. 34B. The memory state can then be determined by comparing it with a reference value generated by a reference generator circuitry 92 coupled to a reference cell in memory string 520R as shown in FIG. 34B.

Figure 35:
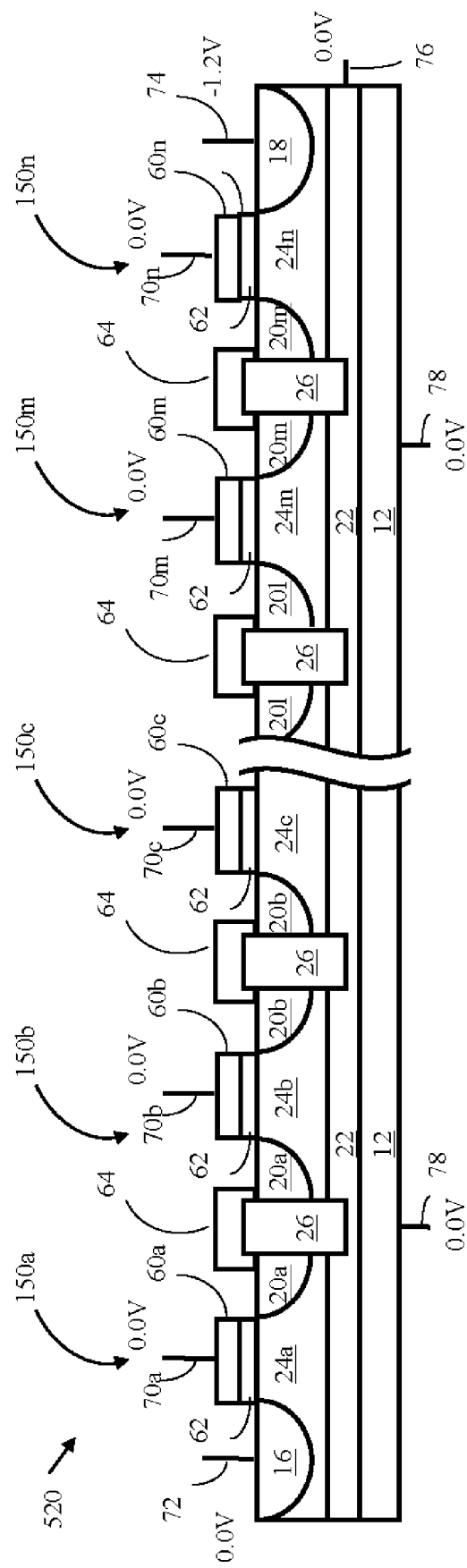
FIG. 35 shows bias conditions on a memory string during a write "0" operation according to an embodiment of the present invention.
Figure 36:
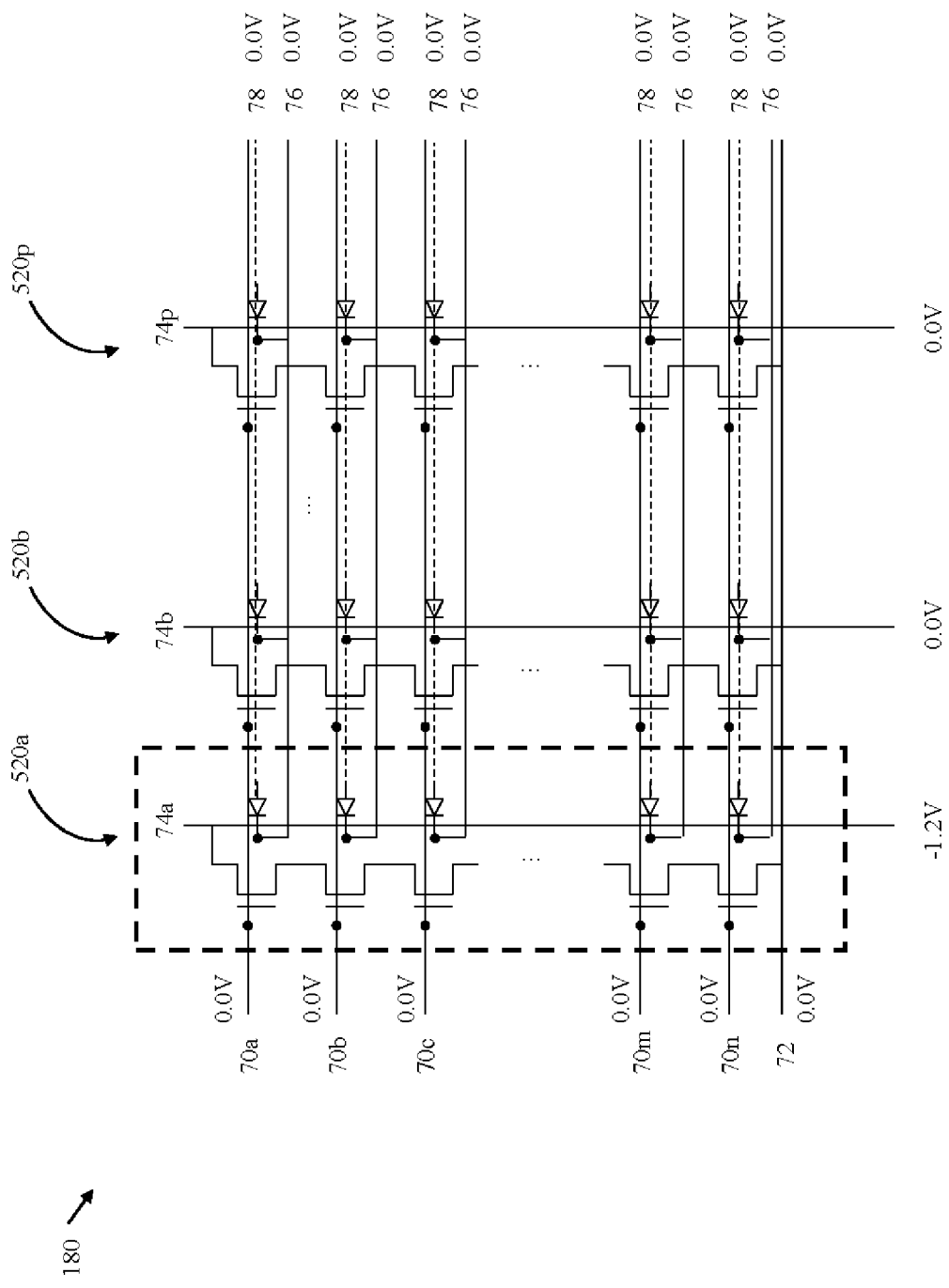
FIG. 36 illustrates bias conditions on a selected memory cell as well as unselected memory cells in the same and in other strings, during a write "0" operation according to an embodiment of the present invention.

A write "0" operation is described with reference to FIGS. 35-36, where the following bias conditions are applied: zero voltage to the SL terminal 72, zero voltage to the WL terminals 70, and negative voltage to the BL terminal 74, while the BW terminal 76 and substrate terminal 78 are grounded. Under these conditions, the p-n junctions between floating body 24 and regions 20 of the memory cells in string 520 are forward-biased, evacuating any holes from the floating bodies 24. In one particular non-limiting embodiment, about −1.2 volts is applied to terminal 74, about 0.0 volts is applied to terminal 70, and about 0.0 volts is applied to terminals 72, 76, and 78. A positive voltage can also be applied to the WL terminals 70 to ensure that the negative voltage applied to the BL terminal 74 is passed to all the memory cells in string 520. However, these voltage levels may vary, while maintaining the relative relationships between the charges applied, as described above.

Figure 37:
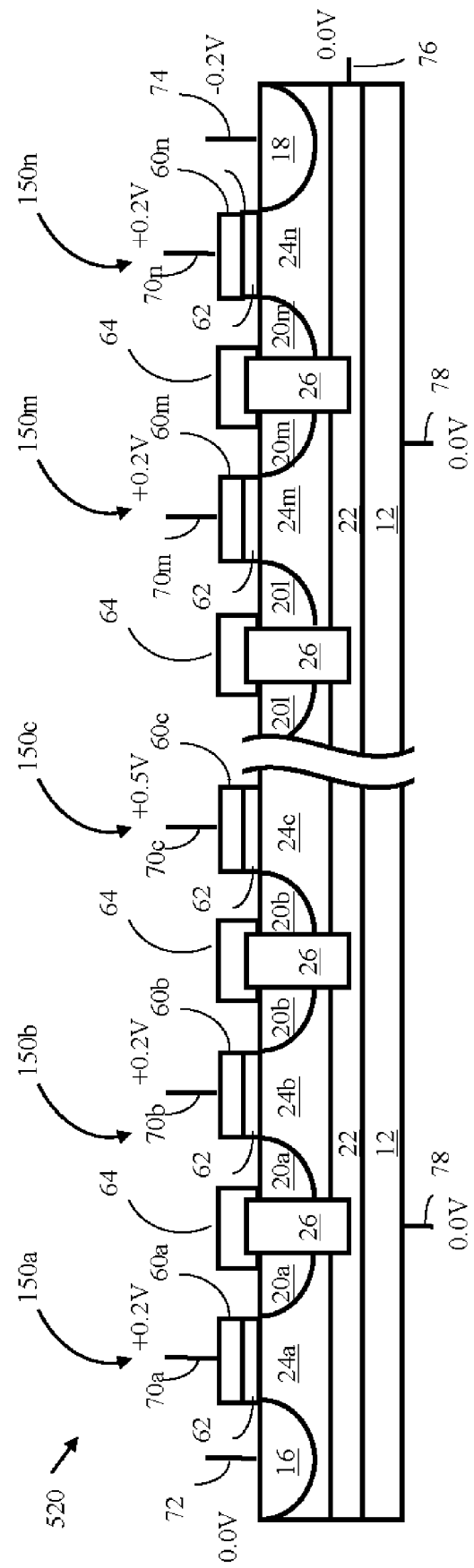
FIG. 37 shows bias conditions on a memory string during a write "0" operation that allows for individual bit writing according to an embodiment of the present invention.
Figure 38:
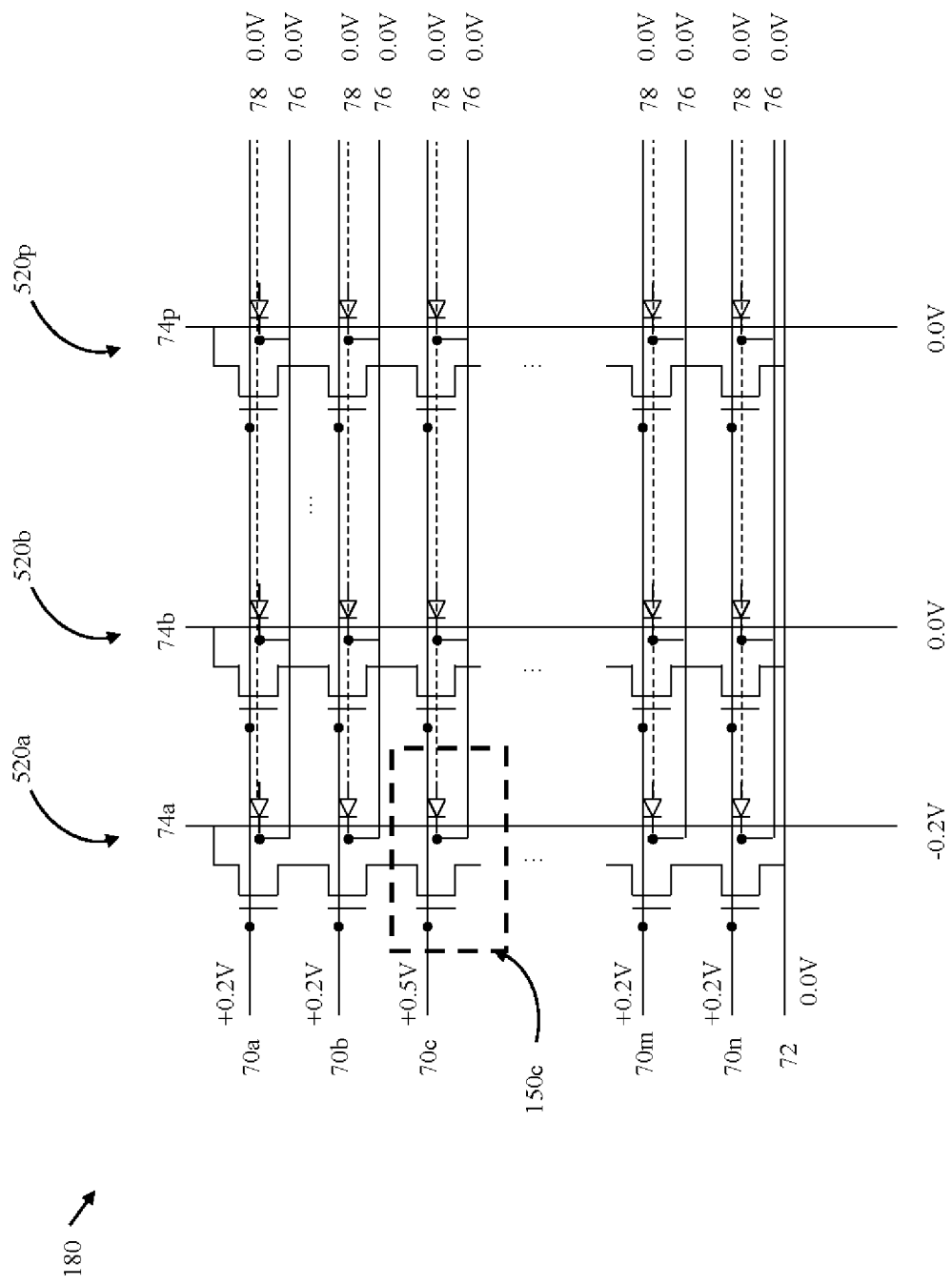
FIG. 38 illustrates bias conditions on a selected memory cell as well as unselected memory cells in the same and in other strings, during a write "0" operation that allows for individual bit writing according to an embodiment of the present invention.

An alternative write "0" operation that allows for individual bit writing is illustrated in FIGS. 37-38 and can be performed by applying a negative voltage to BL terminal 74, zero voltage to SL terminal 72, zero voltage to BW terminal 76, zero voltage to substrate terminal 78, and a positive voltage to passing WL terminals. The selected WL terminal is initially grounded until the voltages applied to SL terminal 72 and BL terminal 74 reach the regions 20b and 20c, respectively, of selected memory cell 150c. Subsequently, the potential of the selected WL terminal 70 is raised to a positive voltage higher than the positive voltage applied to passing WL terminals. Under these conditions, a positive voltage will be applied to the gate of the selected memory cell (e.g. memory cell 150c in FIGS. 37-38) and consequently the floating body 24 potential will increase through capacitive coupling from the positive voltage applied to the WL terminal 70. The passing cells (e.g. memory cell 1501, 150m, and 150n) will pass the negative voltage applied to the BL terminal 74 to the region 20c of the memory cell 150c, while passing cells 150a and 150b will pass zero voltage applied to the SL terminal 72 to the region 20b of the memory cell 150c, similar to the conditions described in regard to FIG. 30. As a result of the floating body 24 potential increase and the negative voltage applied to the BL terminal 74, the p-n junction between floating body region 24c and region 20c is forward-biased, evacuating any holes from the floating body 24. To reduce undesired write "0" disturb to other memory cells 150 in the memory array 180, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74. The voltage applied to WL terminal of the passing cells is optimized such that it is high enough to pass the negative voltage applied to the BL terminal 74, but cannot be too high to prevent the potential of the floating body 24 of the passing cells becoming too high, which will result in holes being evacuated from the passing cells that are in state "1". A higher positive voltage can be applied to passing WL terminals passing zero voltage applied to the SL terminal 72 (e.g. passing WL terminals to the left of selected WL terminal 70c, i.e. 70a and 70b in FIG. 37) than the voltage applied to passing WL terminals passing negative voltage applied to the BL terminal 74 (e.g. passing WL terminals to the right of selected WL terminal 70c). This is because the higher voltage applied to terminal 72 (compared to the negative voltage applied to terminal 74) may require a higher passing gate voltage for the passing transistors to be turned on.

In one particular non-limiting embodiment, the following bias conditions are applied to the memory string 520: a potential of about 0.0 volts to SL terminal 72, a potential of about −0.2 volts to BL terminal 74, a potential of about +0.5 volts is applied to selected terminal 70, a potential of about +0.2 volts is applied to passing WL terminals 70, about 0.0 volts is applied to BW terminal 76, and about 0.0 volts is applied to substrate terminal 78; while about 0.0 volts is applied to unselected SL terminal 72, about 0.0 volts is applied to unselected BL terminal 74, about 0.0 volts is applied to BW terminal 76 (or +1.2 volts is applied to BW terminal 76 to maintain the states of the unselected memory cells), about 0.0 volts is applied to unselected (but not passing) WL terminal 70, and about 0.0 volts is applied to unselected terminal 78.

FIGS. 37-38 show the bias conditions for the selected and unselected memory cells in memory array 180 where memory cell 150c is the selected cell. However, these voltage levels may vary.

Under these bias conditions, a positive voltage will be applied to the gate 60 of the selected cell 150c, while a negative voltage applied to the BL terminal 74 will be passed to the region 20c of the selected cell 150c, and zero voltage applied to the SL terminal 72 will be passed to the region 20b of the selected cell 150c. This condition is similar to the condition described in regard to FIG. 30, and results in hole evacuation out of the floating body 24c of the cell 150c.

A write "1" operation can be performed on memory cell 150 through impact ionization as described for example in Lin et al., "A New 1T DRAM Cell with Enhanced Floating Body Effect", pp. 23-27, IEEE International Workshop on Memory Technology, Design, and Testing, 2006, which was incorporated by reference above, or a write "1" operation can be performed through a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

Figure 39:
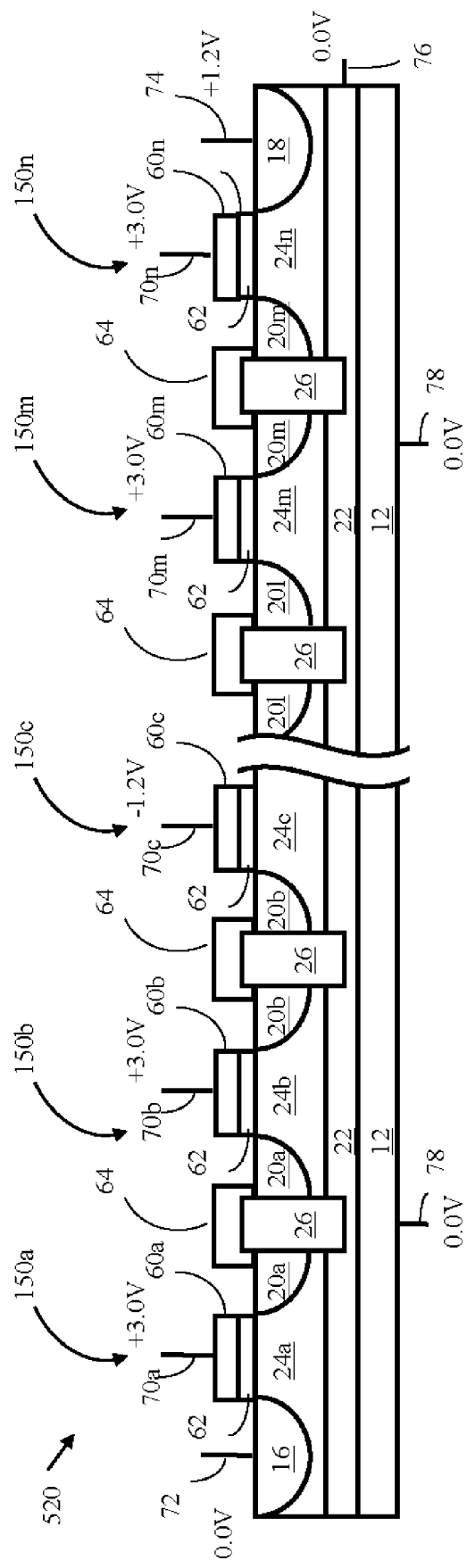
FIG. 39 shows bias conditions on a memory string during a band-to-band tunneling write "1" operation according to an embodiment of the present invention.
Figure 40:
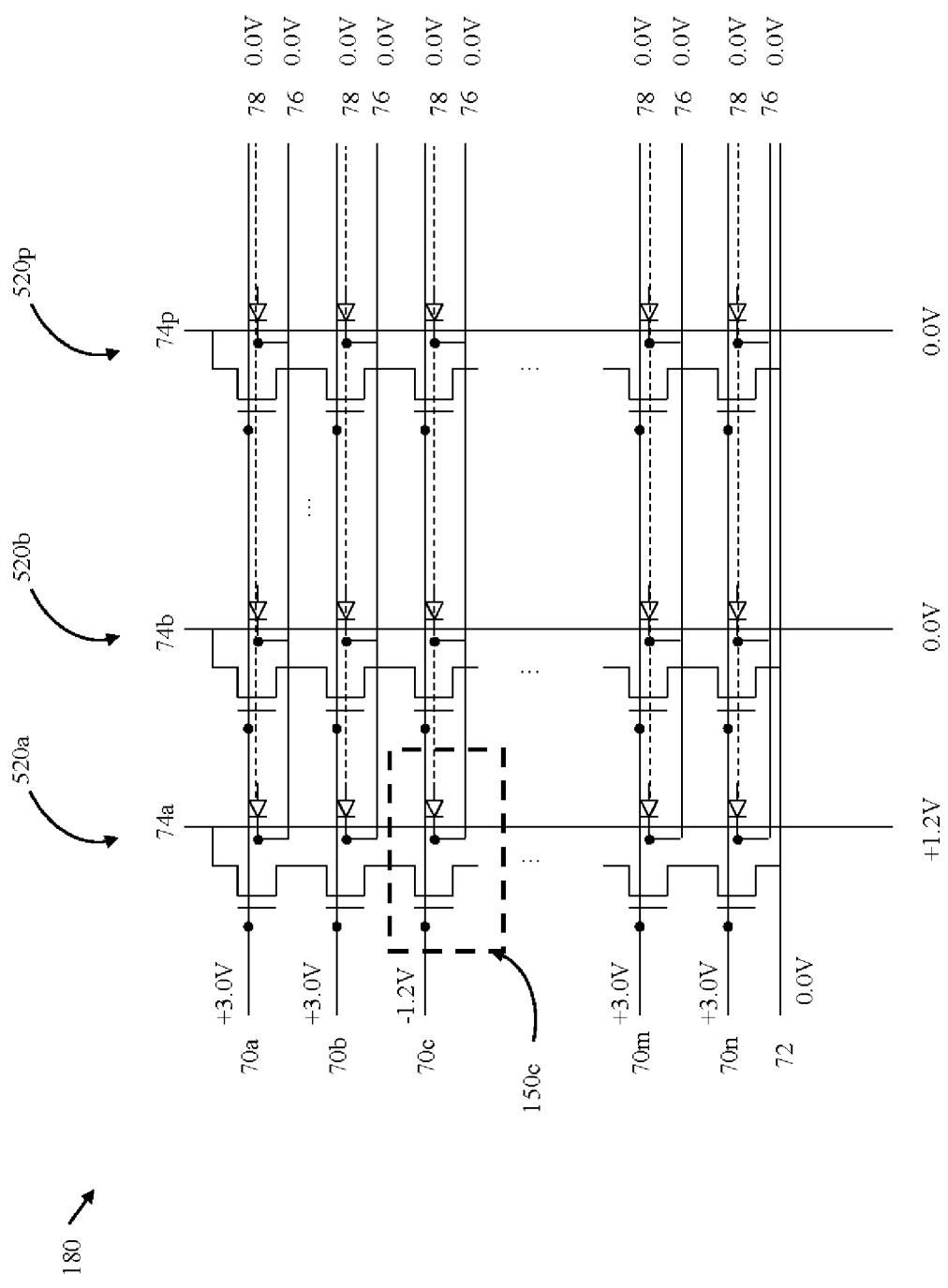
FIG. 40 illustrates bias conditions on a selected memory cell as well as unselected memory cells in the same and in other strings, during a band-to-band tunneling write "1" operation according to an embodiment of the present invention.

An example of bias conditions on a selected memory cell 150 under a band-to-band tunneling write "1" operation is illustrated in FIGS. 39 and 40. A negative bias is applied to the selected WL terminal 70, a positive voltage is applied to the passing WL terminals 70, zero voltage is applied to the SL terminal 72, and a positive bias applied to the BL terminal 74, zero voltage is applied to the BW terminal 76, while the substrate terminal 78 is grounded. This condition results in hole injection to the floating body 24 of the selected memory cell (e.g. cell 150c in FIGS. 39-40).

In one particular non-limiting embodiment, the following bias conditions are applied to the selected memory cell 150c: a potential of about 0.0 volts is applied to SL terminal 72, a potential of about +1.2 volts is applied to BL terminal 74, a potential of about −1.2 volts is applied to the selected WL terminal 70, about +3.0 volts is applied to the passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to maintain the states of the unselected memory cells), and about 0.0 volts is applied to substrate terminal 78. FIG. 40 shows the bias conditions for the selected and unselected memory cells in memory array 180 where memory cell 150c is the selected cell. However, these voltage levels may vary.

Under these bias conditions, a negative voltage will be applied to the gate 60 of the selected cell 150c, while a positive voltage applied to the BL terminal 74 will be passed to the region 20c of the selected cell 150c, and zero voltage applied to the SL terminal 72 will be passed to the region 20b of the selected cell 150c. This condition is similar to the condition described in FIG. 31A, and results in hole injection to the floating body 24c of the cell 150c.

Figure 41:
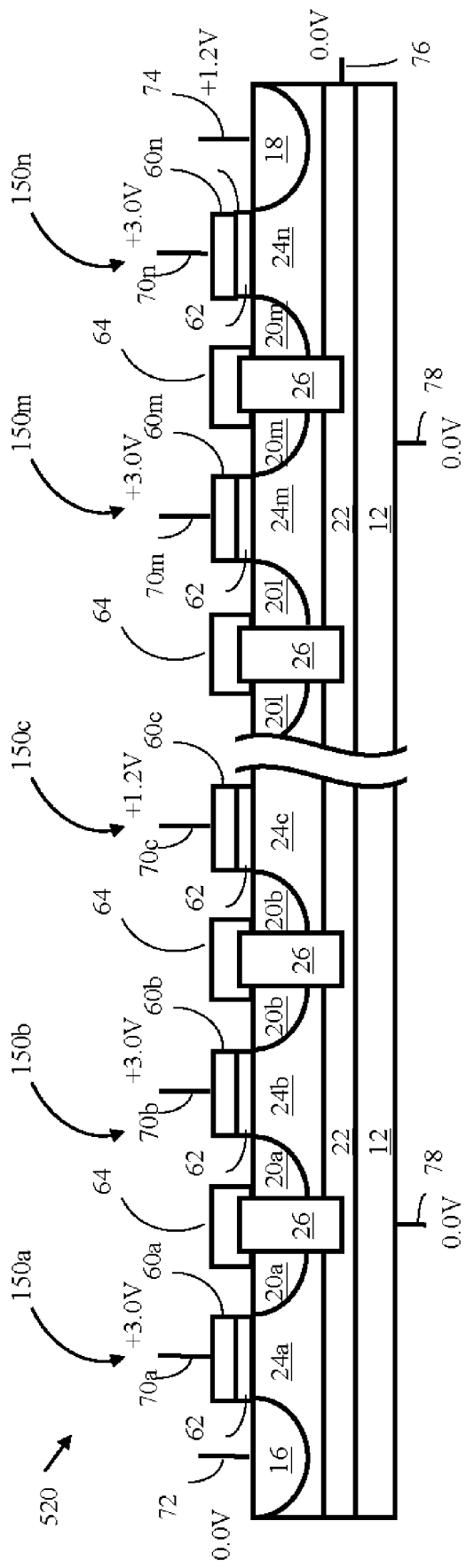
FIG. 41 shows bias conditions on a memory string during an impact ionization write "1" operation according to an embodiment of the present invention.
Figure 42:
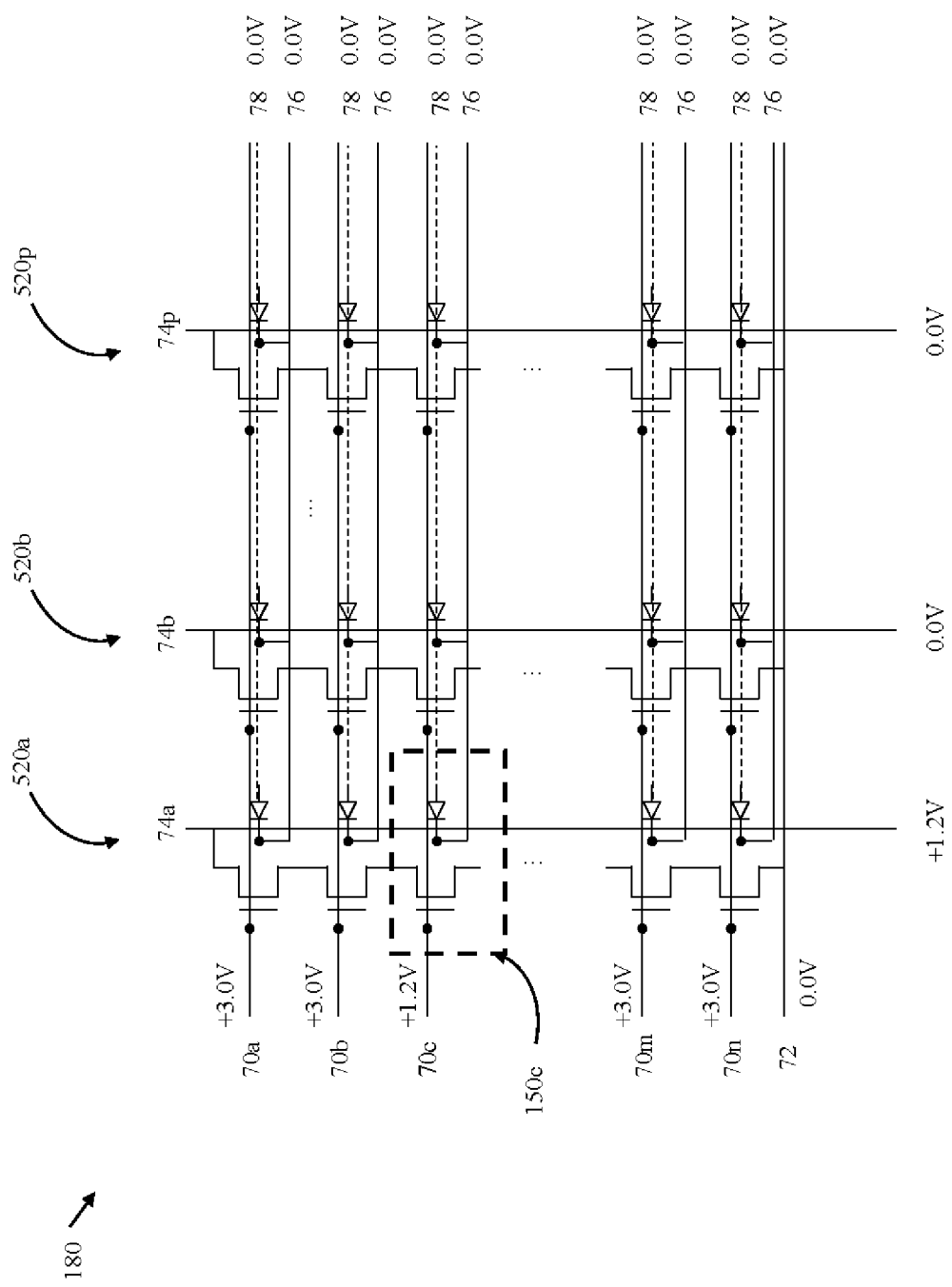
FIG. 42 illustrates bias conditions on a selected memory cell as well as unselected memory cells in the same and in other strings, during an impact ionization write "1" operation according to an embodiment of the present invention.

An example of the bias conditions on the selected memory cell 150 under an impact ionization write "1" operation is illustrated in FIGS. 41-42. A positive bias is applied to the selected WL terminal 70, a positive voltage more positive than the positive voltage applied to the selected WL terminal 70 is applied to the passing WL terminals 70, zero voltage is applied to the SL terminal 72, a positive bias is applied to the BL terminal 74, and zero voltage is applied to BW terminal 76, while the substrate terminal 78 is grounded. These conditions result in hole injection to the floating body 24 of the selected memory cell (e.g. cell 150c in FIGS. 41-42).

In one particular non-limiting embodiment, the following bias conditions are applied to the selected memory cell 150c: a potential of about 0.0 volts is applied to SL terminal 72, a potential of about +1.2 volts is applied to BL terminal 74, a potential of about +1.2 volts is applied to the selected WL terminal 70, about +3.0 volts is applied to the passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to BW terminal 76 to maintain the states of the unselected memory cells), and about 0.0 volts is applied to substrate terminal 78. FIG. 42 shows the bias conditions for the selected and unselected memory cells in memory array 180 (with memory cell 150c as the selected cell). However, these voltage levels may vary.

A multi-level write operation can be performed using an alternating write and verify algorithm, where a write pulse is first applied to the memory cell 150, followed by a read operation to verify if the desired memory state has been achieved. If the desired memory state has not been achieved, another write pulse is applied to the memory cell 150, followed by another read verification operation. This loop is repeated until the desired memory state is achieved.

For example, using band-to-band hot hole injection, a positive voltage is applied to BL terminal 74, zero voltage is applied to SL terminal 72, a negative voltage is applied to the selected WL terminal 70, a positive voltage is applied to the passing WL terminals, zero voltage is applied to the BW terminal 76 and zero voltage is applied to the substrate terminal 78. Positive voltages of different amplitudes are applied to BL terminal 74 to write different states to floating body 24. This results in different floating body potentials 24 corresponding to the different positive voltages or the number of positive voltage pulses that have been applied to BL terminal 74. In one particular non-limiting embodiment, the write operation is performed by applying the following bias conditions: a potential of about 0.0 volts is applied to SL terminal 72, a potential of about −1.2 volts is applied to the selected WL terminal 70, about +3.0 volts is applied to the passing WL terminals, about 0.0 volts is applied to BW terminal 76, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever state of 00, 01, 10 or 11 is the desired state has been achieved), then the multi write operation is concluded. If the desired state has not been not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

Figure 43:
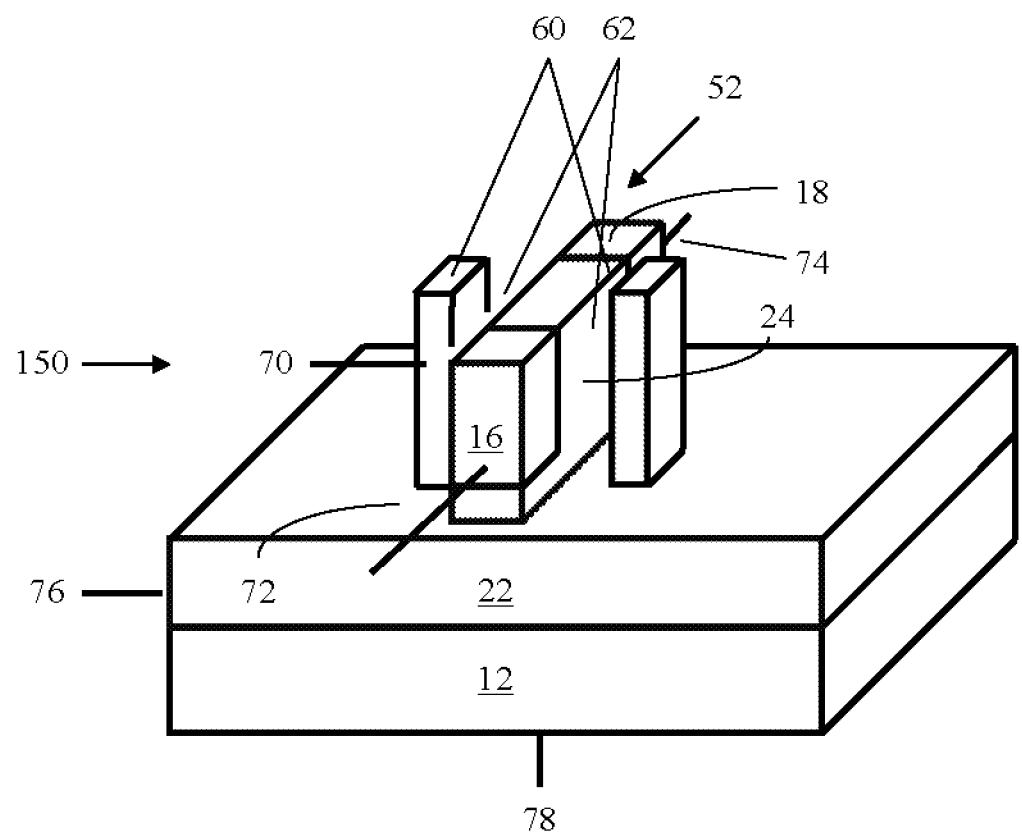
FIG. 43 schematically illustrates a fin-type, three-dimensional memory cell according to an embodiment of the present invention.
Figure 44:
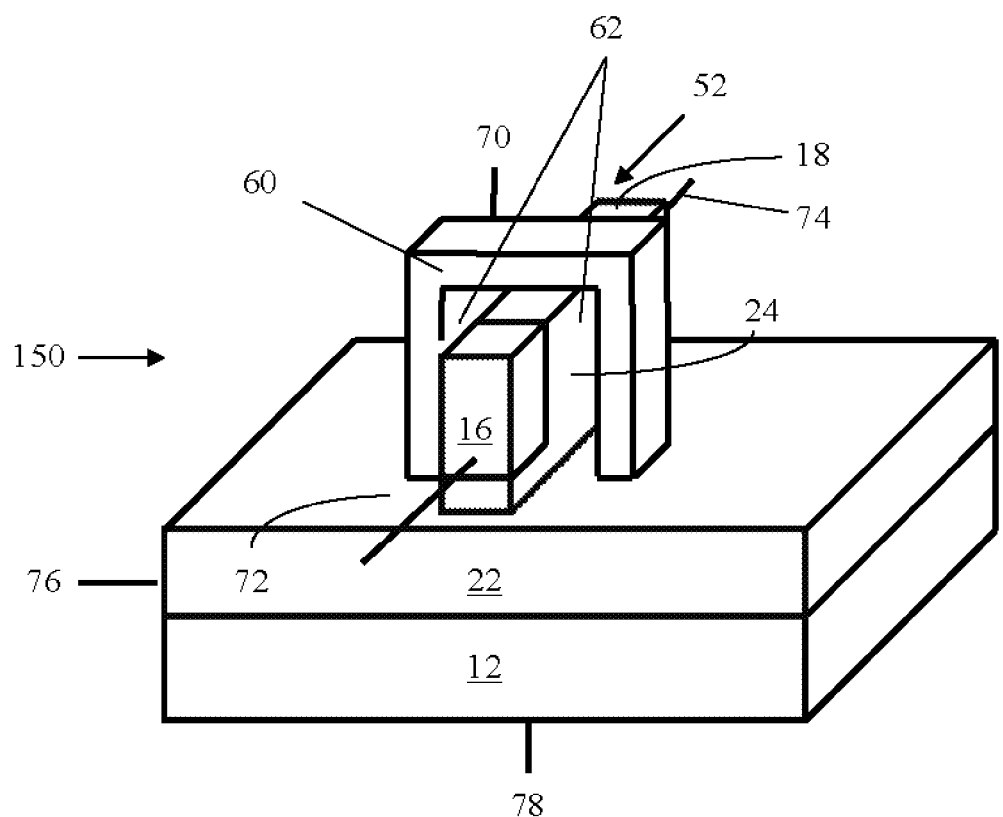
FIG. 44 schematically illustrates a fin-type, three-dimensional memory cell according to another embodiment of the present invention.

The string 520 may be constructed from a plurality of planar cells, such as the embodiments described above with reference to FIGS. 26 and 32A, or may be constructed from fin-type, three-dimensional cells, such as illustrated in FIGS. 43-44. Other variations, modifications and alternative cells 150 may be provided without departing from the scope of the present invention and its functionality.

Figure 45A:
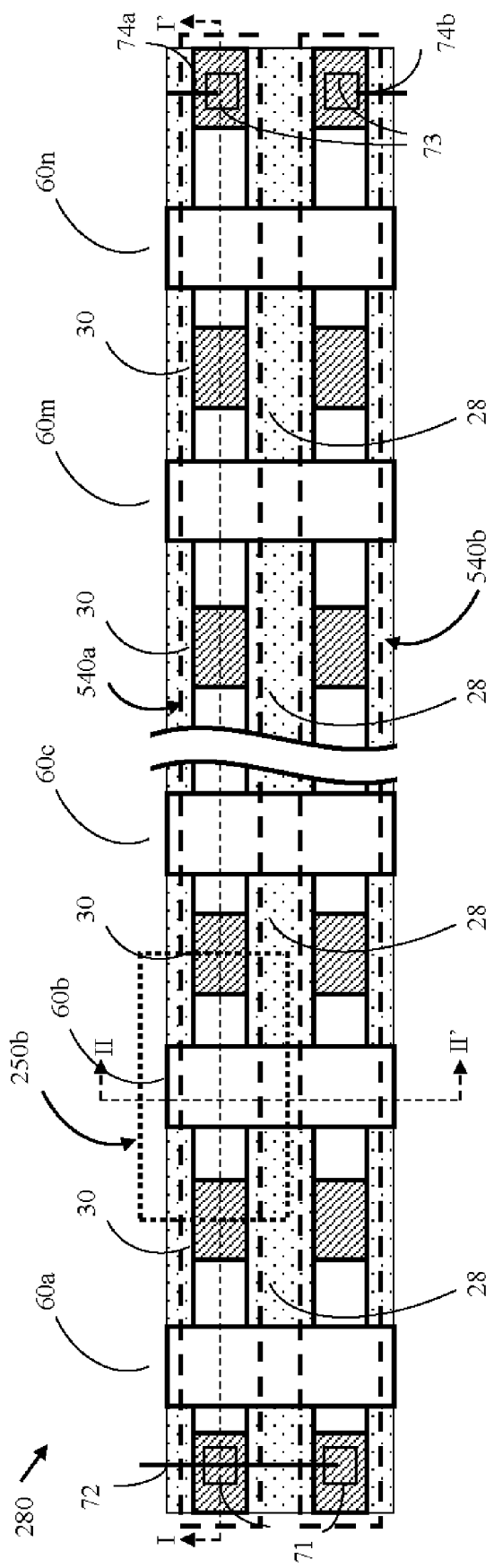
FIG. 45A schematically illustrates a top view of two strings of memory cells in a memory array according to an embodiment of the present invention.
Figure 45B:
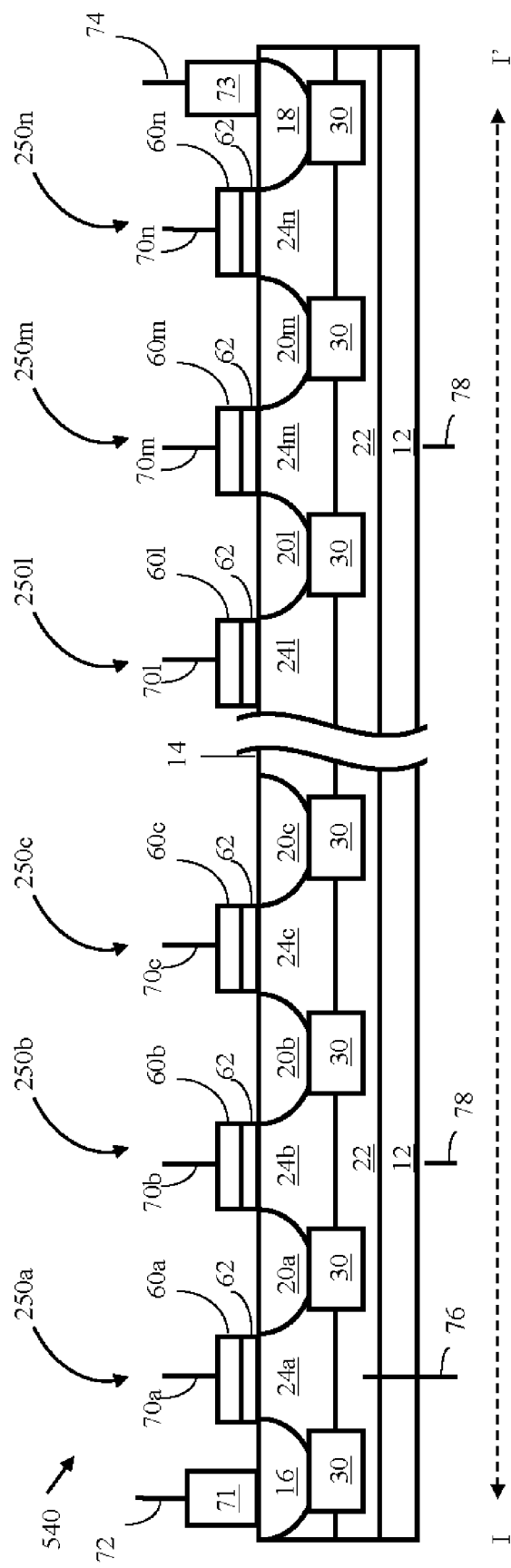
FIG. 45B is a cross-sectional view of a string from the array illustrated in FIG. 45A.

Another embodiment of memory array 280 is described with reference to FIGS. 45A-45B, where FIG. 45A shows a top view of the memory array 280 consisting of two strings of memory cells 540 between the SL terminal 72 and BL terminal 74, and FIG. 45B shows the cross section of a memory string 540. Although FIG. 45A schematically illustrates an array of two strings, it should be noted that the present invention is not limited to two strings, as more than two, or even only one string could be provided.

Each memory string 540 of array 280 includes a plurality of memory cells 250 connected in a NAND architecture, in which the plurality of memory cells 250 are serially connected to make one string of memory cells. String 540 includes "n" memory cells 250, where "n" is a positive integer, which typically ranges between 8 and 64, and in at least one example, is 16. However, this embodiment, like the embodiment above is not limited to the stated range, as fewer than eight or more than sixty-four cells could be included in a string. The region 18 of a second conductivity at one end of the memory string is connected to the BL terminal 74 through contact 73, while the source region 16 of a second conductivity at the other end of the memory string is connected to the SL terminal 72 through contact 71. In some embodiments, the transistors at the ends of the string 540 (e.g., cells 250a and 250n in the example of FIG. 45B) may be configured as access transistors to the memory string 540, and charged stored in the associated floating bodies 24 (24a and 24n in the example of FIG. 45B) are not read.

Referring to FIG. 45B, the memory cell 250 includes a substrate 12 of a first conductivity type, such as p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by region 16 (or region 18 or region 20) of the second conductivity type and insulating layer 62, on the sides by region 16 (or region 18 or region 20) of the second conductivity type and insulating layers 30 and 26 (like, for example, shallow trench isolation (STI)), may be made of silicon oxide, for example. Insulating layer 30 and the region 16 (or region 18 or region 20) of the second conductivity type insulate the floating body region 24 along the I-I' direction as shown in FIG. 45B, while insulating layer 28 insulates the floating body region 24 along the II-II' direction as shown in FIG. 45A.

Regions 16, 18, and 20 having a second conductivity type, such as n-type, for example, are provided in substrate 12 and are exposed at surface 14. Regions 16, 18, and 20 may be formed by an implantation process formed on the material making up substrate 12, according to any implantation process known and typically used in the art. Alternatively, a solid state diffusion process could be used to form regions 16, 18, and 20. Although regions 16, 18, and 20 have the same conductivity type (for example n-type), the dopant concentration forming these regions can be (but need not necessarily be) different. In FIGS. 45A and 45B, regions 16 and 18 are located at the ends of the memory string 540, while regions 20 are located inside the memory string 540, isolating adjacent floating body regions 24 of adjacent memory cells 250.

A gate 60 is positioned above the surface of floating body 24 and is in between the first and second regions 20 (or between region 16 and region 20 or between region 18 and region 20). The gate 60 is insulated from floating body region 24 by an insulating layer 62.

Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory string 540 further includes word line (WL) terminals 70 electrically connected to gates 60, source line (SL) terminal 72 electrically connected to region 16, bit line (BL) terminal 74 electrically connected to region 18, buried layer (BW) terminal 76 connected to buried layer 22, and substrate terminal 78 electrically connected to substrate 12.

The BW terminal 76 connected to the buried layer region 22 serves as a back bias terminal, i.e. a terminal at the back side of a semiconductor transistor device, usually at the opposite side of the gate of the transistor.

A method of manufacturing memory array 280 will be described with reference to FIGS. 46A-46U. These figures are arranged in groups of three related views, with the first figure of each group being a top view of memory cell 250, the second figure of each group being a vertical cross section of the top view in the first figure of the group designated I-I', and the third figure of each group being a vertical cross section of the top view in the first figure of the group designated II-II'.

Figure 46A:
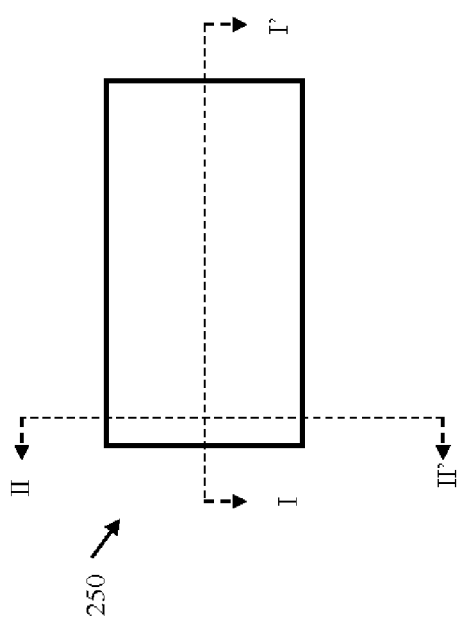
FIGS. 46A-46U illustrates various stages during manufacture of a memory array according to an embodiment of the present invention.
Figure 46C:
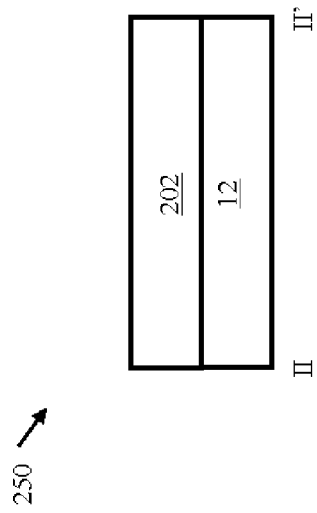
Figure 46B:
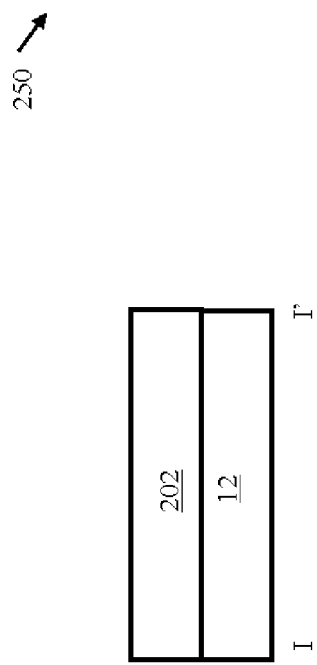

Turning now to FIGS. 46A through 46C, the first steps of the process can be seen starting with growing a thick conductive region 202 comprised of a different material from the materials forming the substrate region 12. The conductive region 202 can be selectively etched without removing the substrate region 12. For example, the conductive region 202 could be made of silicon germanium (SiGe) material, while substrate 12 could be made of silicon, although materials for both of these layers may vary.

Figure 46D:
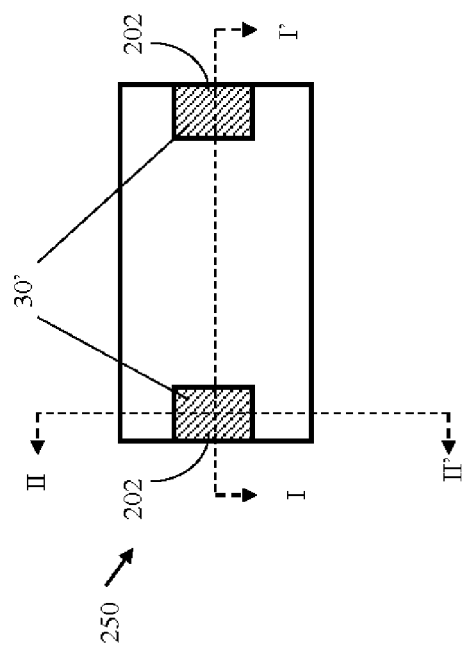
Figure 46F:
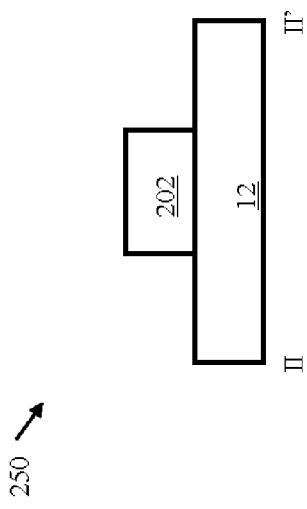
Figure 46E:
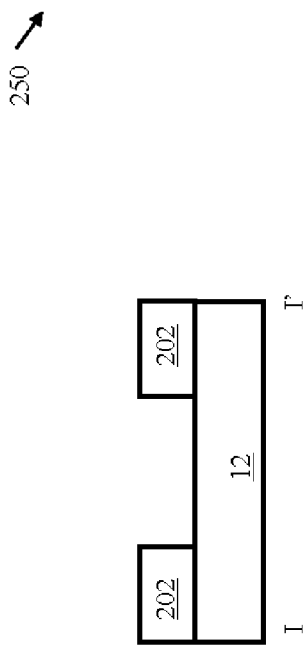

As shown in FIGS. 46D through 46F, a pattern 30' covering the areas to become insulator region 30 (as shown in the final structures in FIGS. 46S through 46U) is formed using a lithography process. The conductive region 202 is then etched following the lithography pattern.

Figure 46I:
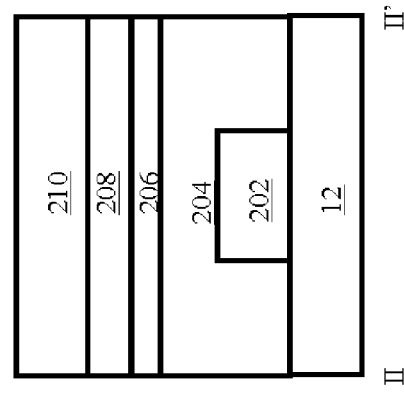
Figure 46G:
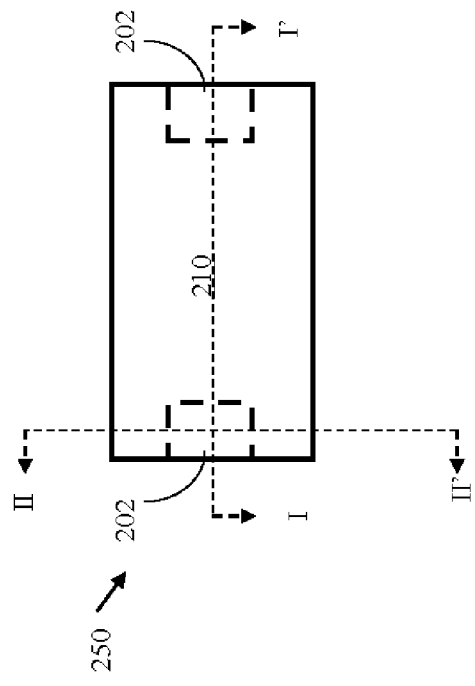
Figure 46H:
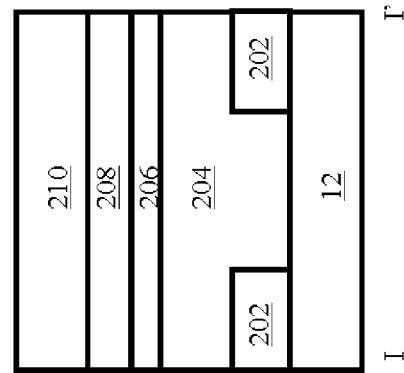

Referring to FIGS. 46G through 46I, a conductive region 204 comprising for example the same material forming the substrate 12 is grown (like, for example, silicon). A chemical mechanical polishing step can then be performed to polish the resulting films so that the silicon surface is flat. Subsequently, a thin layer of silicon oxide 206 is grown on the surface of film 204. This is followed by a deposition of a polysilicon layer 208 and then silicon nitride layer 210.

Figure 46J:
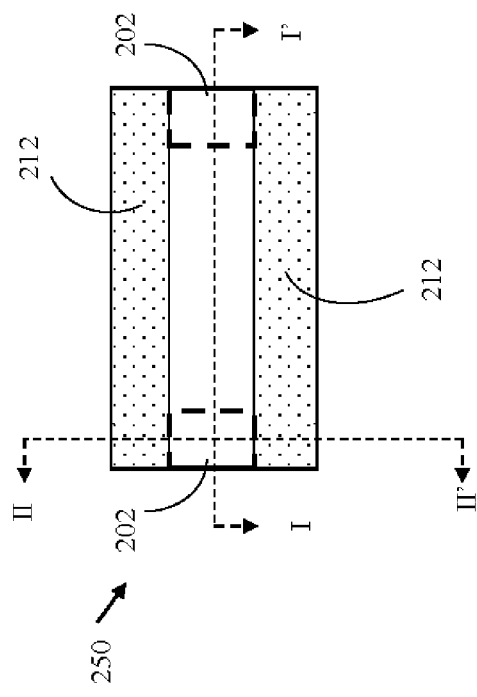
Figure 46L:
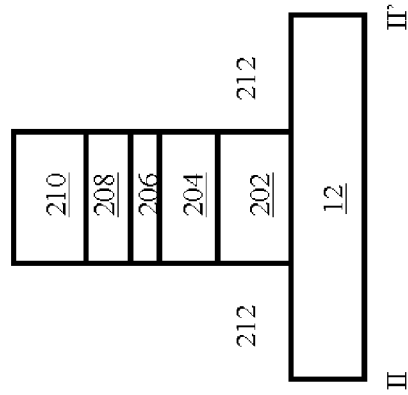
Figure 46K:
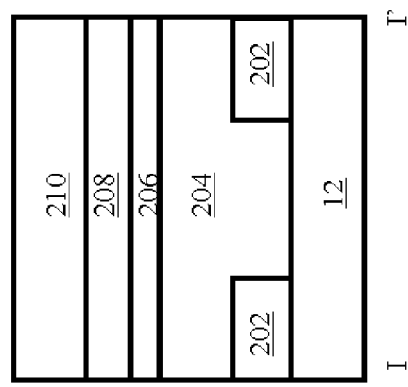

Next, a pattern is formed for use in opening the areas to become insulator regions 28. The pattern can be formed using a lithography process. This is then followed by dry etching of the silicon nitride layer 210, polysilicon layer 208, silicon oxide layer 206, and silicon layer 204, creating trench 212, as shown in FIGS. 46J and 46L (trenches 212 are not visible in the view of FIG. 46K).

Figure 46M:
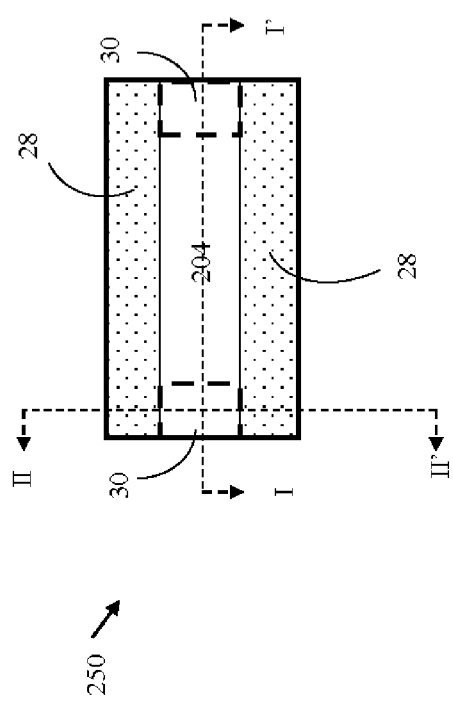
Figure 46O:
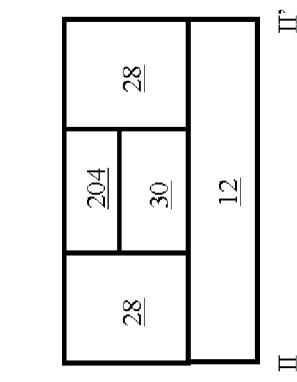
Figure 46N:
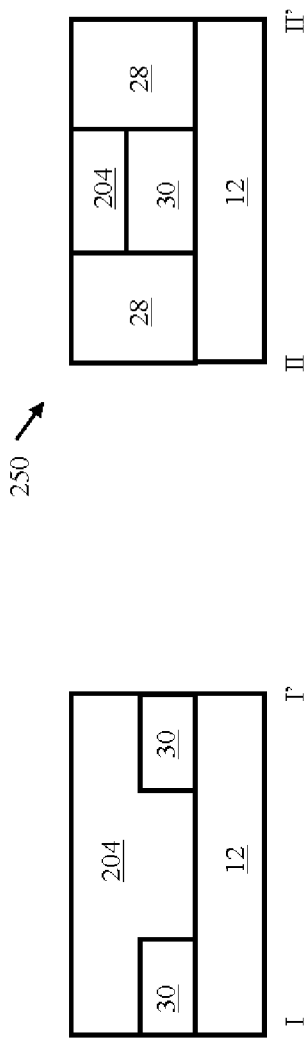

A wet etch process that selectively removes the region 202 is then performed, leaving gaps that are mechanically supported by region 204 The resulting gap regions are then oxidized to form buried oxide regions 30 as shown in FIGS. 46N and 46O. Subsequently, the remaining silicon nitride layer 210, polysilicon layer 208, and silicon oxide layer 206 are then removed, followed by a silicon oxide deposition process and a chemical mechanical polishing step to planarize the resulting silicon oxide film, resulting in the silicon oxide insulator region 28 as shown in FIGS. 46M and 46O. Alternatively, the silicon deposition step can be performed prior to the removal of the silicon nitride layer 210, polysilicon layer 208 and silicon oxide layer 206.

Figure 46P:
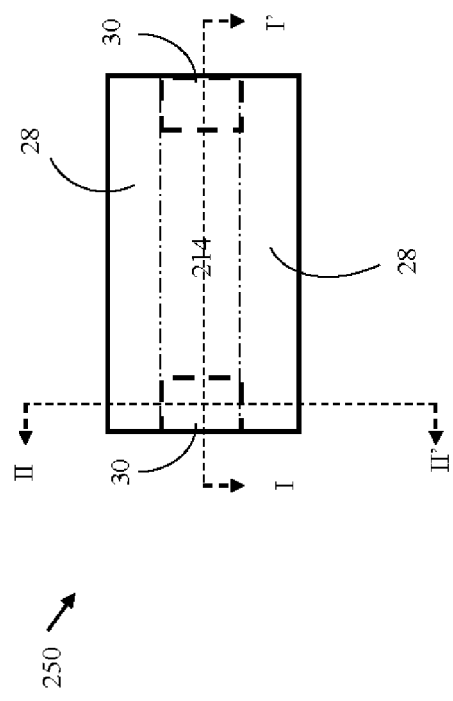
Figure 46R:
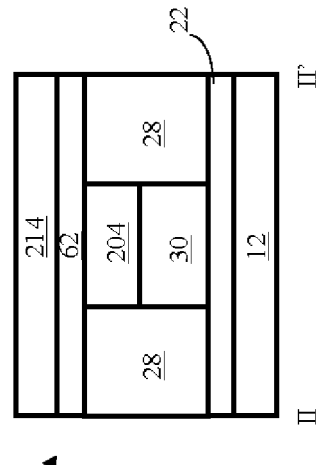
Figure 46Q:
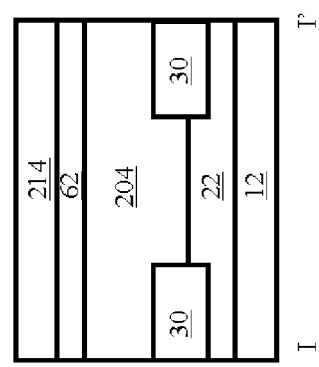

Referring to FIGS. 46P through 46R, an ion implantation step is next performed to form the buried layer region 22. Subsequently a silicon oxide layer (or high-dielectric material layer) 62 is formed on the silicon surface (FIGS. 46Q-46R), followed by polysilicon (or metal) layer 214 deposition (FIGS. 46Q-46R).

A pattern covering the area to be made into gate 60 is next made, such as by using a lithography process. The pattern forming step is followed by dry etching of the polysilicon (or metal) layer 214 and silicon oxide (or high dielectric materials) layer 62. An ion implantation step is then performed to form the regions 20 of the second conductivity type (e.g. n-type). The conductive region 204 underneath the gate region 60 is protected from the ion implantation process and is now bounded by regions 20, insulating layer 30 and insulating layer 28 on the sides, and by buried layer 22 from the substrate 12, and by insulating layer 62 at the surface, forming the floating body region 24 (see FIG. 46T). This is then followed by backend process to form contact and metal layers (not shown in figures).

Figure 47:
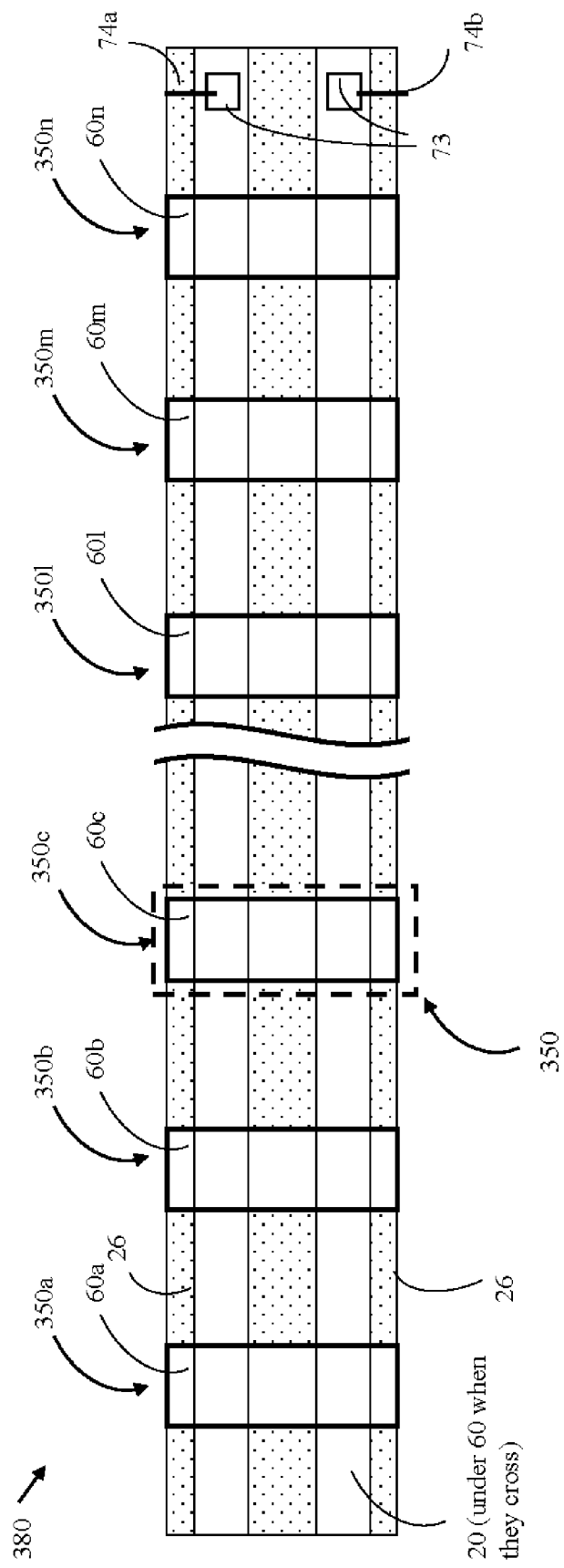
FIG. 47 schematically illustrates a link of memory cells connected in parallel according to an embodiment of the present invention.
Figure 48A:
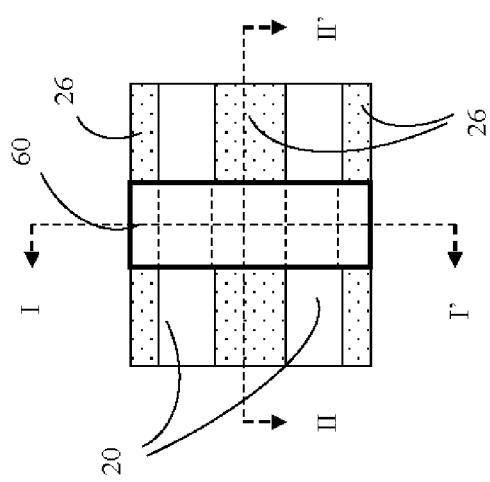
FIG. 48A schematically illustrates a top view of a memory cell of the link of FIG. 47.

Another embodiment of memory array is shown as memory array 380 in FIG. 47, wherein memory array 380 comprises a link connecting a plurality of memory cells 350 in parallel. FIG. 48A shows a top view of memory cell 350 in isolation, with FIGS. 48B and 48C showing sectional views of the memory cell 350 taken along lines I-I' and respectively.

Figure 48C:
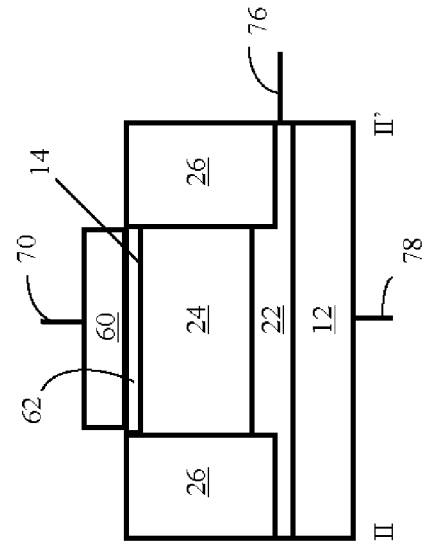
FIG. 48C is a sectional view of the memory cell of FIG. 48A taken along line II-II' of FIG. 48A.
Figure 48B:
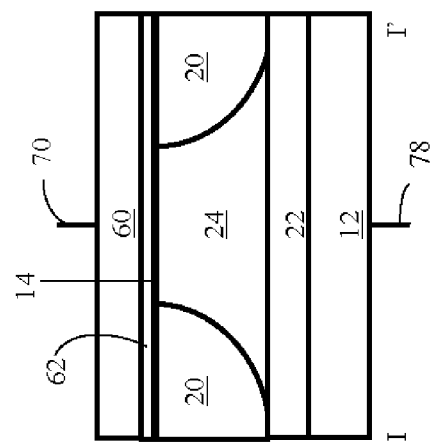
FIG. 48B is a sectional view of the memory cell of FIG. 48A taken along line I-I' of FIG. 48A.

Referring to FIGS. 48B and 48C together, the cell 350 is fabricated on silicon on insulator (SOI) substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried insulator layer 22, such as buried oxide (BOX), is provided in the substrate 12.

A floating body region 24 of the first conductivity type, such as p-type, for example, is bounded on top by insulating layer 62, on the sides by regions 20 of a second conductivity type and insulating layers 26, and on the bottom by buried layer 22. Insulating layers 26 (like, for example, shallow trench isolation (STI)), may be made of silicon oxide, for example. Insulating layers 26 insulate cell 350 from neighboring cells 350 when multiple cells 350 are joined in an array 380 to make a memory device as illustrated in FIGS. 47 and 49.

Regions 20 having a second conductivity type, such as n-type, for example, are provided in substrate 12 and are exposed at surface 14. Regions 20 may be formed by an implantation process formed on the material making up substrate 12, according to any implantation process known and typically used in the art. Alternatively, a solid state diffusion process could be used to form regions 20.

A gate 60 is positioned above the floating body region 24 and regions 20. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Region 20 is continuous (electrically conductive) in the direction along the II-II' direction (referring to FIG. 48A) and can be used to connect several memory cells 350 in parallel as shown in the equivalent circuit representation of the memory array 380 in FIGS. 47 and 49 (where regions 20 are connected to bet line (BL) terminals 74. Connections between regions 20 and bit line (BL) terminals 74a and 74b can be made through contacts 73 at the edge of the parallel connections (see FIG. 47). An adjacent pair of continuous regions 20 can be used to connect a link of cells 350 in parallel. Cell 350 further includes word line (WL) terminal 70 electrically connected to gate 60 and substrate terminal 78 electrically connected to substrate 12 (see FIGS. 48B-48C). In a parallel connection, the voltage applied to the BL terminals 74 is about the same across all memory cells 350 (small differences might occur due to voltage drop along the bit lines) and the current will only flow through the selected memory cell 350.

Because it is possible to minimize the number of connections to BL terminals by making them only at the edge of the parallel connections, the number of contacts can be reduced, for example to two contacts, for each parallel connection. No contacts are made to the regions 20 of the memory cells 350 that are not at the edge of the parallel connections in memory array 380, resulting in contactless memory cells in locations that are not at the edge (end). The number of contacts can be increased to reduce the resistance of the parallel connections if desired.

Figure 50:
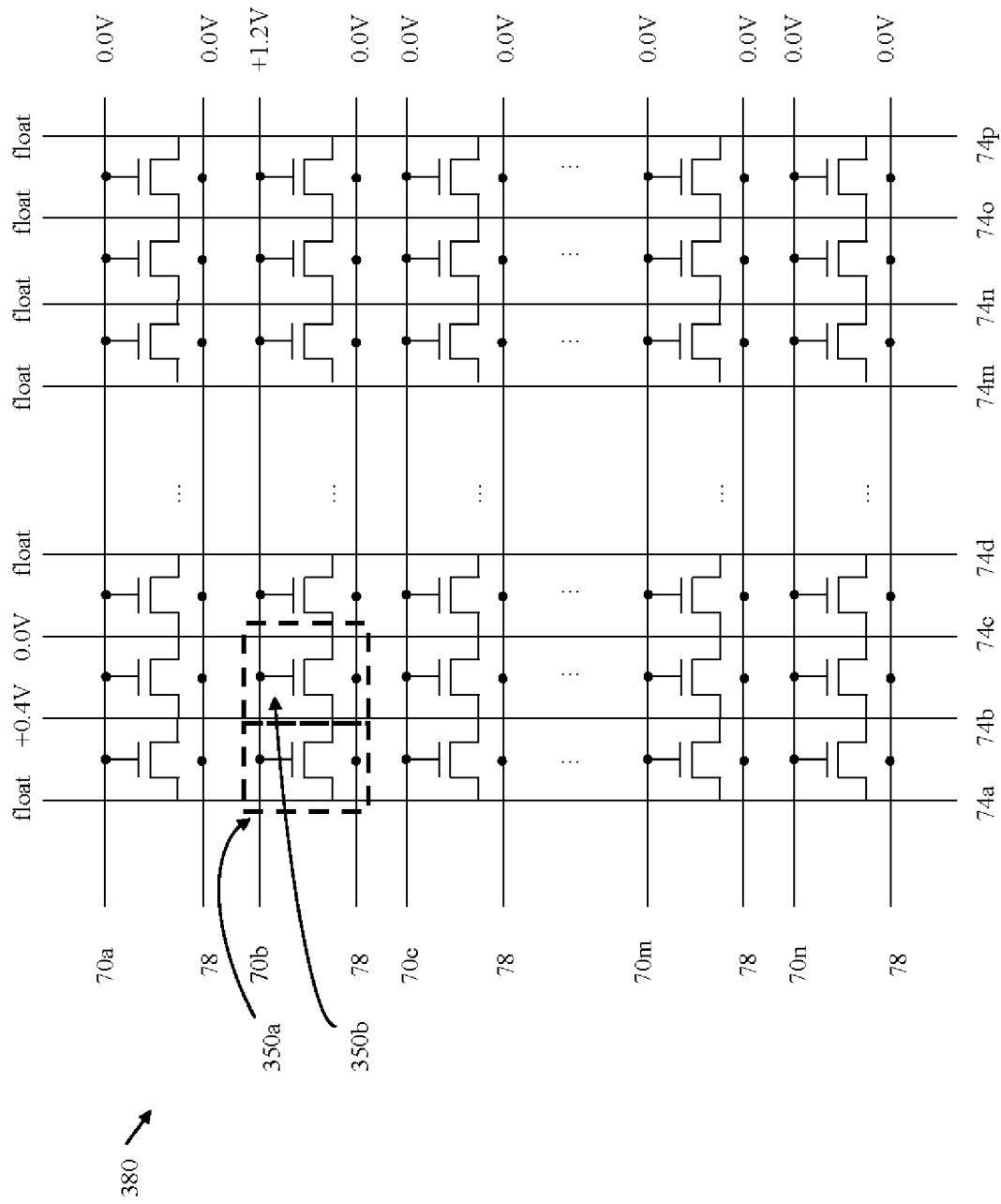
FIG. 50 is a schematic illustration of an equivalent circuit of a memory array of links in which a read operation is being performed on a selected memory cell of one of the links according to an embodiment of the present invention.

A read operation is described with reference to FIGS. 50-51, where memory cell 350b is being selected (as shown in FIG. 50). The following bias conditions may be applied: a positive voltage is applied to BL terminal 74b, zero voltage is applied to BL terminal 74c, a positive voltage is applied to WL terminal 70b, and zero voltage is applied to substrate terminal 78. The unselected BL terminals (e.g. BL terminal 74a, 74d, . . . , 74p in FIG. 50) are left floating, the unselected WL terminals (e.g. WL terminal 70a, 70m, 70n in FIG. 50) will remain at zero voltage, and the unselected substrate terminal 78 will remain at zero voltage. Alternatively, the unselected BL terminals to the right of BL terminal 74c (where zero voltage is applied to) can be grounded. A positive voltage of the same amplitude as that applied to BL terminal 74b can be applied to the unselected BL terminals to the left of BL terminal 74b. Because the region 20b (connected to BL terminal 74b) is shared with the adjacent cell 350a, the unselected BL terminals to the left of BL terminal 74b (where a positive voltage is applied to) need to be left floating or have a positive voltage applied thereto to prevent any parasitic current flowing from BL terminal 74b to the BL terminals to the left of BL terminal 74b. Alternatively, the bias conditions on BL terminals 74b and 74c (connected to regions 20 of the selected memory cell 350b) may be reversed.

In one particular non-limiting embodiment, the following bias conditions are applied to the selected memory cell 350b: a potential of about +0.4 volts is applied to BL terminal 74b, a potential of about 0.0 volts is applied to BL terminal 74c, a potential of about +1.2 volts is applied to WL terminal 70b, and about 0.0 volts is applied to substrate terminal 78; while the following bias conditions are applied to the unselected terminals: about 0.0 volts is applied to unselected WL terminals, about 0.0 volts is applied to unselected substrate terminals, while the unselected BL terminals are left floating.

Figure 51:
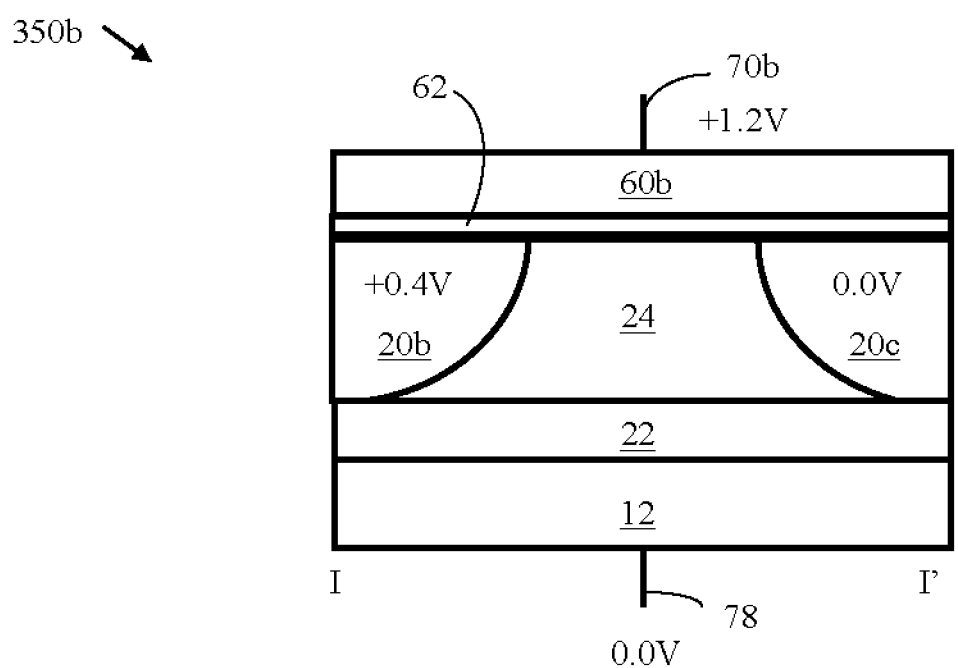
FIG. 51 schematically illustrates the selected memory cell of the array represented in FIG. 50 and bias conditions thereon during the read operation.

As shown in FIG. 51, about +1.2 volts are applied to the gate 60b, about 0.4 volts are applied to the region 20b (connected to BL terminal 74b), about 0.0 volts are applied to region 20c (connected to BL terminal 74c), and about 0.0 volts are applied to substrate 12 of selected memory cell 350b. The current flowing from BL terminal 74b to BL terminal 74c will then be determined by the potential of the floating body region 24 of the selected cell 350b.

If cell 350b is in a state "1" having holes in the floating body region 24, then the memory cell will have a lower threshold voltage (gate voltage where the transistor is turned on), and consequently be conducting a larger current compared to if cell 350b is in a state "0" having no holes in floating body region 24. The cell current can be sensed by, for example, a sense amplifier circuit connected to BL terminal 74b.

Figure 52:
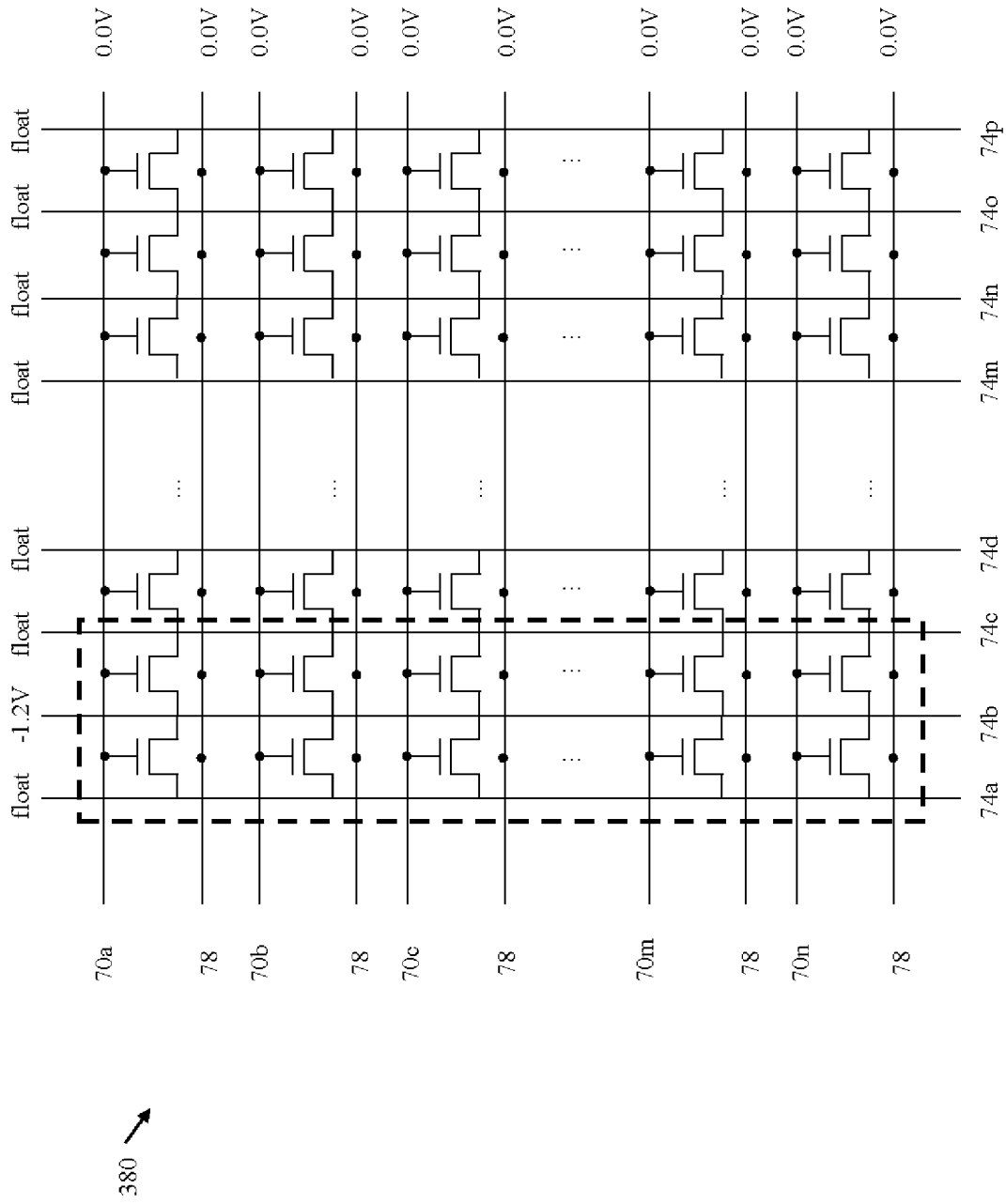
FIG. 52 is a schematic illustration of an equivalent circuit of a memory array in which a write "0" operation is being performed on a selected link of the array according to an embodiment of the present invention.
Figure 53:
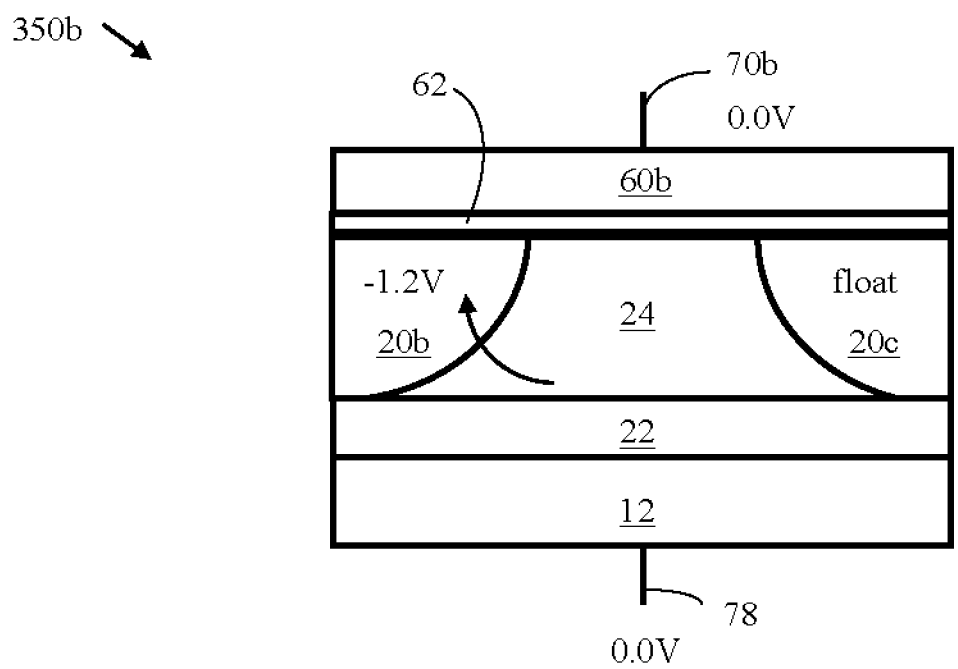
FIG. 53 schematically illustrates a memory cell of the link represented in FIG. 52 that is having a write "0" operation performed thereon according to an embodiment of the present invention.

A write "0" operation is described with reference to FIGS. 52-53, where the following bias conditions are applied: zero voltage to the WL terminals 70, and negative voltage to the BL terminal 74b, while the substrate terminal 78 is grounded. Under these conditions, the p-n junction between floating body 24 and region 20b of the memory cell 350 is forward-biased, evacuating any holes from the floating body 24. The unselected BL terminals 74 can be left floating or grounded, the unselected WL terminals 70 will remain at zero voltage, and the unselected substrate terminal 78 will remain at zero voltage.

In one particular non-limiting embodiment, about −1.2 volts is applied to terminal 74b, about 0.0 volts is applied to terminal 70, and about 0.0 volts is applied to terminal 78. However, these voltage levels may vary, while maintaining the relative relationship between the charges applied, as described above. Because BL terminal 74b is connected to several memory cells 350, all memory cells connected to BL terminal 74b will be written to state "0", as indicated by the memory cells inside the dashed lines in FIG. 52.

Figure 54:
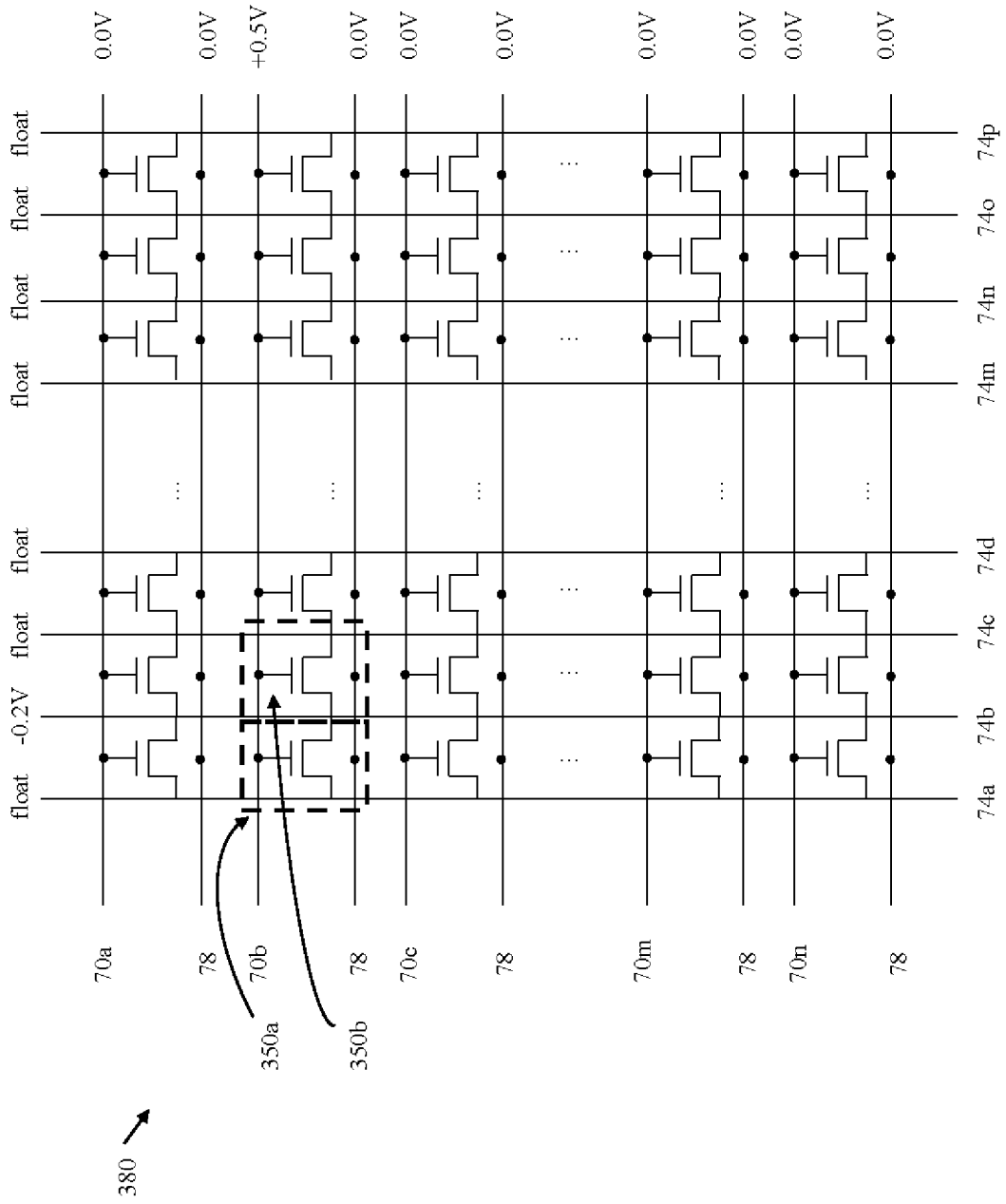
FIG. 54 is a schematic illustration of an equivalent circuit of a memory array in which a write "0" operation is being performed according to an alternative embodiment of the present invention.
Figure 55:
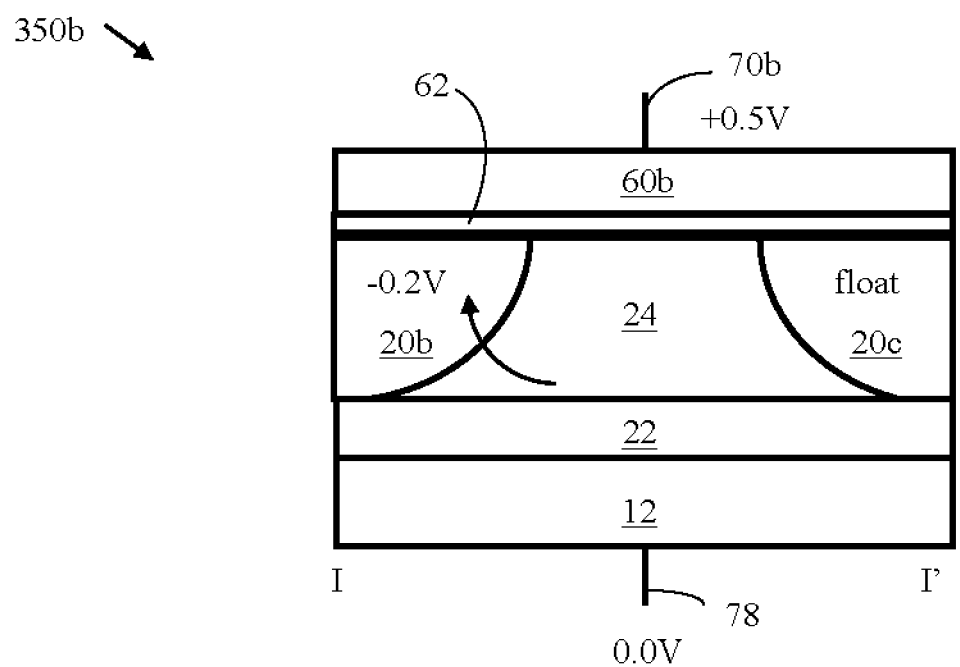
FIG. 55 schematically illustrates a memory cell of the array represented in FIG. 54 that is having a write "0" operation performed thereon according to the alternative embodiment described with regard to FIG. 54.

An alternative write "0" operation that allows for more selective bit writing is shown in FIGS. 54-55 and can be performed by applying a negative voltage to BL terminal 74b, zero voltage to substrate terminal 78, and a positive voltage to WL terminal 70b. The unselected WL terminals will remain at zero voltage, the unselected BL terminals will be left floating or grounded, and the unselected substrate terminal 78 will remain at zero voltage.

Under these conditions, a positive voltage will be applied to the gate of the selected memory cell (e.g. memory cell 350a and 350b in FIG. 54, see also gate 60b in FIG. 55) and consequently the floating body 24 potential will increase through capacitive coupling from the positive voltage applied to the WL terminal 70. As a result of the floating body 24 potential increase and the negative voltage applied to the BL terminal 74b, the p-n junction between 24 and region 20b is forward-biased, evacuating any holes from the floating body 24. To reduce undesired write "0" disturb to other memory cells 350 in the memory array 380, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74b. Under these conditions, memory cell 350a and 350b will be written to state "0" (compared to the previous write "0" described above, which results in all memory cells sharing the same BL terminal 74b to be written to state "0").

In one particular non-limiting embodiment, the following bias conditions are applied to the memory cell 350: a potential of about −0.2 volts to BL terminal 74b, a potential of about +0.5 volts is applied to selected WL terminal 70b, and about 0.0 volts is applied to substrate terminal 78; while unselected BL terminals 74 are left floating, about 0.0 volts is applied to unselected WL terminal 70, and about 0.0 volts is applied to unselected terminal 78. FIGS. 54-55 show the bias conditions for the selected and unselected memory cells in memory array 380 where memory cells 350a and 350b are the selected cells. However, these voltage levels may vary.

Figure 56:
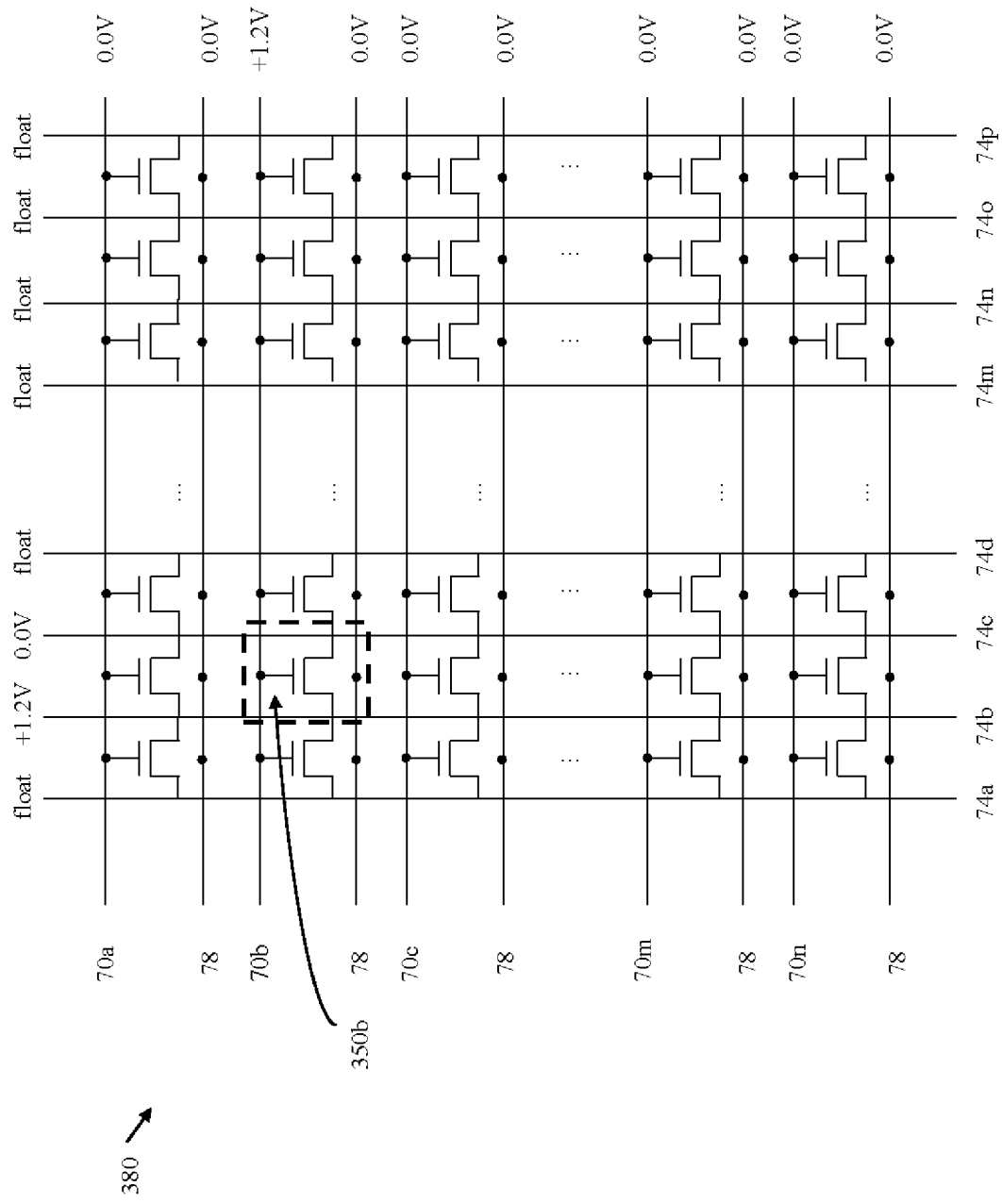
FIG. 56 is a schematic illustration of an equivalent circuit of a memory array in which a write "1" operation is being performed by impact ionization according to an embodiment of the present invention.
Figure 57:
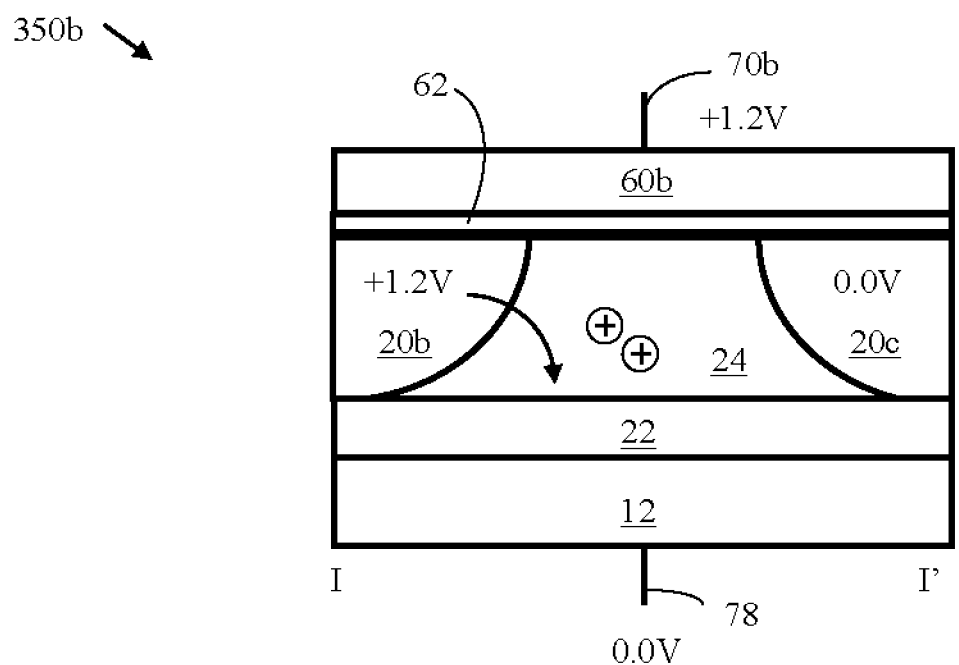
FIG. 57 schematically illustrates a selected memory cell of the array of FIG. 56 on which the write "1" operation is being performed, and the bias conditions thereon.

An example of the bias conditions on a selected memory cell 350b under an impact ionization write "1" operation is illustrated in FIGS. 56-57. A positive bias is applied to the selected WL terminal 70b, zero voltage is applied to the BL terminal 74c, a positive bias applied to the BL terminal 74b, while the substrate terminal 78 is grounded. This condition results in a lateral electric field sufficient to generate energetic electrons, which subsequently generate electron-hole pairs, followed by hole injection to the floating body 24 of the selected memory cell (e.g. cell 350b in FIGS. 56-57). The unselected WL terminals (e.g. WL terminal 70a, 70c, 70m, and 70n in FIG. 56) are grounded, the unselected BL terminals (e.g. BL terminal 74a, 74d, 74m, 74n, 74o, and 74p in FIG. 56) are left floating, and the unselected substrate terminal 78 is grounded. Alternatively, the unselected BL terminals to the right of BL terminal 74c (where zero voltage is applied to) can be grounded. A positive voltage of the same amplitude as that applied to BL terminal 74b can be applied to the unselected BL terminals to the left of BL terminal 74b. Because the region 20b (connected to BL terminal 74b) is shared with the adjacent cell 350a, the unselected BL terminals to the left of BL terminal 74b (where a positive voltage is applied to) need to be left floating or applied a positive voltage to prevent any parasitic current flowing from BL terminal 74b to the BL terminals to the left of BL terminal 74b, which can cause undesired write "1" operations to at least one unselected memory cell 350.

In one particular non-limiting embodiment, the following bias conditions are applied to the selected memory cell 350b: a potential of about 0.0 volts is applied to BL terminal 74c, a potential of about +1.2 volts is applied to BL terminal 74b, a potential of about +1.2 volts is applied to the selected WL terminal 70b, and about 0.0 volts is applied to substrate terminal 78; while the following bias conditions are applied to the unselected terminals: a potential of about 0.0 volts is applied to unselected WL terminals 70 (e.g. WL terminals 70a, 70m, and 70n in FIG. 56), about 0.0 volts is applied to substrate terminal 78, and the unselected BL terminals 74 (e.g. BL terminals 74c, 74d, 74m, 74n, 74o, and 74p in FIG. 56) are left floating. FIGS. 56-57 show the bias conditions for the selected and unselected memory cells in memory array 380 (with memory cell 350b as the selected cell). However, these voltage levels may vary. Alternatively, the bias conditions on BL terminals 74b and 74c (connected to regions 20 of the selected memory cell 350b) may be reversed.

Figure 58:
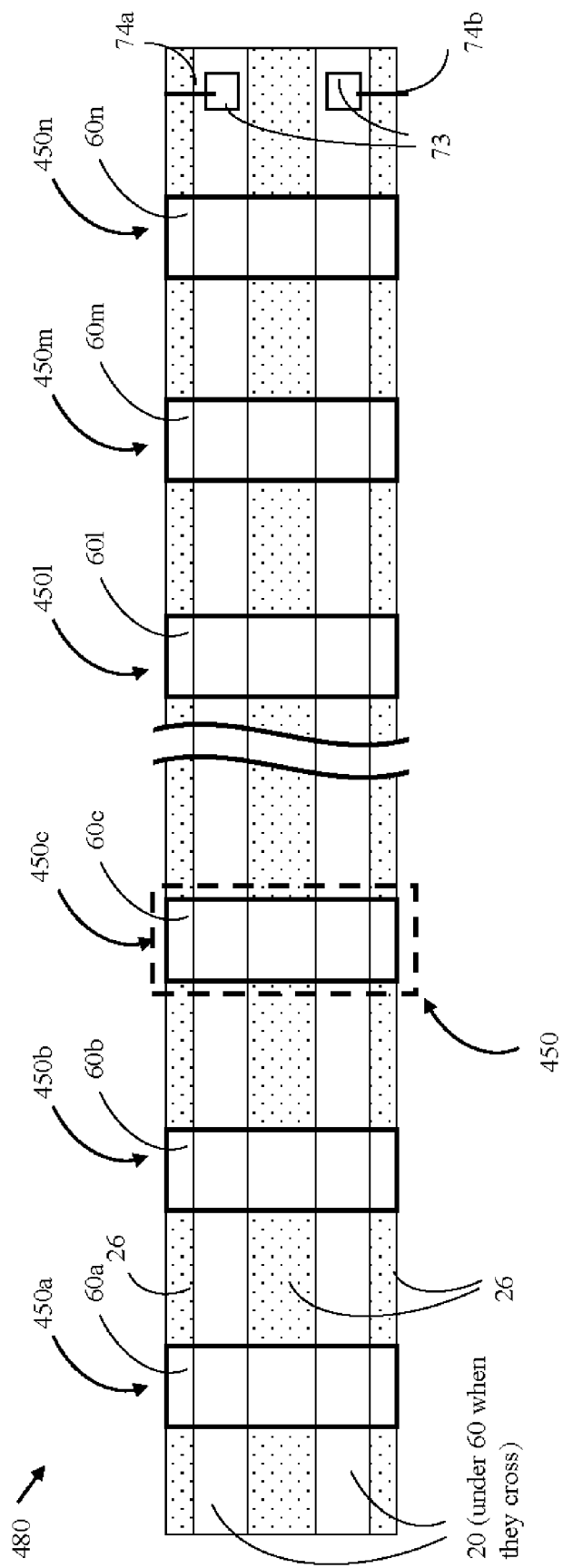
FIG. 58 schematically illustrates a link according to another embodiment of the present invention.

FIG. 58 schematically illustrates a memory array according to another embodiment of the present invention. Memory array 480 includes a plurality of memory cells 450. FIG. 59A shows a top view of memory cell 450 in isolation, with FIGS. 59B and 59C showing sectional views of the memory cell 450 taken along lines I-I' and II-II' of FIG. 58, respectively.

Referring to FIGS. 59B and 59C together, the cell 450 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can be grown epitaxially on top of substrate 12.

A floating body region 24 of the first conductivity type, such as p-type, for example, is bounded on top by regions 20 and insulating layer 62, on the sides by insulating layers 26, and on the bottom by buried layer 22. Insulating layers 26 (like, for example, shallow trench isolation (STI)), may be made of silicon oxide, for example. Insulating layers 26 insulate cell 450 from neighboring cells 450 when multiple cells 450 are joined in an array 480 to make a memory device as illustrated in FIG. 58.

Regions 20 having a second conductivity type, such as n-type, for example, are provided in substrate 12 and are exposed at surface 14. Regions 20 are formed by an implantation process formed on the material making up substrate 12, according to any implantation process known and typically used in the art. Alternatively, a solid state diffusion process could be used to form regions 20.

A gate 60 is positioned above the floating body region 24, regions 20 and insulating layers 26. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 60:
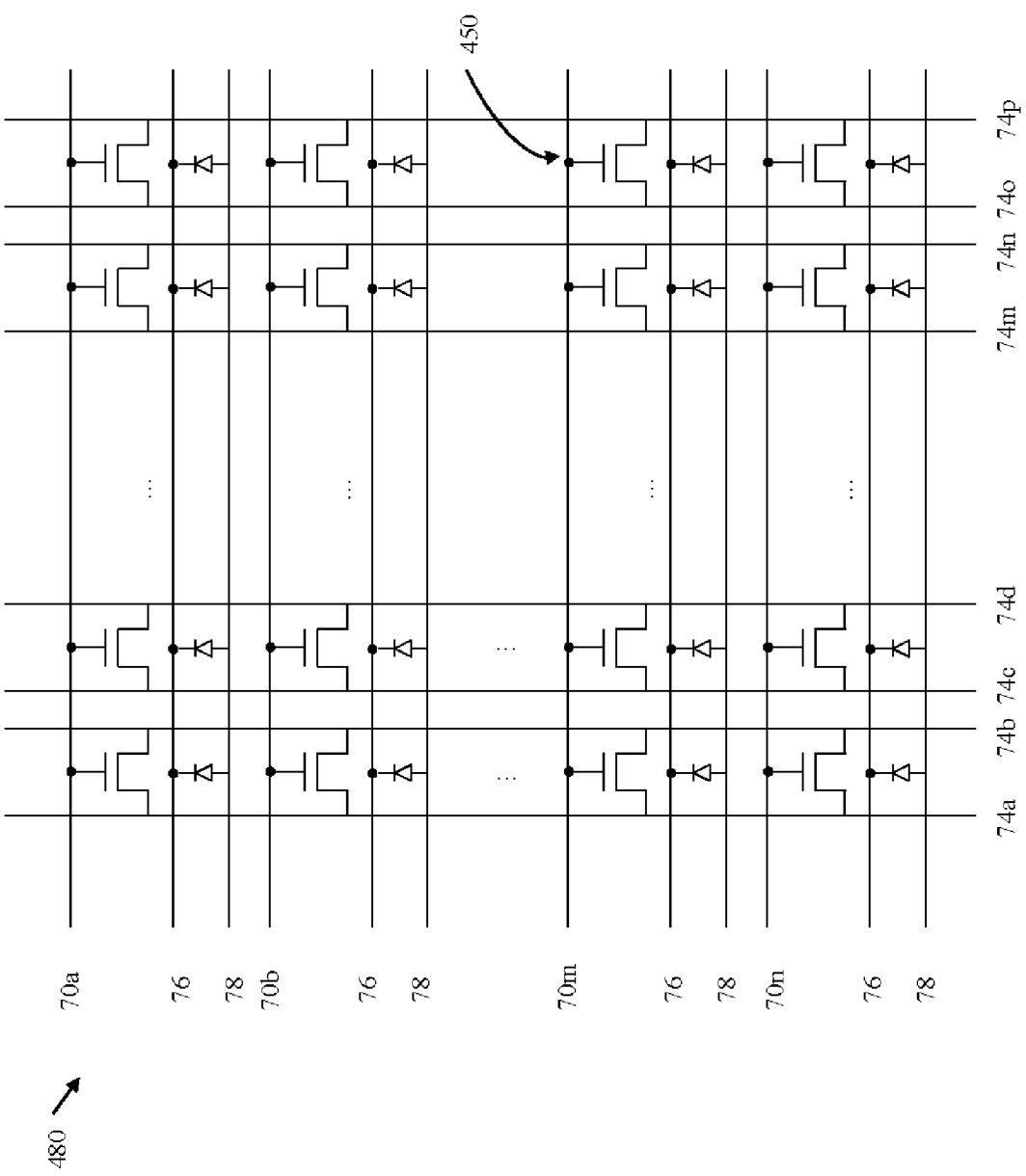
FIG. 60 shows an equivalent circuit representation of a memory array of links, including the link of FIG. 58

Region 20 is continuous (electrically conductive) in the direction along the II-II' direction (referring to FIG. 59A) and can be used to connect several memory cells 450 in parallel as shown in the equivalent circuit representation of the memory array 480 in FIGS. 58 and 60 (where the regions 20 are connected to bit line (BL) terminals 74). Connections between regions 20 and bit line (BL) terminals 74a and 74b can be made through contacts 73 at the edge of the parallel connections (see FIG. 58). An adjacent pair of continuous regions 20 can be used to connect a link of cells 450 in parallel. In a parallel connection, the voltage applied to the BL terminals 74 is about the same across all memory cells 450 (small differences might occur due to voltage drop along the bit lines) and the current will only flow through the selected memory cell 450. Cell 450 further includes word line (WL) terminal 70 electrically connected to gate 60, buried well (BW) terminal 76 connected to buried layer 22, and substrate terminal 78 electrically connected to substrate 12 (se FIGS. 59B-59C).

Because it is possible to make connections to BL terminals only at the edge of the parallel connections, the number of contacts can be reduced, for example to two contacts, for each parallel connection. No contacts to the memory cells that are not at the edge of the parallel connection are necessary, as these are contactless memory cells that are continuously linked by regions 20 The number of contacts can be increased to reduce the resistance of the parallel connections if desired.

Figure 61:
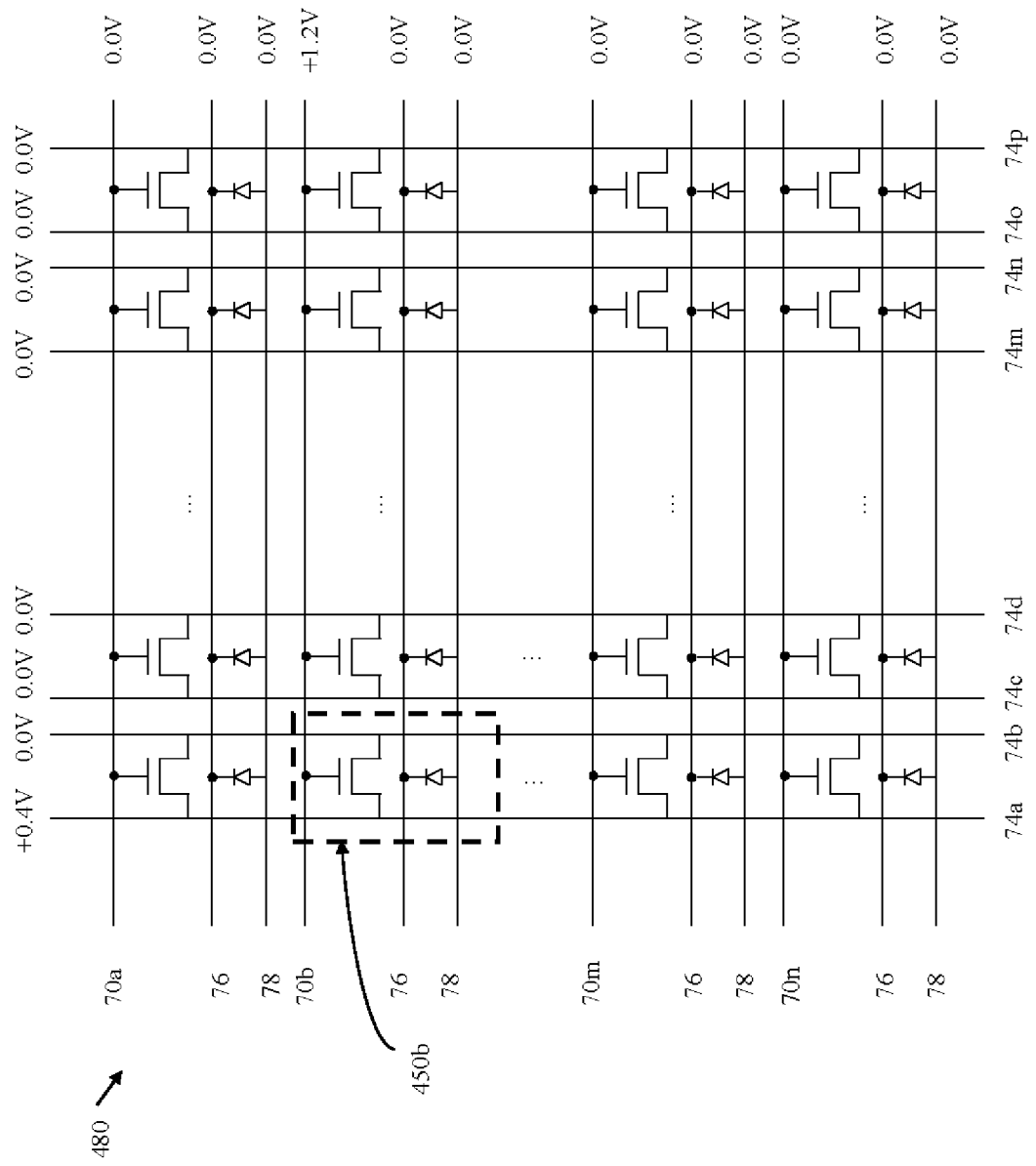
FIG. 61 is a schematic illustration of an equivalent circuit of a memory array in which a read operation is being performed on a selected memory cell according to an embodiment of the present invention.

A read operation of the embodiment of FIGS. 58-59C is described with reference to FIGS. 61-62, where memory cell 450b is being selected (as shown in FIG. 61). The following bias conditions may be applied: a positive voltage is applied to BL terminal 74a, zero voltage is applied to BL terminal 74b, a positive voltage is applied to WL terminal 70b, zero voltage is applied to BW terminal 76 and zero voltage is applied to substrate terminal 78. The unselected BL terminals (e.g. BL terminal 74c, 74d, . . . , 74p in FIG. 61) will remain at zero voltage, the unselected WL terminals (e.g. WL terminal 70a, 70m, 70n in FIG. 61) will remain at zero voltage, the unselected BW terminals 76 will remain at zero voltage (or a positive bias can be applied to maintain the states of the unselected memory cells), and the unselected substrate terminals 78 will remain at zero voltage. Alternatively, the bias conditions on BL terminals 74a and 74b (connected to regions 20 of the selected memory cell 450b) may be reversed.

In one particular non-limiting embodiment, the following bias conditions are applied to the selected memory cell 450b: a potential of about +0.4 volts is applied to BL terminal 74a, a potential of about 0.0 volts is applied to BL terminal 74b, a potential of about +1.2 volts is applied to WL terminal 70b, about 0.0 volts is applied to BW terminal 76 and about 0.0 volts is applied to substrate terminal 78; while the following bias conditions are applied to the unselected terminals: about 0.0 volts is applied to unselected BL terminals, about 0.0 volts is applied to unselected WL terminals, about 0.0 volts is applied to unselected BW terminals (or +1.2 volts is applied to BW terminal 76 to maintain the states of the unselected memory cells), and about 0.0 volts is applied to unselected substrate terminals.

Figure 62:
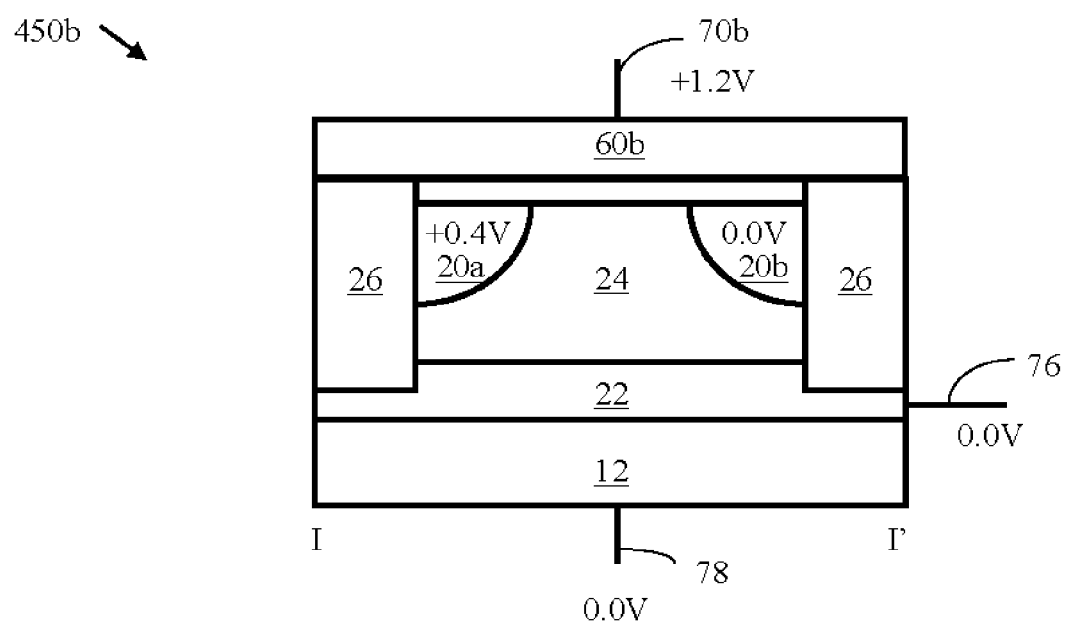
FIG. 62 schematically illustrates the selected memory cell of the array represented in FIG. 61 and bias conditions thereon during the read operation.

As shown in FIG. 62, about +1.2 volts will be applied to the gate 60b (connected to terminal 70b), about 0.4 volts will be applied to the region 20a (connected to BL terminal 74a), about 0.0 volts will be applied to region 20b (connected to BL terminal 74b), about 0.0 volts will be applied to buried layer 22, and about 0.0 will be applied to substrate 12 of selected memory cell 450b. The current flowing from BL terminal 74a to BL terminal 74b will then be determined by the potential of the floating body region 24 of the selected cell 450b.

If cell 450b is in a state "1" having holes in the floating body region 24, then the memory cell will have a lower threshold voltage (gate voltage where the transistor is turned on), and consequently be conducting a larger current compared to if cell 450b is in a state "0" having no holes in floating body region 24. The cell current can be sensed by, for example, a sense amplifier circuit connected to BL terminal 74a.

Figure 63:
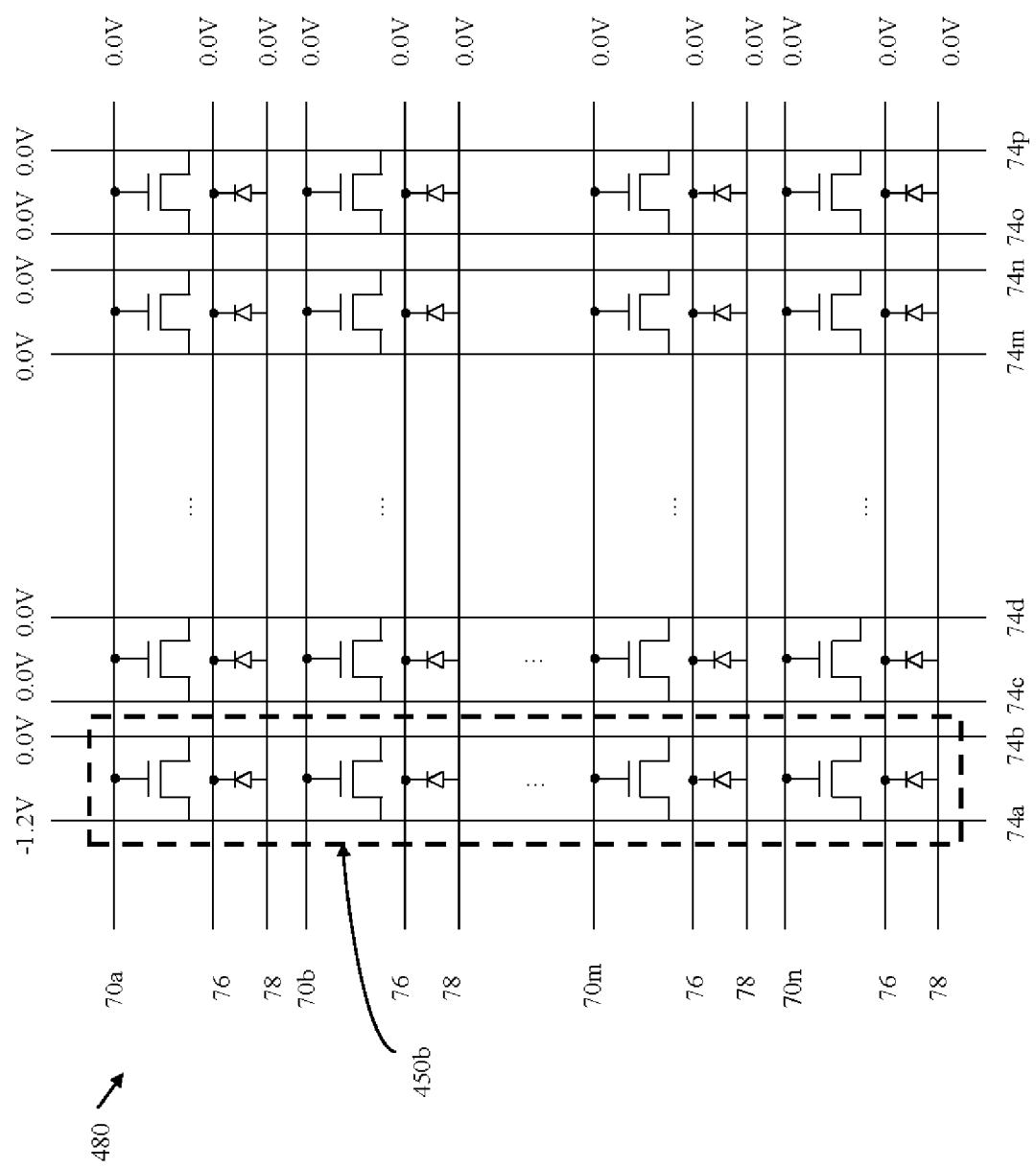
FIG. 63 is a schematic illustration of an equivalent circuit of a memory array in which a write "0" operation is being performed according to an embodiment of the present invention.
Figure 64:
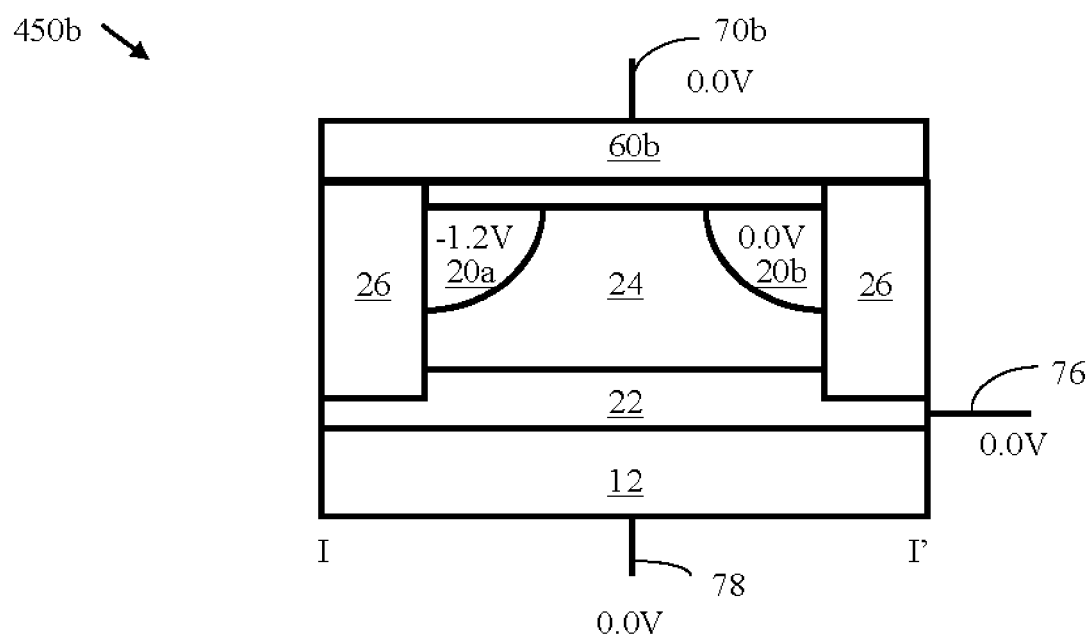
FIG. 64 schematically illustrates a memory cell of the array represented in FIG. 63 that is having a write "0" operation performed thereon according to an embodiment of the present invention.

A write "0" operation is described with reference to FIGS. 63-64, where the following bias conditions are applied: zero voltage to the BL terminal 74b, zero voltage to the WL terminals 70, and negative voltage to the BL terminal 74a, while the BW terminal 76 and substrate terminal 78 are grounded. Under these conditions, the p-n junction between floating body 24 and region 20a of the memory cell 450 is forward-biased, evacuating any holes from the floating body 24. In one particular non-limiting embodiment, about −1.2 volts is applied to terminal 74a, about 0.0 volts is applied to terminal 70, and about 0.0 volts is applied to terminals 76 and 78. However, these voltage levels may vary, while maintaining the relative relationship between the charges applied, as described above. Alternatively, the write "0" operation can be achieved by reversing the bias conditions applied to BL terminals 74a and 74b.

Figure 65:
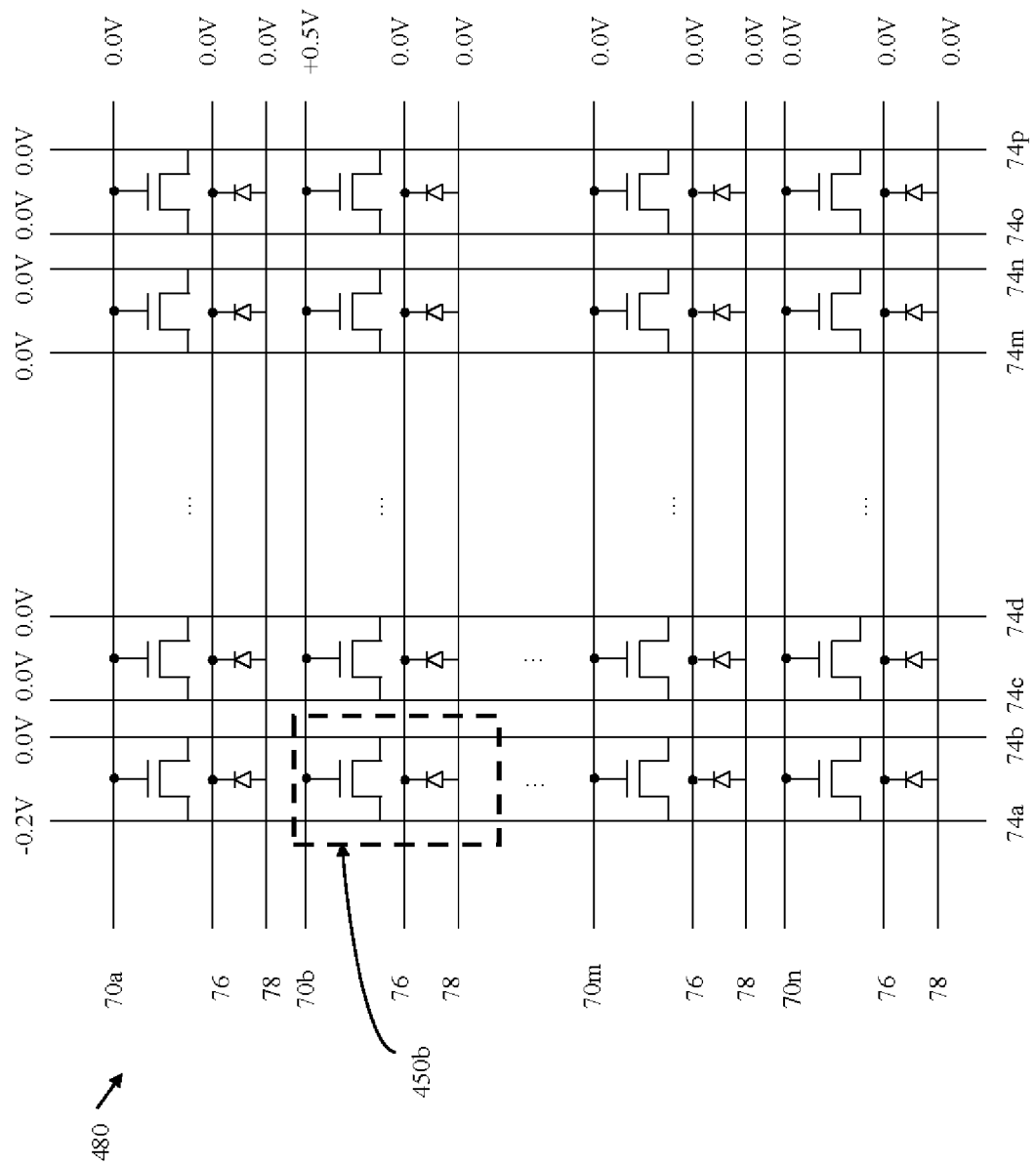
FIG. 65 is a schematic illustration of an equivalent circuit of a memory array in which a write "0" operation is being performed according to an alternative embodiment of the present invention that allows for individual bit writing.
Figure 66:
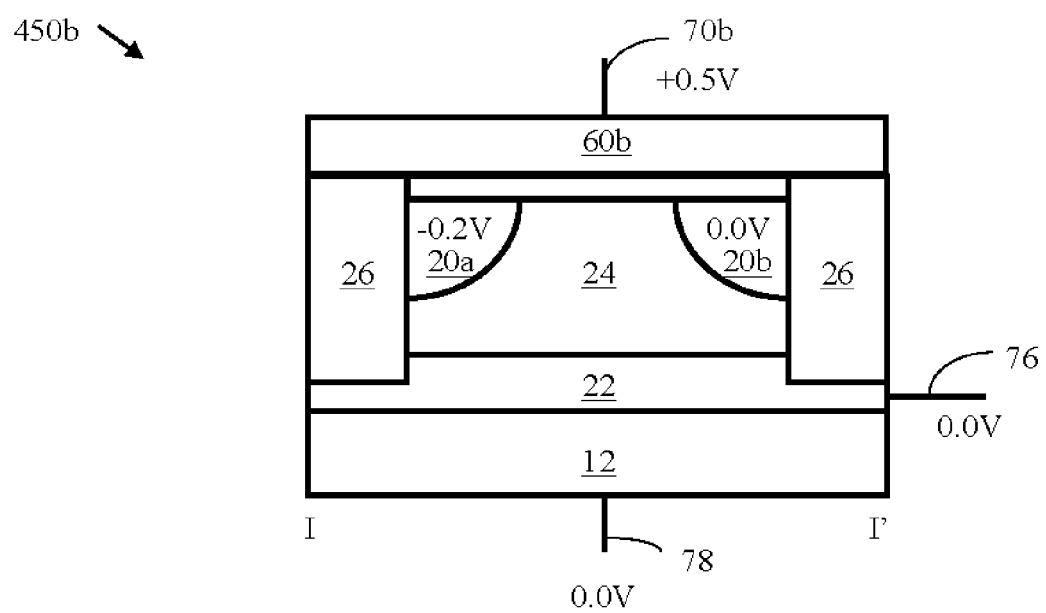
FIG. 66 schematically illustrates a selected memory cell of the array represented in FIG. 65 that is being written to by the write "0" operation according to the alternative embodiment described with regard to FIG. 65.

An alternative write "0" operation that allows for individual bit writing are shown in FIGS. 65-66 and can be performed by applying a negative voltage to BL terminal 74a, zero voltage to BL terminal 74b, zero voltage to BW terminal 76, zero voltage to substrate terminal 78, and a positive voltage to WL terminal 70. Under these conditions, a positive voltage will be applied to the gate of the selected memory cell (e.g. memory cell 450b in FIGS. 65-66) and consequently the floating body 24 potential will increase through capacitive coupling from the positive voltage applied to the WL terminal 70. As a result of the floating body 24 potential increase and the negative voltage applied to the BL terminal 74a, the p-n junction between 24 and region 20a is forward-biased, evacuating any holes from the floating body 24. To reduce undesired write "0" disturb to other memory cells 450 in the memory array 480, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74a.

In one particular non-limiting embodiment, the following bias conditions are applied to the memory cell 450b: a potential of about 0.0 volts to BL terminal 74b, a potential of about −0.2 volts to BL terminal 74a, a potential of about +0.5 volts is applied to selected WL terminal 70b, about 0.0 volts is applied to BW terminal 76, and about 0.0 volts is applied to substrate terminal 78; while about 0.0 volts is applied to unselected BL terminals 74, about 0.0 volts is applied to BW terminal 76 (or +1.2 volts is applied to BW terminal 76 to maintain the states of the unselected memory cells), about 0.0 volts is applied to unselected WL terminal 70, and about 0.0 volts is applied to unselected terminal 78. FIGS. 65-66 show the bias conditions for the selected and unselected memory cells in memory array 480 where memory cell 450b is the selected cell. However, these voltage levels may vary. Alternatively, the write "0" operation can be achieved by reversing the bias conditions applied to BL terminals 74a and 74b.

Figure 67:
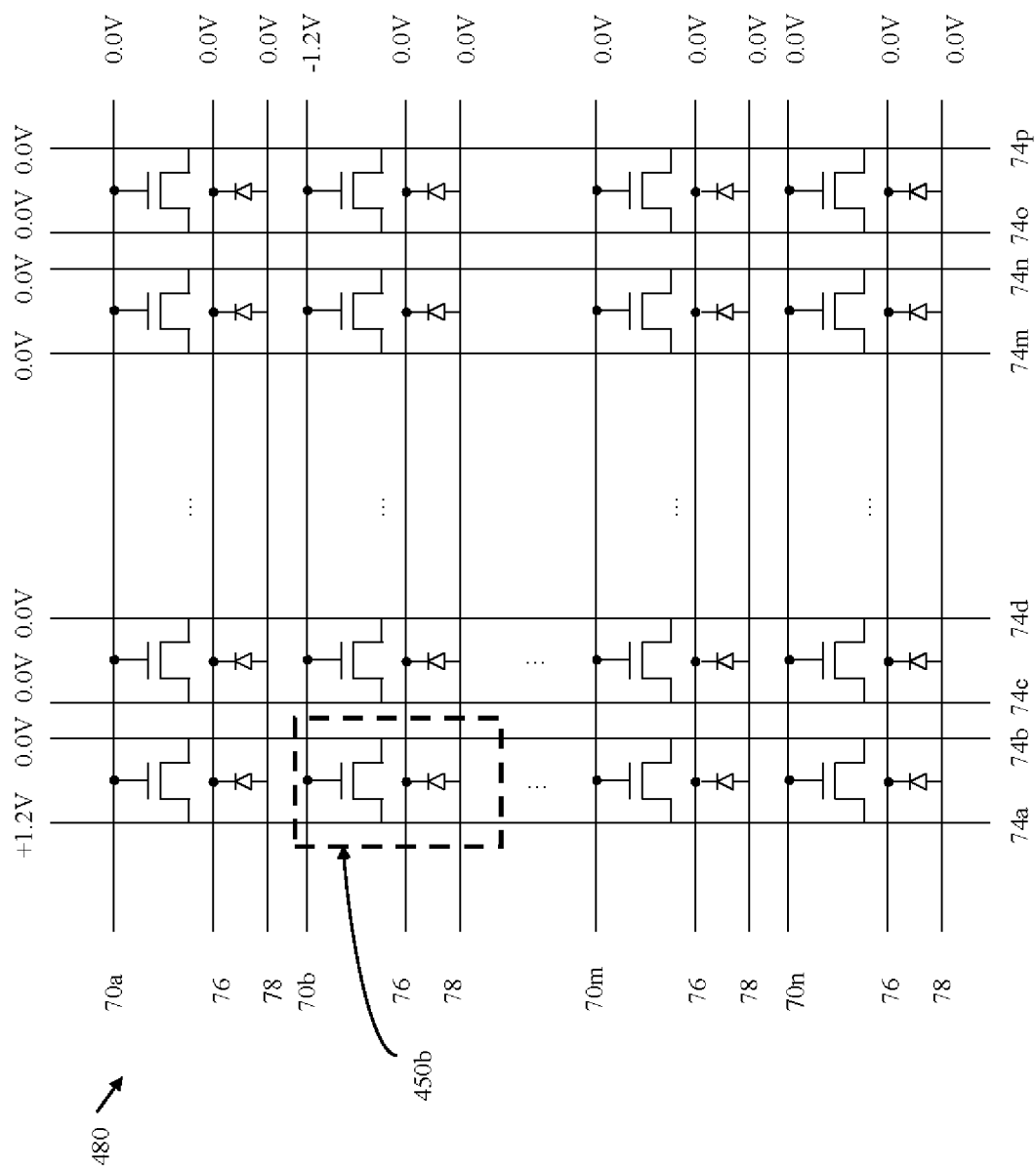
FIG. 67 is a schematic illustration of an equivalent circuit of a memory array in which a write "1" operation is being performed by impact ionization according to an embodiment of the present invention.
Figure 68:
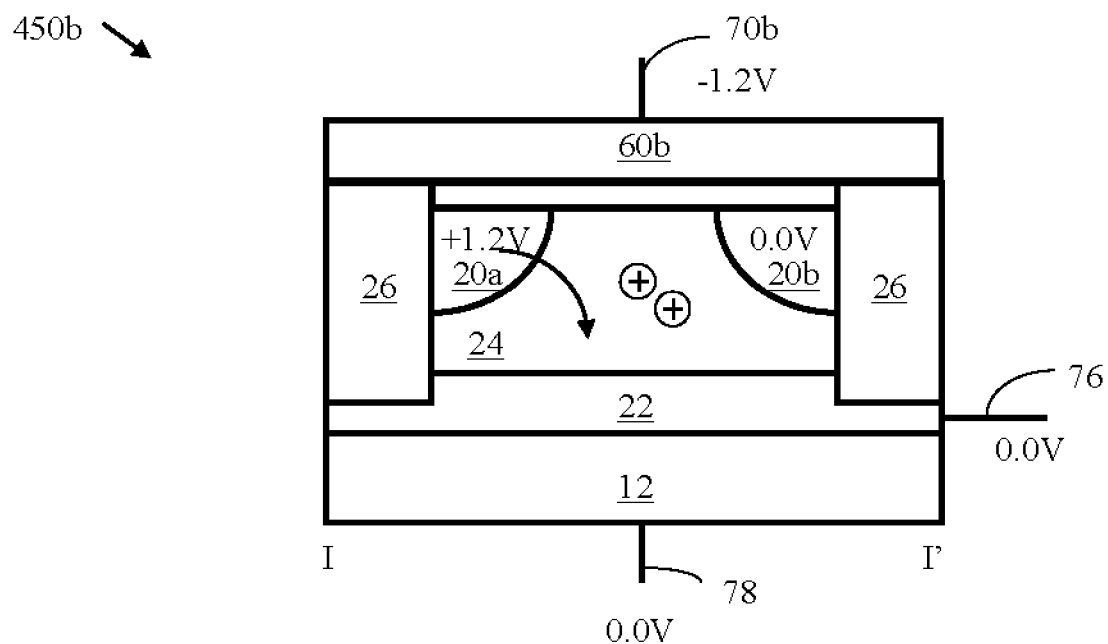
FIG. 68 schematically illustrates a selected memory cell of the array of FIG. 67 on which the write "1" operation is being performed, and the bias conditions thereon.

An example of the bias conditions on a selected memory cell 450b undergoing a band-to-band tunneling write "1" operation is illustrated in FIGS. 67 and 68. A negative bias is applied to the selected WL terminal 70b, zero voltage is applied to the BL terminal 74b, a positive bias is applied to the BL terminal 74a, zero voltage is applied to the BW terminal 76, and the substrate terminal 78 is grounded. These conditions cause electrons flow to the BL terminal 74a, generating holes which subsequently are injected into the floating body region 24.

In one particular non-limiting embodiment, the following bias conditions are applied to the selected memory cell 450b: a potential of about 0.0 volts is applied to BL terminal 74b, a potential of about +1.2 volts is applied to BL terminal 74a, a potential of about −1.2 volts is applied to the selected WL terminal 70b, about 0.0 volts is applied to BW terminal 76, and about 0.0 volts is applied to substrate terminal 78; while the following bias conditions are applied to the unselected terminals: about 0.0 volts is applied to unselected BL terminals (e.g. BL terminals 74c, 74d, 74m, 74n, 74o, and 74p in FIG. 67), a potential of about 0.0 volts is applied to unselected WL terminals 70 (e.g. WL terminals 70a, 70m, and 70n in FIG. 67), about 0.0 volts is applied to unselected BW terminals 76 (or +1.2 volts is applied to maintain the states of the unselected memory cells), and about 0.0 volts is applied to unselected substrate terminals 78. FIGS. 67-68 show the bias conditions for the selected and unselected memory cells in memory array 480 where memory cell 450b is the selected cell. However, these voltage levels may vary. Alternatively, the write "1" operation can be achieved by reversing the bias conditions applied to BL terminals 74a and 74b.

Figure 69:
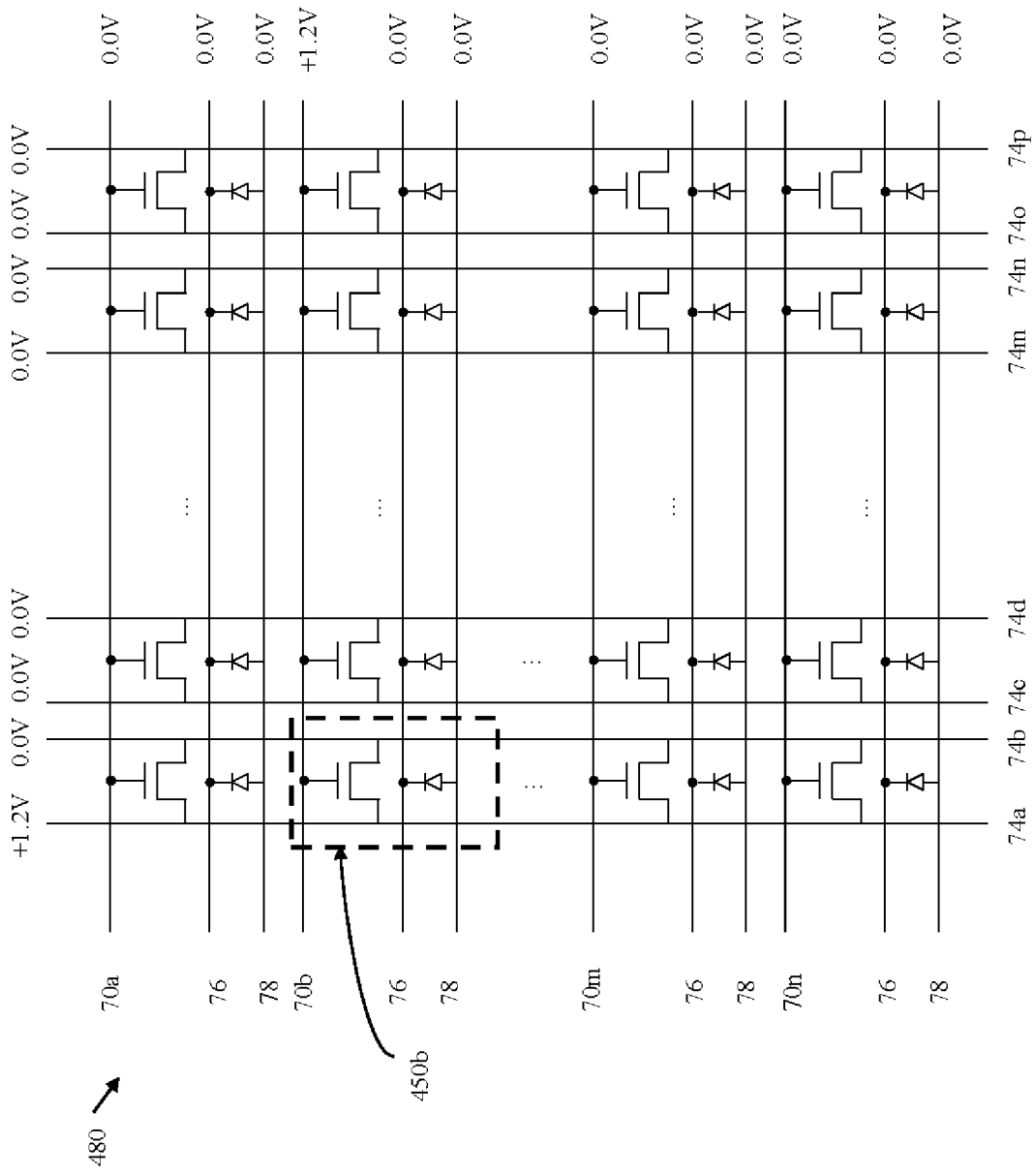
FIG. 69 is a schematic illustration of an equivalent circuit of a memory array in which a write "1" operation is being performed by impact ionization according to an embodiment of the present invention.
Figure 70:
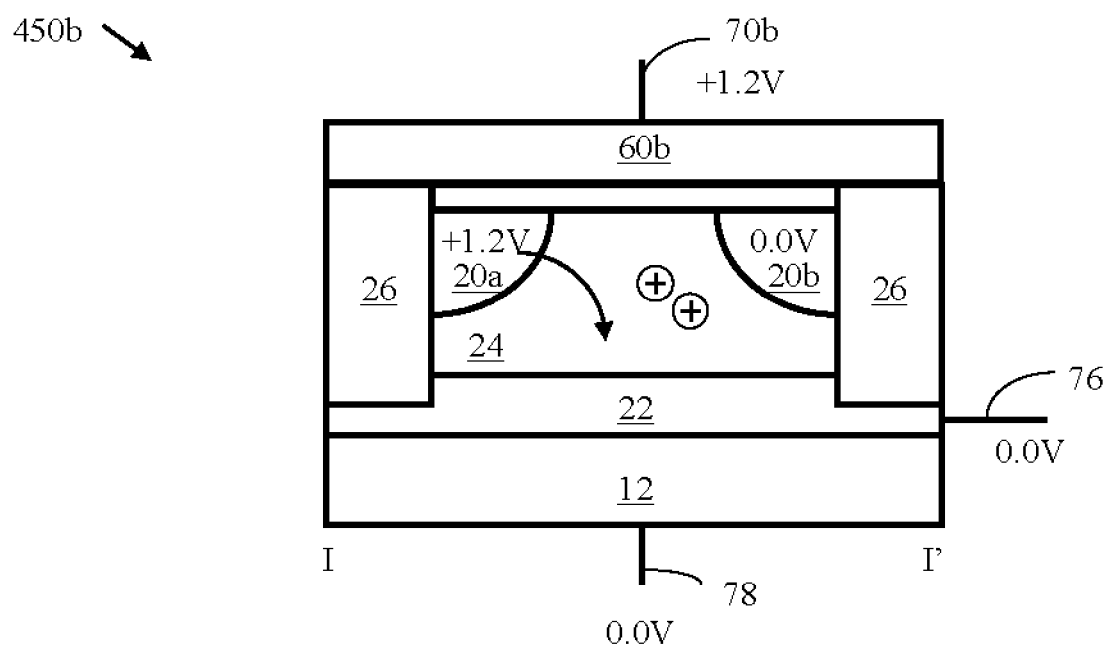
FIG. 70 schematically illustrates a selected memory cell of the array of FIG. 69 on which the write "1" operation is being performed, and the bias conditions thereon.

An example of the bias conditions on a selected memory cell 450b undergoing an impact ionization write "1" operation is illustrated in FIGS. 69-70. A positive bias is applied to the selected WL terminal 70b, zero voltage is applied to the BL terminal 74b, a positive bias is applied to the BL terminal 74a, zero voltage is applied to BW terminal 76, and the substrate terminal 78 is grounded. These conditions cause a lateral electric field sufficient to generate energetic electrons, which subsequently generate electron-hole pairs, followed by hole injection into the floating body 24 of the selected memory cell (e.g. cell 450b in FIGS. 69-70).

In one particular non-limiting embodiment, the following bias conditions are applied to the selected memory cell 450b: a potential of about 0.0 volts is applied to BL terminal 74b, a potential of about +1.2 volts is applied to BL terminal 74a, a potential of about +1.2 volts is applied to the selected WL terminal 70b, about 0.0 volts is applied to BW terminal 76, and about 0.0 volts is applied to substrate terminal 78; while the following bias conditions are applied to the unselected terminals: about 0.0 volts is applied to unselected BL terminals 74 (e.g. BL terminals 74c, 74d, 74m, 74n, 74o, and 74p in FIG. 69), a potential of about 0.0 volts is applied to unselected WL terminals 70 (e.g. WL terminals 70a, 70m, and 70n in FIG. 69), about 0.0 volts is applied to BW terminal 76 (or +1.2 volts is applied to BW terminal 76 to maintain the states of the unselected memory cells), and about 0.0 volts is applied to substrate terminal 78. FIGS. 69-70 show the bias conditions for the selected and unselected memory cells in memory array 480 (with memory cell 450b as the selected cell). However, these voltage levels may vary. Alternatively, the write "1" operation can be achieved by reversing the bias conditions applied to BL terminals 74a and 74b.

Figure 71:
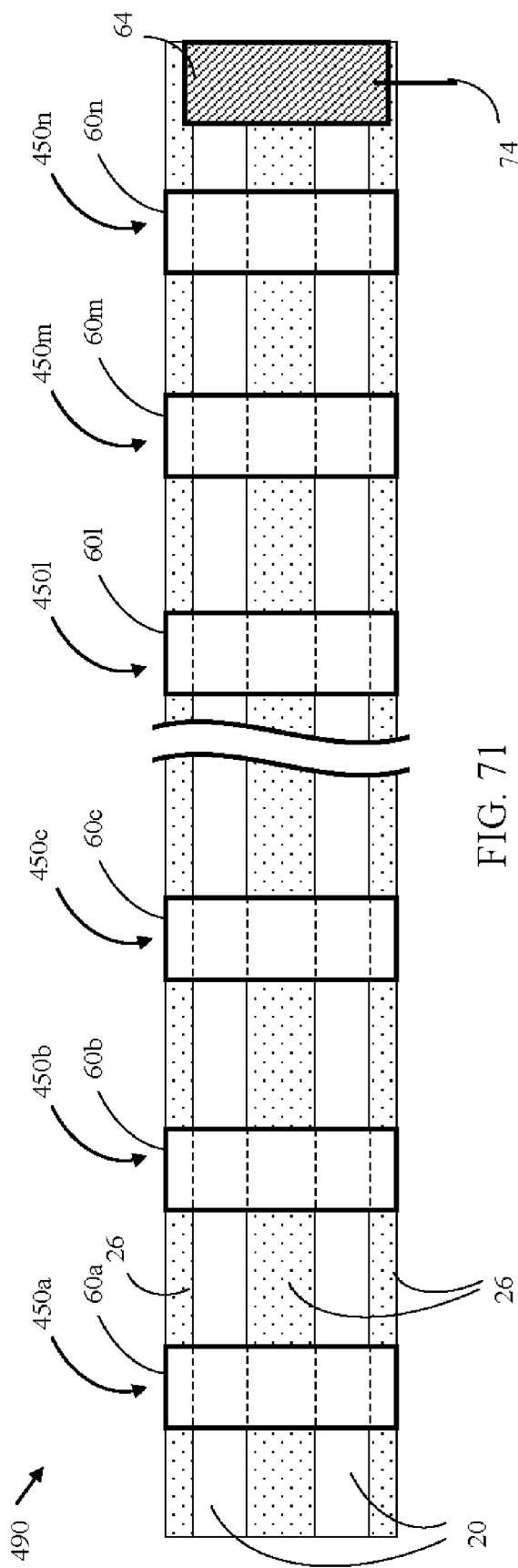
FIG. 71 shows a memory array where adjacent regions are connected a common BL terminal through a conductive region according to an alternative embodiment of the present invention.

FIG. 71 shows an alternative embodiment of memory array 490, where adjacent regions 20 are connected to a common BL terminal 74 through a conductive region 64. The operation of memory array 490 is similar to that of memory array 380 fabricated on a silicon on insulator (SOI) surface, where regions 20 are shared between two adjacent memory cells 350.

Figure 72A:
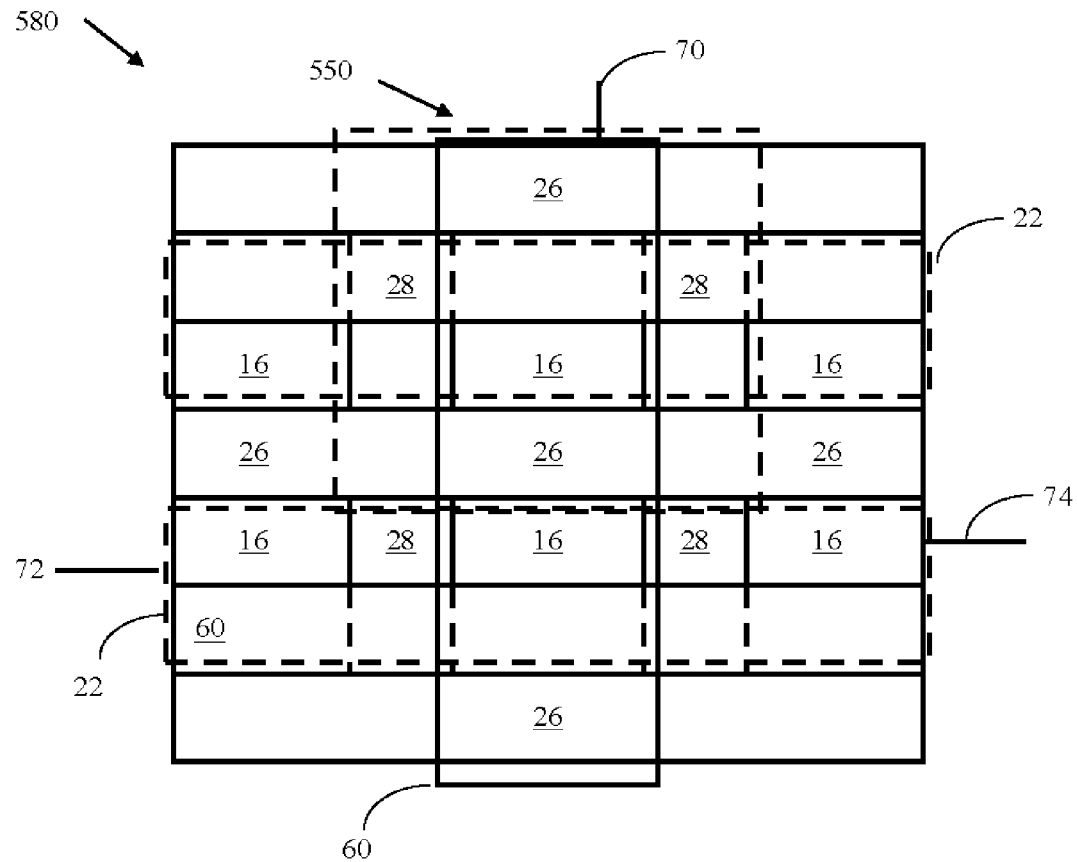
FIG. 72A shows a memory array according to another embodiment of the present invention.
Figure 72B:
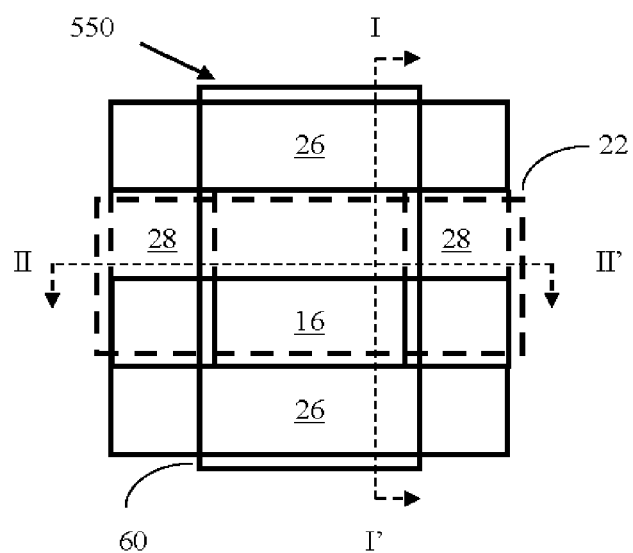
FIG. 72B shows, in isolation, a memory cell from the memory array of FIG. 72A.

FIG. 72A shows another embodiment of a memory array, referred to as 580. Memory array 580 comprises a plurality of memory cells 550. FIG. 72B shows a memory cell 550 in isolation while FIGS. 72C and 72D show sectional views of the memory cell 550 of FIG. 72B taken along lines I-I' and II-II' of FIG. 72B, respectively.

Memory cell 550 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can be grown epitaxially on top of substrate 12.

Figure 72C:
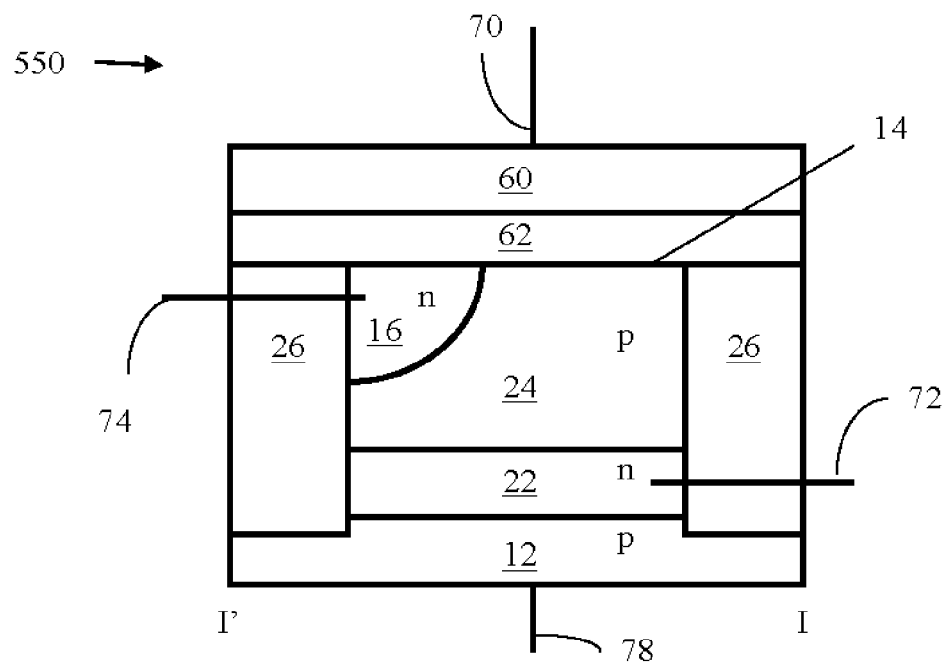
FIGS. 72C and 72D show sectional views of the memory cell of FIG. 72B taken along lines I-I' and II-II' of FIG. 72B, respectively.
Figure 72D:
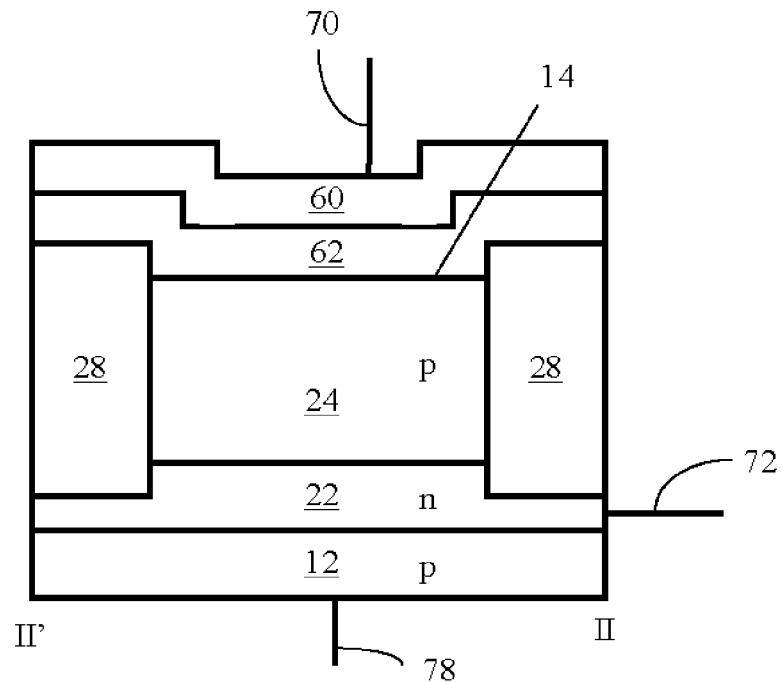

A floating body region 24 of the first conductivity type, such as p-type, for example, is bounded on top by region 16 and insulating layer 62, on the sides by insulating layers 26 and 28, and on the bottom by buried layer 22, see FIGS. 72C-72D. Insulating layers 26 and 28 (like, for example, shallow trench isolation (STI)), may be made of silicon oxide, for example. Insulating layers 26 and 28 insulate cell 550 from neighboring cells 550 when multiple cells 550 are joined in an array 580 to make a memory device as illustrated in FIG. 72A. Insulating layer 26 insulate both body region 24 and buried region 22 of adjacent cells (see FIG. 72C), while insulating layers 28 insulate neighboring body regions 24, but not the buried layer 22, allowing the buried layer 22 to be continuous (i.e. electrically conductive) in one direction (along the II-II' direction as shown in FIG. 72D).

A region 16 having a second conductivity type, such as n-type, for example, is provided in substrate 12 and is exposed at surface 14. Region 16 is formed by an implantation process formed on the material making up substrate 12, according to any implantation process known and typically used in the art. Alternatively, a solid state diffusion process can be used to form region 16. Region 16 is continuous (electrically conductive) in the direction along the II-II' direction (referring to FIG. 72B) and can be used to connect several memory cells 550 in parallel like shown in the equivalent circuit representation of the memory array 580 in FIG. 73.

A gate 60 is positioned in between the region 16 and insulating layer 26 and above the floating body region 24. The gate 60 is insulated from floating body region 24 by an insulating layer 62, see FIG. 72C. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Contact between bit line (BL) terminal 74a and region 16 and contact between source line (SL) terminal 72a and buried layer 22 can be made at the edge of the parallel connections. Cell 550 further includes word line (WL) terminal 70 electrically connected to gate 60 and substrate terminal 78 electrically connected to substrate 12. Region 16 (connected to BL terminal 74) and buried layer 22 (connected to SL terminal 72) can be used to connect a link of cells 550 in parallel. In a parallel connection, the voltage applied to the SL terminal 72 and BL terminal 74 is about the same for all memory cells 550 (small differences might occur due to voltage drop along the bit lines) and the current will only flow through the selected memory cell 550.

Figure 73:
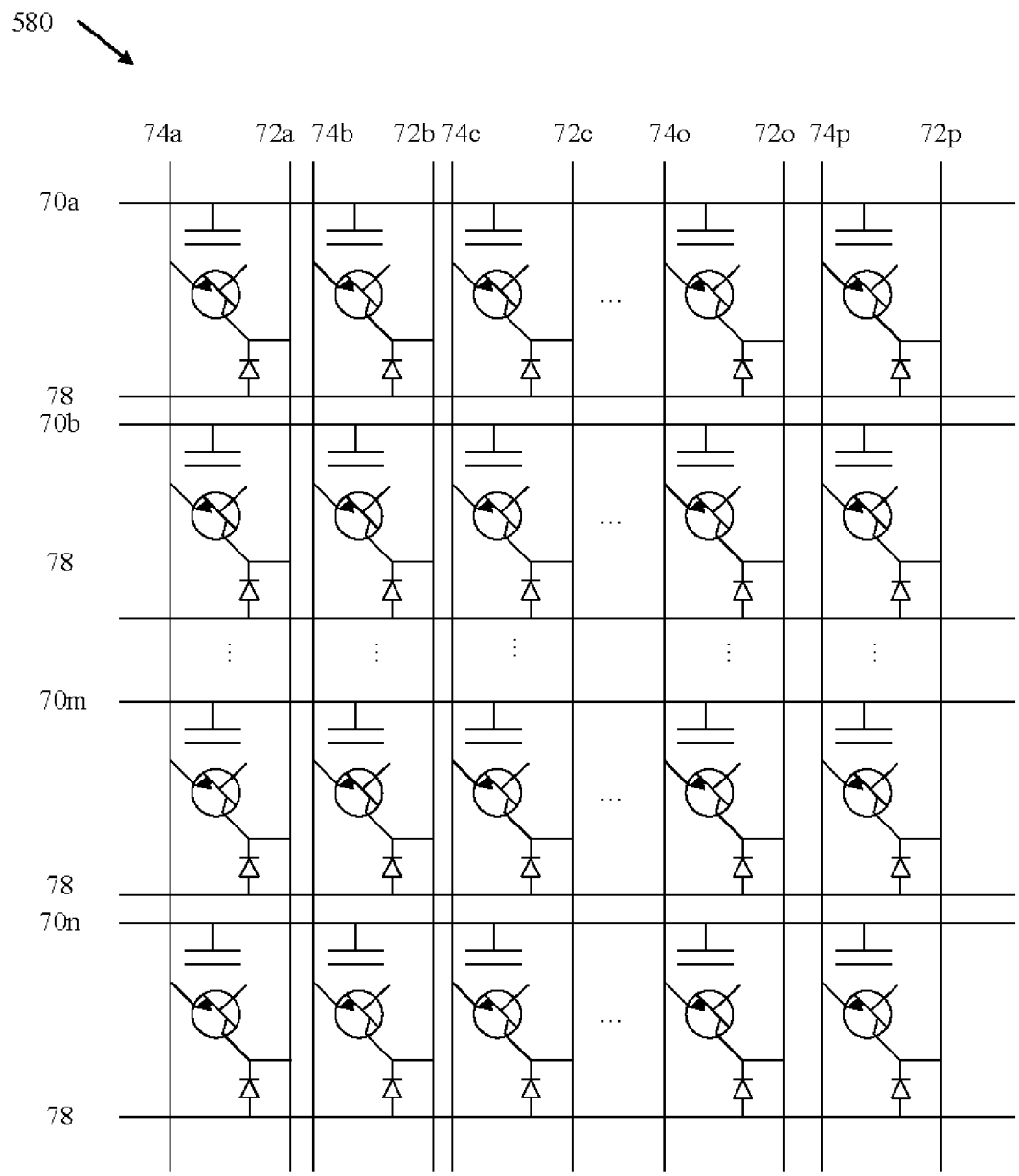
FIG. 73 is an equivalent circuit representation of a memory array of the type shown in FIG. 72A according to an embodiment of the present invention.

FIG. 73 shows an equivalent circuit representation of memory array 580, where a plurality of memory cells 550 are connected in parallel. Because it is possible to make connections to SL and BL terminals at only the edge of the parallel connections, the number of contacts can be reduced, for example to two contacts, for each parallel connection. No contacts are made to the regions 16 and 22 of the memory cells 550, except for those cells 550 at the edge of the parallel connections in memory array 580. Thus, those cells 550 not at the edge of the parallel connections are contactless memory cells. Of course, the number of contacts can be increased to reduce the resistance of the parallel connections if desired.

Figure 74A:
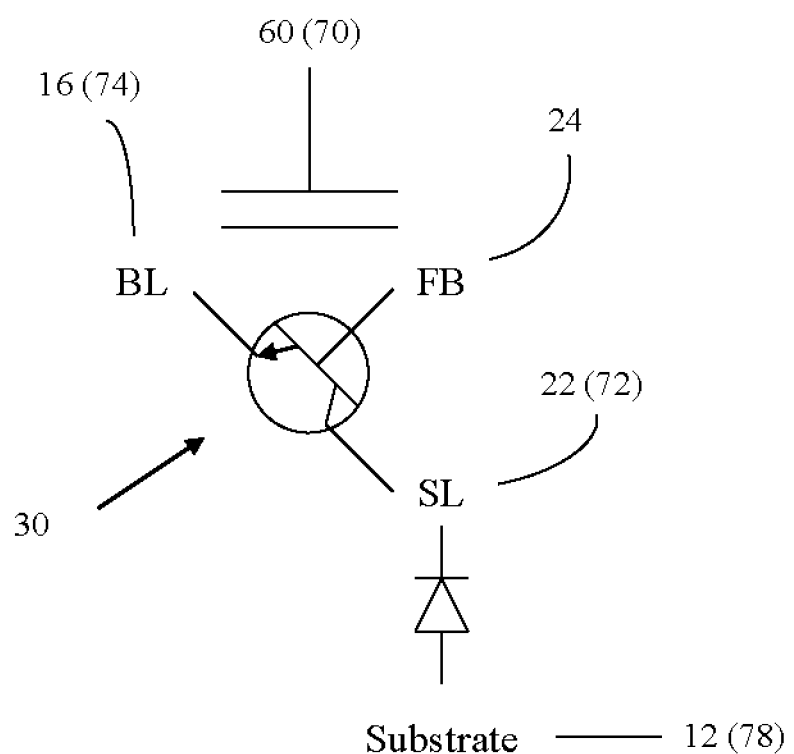
FIG. 74A shows an equivalent circuit representation of the memory cell of FIGS. 72B-72D according to an embodiment of the present invention.

FIG. 74A shows an equivalent circuit representation of memory cell 550, consisting of a n-p-n bipolar device 30 formed by buried well region 22, floating body 24, and region 16, with a gate 60 coupled to the floating body region 24.

A holding operation can be performed by utilizing the properties of the n-p-n bipolar devices 30 through the application of a positive back bias to the SL terminal 72 while grounding terminal 74. If floating body 24 is positively charged (i.e. in a state "1"), the bipolar transistor formed by BL region 16, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar device 30 formed by buried well layer 22, floating region 24, and region 16 to be a low-gain, (i.e., as near to 1:1 as practical) bipolar device, where the bipolar gain is defined as the ratio of the collector current flowing out of SL terminal 72 to the base current flowing into the floating region 24.

For memory cells in state "0" data, the bipolar device 30 will not be turned on, and consequently no base hole current will flow into floating region 24. Therefore, memory cells in state "0" will remain in state "0".

An example of the bias conditions applied to cell 550 to carry out a holding operation includes: zero voltage is applied to BL terminal 74, a positive voltage is applied to SL terminal 72, zero or negative voltage is applied to WL terminal 70, and zero voltage is applied to substrate terminal 78. In one particular non-limiting embodiment, about +1.2 volts is applied to terminal 72, about 0.0 volts is applied to terminal 74, about 0.0 volts is applied to terminal 70, and about 0.0 volts is applied to terminal 78. However, these voltage levels may vary.

Figure 74B:
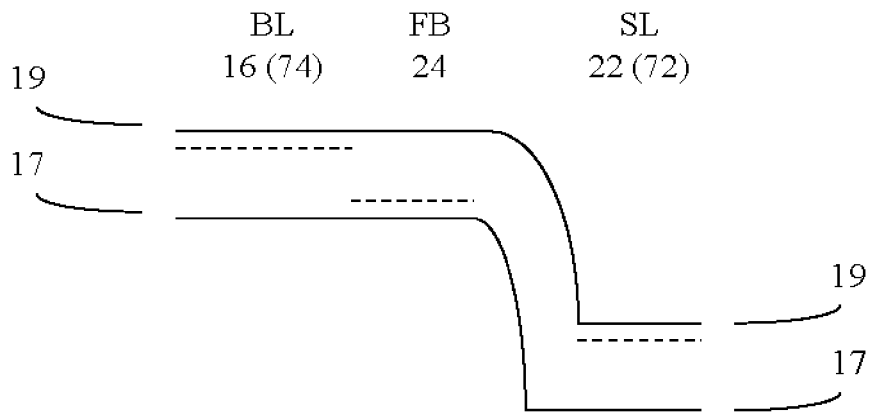
FIG. 74B shows an energy band diagram of the intrinsic n-p-n bipolar device of FIG. 74B when the floating body region is positively charged and a positive bias voltage is applied to the buried well region, according to an embodiment of the present invention.

FIG. 74B shows an energy band diagram of the intrinsic n-p-n bipolar device 30 of FIG. 74B when the floating body region 24 is positively charged and a positive bias voltage is applied to the buried well region 22. The dashed lines indicate the Fermi levels in the various regions of the n-p-n transistor 30. The Fermi level is located in the band gap between the solid line 17 indicating the top of the valance band (the bottom of the band gap) and the solid line 19 indicating the bottom of the conduction band (the top of the band gap) as is well known in the art. The positive charge in the floating body region lowers the energy barrier of electron flow into the base region. Once injected into the floating body region 24, the electrons will be swept into the buried well region 22 (connected to SL terminal 72) due to the positive bias applied to the buried well region 22. As a result of the positive bias, the electrons are accelerated and create additional hot carriers (hot hole and hot electron pairs) through an impact ionization mechanism. The resulting hot electrons flow into the SL terminal 72 while the resulting hot holes will subsequently flow into the floating body region 24. This process restores the charge on floating body 24 to its maximum level and will maintain the charge stored in the floating body region 24 which will keep the n-p-n bipolar transistor 30 on for as long as a positive bias is applied to the buried well region 22 through SL terminal 72.

If floating body 24 is neutrally charged (i.e., the voltage on floating body 24 being substantially equal to the voltage on grounded bit line region 16), a state corresponding to state "0", the bipolar device will not be turned on, and consequently no base hole current will flow into floating region 24. Therefore, memory cells in the state "0" will remain in the state "0".

Figure 74C:
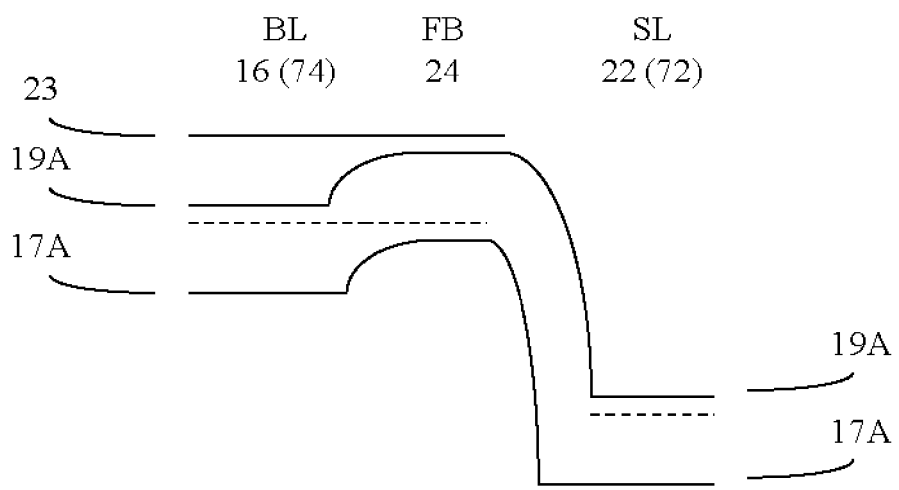
FIG. 74C shows an energy band diagram of the intrinsic n-p-n bipolar device 30 of FIG. 74A when the floating body region is neutrally charged and a bias voltage is applied to the buried well region, according to an embodiment of the present invention.

FIG. 74C shows an energy band diagram of the intrinsic n-p-n bipolar device 30 of FIG. 74A when the floating body region 24 is neutrally charged and a bias voltage is applied to the buried well region 22. In this state the energy level of the band gap bounded by solid lines 17A and 19A is different in the various regions of n-p-n bipolar device 30. Because the potentials of the floating body region 24 and the bit line region 16 are substantially equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30 will remain off.

To perform the holding operation, a periodic pulse of positive voltage can be applied to the back bias terminals of memory cells 550 through SL terminal 72 as opposed to applying a constant positive bias, thereby reducing the power consumption of the memory cells 550.

Although for description purposes, the bipolar devices 30 in the embodiment of FIGS. 74A through 74C have been described as n-p-n transistors, persons of ordinary skill in the art will readily appreciate that by reversing the first and second connectivity types and inverting the relative values of the applied voltages memory cell 550 could comprise a bipolar device 30 which is a p-n-p transistor. Thus the choice of an n-p-n transistor as an illustrative example for simplicity of explanation in FIGS. 74A through 74C is not limiting in any way.

Figure 75:
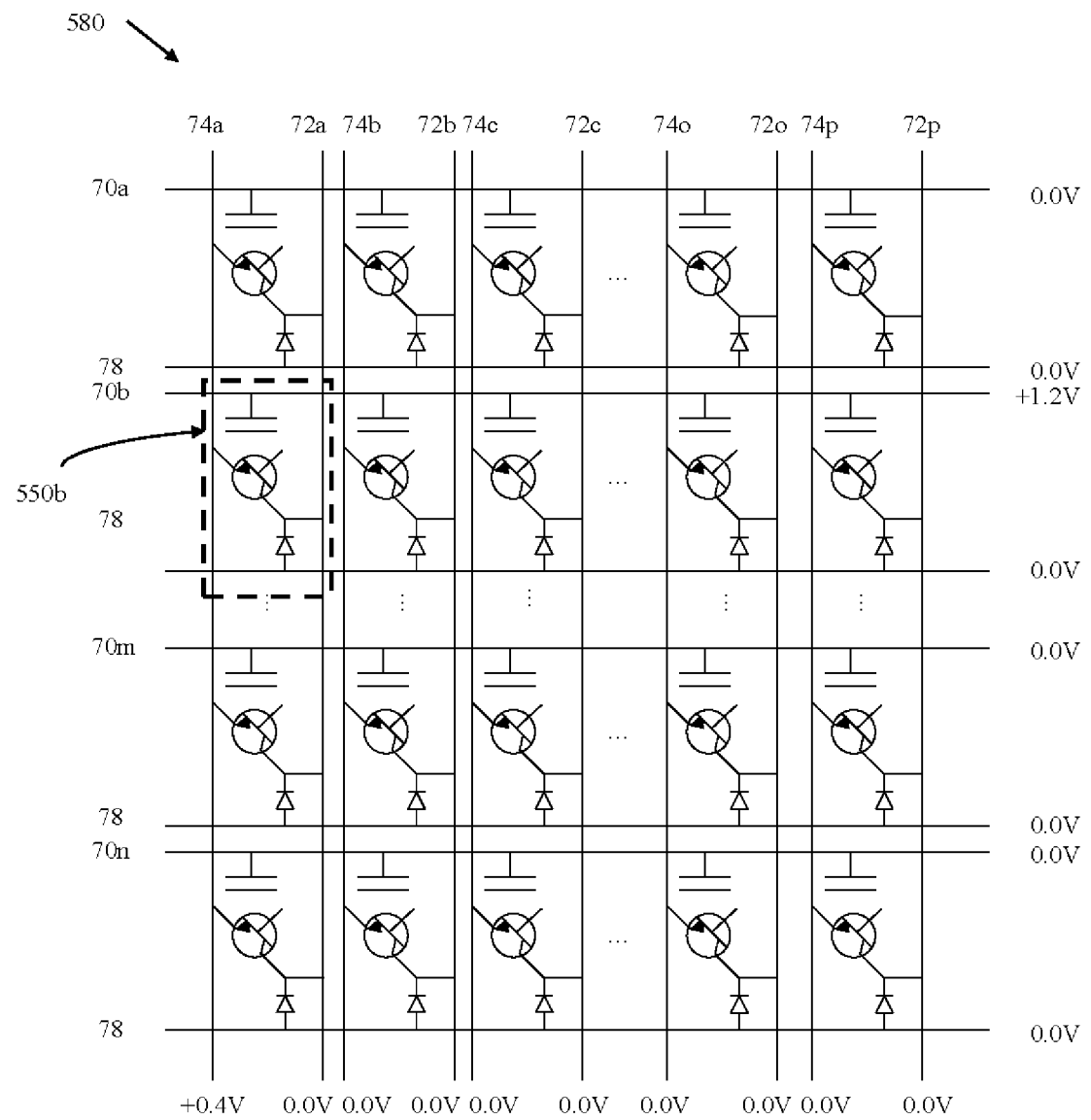
FIG. 75 is a schematic illustration of a memory array in which a read operation is being performed on a selected memory cell according to an embodiment of the present invention.

A read operation is described with reference to FIGS. 75-76, where memory cell 550b is being selected (as shown in FIG. 75). The following bias conditions may be applied: a positive voltage is applied to BL terminal 74a, zero voltage is applied to SL terminal 72a, a positive voltage is applied to WL terminal 70b, and zero voltage is applied to substrate terminal 78. The unselected BL terminals (e.g. BL terminal 74b, 74c, . . . , 74p in FIG. 75) remain at zero voltage, the unselected SL terminals (e.g. SL terminals 72b, 72c, . . . , 72p in FIG. 75) remain at zero voltage, the unselected WL terminals (e.g. WL terminal 70a, 70m, 70n in FIG. 75) remain at zero voltage, and the unselected substrate terminal 78 remains at zero voltage. Alternatively, a positive voltage can be applied to the unselected BL terminals connected to the buried layer region to maintain the states of the unselected memory cells.

In one particular non-limiting embodiment, the following bias conditions are applied to the selected memory cell 550b: a potential of about +0.4 volts is applied to BL terminal 74a, a potential of about 0.0 volts is applied to SL terminal 72a, a potential of about +1.2 volts is applied to WL terminal 70b, and about 0.0 volts is applied to substrate terminal 78; while the following bias conditions are applied to the unselected terminals: about 0.0 volts is applied to unselected BL terminals (or +1.2 volts can be applied to SL terminals connected to the buried layer region to maintain the states of the unselected memory cells), about 0.0 volts is applied to unselected WL terminals, and about 0.0 volts is applied to unselected substrate terminals.

Figure 76:
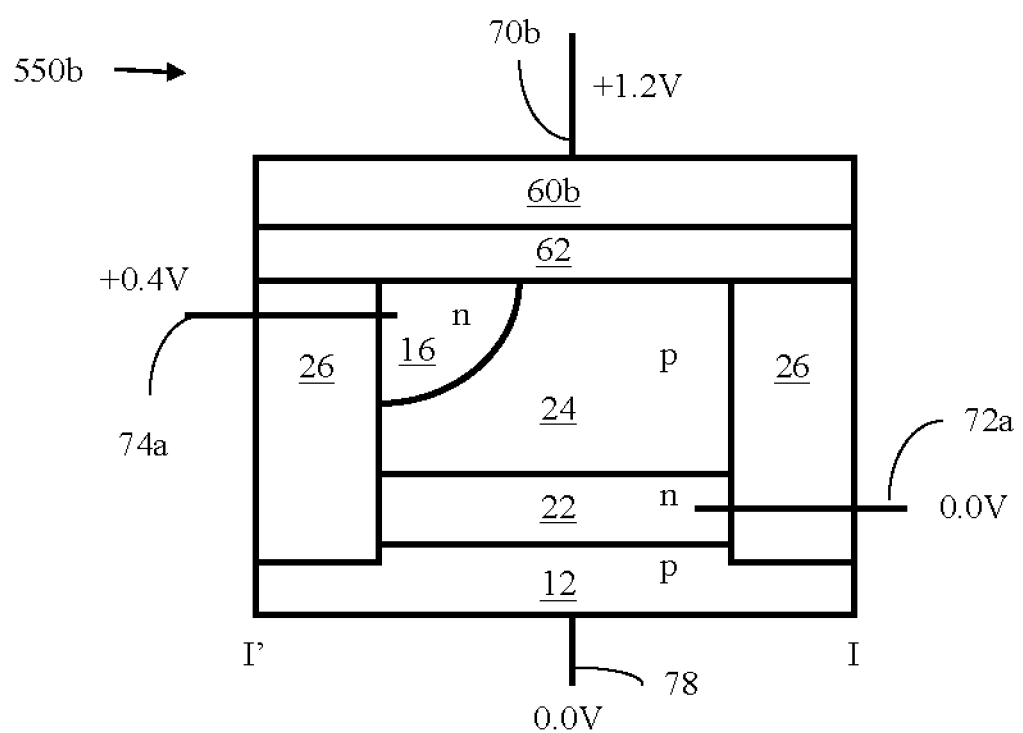
FIG. 76 is a schematic illustration of the selected memory cell in FIG. 75 that is being read, and bias conditions thereon during the read operation.

As shown in FIG. 76, about +1.2 volts will be applied to the gate 60b, about 0.4 volts will be applied to the region 16 (connected to BL terminal 74a), about 0.0 volts will be applied to buried layer region 22 (connected to SL terminal 72a), about 0.0 volts will be applied to buried layer 22, and about 0.0 will be applied to substrate 12 of selected memory cell 550b. The current flowing from BL terminal 74a to SL terminal 72a will then be determined by the potential of the floating body region 24 of the selected cell 550b.

If cell 550b is in a state "1" having holes in the floating body region 24, then the memory cell will have a lower threshold voltage (gate voltage where the transistor is turned on), and consequently will conduct a larger current compared to if cell 550b is in a state "0" having no holes in floating body region 24. The cell current can be sensed by, for example, a sense amplifier circuit connected to BL terminal 74a.

Alternatively, the read operation can be performed by reversing the conditions applied to BL terminal 74 and SL terminal 72.

Figure 77:
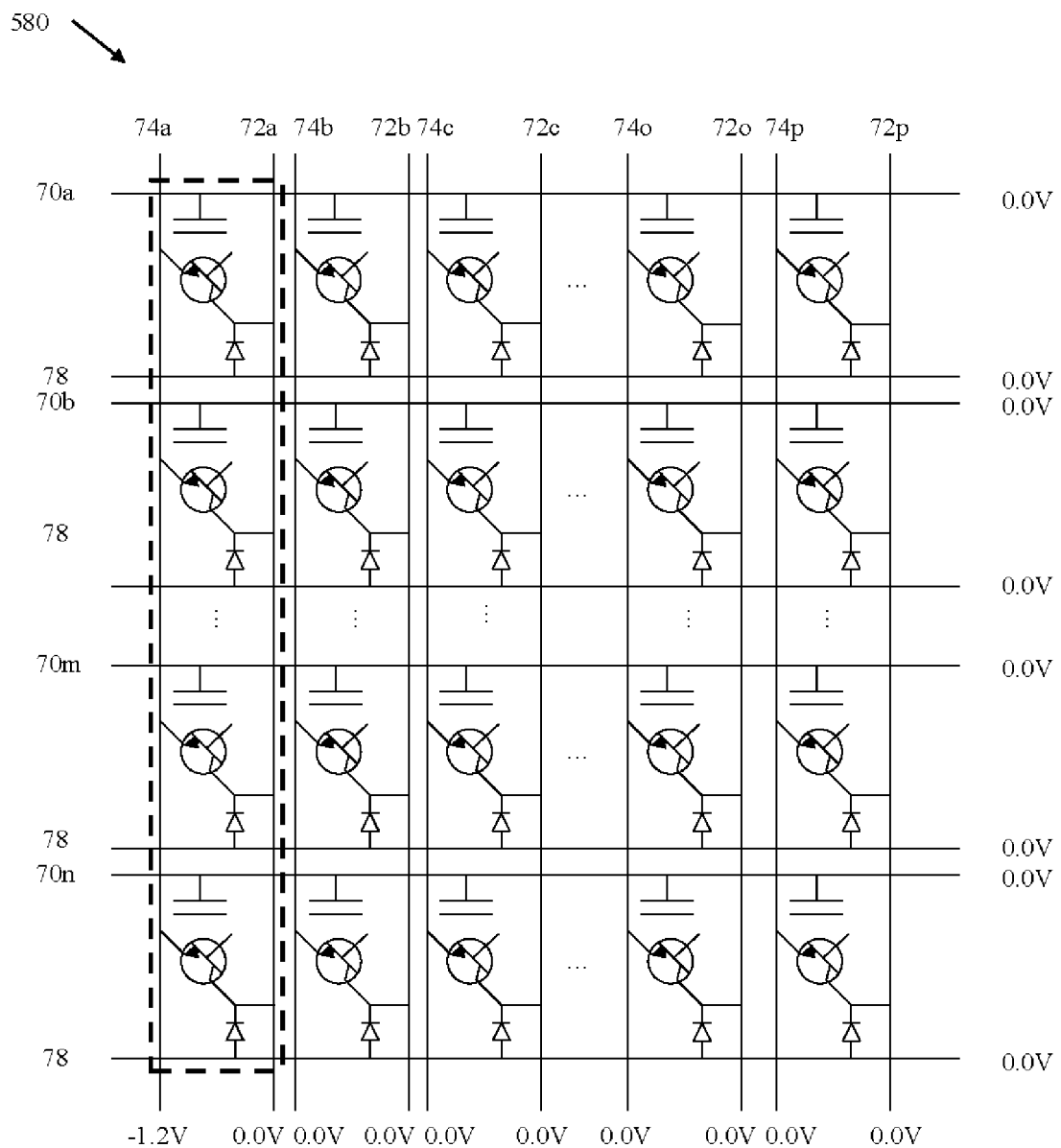
FIG. 77 is a schematic illustration of a memory array in which a write "0" operation is being performed according to an embodiment of the present invention.
Figure 78:
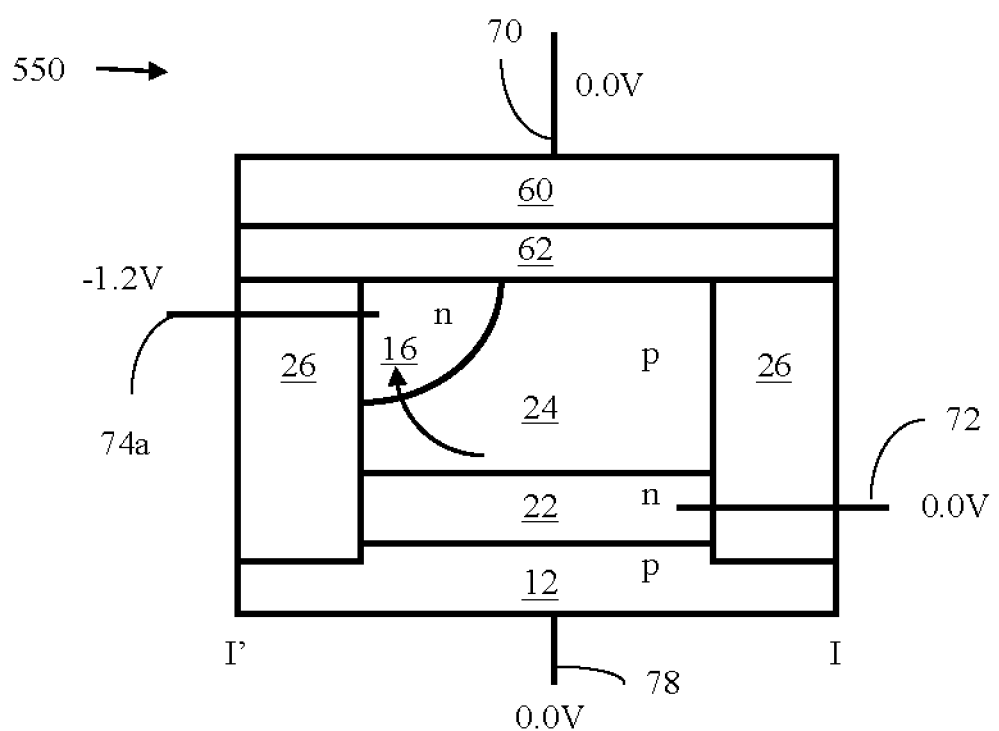
FIG. 78 schematically illustrates a memory cell of the array represented in FIG. 77 that is having a write "0" operation performed thereon according to an embodiment of the present invention.

A write "0" operation is described with reference to FIGS. 77-78, where the following bias conditions are applied: zero voltage to the SL terminal 72a, zero voltage to the WL terminals 70, negative voltage to the BL terminal 74a, and the substrate terminal 78 is grounded. Under these conditions, the p-n junction between floating body 24 and region 16 of the memory cell 550 is forward-biased, evacuating any holes from the floating body 24. All memory cells 550 sharing the same BL terminal 74a will be written to state "0". The unselected WL terminals, unselected BL terminals, unselected SL terminals, and unselected substrate terminals are grounded.

In one particular non-limiting embodiment, about −1.2 volts is applied to terminal 74a, about 0.0 volts is applied to SL terminal 72a, about 0.0 volts is applied to terminal 70, and about 0.0 volts is applied to substrate terminal 78. The unselected BL terminals 74 (e.g. BL terminals 74b, 74c, . . . , 74o, and 74p) will remain at 0.0 volts, the unselected SL terminals 74 (e.g. SL terminals 72b, 72c, . . . , 72o, and 72p) will remain at 0.0 volts, and the unselected substrate terminal 78 will remain at 0.0 volts. However, these voltage levels may vary, while maintaining the relative relationship between the charges applied, as described above.

Alternatively the write "0" operation can be achieved by reversing the bias condition applied to BL terminals 74 and SL terminals 72.

Figure 79:
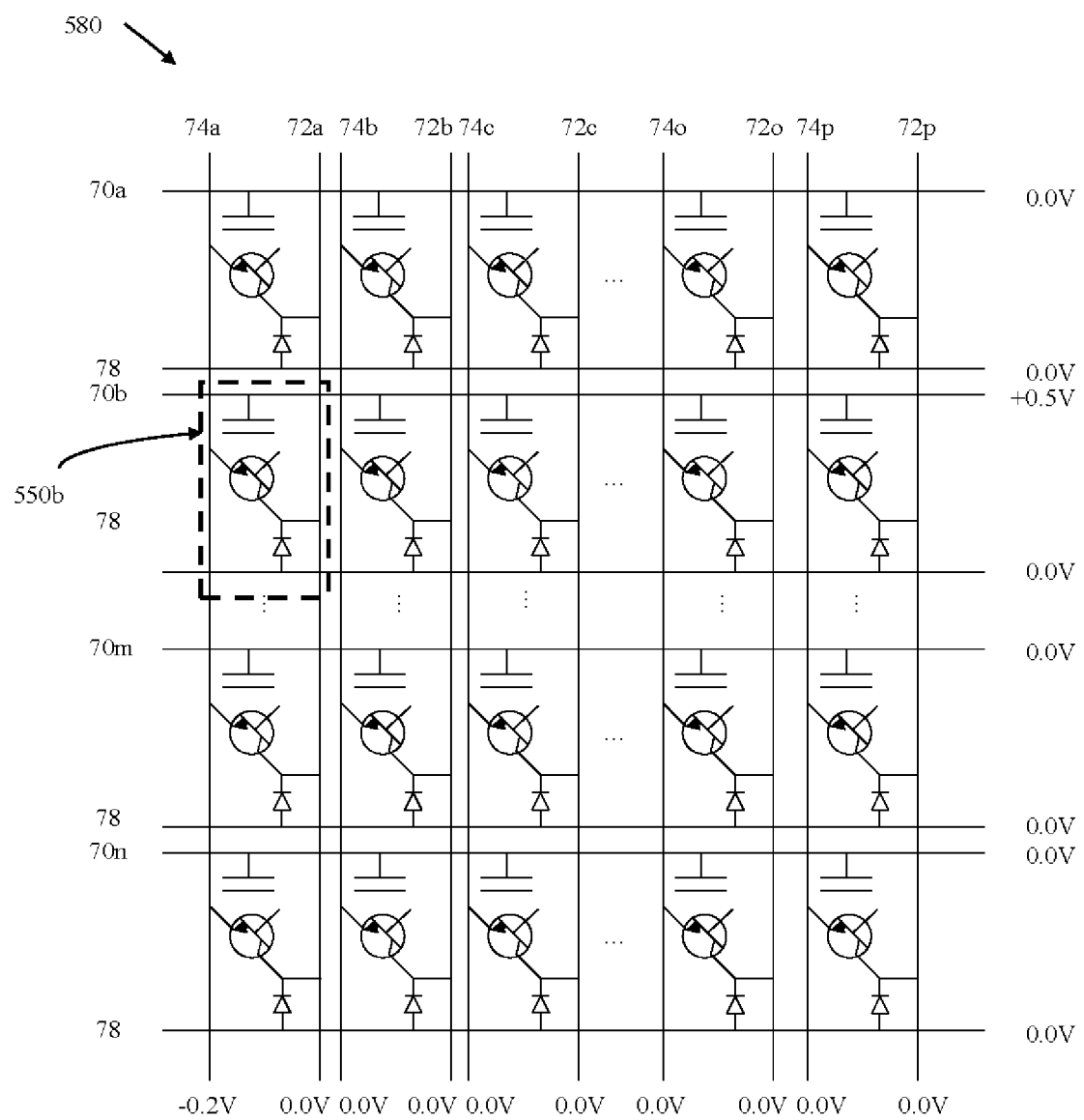
FIG. 79 is a schematic illustration of a memory array in which a write "0" operation is being performed according to an alternative embodiment of the present invention.
Figure 80:
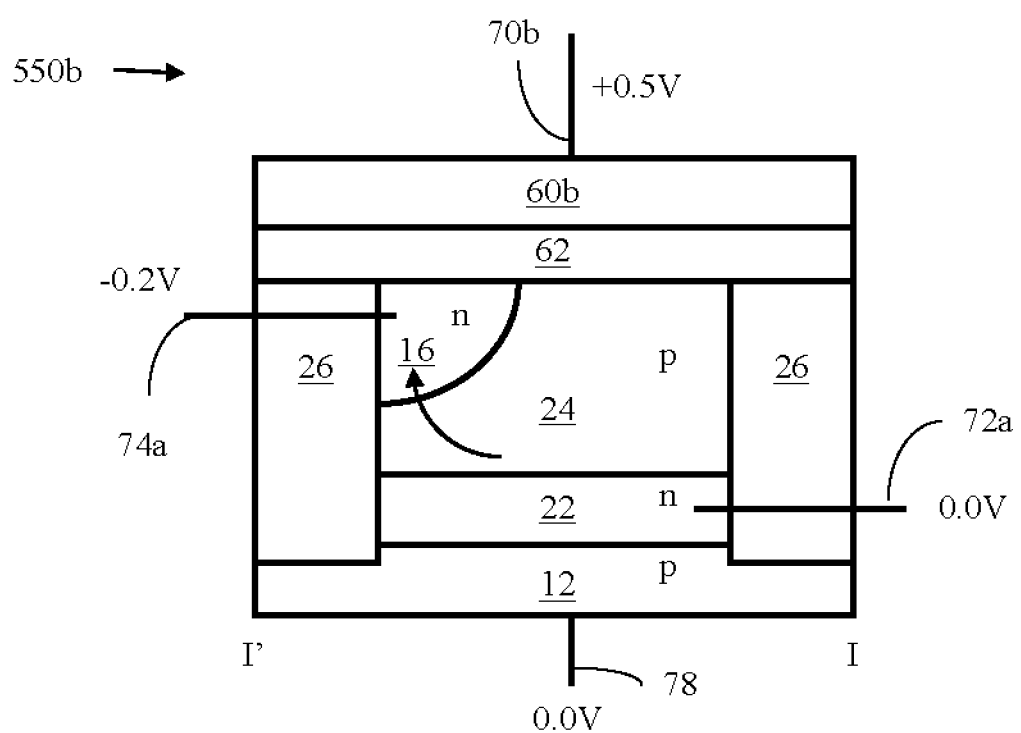
FIG. 80 schematically illustrates a memory cell of the array represented in FIG. 79 that is having a write "0" operation performed thereon according to the alternative embodiment described with regard to FIG. 79.

An alternative write "0" operation that allows for individual bit writing is shown in FIGS. 79-80, and can be performed by applying a negative voltage to BL terminal 74a, zero voltage to SL terminal 72a, zero voltage to substrate terminal 78, and a positive voltage to WL terminal 70. Under these conditions, a positive voltage will be applied to the gate of the selected memory cell (e.g. memory cell 550b in FIGS. 79-80) and consequently the floating body 24 potential will increase through capacitive coupling from the positive voltage applied to the WL terminal 70. As a result of the floating body 24 potential increase and the negative voltage applied to the BL terminal 74a, the p-n junction between 24 and region 16 is forward-biased, evacuating any holes from the floating body 24. To reduce undesired write "0" disturb to other memory cells 550 in the memory array 580, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74a.

In one particular non-limiting embodiment, the following bias conditions are applied to the memory cell 550: a potential of about 0.0 volts to SL terminal 72a, a potential of about −0.2 volts to BL terminal 74a, a potential of about +0.5 volts is applied to selected WL terminal 70b, and about 0.0 volts is applied to substrate terminal 78; while about 0.0 volts is applied to unselected BL terminals 74, about 0.0 volts is applied to unselected SL terminals, about 0.0 volts is applied to unselected WL terminal 70, and about 0.0 volts is applied to unselected terminal 78. Alternatively, a positive voltage, for example of +1.2 volts, can be applied to unselected SL terminals 72 connected to the buried layer region 22 to maintain the states of the unselected memory cells. FIGS. 79-80 show the bias condition for the selected and unselected memory cells in memory array 580 where memory cell 550b is the selected cell. However, these voltage levels may vary.

Alternatively, the write "0" operation described above can be achieved by reversing the bias condition applied to BL terminals 74 and SL terminals 72.

Figure 81:
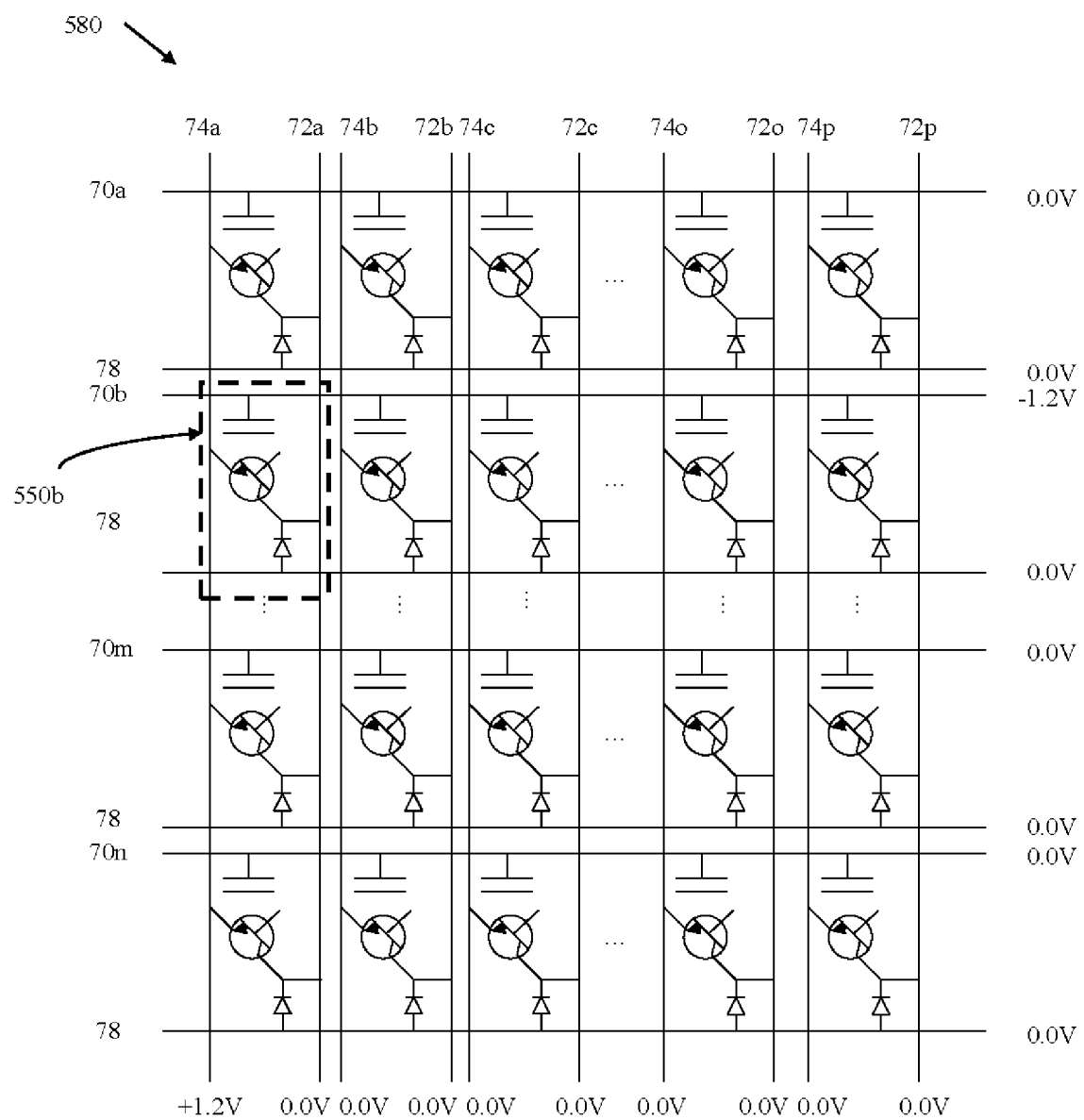
FIG. 81 is a schematic illustration of a memory array in which a write "1" operation is being performed by band-to-band tunneling according to an embodiment of the present invention.
Figure 82:
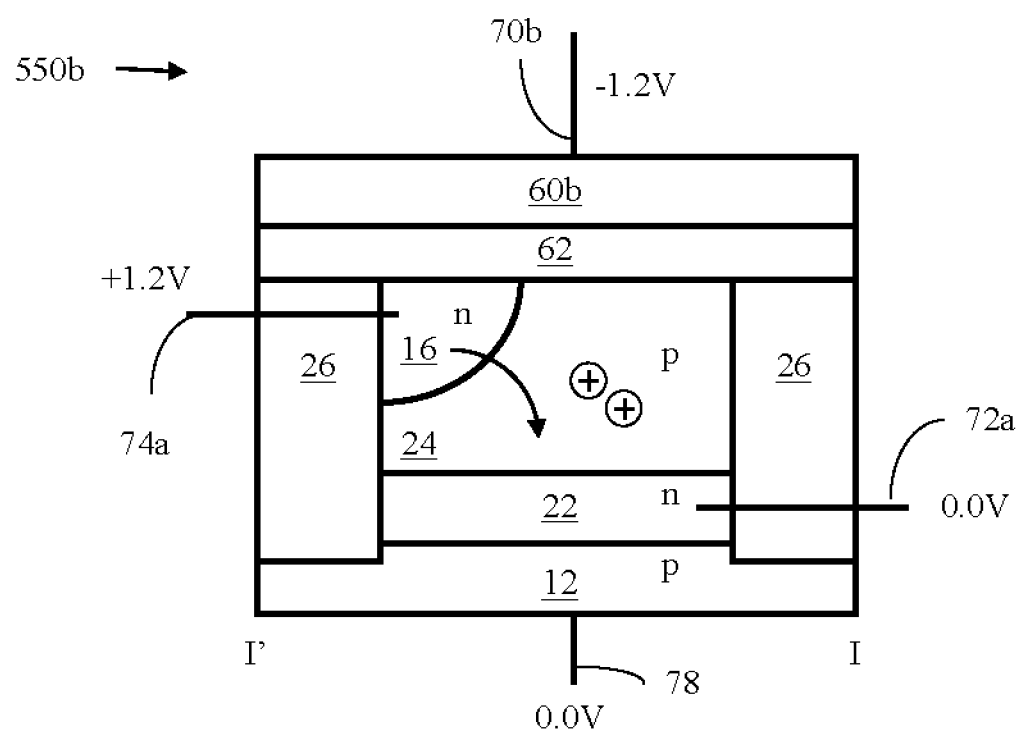
FIG. 82 schematically illustrates a selected memory cell of the array of FIG. 81 on which the write "1" operation is being performed, and the bias conditions thereon.

An example of the bias condition of the selected memory cell 550b under band-to-band tunneling write "1" operation is illustrated in FIGS. 81 and 82. A negative bias is applied to the selected WL terminal 70b, zero voltage is applied to the SL terminal 72a, and a positive bias applied to the BL terminal 74a, while the substrate terminal 78 is grounded. This condition results in electrons flow to the BL terminal 74a, generating holes which subsequently are injected to the floating body region 24.

In one particular non-limiting embodiment, the following bias conditions are applied to the selected memory cell 550b: a potential of about 0.0 volts is applied to SL terminal 72a, a potential of about +1.2 volts is applied to BL terminal 74a, a potential of about −1.2 volts is applied to the selected WL terminal 70b, and about 0.0 volts is applied to substrate terminal 78; while the following bias conditions are applied to the unselected terminals: about 0.0 volts is applied to unselected BL terminals (e.g. BL terminals 74b, 74c, . . . , 74o, and 74p in FIG. 81), about 0.0 volts is applied to unselected SL terminals (e.g. SL terminals 72b, 72c, . . . , 72o, and 72p in FIG. 81), a potential of about 0.0 volts is applied to unselected WL terminal 70 (e.g. WL terminals 70a, 70m, and 70n in FIG. 81), and about 0.0 volts is applied to substrate terminal 78. A positive voltage of about +1.2 volts can alternatively be applied (either continuously, or intermittently in pulse fashion as described above, to reduce power consumption) to unselected SL terminals connected to the buried layer region 22 to maintain the states of the unselected memory cells). FIGS. 81-82 show the bias conditions for the selected and unselected memory cells in memory array 580 where memory cell 550*b* is the selected cell. However, these voltage levels may vary.

Figure 83:
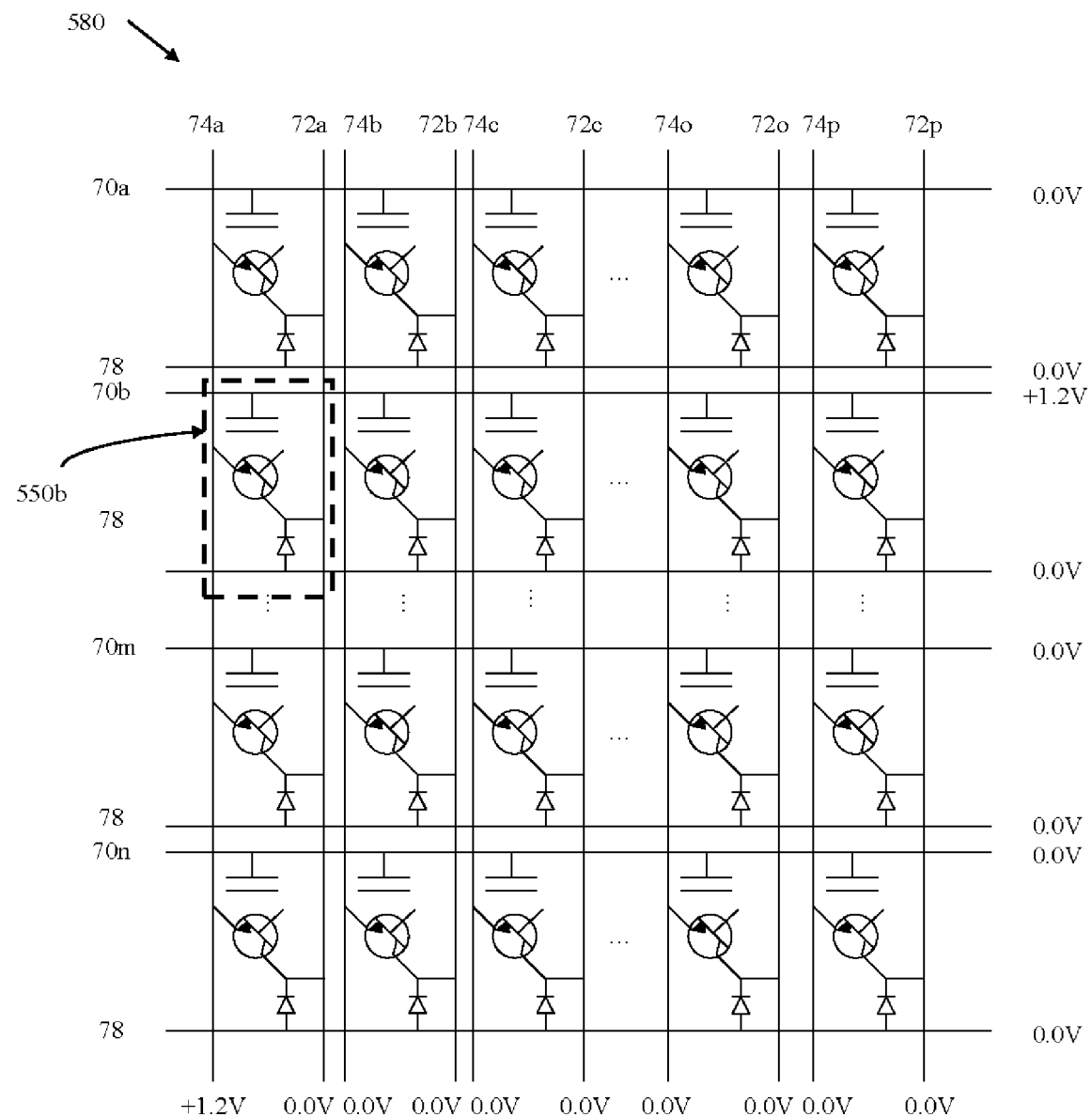
FIG. 83 is a schematic illustration of a memory array in which a write "1" operation is being performed by impact ionization according to an embodiment of the present invention.
Figure 84:
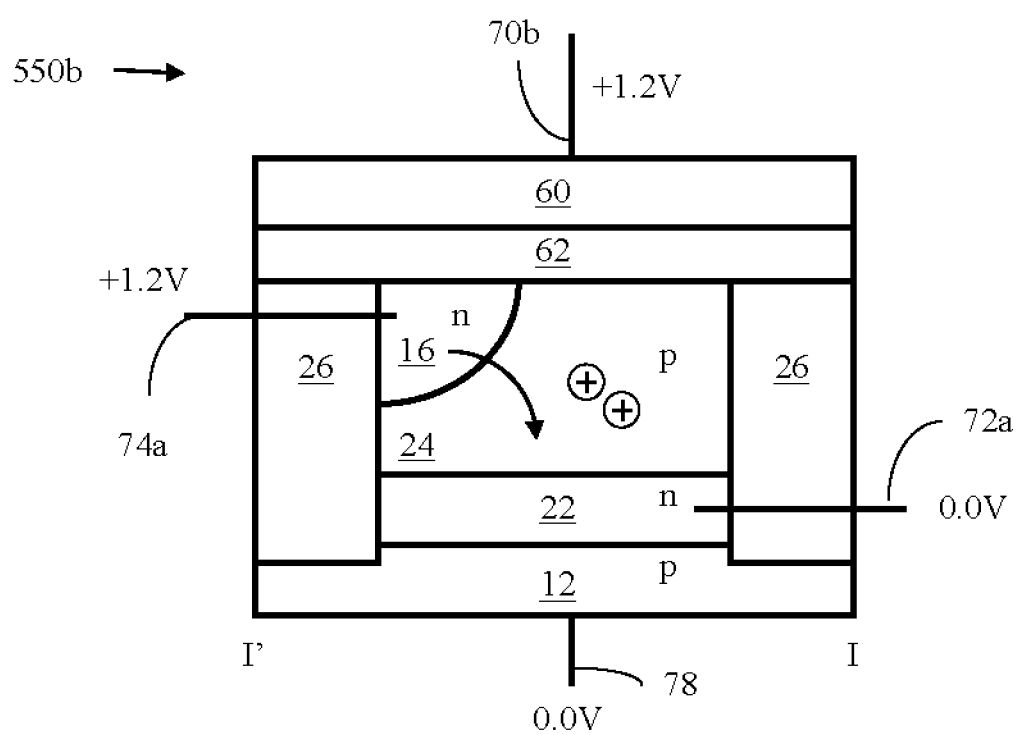
FIG. 84 schematically illustrates a selected memory cell of the array of FIG. 83 on which the write "1" operation is being performed, and the bias conditions thereon.

An example of the bias conditions on the selected memory cell 550*b* under impact ionization write "1" operation is illustrated in FIGS. 83-84. A positive bias is applied to the selected WL terminal 70*b*, zero voltage is applied to the SL terminal 72*a*, a positive bias is applied to the BL terminal 74*a*, and the substrate terminal 78 is grounded. These conditions result in a lateral electric field sufficient to generate energetic electrons, which subsequently generate electron-hole pairs, followed by hole injection to the floating body 24 of the selected memory cell (e.g. cell 550*b* in FIGS. 83-84).

In one particular non-limiting embodiment, the following bias conditions are applied to the selected memory cell 550*b*: a potential of about 0.0 volts is applied to SL terminal 72*a*, a potential of about +1.2 volts is applied to BL terminal 74*a*, a potential of about +1.2 volts is applied to the selected WL terminal 70*b*, and about 0.0 volts is applied to substrate terminal 78; while the following bias conditions are applied to the unselected terminals: about 0.0 volts is applied to unselected BL terminals 74 (e.g. BL terminals 74*b*, 74*c*, ..., 74*o*, and 74*p* in FIG. 83), about 0.0 volts is applied to unselected SL terminals 72 (e.g. SL terminals 72*b*, 72*c*, ..., 72*o*, and 72*p* in FIG. 83), a potential of about 0.0 volts is applied to unselected WL terminals 70 (e.g. WL terminals 70*a*, 70*m*, and 70*n* in FIG. 83), and about 0.0 volts is applied to substrate terminal 78. A positive voltage of about +1.2 volts can alternatively (either continuously, or intermittently in pulse fashion as described above, to reduce power consumption) be applied to unselected SL terminals 72 connected to the buried layer region 22 to maintain the states of the unselected memory cells). FIGS. 83-84 show the bias conditions on the selected and unselected memory cells in memory array 580 (with memory cell 550*b* as the selected cell). However, these voltage levels may vary.

Alternatively, the write "1" operations under band-to-band tunneling and impact ionization mechanisms described above can be achieved by reversing the bias conditions applied to BL terminals 74 and SL terminals 72.

The array 580 may be constructed from a plurality of planar cells, such as the embodiments described above with reference to FIGS. 74C and 74D, or, alternatively, may be constructed from fin-type, three-dimensional cells. Other variations, modifications and alternative cells may be provided without departing from the scope of the present invention and its functionality.

From the foregoing it can be seen that with the present invention, a semiconductor memory with electrically floating body is achieved. The present invention also provides the capability of maintaining memory states or parallel non-algorithmic periodic refresh operations. As a result, memory operations can be performed in an uninterrupted manner. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples, but by all embodiments and methods within the scope and spirit of the invention as claimed. While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. An integrated circuit comprising:
a link or string of semiconductor memory cells, wherein each said memory cell comprises a floating body region for storing data; and
said link or string comprises at least one contact configured to electrically connect said memory cells to at least one control line, wherein the number of contacts is the same as or less than the number of said memory cells.

2. The integrated circuit of claim 1, wherein said number of contacts is less than said number of memory cells.

3. The integrated circuit of claim 1, where said semiconductor memory cells are connected in series.

4. The integrated circuit of claim 1, where said semiconductor memory cells are connected in parallel.

5. The integrated circuit of claim 1, where said integrated circuit is fabricated on a silicon-on-insulator (SOI) substrate.

6. The integrated circuit of claim 1, where said integrated circuit is fabricated on a bulk silicon substrate.

7. The integrated circuit of claim 1, where said number of contacts is two.

8. The integrated circuit of claim 1, wherein said memory cells further comprise first and second conductive regions interfacing with said floating body region.

9. The integrated circuit of claim 8, wherein said first and second conductive regions are shared by adjacent ones of said memory cells for each said memory cell having said adjacent memory cells.

10. The integrated circuit of claim 1, wherein each said memory cell further comprises first, second, and third conductive regions interfacing with said floating body region.

11. The integrated circuit of claim 1, wherein each said memory cell further comprises a gate insulated from said floating body region.

12. The integrated circuit of claim 1, wherein at least one of said memory cells is a contactless memory cell.

13. The integrated circuit of claim 12, wherein a majority of said memory cells are contactless memory cells.

14. The integrated circuit of claim 1, wherein said memory cells store multi-bit data.

15. An integrated circuit comprising:
a plurality of contactless semiconductor memory cells, each said semiconductor memory cell comprising:
a floating body region for storing data;
first and second conductive regions interfacing with the floating body region;
a gate; and
an insulating region insulating said gate from said floating body region.

16. The integrated circuit of claim 15, wherein said contactless memory cells are connected in series.

17. The integrated circuit of claim 15, wherein said contactless memory cells are connected in parallel.

18. The integrated circuit of claim 15, wherein said integrated circuit is fabricated on a silicon-on-insulator (SOI) substrate.

19. The integrated circuit of claim 15, wherein said integrated circuit is fabricated on a bulk silicon substrate.

20. The integrated circuit of claim 15, wherein each said contactless memory cell comprises a third conductive region interfacing with the floating body region.

21. The integrated circuit of claim 15, wherein said integrated circuit comprises at least one semiconductor memory cell having at least one contact, a total number of said contacts being less than a total number of memory cells that includes a total number of said memory cells having at least one contact and a total number of said contactless memory cells.

22. The integrated circuit of claim 15, wherein said memory cells store multi-bit data.

23. An integrated circuit comprising:
a plurality of semiconductor memory cells connected in series, each said semiconductor memory cell comprising:
a floating body region for storing data;
first and second conductive regions interfacing with said floating body region;
a gate; and
an insulating region insulating the gate and the floating body region.

24. The integrated circuit of claim 23, wherein at least one of said semiconductor memory cells is a contactless semiconductor memory cell.

25. The integrated circuit of claim 23, wherein said integrated circuit is fabricated on a silicon-on-insulator (SOI) substrate.

26. The integrated circuit of claim 23, wherein said integrated circuit is fabricated on a bulk silicon substrate.

27. The integrated circuit of claim 23, wherein said integrated circuit comprises a number of contacts, said number of contacts being less than or equal to a number of said memory cells.

28. The integrated circuit of claim 23, wherein said memory cells each further comprise a third conductive region interfacing with said floating body region.

29. The integrated circuit of claim 23, wherein said memory cells store multi-bit data.

30. An integrated circuit comprising:
a plurality of semiconductor memory cells connected in parallel, each said semiconductor memory cell comprising:
a floating body region for storing data;
a conductive region interfacing with the floating body region;
a gate; and
an insulating region insulating said gate from said floating substrate region;
wherein at least one of said semiconductor memory cells is a contactless semiconductor memory cell.

31. The integrated circuit of claim 30, wherein a majority of said semiconductor memory cells are contactless semiconductor memory cells.

32. The integrated circuit of claim 30, wherein said integrated circuit is fabricated on a silicon-on-insulator (SOI) substrate.

33. The integrated circuit of claim 30, wherein said integrated circuit is fabricated on a bulk silicon substrate.

34. The integrated circuit of claim 30, wherein said integrated circuit comprises a number of contacts, said number being less than or equal to a number of said memory cells.

35. The integrated circuit of claim 30, wherein at least one of said memory cells fluffier comprises a second conductive region interfacing with said floating body region.

36. The integrated circuit of claim 30, wherein said memory cells each further comprise second and third conductive regions interfacing with said floating body region.

37. The integrated circuit of claim 30, wherein said memory cells store multi-bit data.

38. An integrated circuit comprising:
a plurality of contactless semiconductor memory cells connected in parallel, each said semiconductor memory cell comprising:
a floating body region for storing data;
first and second conductive regions interfacing with the floating body region;
a gate; and
an insulating region insulating the gate and the floating body region.

39. The integrated circuit of claim 38, where said integrated circuit is fabricated on a silicon-on-insulator (SOI) substrate.

40. The integrated circuit of claim 38, where said integrated circuit is fabricated on a bulk silicon substrate.

41. The integrated circuit of claim 38, wherein each said contactless memory cell comprises a third conductive region interfacing with the floating body region.

42. The integrated circuit of claim 38, wherein the number of contacts is the same or less than the number of said memory cells.

43. The integrated circuit of claim 38, wherein said memory cells store multi-bit data.

44. An integrated circuit comprising:
a memory string or link comprising a set of contactless semiconductor memory cells; and
a first contact contacting a semiconductor transistor forming part of said string or link; and
wherein said contactless semiconductor memory cells are accessible via said first contact.

45. The integrated circuit of claim 44, further comprising:
a second contact contacting a second semiconductor transistor forming part of said string or link;
wherein said contactless semiconductor memory cells are accessible via said second contact.

46. The integrated circuit of claim 44, wherein said contactless semiconductor memory cells and said transistors are connected in series.

47. The integrated circuit of claim 44,
wherein said memory string or link comprises a first memory string or link and said set comprises a first set, said integrated circuit further comprising:
a second memory string or link comprising a second set of contactless semiconductor memory cells; and
a second contact contacting a second semiconductor transistor forming part of said second memory string or link;
wherein said second set of contactless semiconductor memory cells are accessible via said second contact.

48. The integrated circuit of claim 45,
wherein said memory string or link comprises a first memory string and said set comprises a first set, said integrated circuit further comprising:
a second memory string comprising a second set of contactless semiconductor memory cells;
a third contact contacting a third semiconductor transistor forming part of said second memory string or link; and
a fourth contact contacting a fourth semiconductor transistor forming part of said second memory string or link;
wherein said second set of contactless semiconductor memory cells are accessible via said third and fourth contacts;

wherein said first set of contactless semiconductor memory cells, said first semiconductor transistor and said second semiconductor transistor are connected in series, and wherein said second set of contactless semiconductor memory cells, said third semiconductor transistor and said fourth semiconductor transistor are connected in series in said second string.

49. The integrated circuit of claim 48, further comprising a first terminal connected to said first contact and said third contact;

a second terminal connected to said second contact; and a third terminal connected to said fourth contact.

50. The integrated circuit of claim 44, wherein said semiconductor memory cells comprise substantially planar semiconductor memory cells.

51. The integrated circuit of claim 44, wherein said semiconductor memory cells comprise fin-type, three-dimensional semiconductor memory cells.

52. The integrated circuit of claim 47, wherein said first set of contactless semiconductor memory cells are aligned side-by side of said second set of contactless semiconductor memory cells; and wherein said first string comprises a first set of insulation portions that insulate adjacent memory cells in said first string, and a second set of insulation portions that insulate said memory cells in said first string from adjacent memory cells in said second string; and wherein said second string comprises a third set of insulation portions that insulate adjacent memory cells in said second siring, and said second set of insulation portions insulate said memory cells in said second siring from adjacent memory cells in said first siring.

53. The integrated circuit of claim 45, wherein said first and second contacts are located at first and second ends of said memory siring.

54. The integrated circuit of claim 44, wherein each said semiconductor memory cell comprises:

a floating body region for storing data;

first and second conductive regions interfacing with said floating body region;

a gate;

an insulating region insulating said gate from said floating body region; and a word line terminal electrically connected to said gate.

* * * * *

UNITED STATES PATENT AND TRADEMARK OFFICE
CERTIFICATE OF CORRECTION

PATENT NO. : 8,514,622 B2
APPLICATION NO. : 12/897528
DATED : August 20, 2013
INVENTOR(S) : Widjaja Page 1 of 1

It is certified that error appears in the above-identified patent and that said Letters Patent is hereby corrected as shown below:

Specification
Column 17, line 14, please delete "series to from" and insert --series to form--;
Column 33, line 33, please delete "and charged" and insert --and charges--;
Column 36, line 9, please delete "to bet line" and insert --to bit line--;
Claims
Column 49, line 66 (Claim 35, line 2), please delete "cells fluffier" and insert --cells further--; and
Column 52, line 13 (Claim 53, line 3), please delete "memory siring"" and insert --memory string--.

Signed and Sealed this
Eighth Day of March, 2016

Michelle K. Lee
*Director of the United States Patent and Trademark Office*